US012490647B2

(12) United States Patent
Kim et al.

(10) Patent No.: US 12,490,647 B2
(45) Date of Patent: *Dec. 2, 2025

(54) AMINE COMPOUND AND LIGHT-EMITTING DEVICE INCLUDING SAME

(71) Applicant: Samsung Display Co., Ltd., Yongin-si (KR)

(72) Inventors: Minji Kim, Yongin-si (KR); Sanghyun Han, Yongin-si (KR); Dongjun Kim, Yongin-si (KR); Hankyu Pak, Yongin-si (KR); Eunjae Jeong, Yongin-si (KR); Sohee Jo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 861 days.

This patent is subject to a terminal disclaimer.

(21) Appl. No.: 17/223,851

(22) Filed: Apr. 6, 2021

(65) Prior Publication Data

US 2022/0059770 A1 Feb. 24, 2022

(30) Foreign Application Priority Data

Aug. 20, 2020 (KR) ........................ 10-2020-0104804

(51) Int. Cl.
*H10K 85/60* (2023.01)
*H10K 50/15* (2023.01)
(Continued)

(52) U.S. Cl.
CPC ......... *H10K 85/615* (2023.02); *H10K 85/622* (2023.02); *H10K 85/623* (2023.02);
(Continued)

(58) Field of Classification Search
CPC .. H10K 85/636; H10K 85/622; H10K 85/623; H10K 85/633; H10K 85/6572;
(Continued)

(56) References Cited

U.S. PATENT DOCUMENTS 4,720,432 A 1/1988 VanSlyke et al.
5,061,569 A 10/1991 VanSlyke et al.
(Continued)

FOREIGN PATENT DOCUMENTS

CN 104488359 A 4/2015
CN 106560934 A 4/2017
(Continued)

OTHER PUBLICATIONS

Jhulki, Samik, and Jarugu Narasimha Moorthy. "Small molecular hole-transporting materials (HTMs) in organic light-emitting diodes (OLEDs): Structural diversity and classification." Journal of Materials Chemistry C 6, No. 31 (2018): 8280-8325. (Year: 2018).*
(Continued)

*Primary Examiner* — Dawn L Garrett
(74) *Attorney, Agent, or Firm* — Womble Bond Dickinson (US) LLP

(57) ABSTRACT

Provided are an amine compound represented by Formula 1 and a light-emitting device including the amine compound. The light emitting device includes: a first electrode; a second electrode facing the first electrode; and an interlayer between the first electrode and the second electrode and including an emission layer, wherein the light-emitting device includes an amine compound represented by Formula 1.

19 Claims, 3 Drawing Sheets

(51) Int. Cl.

| | |
|---|---|
| ***H10K 50/16*** | (2023.01) |
| ***H10K 50/17*** | (2023.01) |
| ***H10K 50/18*** | (2023.01) |

(52) U.S. Cl.

CPC ......... *H10K 85/624* (2023.02); *H10K 85/633* (2023.02); *H10K 85/636* (2023.02); *H10K 85/6572* (2023.02); *H10K 85/6574* (2023.02); *H10K 85/6576* (2023.02); *H10K 50/15* (2023.02); *H10K 50/16* (2023.02); *H10K 50/17* (2023.02); *H10K 50/171* (2023.02)

(58) Field of Classification Search

CPC ........... H10K 85/6574; H10K 85/6576; H10K 50/15; H10K 50/16; H10K 50/171; H10K 50/18; H10K 50/11; H10K 50/17; H10K 85/626; H10K 85/615; H10K 85/631; H10K 85/657; C07D 209/88; C07D 211/61; C07D 307/91; C07D 333/76; C07D 405/12; C07D 2601/14; C07D 2603/18; C07D 2603/94; C07D 211/54; C07D 211/57; C07D 2603/12

See application file for complete search history.

(56) References Cited

U.S. PATENT DOCUMENTS

| | | | |
|---|---|---|---|
| 6,242,115 | B1 | 6/2001 | Thomson et al. |
| 6,674,596 | B1 | 1/2004 | Takayama |
| 7,470,933 | B2 | 12/2008 | Lee et al. |
| 7,875,895 | B2 | 1/2011 | Kwack et al. |
| 8,021,764 | B2 | 9/2011 | Hwang et al. |
| 8,373,191 | B2 | 2/2013 | Ide et al. |
| 8,471,463 | B2 | 6/2013 | Sumida et al. |
| 8,530,888 | B2 | 9/2013 | Jeong et al. |
| 8,963,143 | B2 | 2/2015 | Loebl et al. |
| 9,293,732 | B2 | 3/2016 | Pyo et al. |
| 9,412,964 | B2 | 8/2016 | Sotoyama et al. |
| 9,478,753 | B2 | 10/2016 | Jung et al. |
| 9,496,503 | B2 | 11/2016 | Takeda et al. |
| 10,283,734 | B2 | 5/2019 | Yim et al. |
| 10,297,760 | B2 | 5/2019 | Kitamura et al. |
| 10,483,479 | B2 | 11/2019 | Tanaka |
| 10,497,877 | B2 | 12/2019 | Mujica-Fernaud et al. |
| 10,790,337 | B2 | 9/2020 | Jeong et al. |
| 10,941,108 | B2 | 3/2021 | Jeong et al. |
| 11,407,854 | B2 | 8/2022 | Burkhart et al. |
| 11,950,499 | B2 * | 4/2024 | Lee .................... H10K 85/6572 |
| 12,167,619 | B2 * | 12/2024 | Ko ....................... H10K 59/876 |
| 2011/0121271 | A1 | 5/2011 | Jeon et al. |
| 2011/0198581 | A1 | 8/2011 | Yabunouchi et al. |
| 2011/0215308 | A1 | 9/2011 | Im et al. |
| 2012/0025180 | A1 | 2/2012 | Matsumoto et al. |
| 2013/0161656 | A1 | 6/2013 | Choi et al. |
| 2013/0299806 | A1 | 11/2013 | Kato et al. |
| 2014/0225100 | A1 | 8/2014 | Yokoyama et al. |
| 2015/0099485 | A1 | 4/2015 | Chuang |
| 2016/0043317 | A1 * | 2/2016 | Takada ................. H10K 50/156 257/40 |
| 2016/0079542 | A1 | 3/2016 | Itoi |
| 2016/0133850 | A1 | 5/2016 | Matsuura et al. |
| 2016/0149141 | A1 * | 5/2016 | Jung .................... H10K 85/633 548/440 |
| 2016/0155979 | A1 | 6/2016 | Yim et al. |
| 2016/0197277 | A1 | 7/2016 | Kato et al. |
| 2016/0308162 | A1 | 10/2016 | Yoo et al. |
| 2017/0098686 | A1 * | 4/2017 | Jeong ..................... H10K 50/13 |
| 2017/0229649 | A1 | 8/2017 | Kato et al. |
| 2017/0294628 | A1 | 10/2017 | Kim et al. |
| 2017/0317285 | A1 * | 11/2017 | Mujica-Fernaud .... H05B 33/20 |
| 2018/0123042 | A1 | 5/2018 | Cha et al. |
| 2019/0016666 | A1 * | 1/2019 | Jeong ................. H10K 85/6572 |
| 2019/0040187 | A1 | 2/2019 | Sano et al. |
| 2019/0288209 | A1 | 9/2019 | Pfister et al. |
| 2020/0144337 | A1 | 5/2020 | Lim et al. |
| 2020/0152884 | A1 | 5/2020 | Hwang et al. |
| 2020/0235297 | A1 | 7/2020 | Miyake et al. |
| 2020/0328383 | A1 | 10/2020 | Song |
| 2021/0005814 | A1 | 1/2021 | Watabe et al. |
| 2021/0202843 | A1 * | 7/2021 | Qian .................... C07D 213/38 |
| 2022/0158095 | A1 | 5/2022 | Huang et al. |
| 2022/0158099 | A1 | 5/2022 | Han et al. |

FOREIGN PATENT DOCUMENTS

| | | | |
|---|---|---|---|
| CN | 107778212 | A | 3/2018 |
| CN | 110950762 | A | 4/2020 |
| CN | 111533716 | A | 8/2020 |
| CN | 111548278 | A | 8/2020 |
| EP | 2347896 | A1 | 7/2011 |
| JP | 6-314594 | A | 11/1994 |
| JP | 8-291115 | A | 11/1996 |
| JP | 11-144873 | A | 5/1999 |
| JP | 11-251068 | A | 9/1999 |
| JP | 2000-302756 | A | 10/2000 |
| JP | 2000-309566 | A | 11/2000 |
| JP | 2003-133075 | A | 5/2003 |
| JP | 2004-079265 | A | 3/2004 |
| JP | 2006-151979 | A | 6/2006 |
| JP | 3801330 | B2 | 7/2006 |
| JP | 2008-34701 | A | 2/2008 |
| JP | 2013-258269 | A | 12/2013 |
| JP | 2016-39187 | A | 3/2016 |
| JP | 2016-92297 | A | 5/2016 |
| JP | 2017-508715 | A | 3/2017 |
| JP | 2017-139342 | | 8/2017 |
| JP | 2018-131444 | A | 8/2018 |
| JP | 5696091 | B2 | 4/2020 |
| KR | 10-2005-0120400 | A | 12/2005 |
| KR | 10-0873082 | B1 | 12/2008 |
| KR | 10-0873704 | B1 | 12/2008 |
| KR | 10-2011-0101418 | | 9/2011 |
| KR | 10-1084197 | B1 | 11/2011 |
| KR | 10-1290610 | B1 | 7/2013 |
| KR | 10-1408547 | B1 | 6/2014 |
| KR | 10-1453768 | B1 | 10/2014 |
| KR | 10-1496789 | B1 | 2/2015 |
| KR | 10-2015-0038193 | A | 4/2015 |
| KR | 10-2016-0017596 | A | 2/2016 |
| KR | 10-2016-0030429 | A | 3/2016 |
| KR | 10-2016-0055675 | A | 5/2016 |
| KR | 10-2016-0065318 | | 6/2016 |
| KR | 10-2016-0065318 | A | 6/2016 |
| KR | 10-1632517 | B1 | 6/2016 |
| KR | 10-1708176 | B1 | 2/2017 |
| KR | 10-2017-0030450 | A | 3/2017 |
| KR | 10-2017-0080432 | A | 7/2017 |
| KR | 10-1772371 | B1 | 8/2017 |
| KR | 10-1790321 | B1 | 10/2017 |
| KR | 10-2018-0047421 | A | 5/2018 |
| KR | 10-2018-0082710 | A | 7/2018 |
| KR | 10-1883591 | B1 | 7/2018 |
| KR | 10-2018-0090421 | A | 8/2018 |
| KR | 10-1871289 | B1 | 8/2018 |
| KR | 10-2018-0112925 | A | 10/2018 |
| KR | 10-2018-0131115 | A | 12/2018 |
| KR | 10-2019-0063368 | A | 6/2019 |
| KR | 10-2019-0091410 | A | 8/2019 |
| KR | 10-2020-0006406 | A | 1/2020 |
| KR | 10-2020-0021075 | A | 2/2020 |
| KR | 10-2020-0040166 | A | 4/2020 |
| KR | 10-2021-0086504 | A | 7/2021 |
| KR | 10-2022-0012459 | A | 2/2022 |
| KR | 10-2022-0033609 | A | 3/2022 |
| TW | 660535 | B | 5/2019 |
| WO | WO 2010/044130 | A1 | 4/2010 |
| WO | WO 2012/096382 | A1 | 7/2012 |
| WO | WO 2013/038627 | A1 | 3/2013 |
| WO | WO 2016/199784 | A | 12/2016 |

(56) References Cited

FOREIGN PATENT DOCUMENTS

| | | |
|---|---|---|
| WO | WO 2017/149636 A1 | 9/2017 |
| WO | WO 2019/074322 A1 | 4/2019 |

OTHER PUBLICATIONS

Extended European Search Report for EP Patent Application No. 21152336.0 dated on Jun. 11, 2021, 7 pages.
Kumar et al., "Physical and optical properties of phthalocyanine doped inorganic glasses", Journal of Materials Science, 35, 2000, pp. 2539-2542.
Schwab et al., "Efficiency enhancement of top-emitting organic light-emitting diodes using conversion dyes", Journal of Applied Physics, 110(083118), Oct. 2011, 7 pages.
Third Party Observation for European Patent Application or Patent No. 21152336.0 dated Nov. 3, 2021, 318 pages.
Korean Notice of Allowance dated Jul. 4, 2025, issued in corresponding Korean Patent Application No. 10-2020-0104804 (3 pages).

* cited by examiner

AMINE COMPOUND AND LIGHT-EMITTING DEVICE INCLUDING SAME

CROSS-REFERENCE TO RELATED APPLICATION

This application claims priority to and the benefit of Korean Patent Application No. 10-2020-0104804, filed on Aug. 20, 2020, in the Korean Intellectual Property Office, the entire content of which is hereby incorporated by reference.

BACKGROUND

1. Field

One or more embodiments of the present disclosure relate to an amine compound and a light-emitting device including the amine compound.

2. Description of Related Art

Light-emitting devices are devices that convert electrical energy into light energy. Examples of such light-emitting devices include organic light-emitting devices that use organic materials for an emission layer, quantum dot light-emitting devices that use quantum dots for an emission layer, and the like.

Light-emitting devices may include a first electrode on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transit (e.g., transition or relax) from an excited state to a ground state to thereby generate light.

SUMMARY

One or more embodiments of the present disclosure include a light-emitting device having a low driving voltage, improved efficiency, and long lifespan.

Additional aspects of embodiments will be set forth in part in the description which follows and, in part, will be apparent from the description, or may be learned by practice of the presented embodiments of the disclosure.

According to one or more embodiments, an amine compound may be represented by Formula 1:

Formula 1

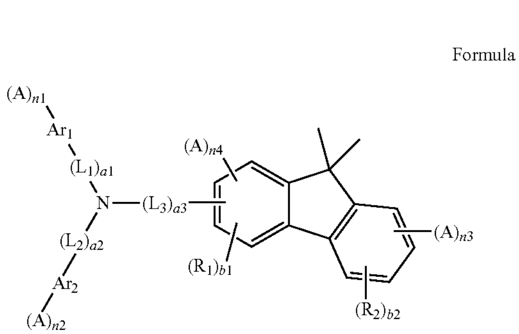

wherein, in Formula 1, each A may independently be a cyclohexyl group unsubstituted or substituted with at least one $R_{10a}$, n1 to n4 may each independently be an integer from 0 to 3, provided that n1+n2+n3+n4≥1, $L_1$ to $L_3$, $Ar_1$, and $Ar_2$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a1 to a3 may each independently be an integer from 0 to 5, $R_1$ and $R_2$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, b1 may be an integer from 0 to 3, b2 may be an integer from 0 to 4, and $R_{10a}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or $Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, wherein $Q_1$ to $Q_3$, $Q_{11}$ to $Q_{13}$, $Q_{21}$ to $Q_{23}$, and $Q_{31}$ to $Q_{33}$ may each independently be hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

According to one or more embodiments, a light-emitting device may include a first electrode; a second electrode facing the first electrode; an interlayer between the first electrode and the second electrode and including an emission layer and the amine compound represented by Formula 1.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
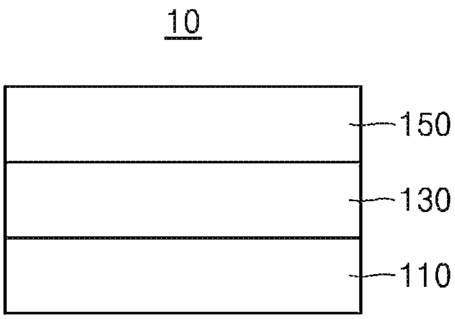
FIG. 1 is a schematic cross-sectional view of a light-emitting device according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of embodiments of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the subject matter of the present disclosure allows for various changes and numerous embodiments, certain embodiments will be illustrated in the drawings and described in more detail in the written description. By referring to example embodiments of the present disclosure with reference to the attached drawings, effects, features, and a method of achieving the subject matter of the present disclosure will be readily recognizable to those of ordinary skill in the art. The subject matter of the present disclosure may, however, be embodied in many different forms and should not be construed as being limited to the embodiments set forth herein.

In the embodiments described in the present specification, an expression used in the singular encompasses the expression of the plural, unless it has a clearly different meaning in the context.

In the present specification, it is to be understood that the terms such as "including," "having," and "comprising" are intended to indicate the existence of the features or components disclosed in the specification, and are not intended to preclude the possibility that one or more other features or components may exist or may be added.

It will be understood that when a layer, region, or component is referred to as being "on" or "onto" another layer, region, or component, it may be directly or indirectly formed over the other layer, region, or component. For example, intervening layers, regions, or components may be present.

Sizes of components in the drawings may be exaggerated for convenience of explanation. In other words, because sizes and thicknesses of components in the drawings may be arbitrarily illustrated for convenience of explanation, the following embodiments are not limited thereto.

The term "interlayer," as used herein, refers to a single layer and/or a plurality of all layers between a first electrode and a second electrode in a light-emitting device.

"$R_{10a}$," as used herein, may be:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si$(Q_{11})(Q_{12})(Q_{13})$, —N$(Q_{11})(Q_{12})$, —B$(Q_{11})(Q_{12})$, —C(=O)$(Q_{11})$, —S(=O)$_2(Q_{11})$, —P(=O)$(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si$(Q_{21})(Q_{22})(Q_{23})$, —N$(Q_{21})(Q_{22})$, —B$(Q_{21})(Q_{22})$, —C(=O)$(Q_{21})$, —S(=O)$_2(Q_{21})$, —P(=O)$(Q_{21})(Q_{22})$, or any combination thereof; or Si$(Q_{31})(Q_{32})(Q_{33})$, —N$(Q_{31})(Q_{32})$, —B$(Q_{31})(Q_{32})$, —C(=O)$(Q_{31})$, —S(=O)$_2(Q_{31})$, or —P(=O)$(Q_{31})(Q_{32})$, wherein $Q_{11}$ to $Q_{13}$, $Q_{21}$ to $Q_{23}$, and $Q_{31}$ to $Q_{33}$ may each independently be hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

According to embodiments of the present disclosure, an amine compound may be represented by Formula 1:

Formula 1

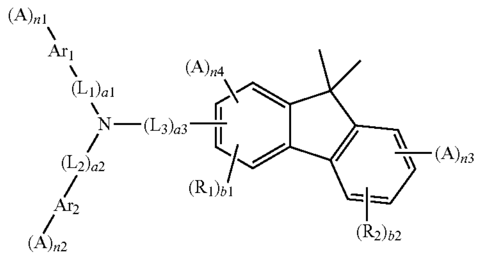

wherein, in Formula 1, each A may independently be a cyclohexyl group unsubstituted or substituted with at least one $R_{10a}$.

In Formula 1, n1 to n4 may each indicate the number of the respective A(s), and n1 to n4 may each independently be an integer from 0 to 3, provided that n1+n2+n3+n4≥1.

In some embodiments, n1+n2+n3+n4 may be 1, 2, or 3. In some embodiments, n4 may be 0, and n1+n2+n3 may be 1, 2, or 3.

In one or more embodiments, n1 may be 1, and n2 to n4 may each be 0, n2 may be 1, and n1, n3, and n4 may each be 0, n3 may be 1, and n1, n2, and n4 may each be 0, n1 and n2 may each be 1, and n3 and n4 may each be 0, n1 and n3 may each be 1, and n2 and n4 may each be 0, n2 and n3 may each be 1, and n1 and n4 may each be 0, or n1, n2, and n3 may each be 1, and n4 may be 0.

In Formula 1, $L_1$ to $L_3$, $Ar_1$, and $Ar_2$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

In some embodiments, $L_1$ to $L_3$ in Formula 1 may each independently be a benzene group, a pentalene group, an indene group, a naphthalene group, an azulene group, a heptalene group, an indacene group, an acenaphthalene group, a fluorene group, a spiro-bifluorene group, a spiro-benzofluorene-fluorene group, a benzofluorene group, a dibenzofluorene group, a phenalene group, a phenanthrene group, an anthracene group, a fluoranthene group, a pyrene group, a chrysene group, a naphthacene group, a picene group, a perylene group, a pyrrole group, a thiophene group, a furan group, a silole group, an imidazole group, a pyrazole group, a thiazole group, an isothiazole group, an oxazole group, an isoxazole group, a pyridine group, a pyrazine group, a pyrimidine group, a pyridazine group, a triazine group, a benzofuran group, a benzothiophene group, a dibenzofuran group, a dibenzothiophene group, a carbazole group, a benzosilole group, a dibenzosilole group, a quinoline group, an isoquinoline group, a benzimidazole group, an imidazopyridine group, or an imidazopyrimidine group, each unsubstituted or substituted with deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-benzofluorene-fluorenyl group, a benzofluorenyl group, a dibenzofluorenyl group, a phenalenyl group, a phenanthrenyl group, an anthracenyl group, a fluoranthenyl group, a pyrenyl group, a chrysenyl group, a naphthacenyl group, a picenyl group, a perylenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a triazinyl group, a benzofuranyl group, a benzothiophenyl group, a dibenzofuranyl group, a dibenzothiophenyl group, a carbazolyl group, a benzosilolyl group, a dibenzosilolyl group, a quinolinyl group, an isoquinolinyl group, a benzimidazolyl group, an imidazopyridinyl group, an imidazopyrimidinyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, —$P(=O)(Q_{31})(Q_{32})$, or any combination thereof, wherein $Q_{31}$ to $Q_{33}$ may each independently be a $C_1$-$C_{10}$ alkyl group, a $C_1$-$C_{10}$ alkoxy group, a phenyl group, a phenyl group substituted with a cyano group, a biphenyl group, a terphenyl group, or a naphthyl group.

In some embodiments, $L_1$ to $L_3$ may each independently be a group represented by one of Formulae 3-1 to 3-25:

3-1

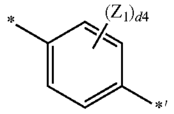

3-2

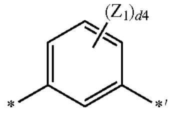

3-3

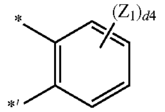

3-4

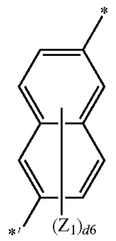

3-5

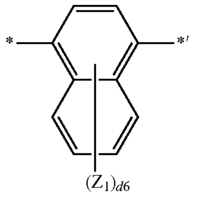

3-6

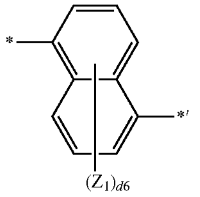

3-7

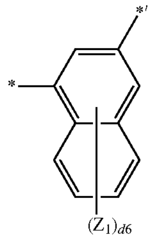

3-8

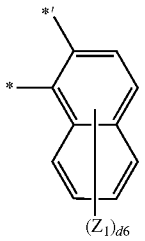

-continued
3-9
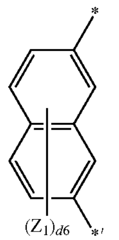
3-10
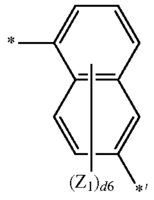
3-11
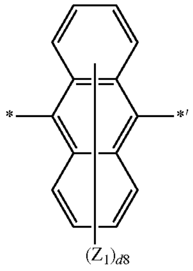
3-12
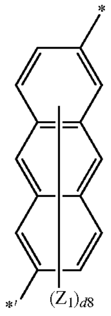
3-13
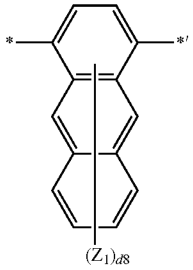
3-14
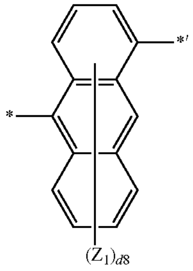
-continued
3-15
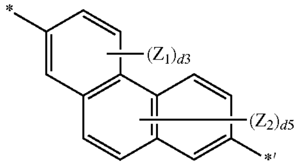
3-16
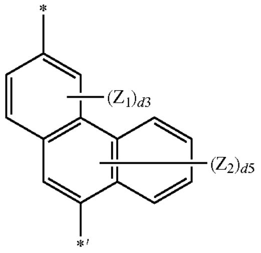
3-17
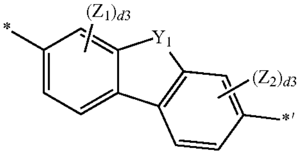
3-18
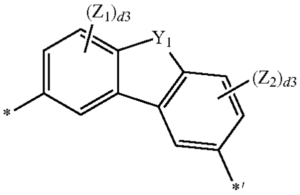
3-19
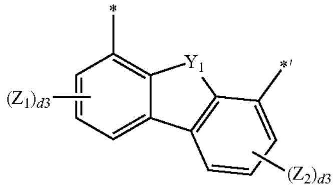
3-20
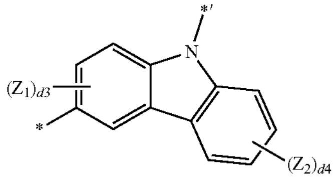
3-21
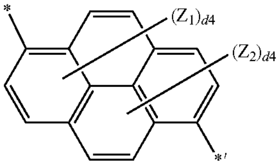
3-22
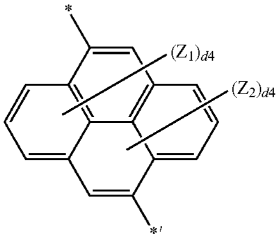

-continued 3-23

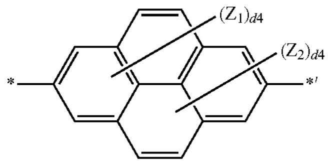

3-24

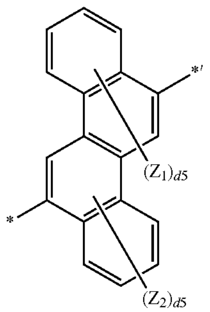

3-25

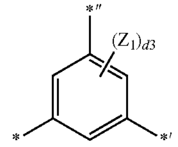

wherein, in Formulae 3-1 to 3-25, $Y_1$ may be O, S, $C(Z_3)(Z_4)$, $N(Z_5)$, or $Si(Z_6)(Z_7)$, $Z_1$ to $Z_7$ may each independently be hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a carbazolyl group, a dibenzofuranyl group, a dibenzothiophenyl group, a triazinyl group, a benzimidazolyl group, $—Si(Q_{31})(Q_{32})(Q_{33})$, $—N(Q_{31})(Q_{32})$, or $—B(Q_{31})(Q_{32})$, wherein $Q_{31}$ to $Q_{33}$ may each independently be a $C_1$-$C_{10}$ alkyl group, a $C_1$-$C_{10}$ alkoxy group, a phenyl group, a phenyl group substituted with a cyano group, a biphenyl group, a terphenyl group, or a naphthyl group, d3 may be an integer from 0 to 3, d4 may be an integer from 0 to 4, d5 may be an integer from 0 to 5, d6 may be an integer from 0 to 6, d8 may be an integer from 0 to 8, and

*, *', and *" each indicate a binding site to an adjacent atom.

In Formula 1, a1 to a3 may each independently be an integer from 0 to 5. When a1 is 0, $(L_1)_{a1}$ may be a single bond, when a2 is 0, $(L_2)_{a2}$ may be a single bond, and when a3 is 0, $(L_3)_{a3}$ may be a single bond.

In some embodiments, a1 to a3 may each independently be 0 or 1.

In some embodiments, $Ar_1$ and $Ar_2$ may each independently be a cyclopentyl group, a cyclohexyl group, a cycloheptyl group, a cyclopentenyl group, a cyclohexenyl group, a phenyl group, a biphenyl group, a terphenyl group, a naphthyl group, a fluorenyl group, a spiro-bifluorenyl group, a spiro-cyclopentane-fluorenyl group, a spiro-cyclohexane-fluorenyl group, a spiro-fluorene-benzofluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a triazinyl group, an indolyl group, an isoindolyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a dibenzofuranyl group, a dibenzothiophenyl group, a dibenzosilolyl group, a carbazolyl group, a benzocarbazolyl group, a dibenzocarbazolyl group, an azafluorenyl group, an azaspiro-bifluorenyl group, an azacarbazolyl group, a diazacarbazolyl group, an azadibenzofuranyl group, an azadibenzothiophenyl group, an azadibenzosilolyl group, an imidazopyridinyl group, or an imidazopyrimidinyl group, each unsubstituted or substituted with deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkyl group substituted with at least one phenyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a naphthyl group, a fluorenyl group, a spiro-bifluorenyl group, a spiro-cyclopentane-fluorenyl group, a spiro-cyclohexane-fluorenyl group, a spiro-fluorene-benzofluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a triazinyl group, an indolyl group, an isoindolyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a dibenzofuranyl group, a dibenzothiophenyl group, a dibenzosilolyl group, a carbazolyl group, a benzocarbazolyl group, a dibenzocarbazolyl group, an azafluorenyl group, an azaspiro-bifluorenyl group, an azacarbazolyl group, a diazacarbazolyl group, an azadibenzofuranyl group, an azadibenzothiophenyl group, an azadibenzosilolyl group, an imidazopyridinyl group, an imidazopyrimidinyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, $—P(=O)(Q_{31})(Q_{32})$, or any combination thereof, wherein $Q_{31}$ to $Q_{33}$ may each independently be a $C_1$-$C_{10}$ alkyl group, a $C_1$-$C_{10}$ alkoxy group, a phenyl group, a phenyl group substituted with a cyano group, a biphenyl group, a terphenyl group, or a naphthyl group.

In some embodiments, $Ar_1$ and $Ar_2$ may each independently be a group represented by one of Formulae 5-1 to 5-21:
5-1
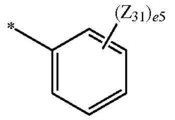
5-2
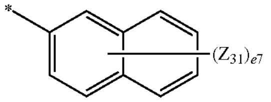
5-3
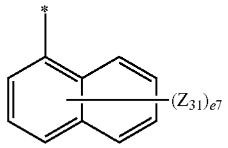
5-4
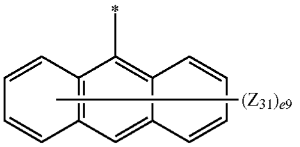
5-5
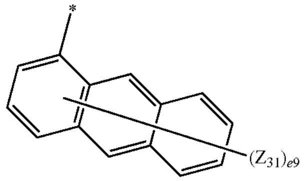
5-6
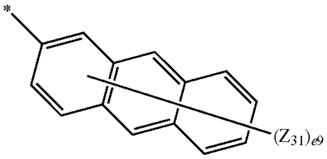
5-7
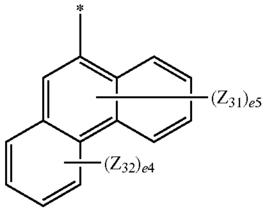
5-8
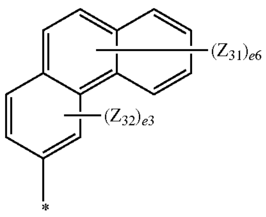
-continued
5-9
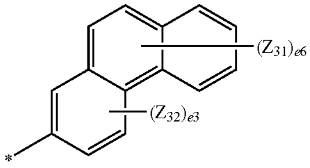
5-10
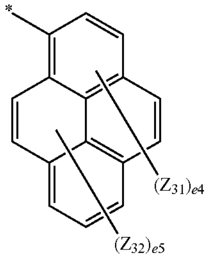
5-11
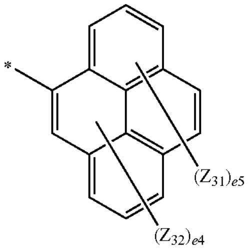
5-12
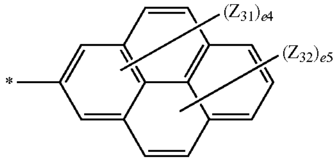
5-13
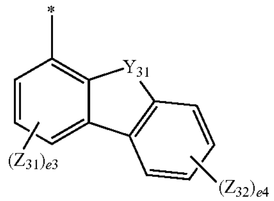
5-14
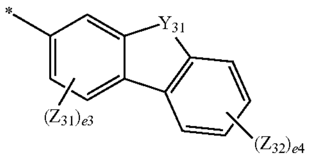
5-15
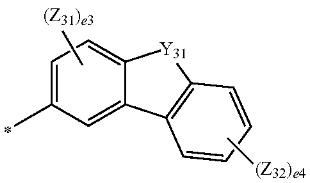

-continued 5-16

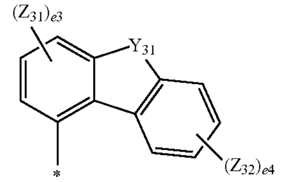

5-17

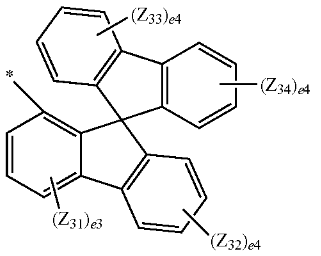

5-18

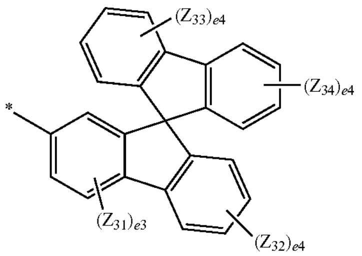

5-19

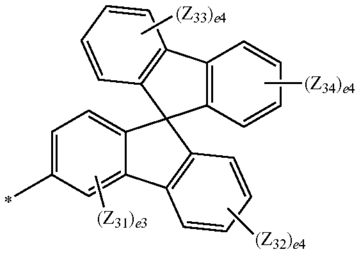

5-20

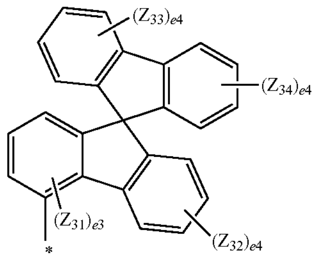

5-21

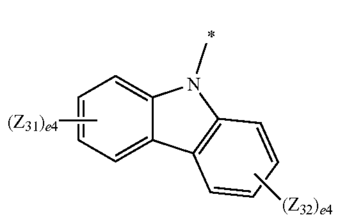

wherein, in Formula 5-1 to 5-21, $Y_{31}$ may be O, S, $N(Z_{35})$, $C(Z_{33})(Z_{34})$, or $Si(Z_{36})(Z_{37})$, $Z_{31}$ to $Z_{37}$ may each independently be a binding site to A, hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkyl group substituted with at least one phenyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a naphthyl group, a fluorenyl group, a spiro-bifluorenyl group, a spiro-fluorene-benzofluorenyl group, a benzofluorenyl group, a dibenzofluorenyl group, a phenalenyl group, a phenanthrenyl group, an anthracenyl group, a fluoranthenyl group, a triphenylenyl group, a pyridinyl group, a pyrimidinyl group, a pyrazinyl group, a triazinyl group, a quinolinyl group, an isoquinolinyl group, a benzoquinolinyl group, a naphthyridinyl group, a quinoxalinyl group, a quinazolinyl group, a carbazolyl group, a phenanthridinyl group, an acridinyl group, a phenanthrolinyl group, a phenazinyl group, a dibenzofuranyl group, a dibenzothiophenyl group, a dibenzosilolyl group, $—Si(Q_{31})(Q_{32})(Q_{33})$, $—N(Q_{31})(Q_{32})$, or $—B(Q_{31})(Q_{32})$, e2 may be 1 or 2, e3 may be an integer from 1 to 3, e4 may be an integer from 1 to 4, e5 may be an integer from 1 to 5, e6 may be an integer from 1 to 6, e7 may be an integer from 1 to 7, and e9 may be an integer from 1 to 9, wherein $Q_1$ to $Q_3$ and $Q_{31}$ to $Q_{33}$ may each independently be a $C_1$-$C_{10}$ alkyl group, a $C_1$-$C_{10}$ alkoxy group, a phenyl group, a phenyl group substituted with a cyano group, a biphenyl group, a terphenyl group, or a naphthyl group, and

* indicates a binding site to an adjacent atom.

In one or more embodiments, in Formula 1, at least one of $Ar_1$ and $Ar_2$ may be a π electron-rich $C_3$-$C_{60}$ cyclic group unsubstituted or substituted with at least one $R_{10a}$.

The term "π electron-rich $C_3$-$C_{60}$ cyclic group," as used herein, refers to a cyclic group having 3 to 60 carbon atoms and not including *—N=*' as a ring-forming moiety. For example, the π electron-rich $C_3$-$C_{60}$ cyclic group may be a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, an indenoanthracene group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, or a benzothienodibenzothiophene group.

In some embodiments, at least one of $Ar_1$ and $Ar_2$ may be a phenyl group, a biphenyl group, a naphthyl group, a fluorenyl group, a spiro-bifluorenyl group, a spiro-cyclopentane-fluorenyl group, a carbazolyl group, a dibenzosilolyl group, a dibenzothiophenyl group, or a dibenzofuranyl group, each unsubstituted or substituted with at least one $R_{10a}$.

In some embodiments, in Formula 1, *—$Ar_1$-$(A)_{n1}$ may be represented by one of Formulae 2-1A to 2-1D, and *—$Ar_2$-$(A)_{n2}$ may be represented by one of Formulae 2-2A to 2-2D:

2-1A

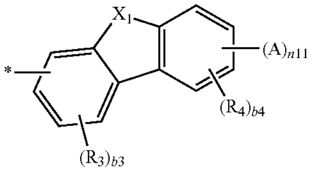

2-1B

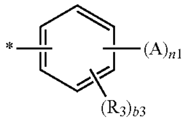

2-1C

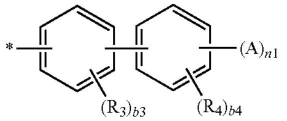

2-1D

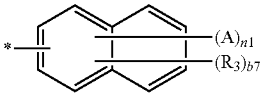

2-2A

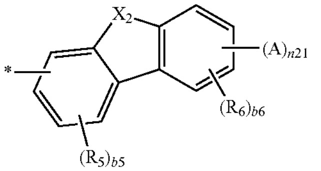

2-2B

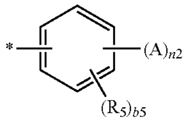

2-2C

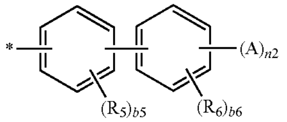

2-2D

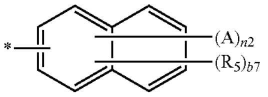

wherein in Formulae 2-1A to 2-1 D and 2-2A to 2-2D, $X_1$ may be O, S, C[$R_{11}$-$(A)_{n12}$][$R_{12}$-$(A)_{n13}$], or Si[$R_{11}$-$(A)_{n12}$][$R_{12}$-$(A)_{n13}$], $X_2$ may be O, S, C[$R_{21}$-$(A)_{n22}$][$R_{22}$-$(A)_{n23}$], or Si[$R_{21}$-$(A)_{n22}$][$R_{22}$-$(A)_{n23}$], $R_3$ to $R_6$ may each be understood by referring to the description of $R_{10a}$ provided herein, b3 and b5 may each independently be an integer from 0 to 3, b4 and b6 may each independently be an integer from 0 to 4, b7 may be an integer from 0 to 7, $R_{11}$, $R_{12}$, $R_{21}$, and $R_{22}$ may each independently be a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, or a $C_6$-$C_{60}$ arylthio group unsubstituted or substituted with at least one $R_{10a}$, n11 to n13 and n21 to n23 may each independently be 0, 1, 2, or 3, in Formula 2-1A, when $X_1$ is O or S, n11=n1, and when $X_1$ is C[$R_{11}$-$(A)_{n12}$][$R_{12}$-$(A)_{n13}$] or Si[$R_{11}$-$(A)_{n12}$][$R_{12}$-$(A)_{n13}$], n11+n12+n13=n1, in Formula 2-2A, when $X_2$ is O or S, n21=n2, and when $X_2$ is C[$R_{21}$-$(A)_{n22}$][$R_{22}$-$(A)_{n23}$] or Si[$R_{21}$-$(A)_{n22}$][$R_{22}$-$(A)_{n23}$], n21+n22+n23=n2, and

* indicates a binding site to an adjacent atom.

In one or more embodiments, *—$Ar_1$-$(A)_{n1}$ and *—$Ar_2$-$(A)_{n2}$ in Formula 1 may each independently be represented by one of Formulae 6-1 to 6-52:

6-1

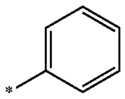

6-2

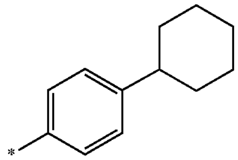

6-3

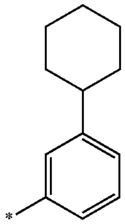

6-4

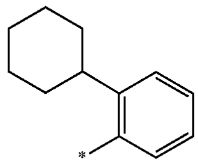

6-5

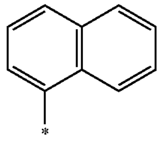

6-6

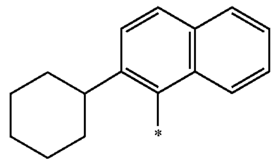

-continued
6-7
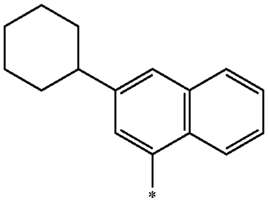
6-8
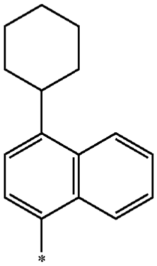
6-9
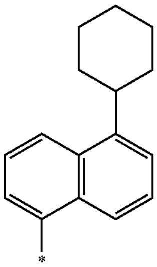
6-10
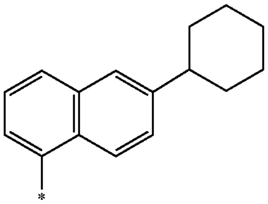
6-11
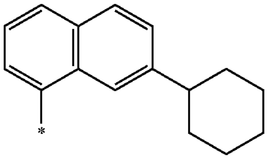
6-12
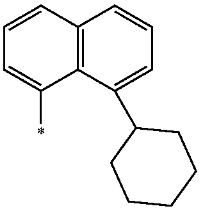
6-13
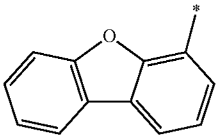
-continued
6-14
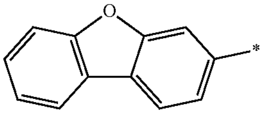
6-15
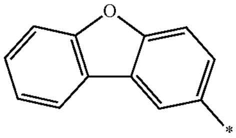
6-16
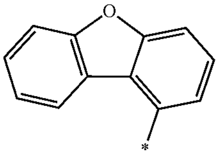
6-17
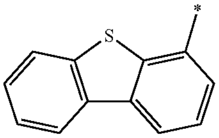
6-18
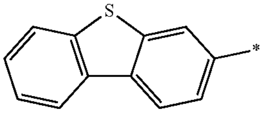
6-19
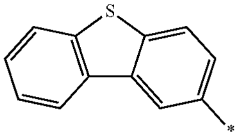
6-20
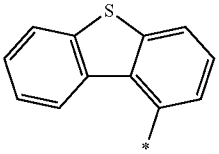
6-21
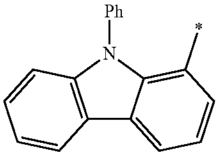
6-22
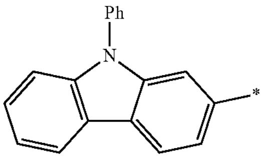
6-23
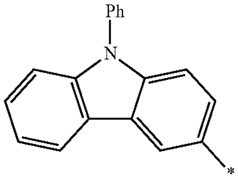

-continued
6-24
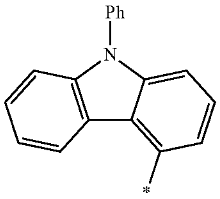
6-25
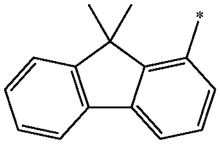
6-26
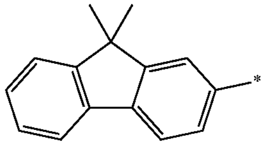
6-27
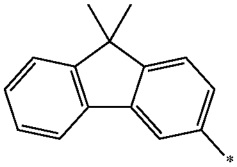
6-28
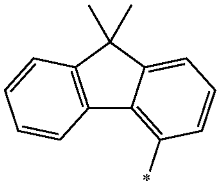
6-29
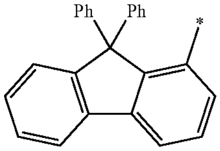
6-30
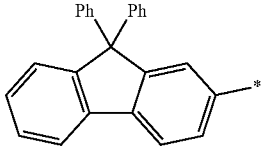
6-31
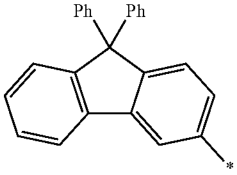
6-32
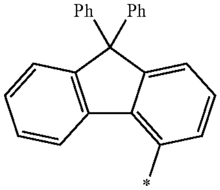
-continued
6-33
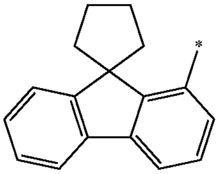
6-34
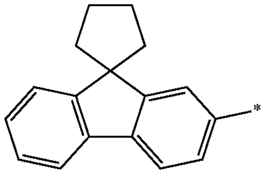
6-35
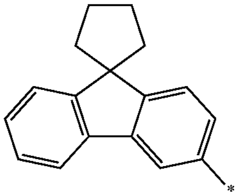
6-36
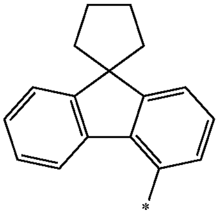
6-37
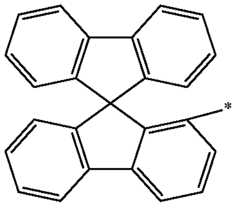
6-38
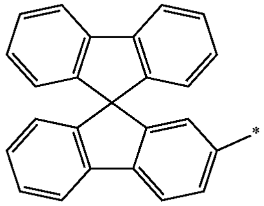
6-39
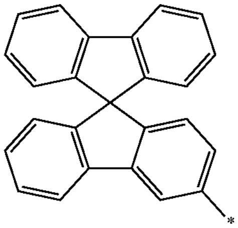

-continued 6-40

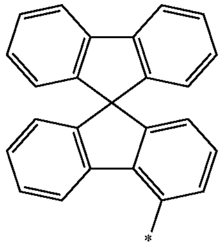

6-41

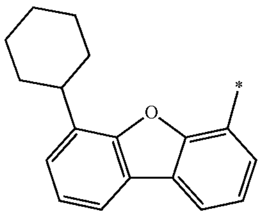

6-42

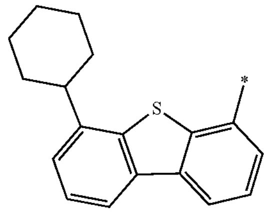

6-43

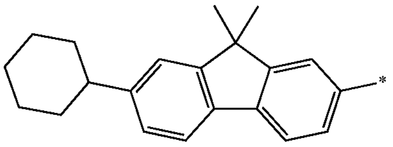

6-44

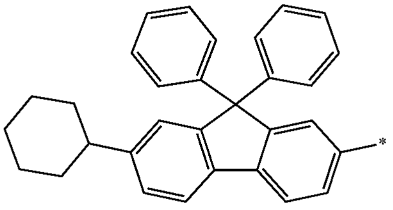

6-45

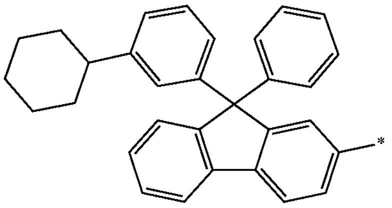

6-46

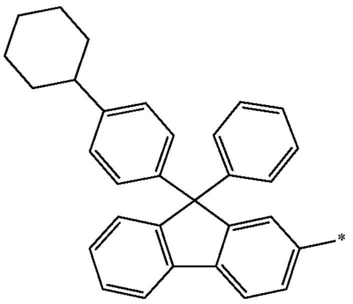

-continued 6-47

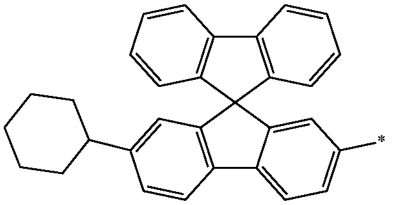

6-48

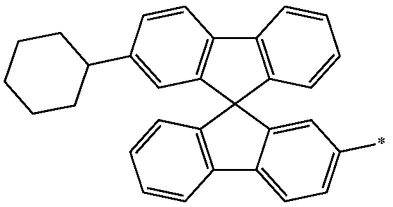

6-49

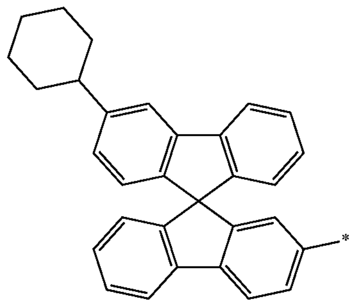

6-50

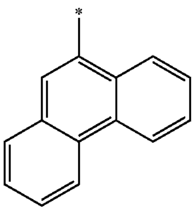

6-51

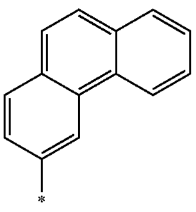

6-52

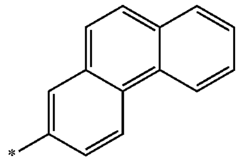

wherein, in Formulae 6-1 to 6-52,

"Ph" represents a phenyl group, and

* indicates a binding site to an adjacent atom.

In Formula 1, $R_1$ and $R_2$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, wherein $Q_1$ to $Q_3$ may each independently be hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In some embodiments, $R_1$ and $R_2$ may each independently be hydrogen, deuterium, —F, —Cl, —Br, —I, a hydroxyl group, a cyano group, or a nitro group;

a $C_1$-$C_{20}$ alkyl group or a $C_1$-$C_{20}$ alkoxy group, each unsubstituted or substituted with deuterium, —F, —Cl, —Br, —I, a cyano group, a phenyl group, a biphenyl group, or any combination thereof;

a cyclopentyl group, a cyclohexyl group, a cycloheptyl group, a cyclopentenyl group, a cyclohexenyl group, a phenyl group, a biphenyl group, a terphenyl group, a naphthyl group, a fluorenyl group, a spiro-bifluorenyl group, a spiro-cyclopentane-fluorenyl group, a spiro-cyclohexane-fluorenyl group, a spiro-fluorene-benzofluorenyl group, a benzofluorenyl group, a dibenzofluorenyl group, a pyrenyl group, a phenalenyl group, a phenanthrenyl group, an anthracenyl group, a fluoranthenyl group, a triphenylenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, a diazacarbazolyl group, an azadibenzofuranyl group, an azadibenzothiophenyl group, or an azadibenzosilolyl group, each unsubstituted or substituted with deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a naphthyl group, a fluorenyl group, a spiro-bifluorenyl group, a spiro-cyclopentane-fluorenyl group, a spiro-cyclohexane-fluorenyl group, a spiro-fluorene-benzofluorenyl group, a benzofluorenyl group, a dibenzofluorenyl group, a pyrenyl group, a phenalenyl group, a phenanthrenyl group, an anthracenyl group, a fluoranthenyl group, a triphenylenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, a diazacarbazolyl group, an azadibenzofuranyl group, an azadibenzothiophenyl group, an azadibenzosilolyl group, or any combination thereof, or —$Si(Q_1)(Q_2)(Q_3)$, —$N(Q_1)(Q_2)$, or —$B(Q_1)(Q_2)$, wherein $Q_1$ to $Q_3$ may each independently be a $C_1$-$C_{10}$ alkyl group, a $C_1$-$C_{10}$ alkoxy group, a phenyl group, a biphenyl group, a terphenyl group, or a naphthyl group.

In Formula 1, b1 and b2 may respectively indicate the number of $R_1$(s) and $R_2$(s), and b1 may be an integer from 0 to 3, and b2 may be an integer from 0 to 4.

In some embodiments, the amine compound may be represented by one of Formulae 1-1 to 1-4:

1-1

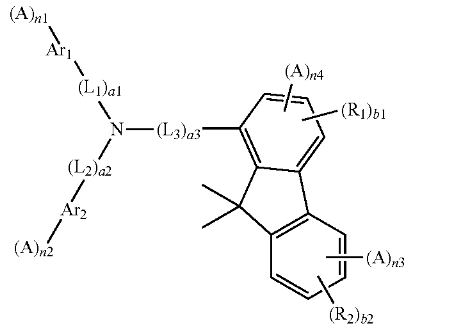

1-2

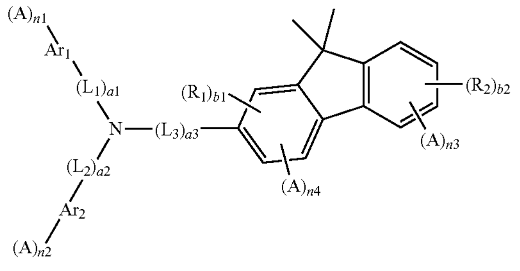

-continued 1-3

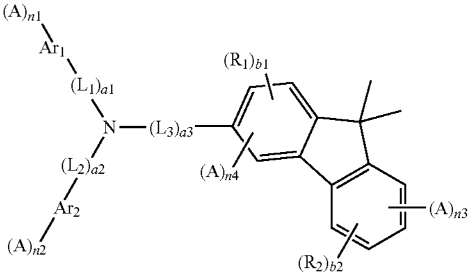

1-4

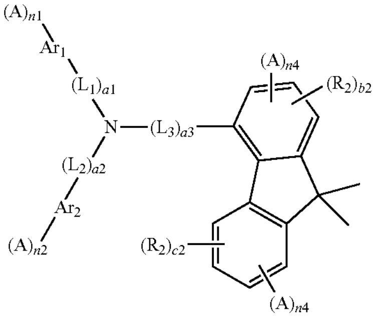

wherein, in Formulae 1-1 to 1-4,

A, n1 to n4, $L_1$ to $L_3$, a1 to a3, $Ar_1$, $Ar_2$, $R_1$, $R_2$, b1, and b2 may respectively be understood by referring to the descriptions of A, n1 to n4, $L_1$ to $L_3$, a1 to a3, $Ar_1$, $Ar_2$, $R_1$, $R_2$, b1, and b2 provided herein.

In some embodiments, the amine compound represented by Formula 1-2 may be represented by Formula 1-2A or Formula 1-2B:

1-2A

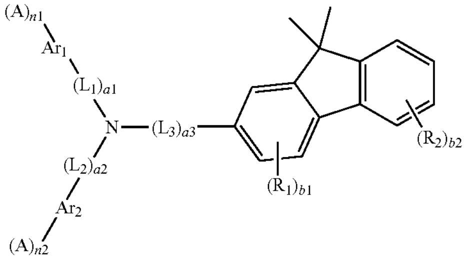

1-2B

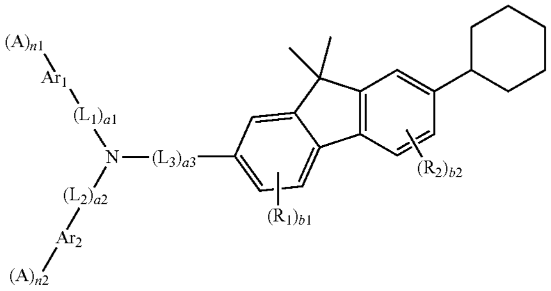

In Formula 1-2A, $n1+n2\geq1$, in Formula 1-2B, $n1+n2\geq0$, and in Formulae 1-2A and 1-2B, $L_1$ to $L_3$, a1 to a3, $Ar_1$, $Ar_2$, $R_1$, $R_2$, b1, and b2 may respectively be understood by referring to the descriptions of $L_1$ to $L_3$, a1 to a3, $Ar_1$, $Ar_2$, $R_1$, $R_2$, b1, and b2.

In some embodiments, in Formula 1-2B, $n1+n2\geq1$.

In some embodiments, the amine compound may be selected from Compounds 1 to 168, but embodiments are not limited thereto:

1

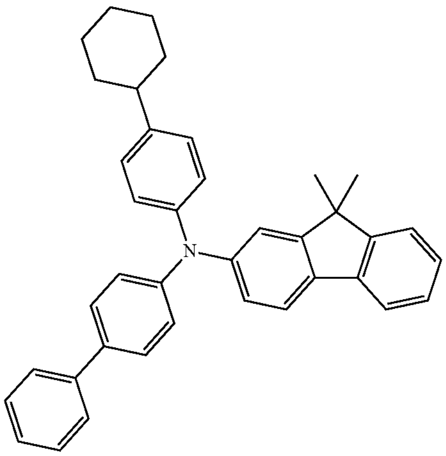

2

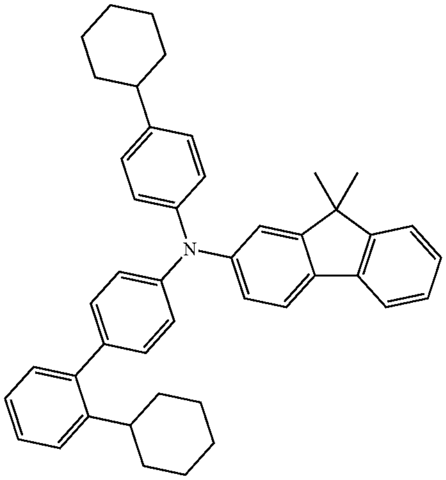

3

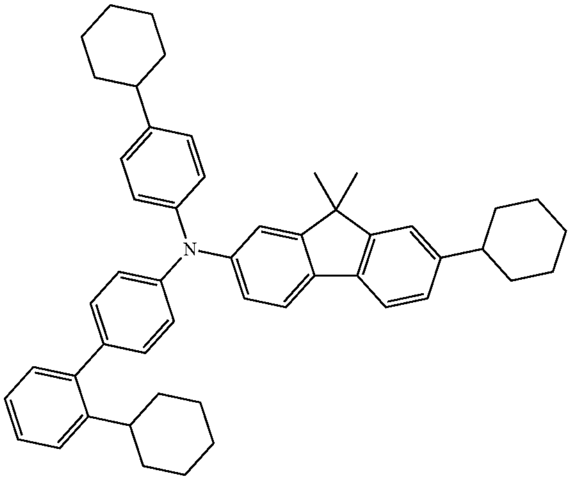

-continued
4
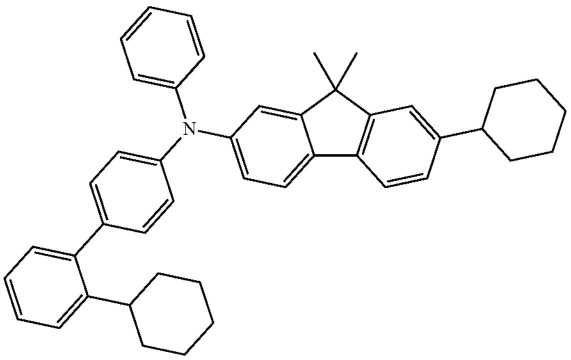
5
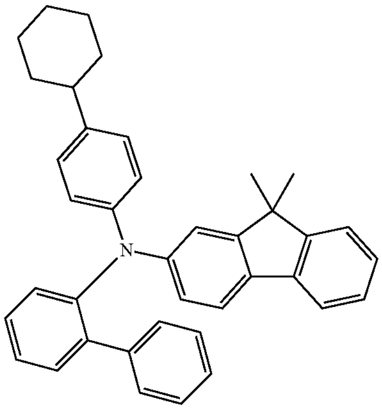
6
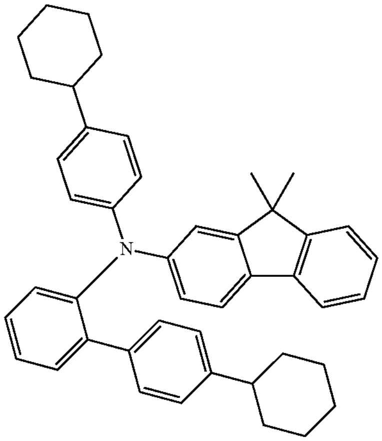
-continued
7
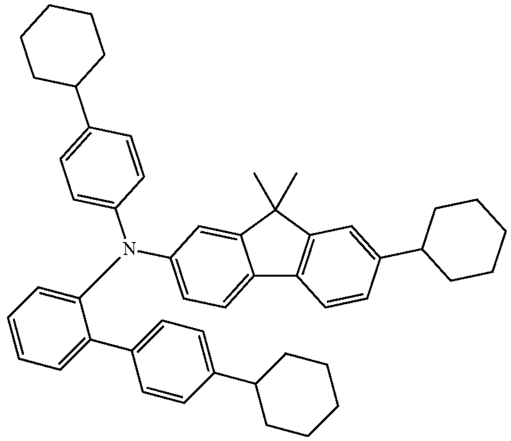
8
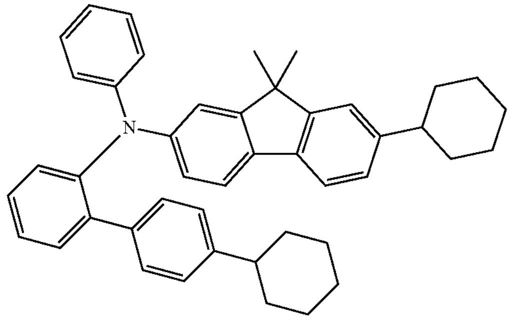
9
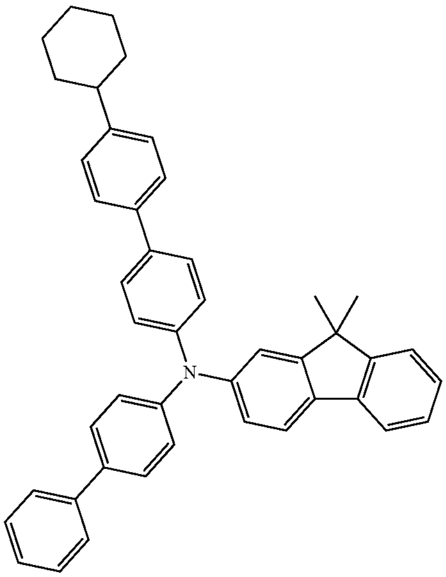

10
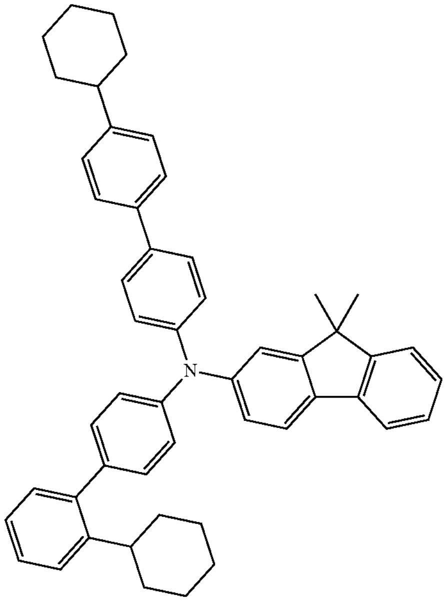
11
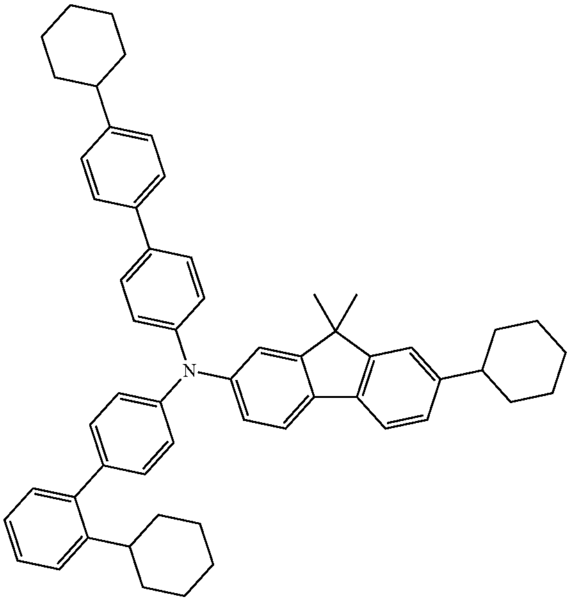
12
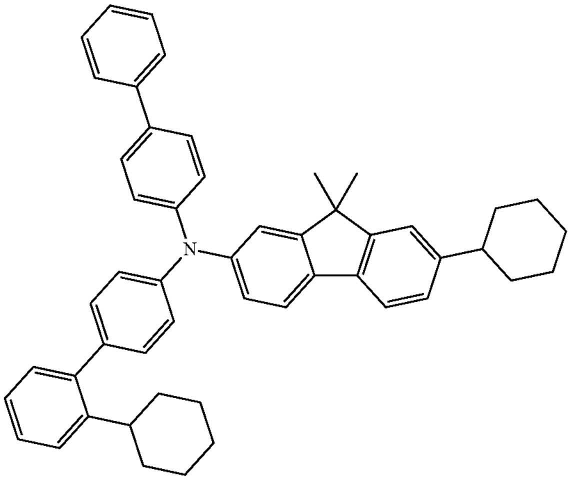
13
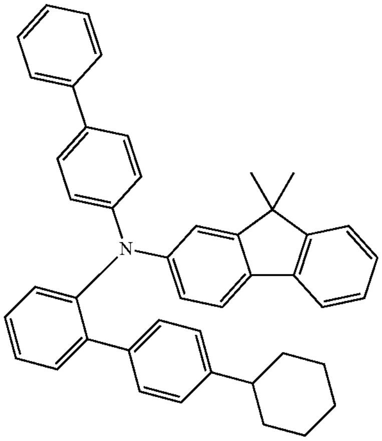
14
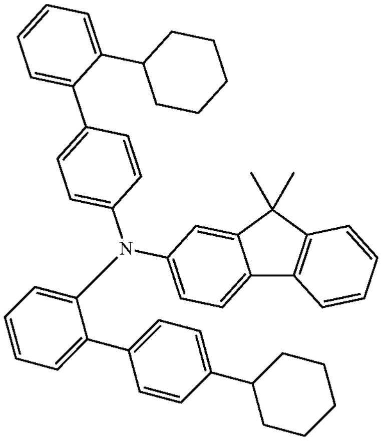

-continued
15
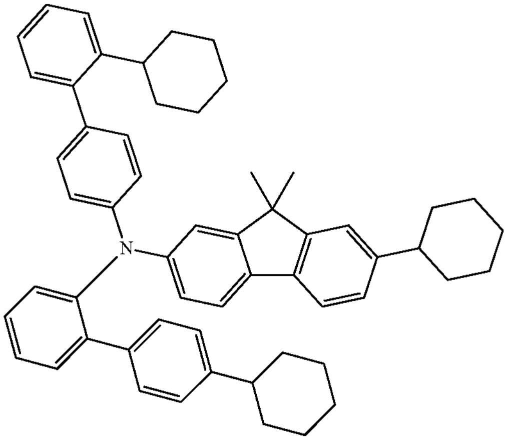
16
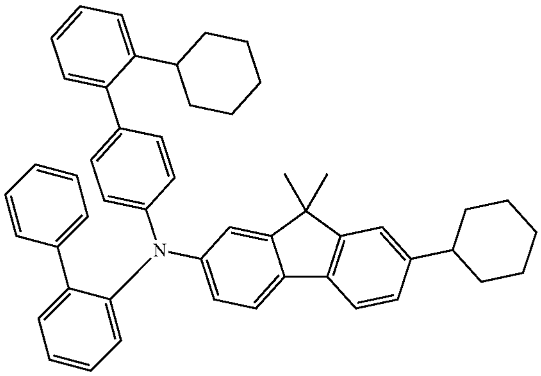
17
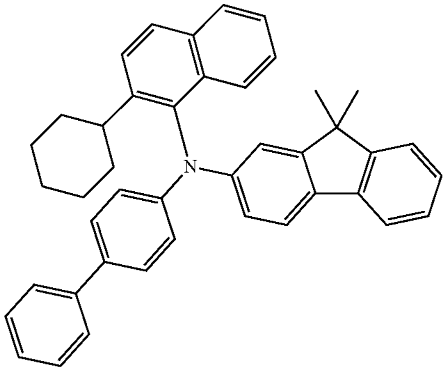
18
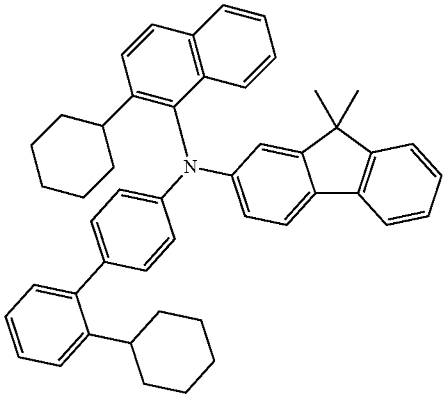
-continued
19
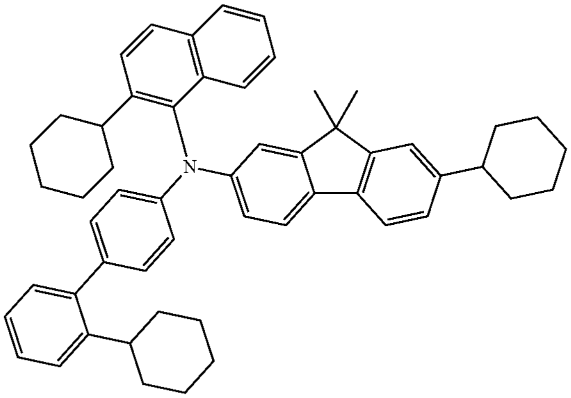
20
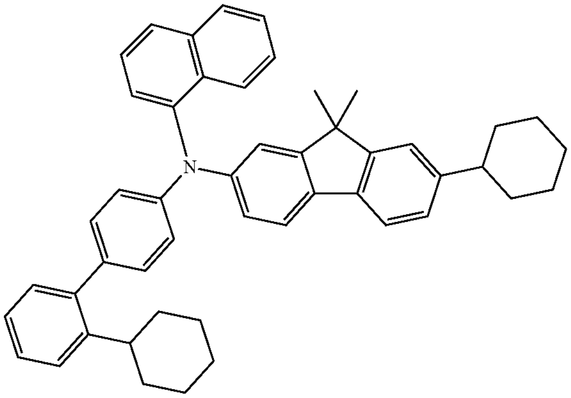
21
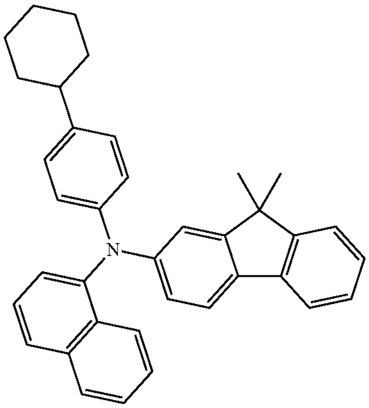
22
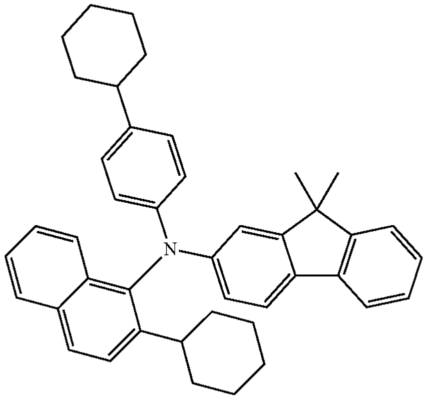

-continued
23
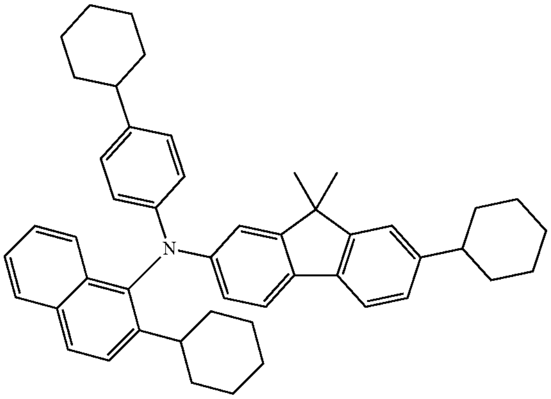
24
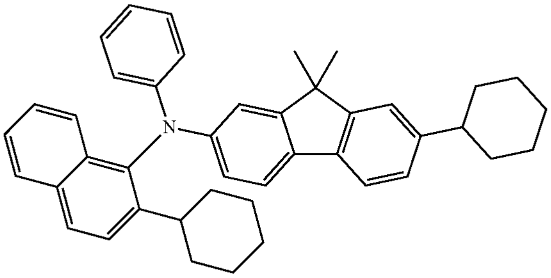
25
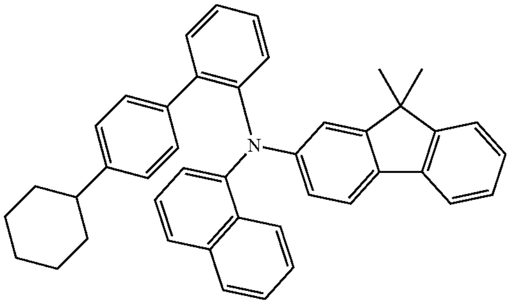
26
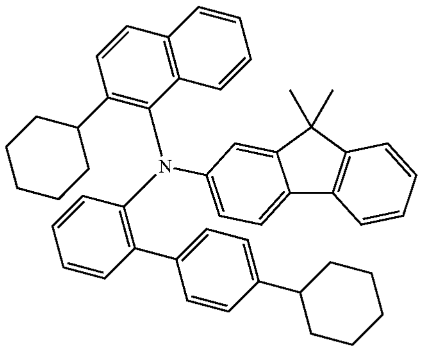
-continued
27
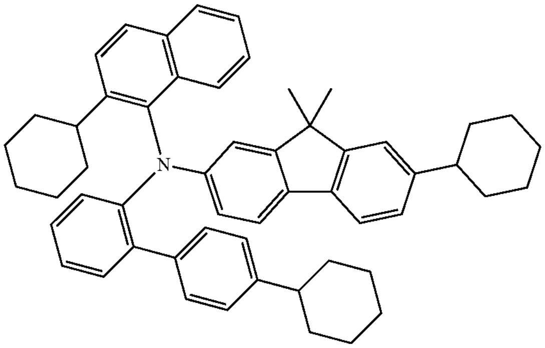
28
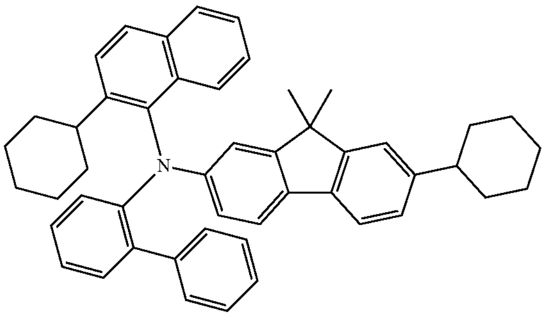
29
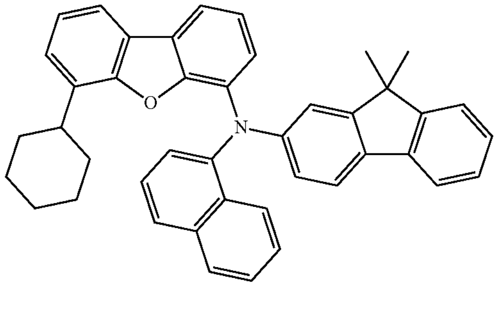
30
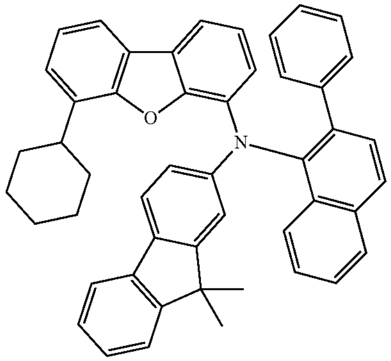

-continued
31
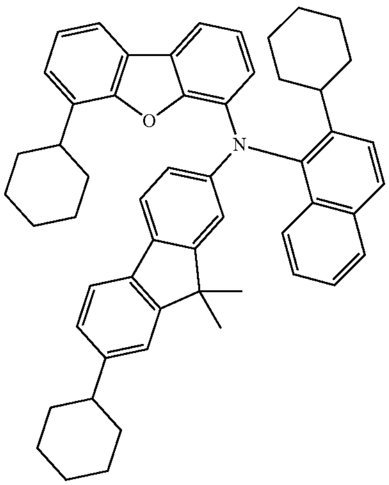
32
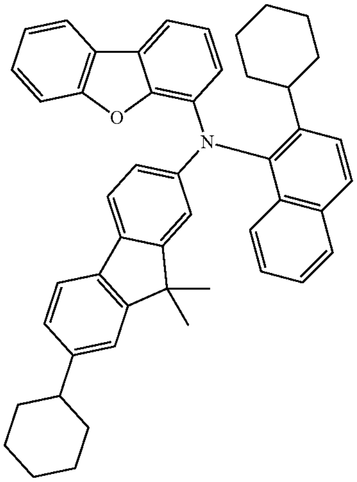
33
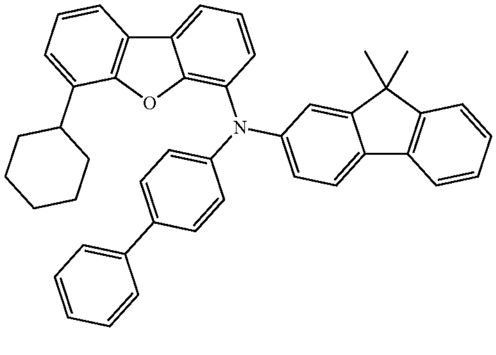
-continued
34
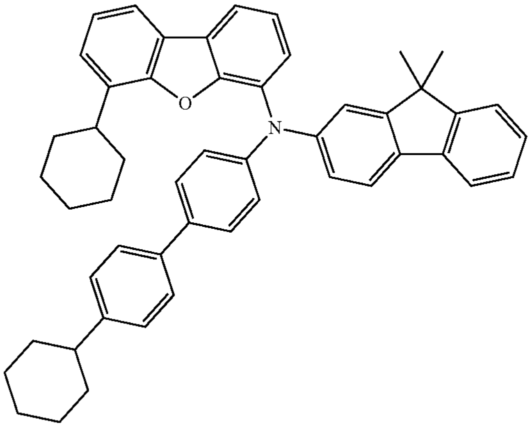
35
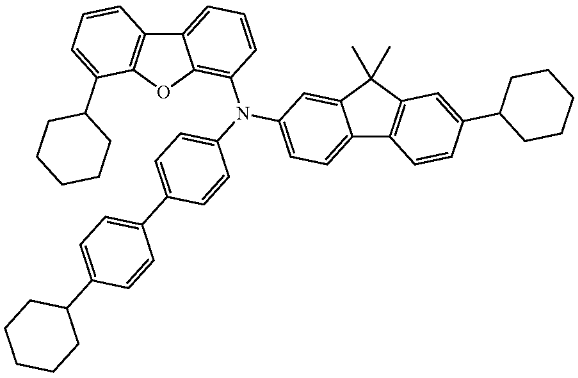
36
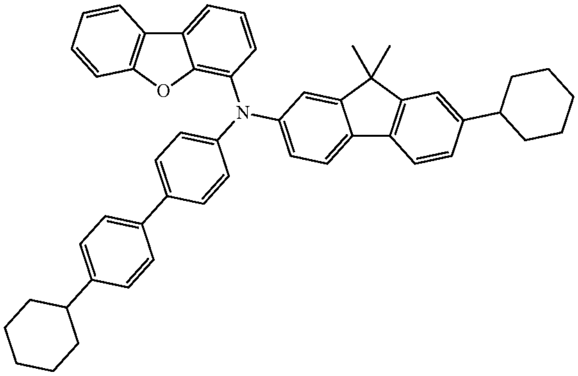
37
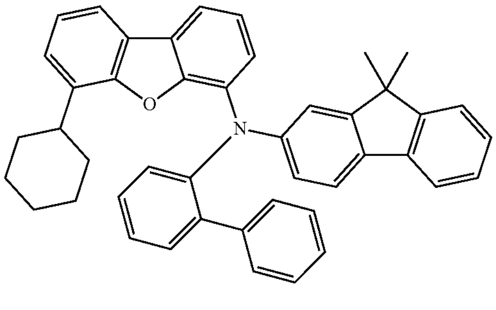

-continued
38
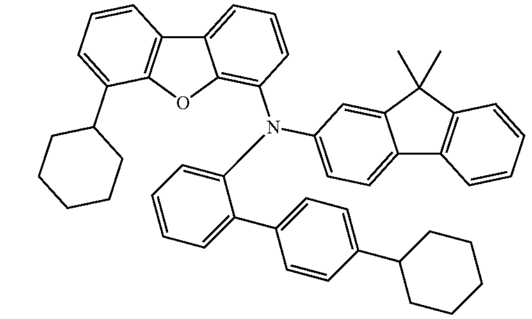
39
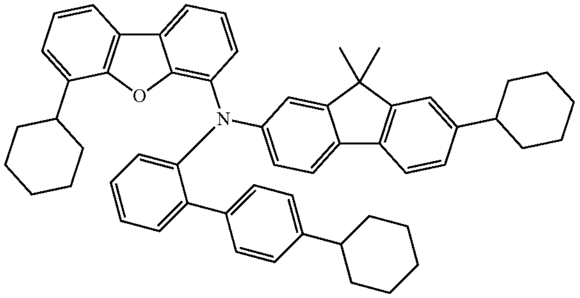
40
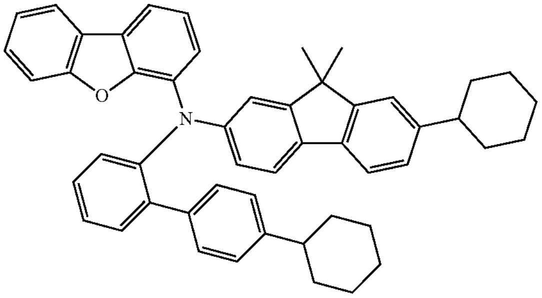
41
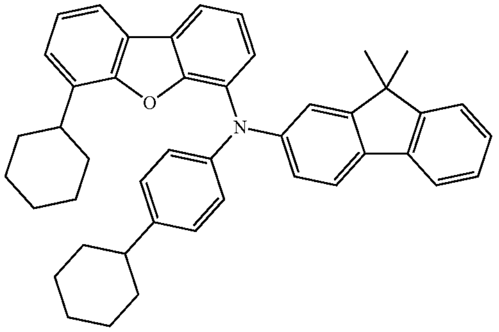
42
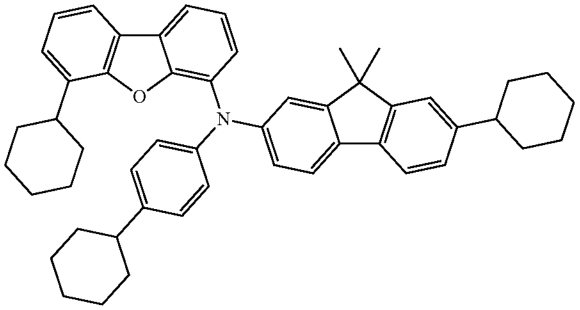
-continued
43
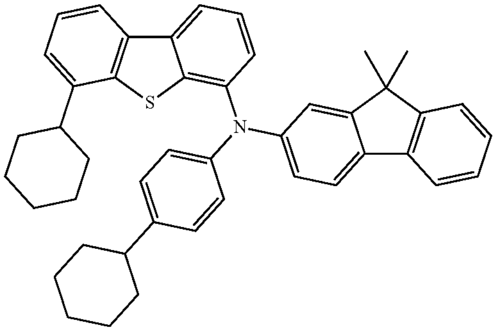
44
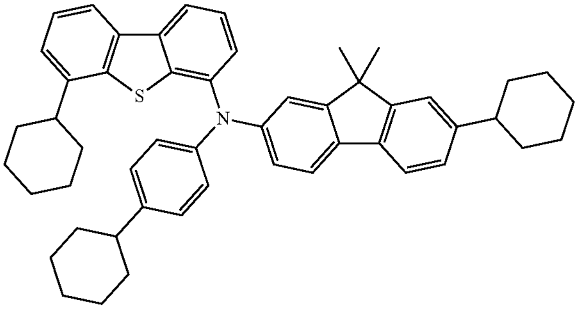
45
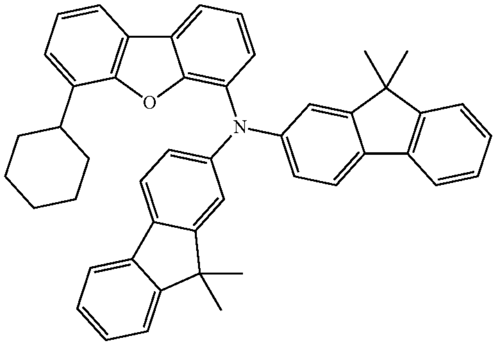
46
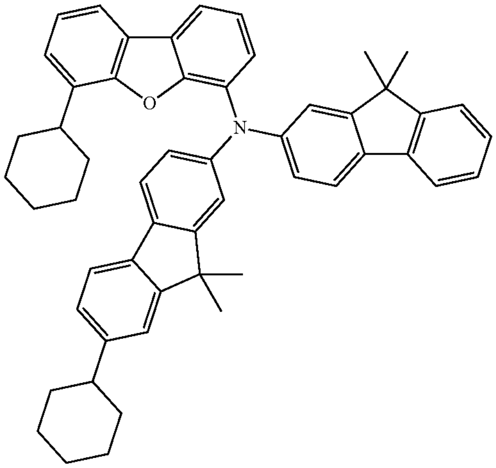

-continued
47
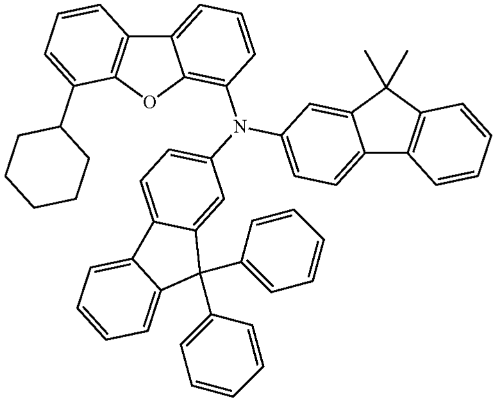
48
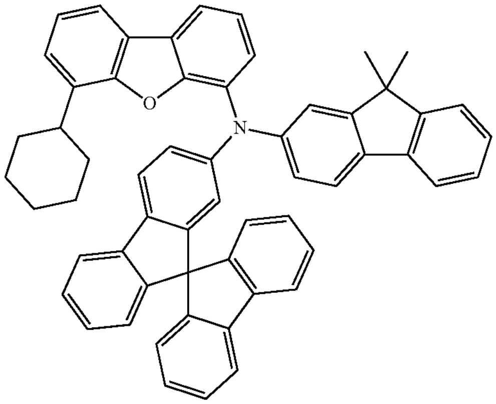
49
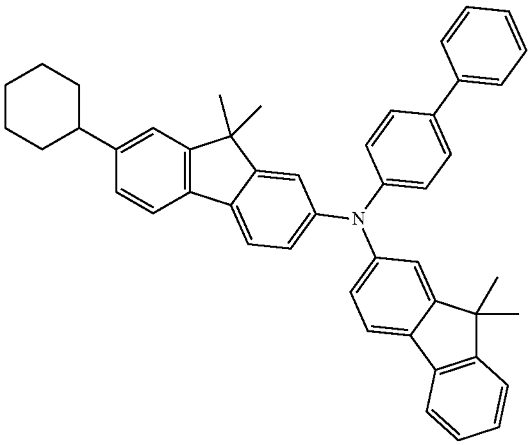
-continued
50
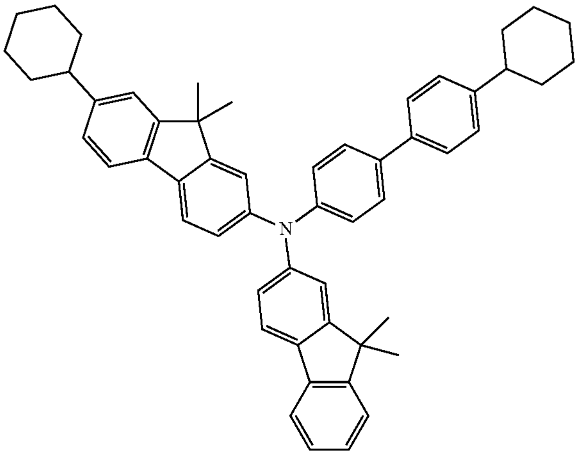
51
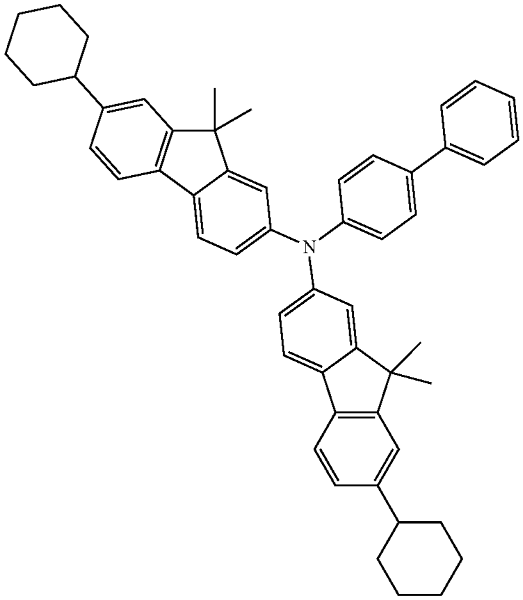
52
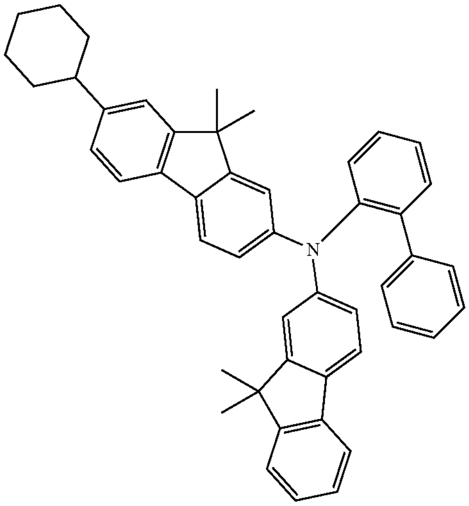

-continued
53
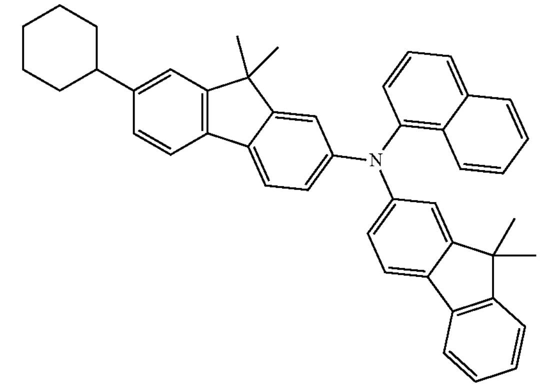
54
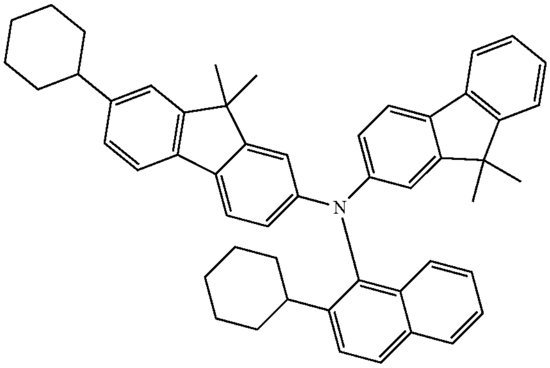
55
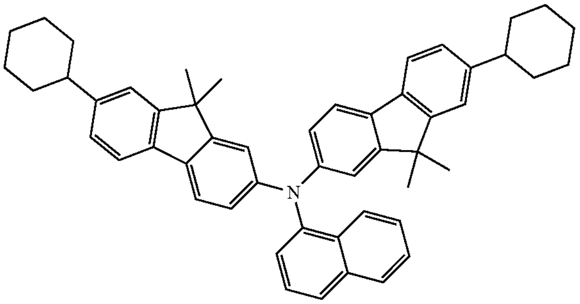
56
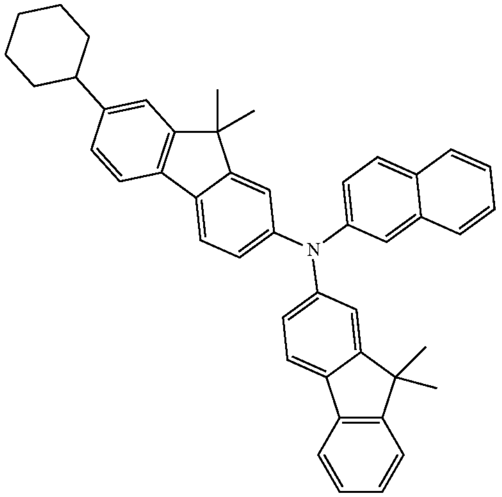
-continued
57
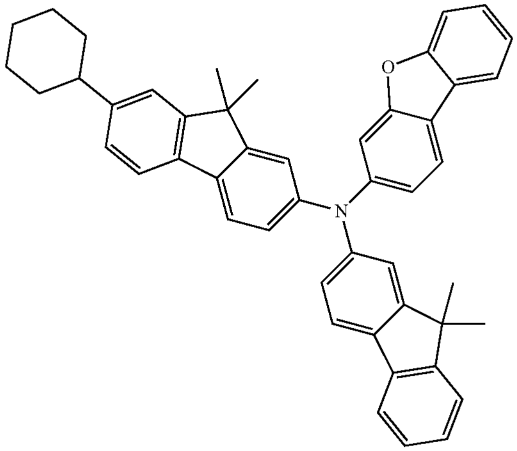
58
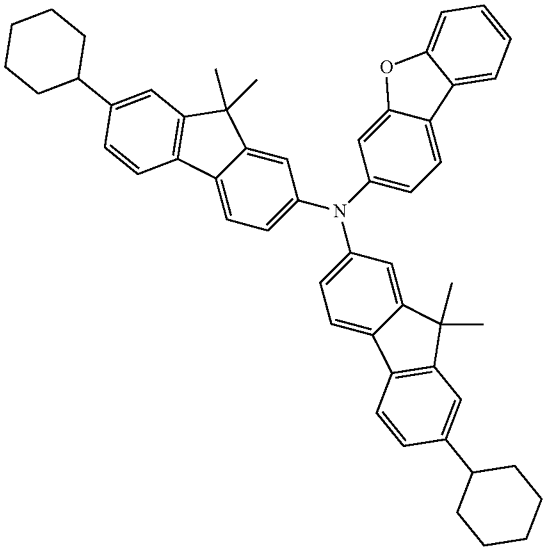
59
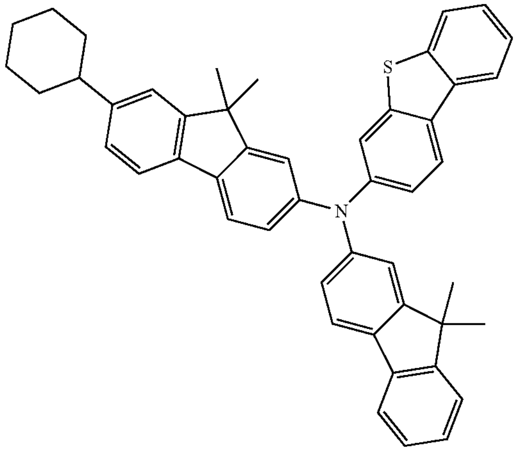

-continued
60
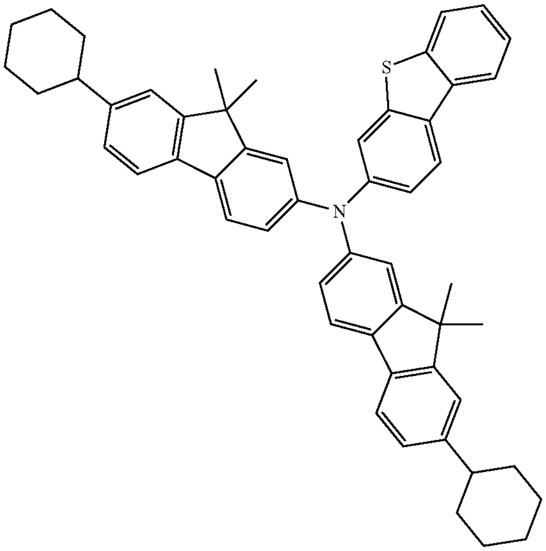
61
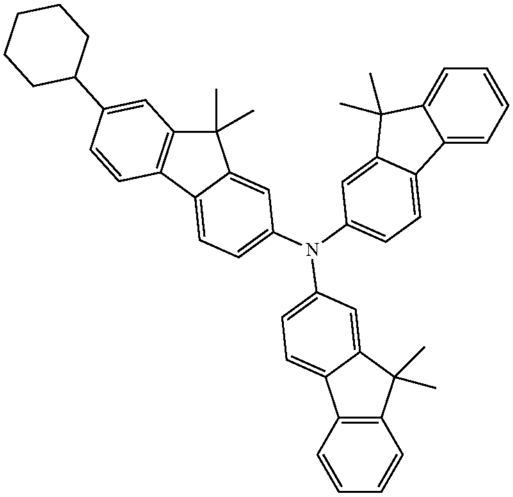
62
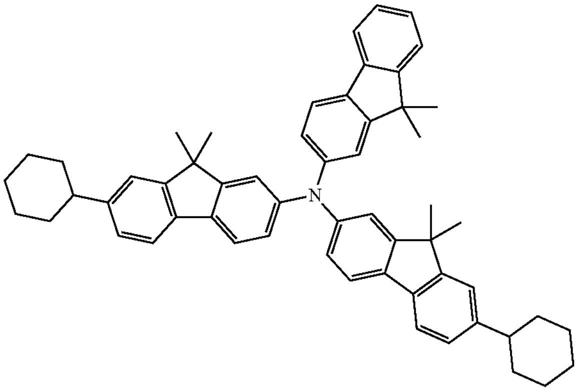
-continued
63
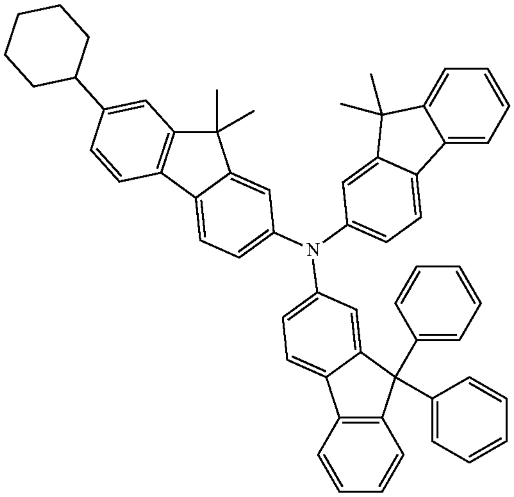
64
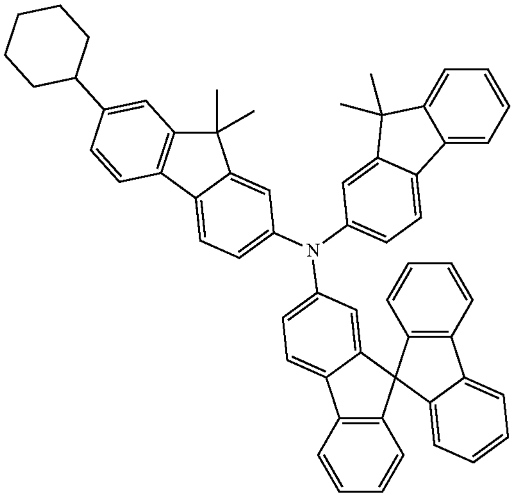
65
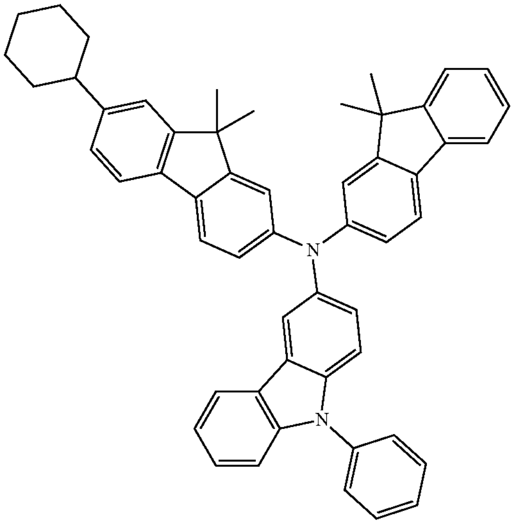

-continued
66
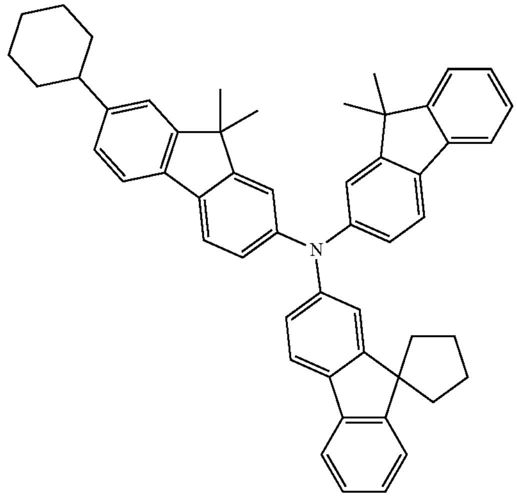
67
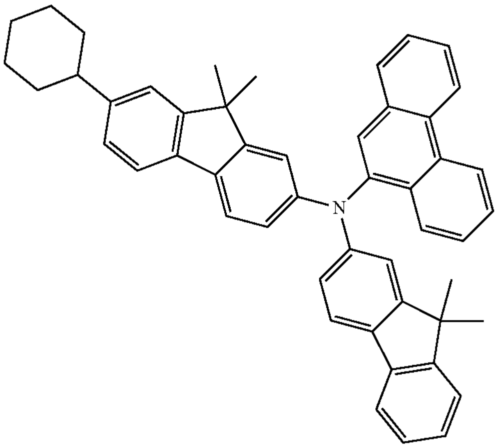
68
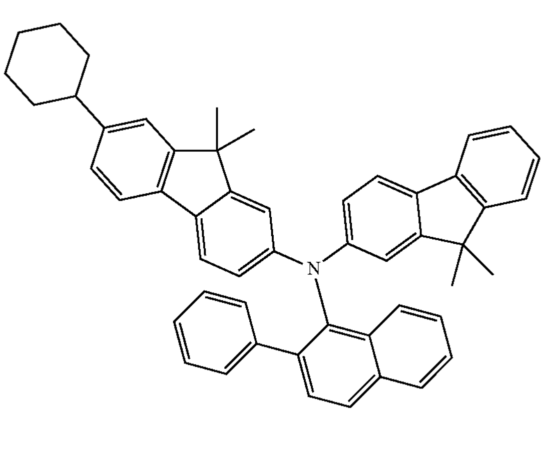
-continued
69
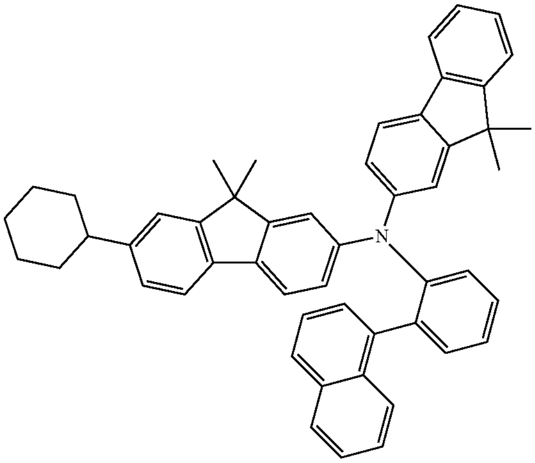
70
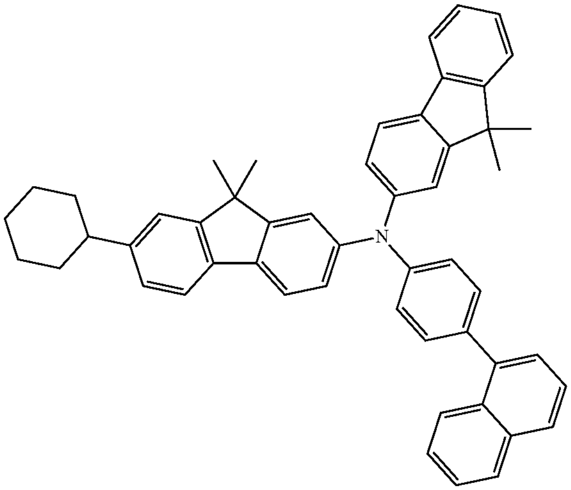
71
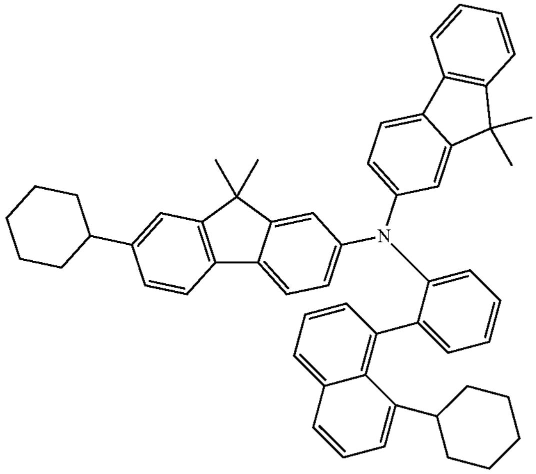

-continued
72
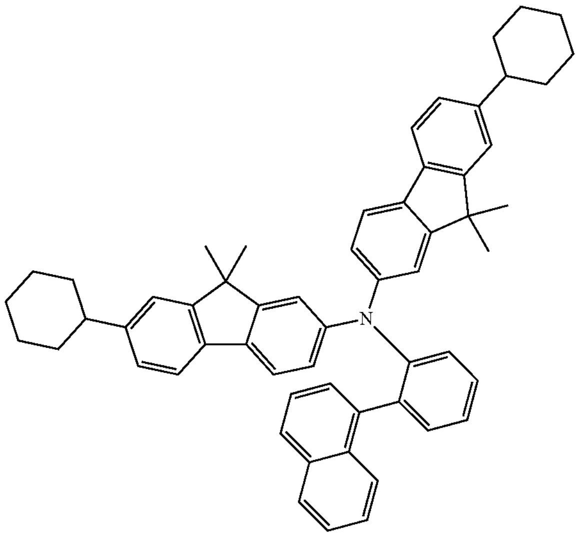
73
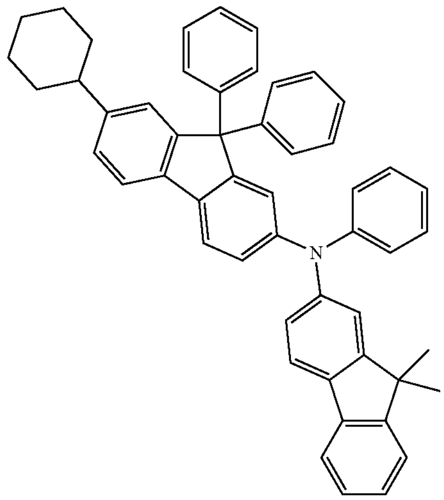
74
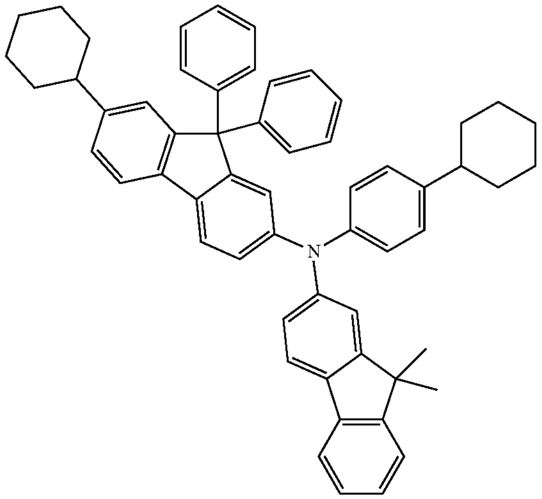
-continued
75
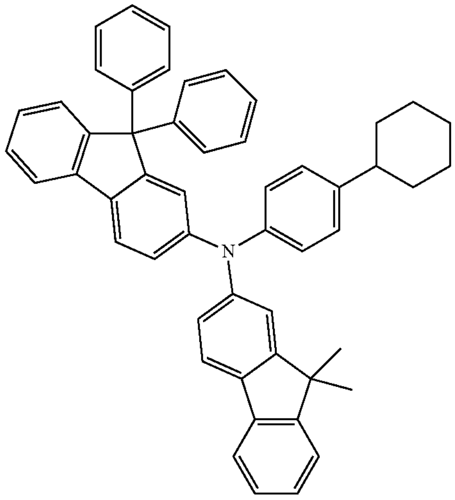
76
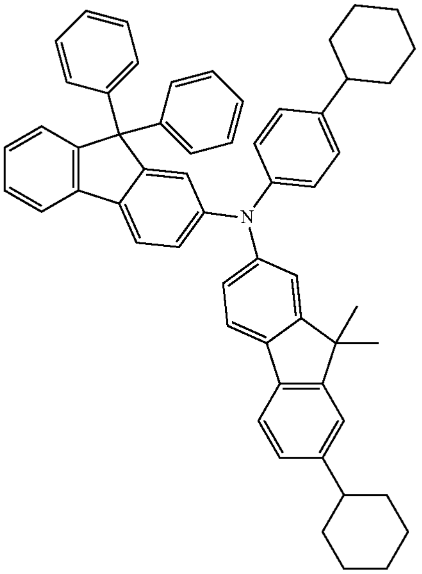
77
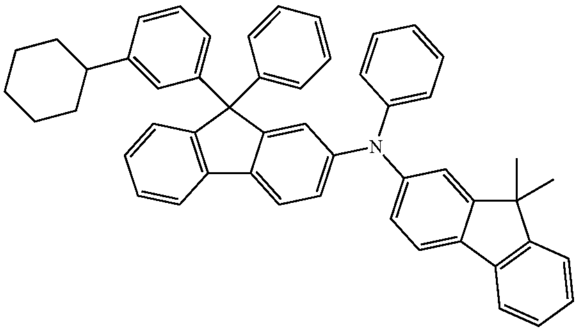

-continued
78
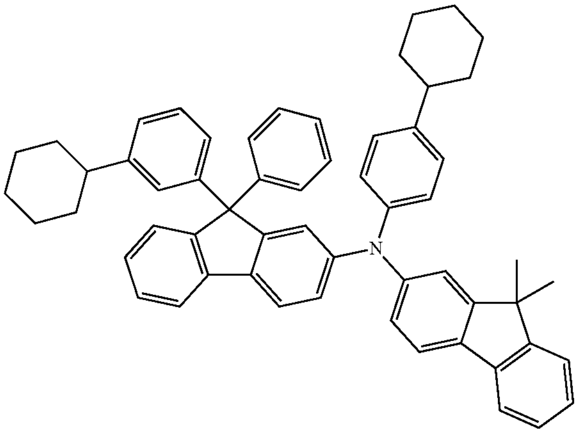
79
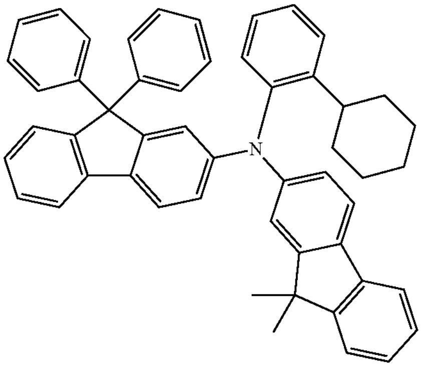
80
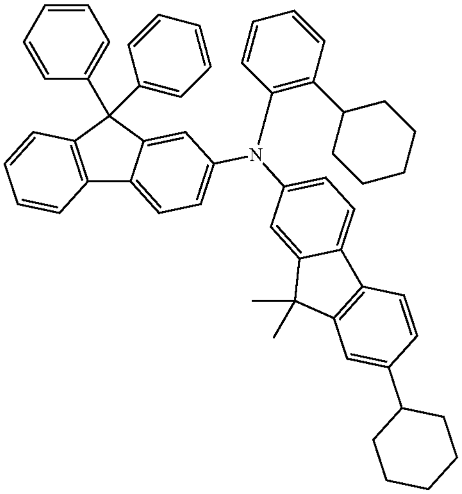
-continued
81
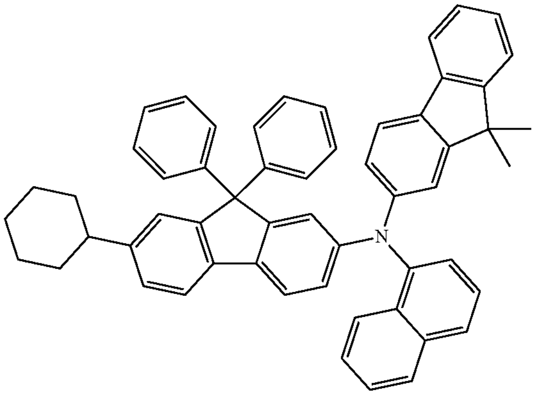
82
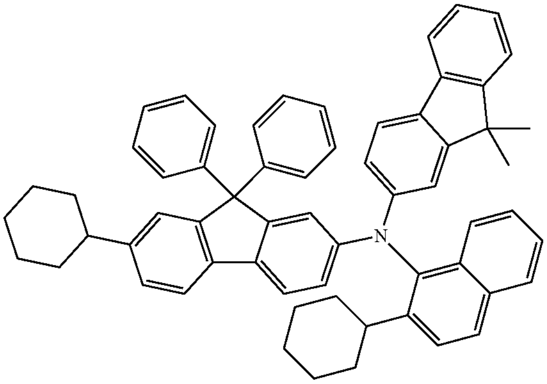
83
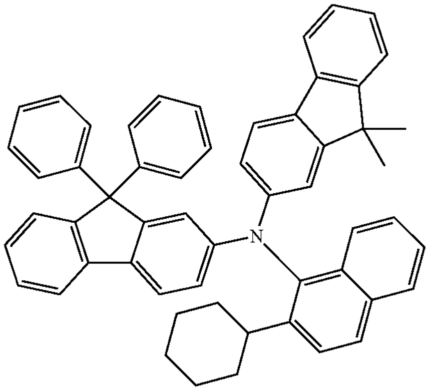

-continued
84
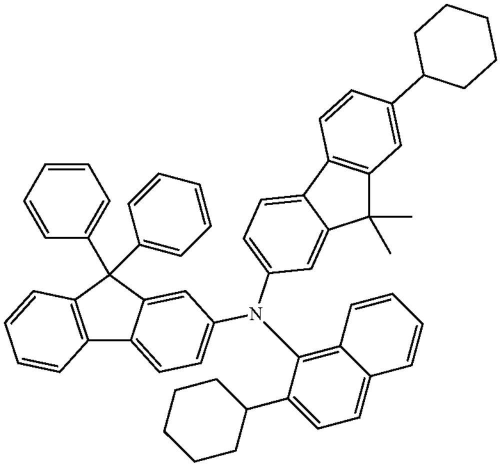
85
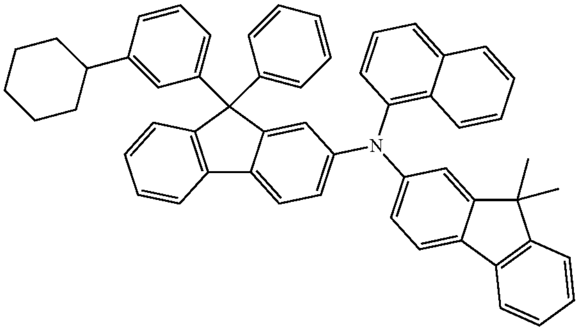
86
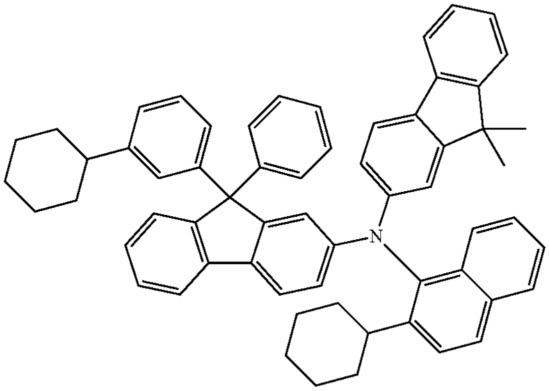
87
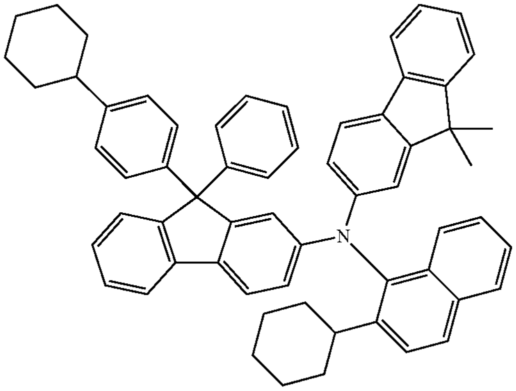
-continued
88
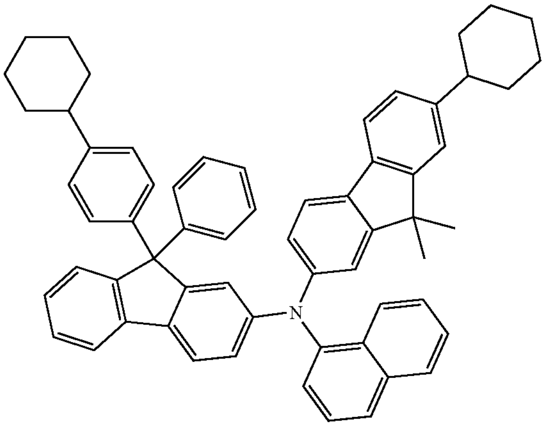
89
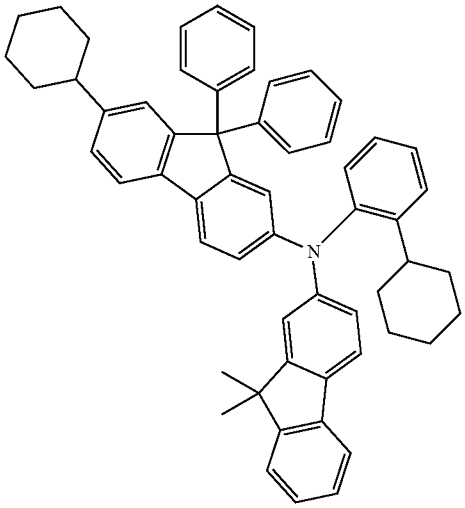
90
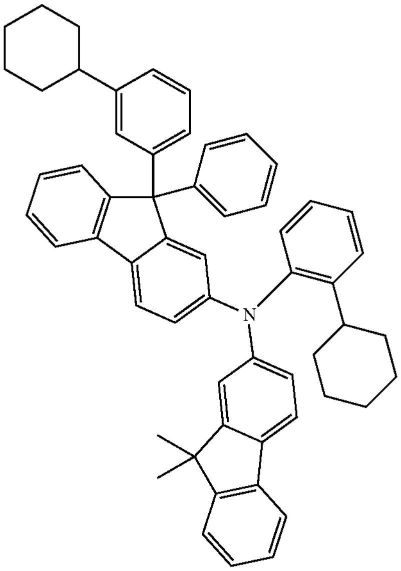

-continued
91
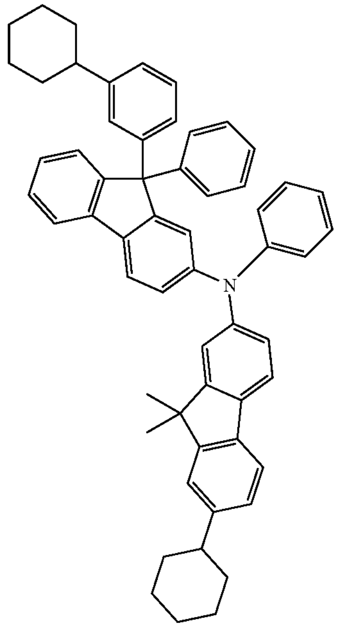
92
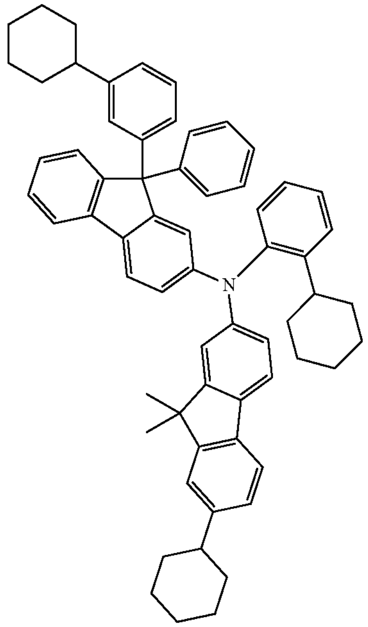
93
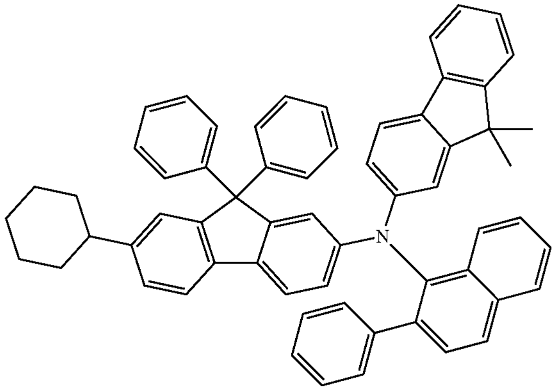
-continued
94
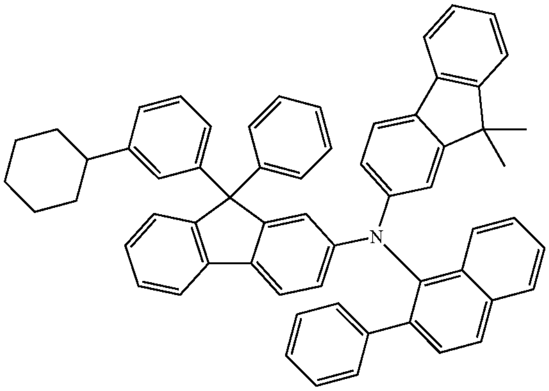
95
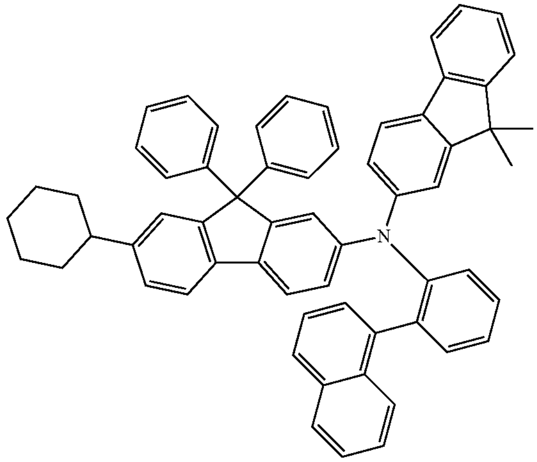
96
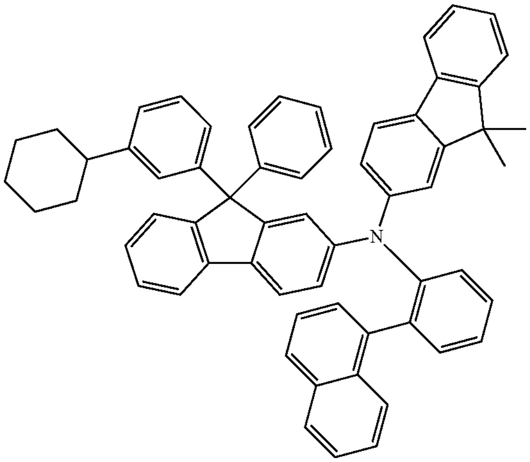

-continued
97
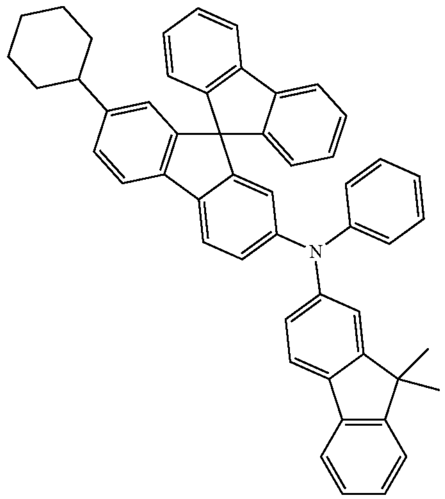
98
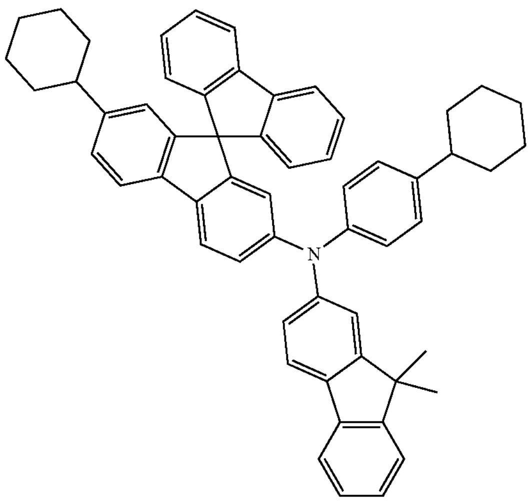
99
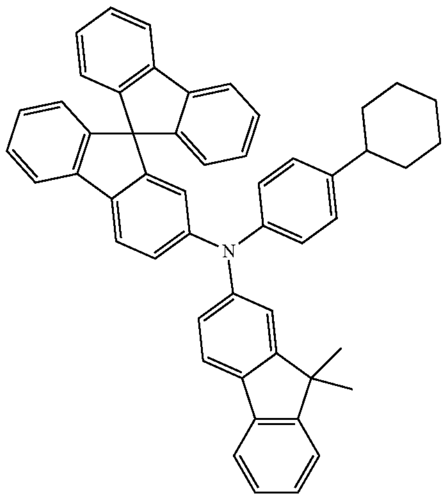
-continued
100
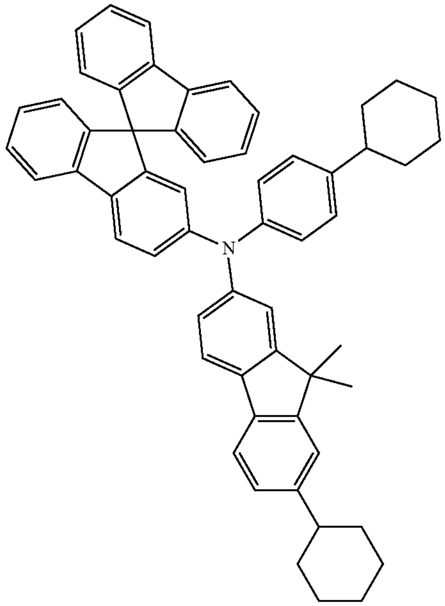
101
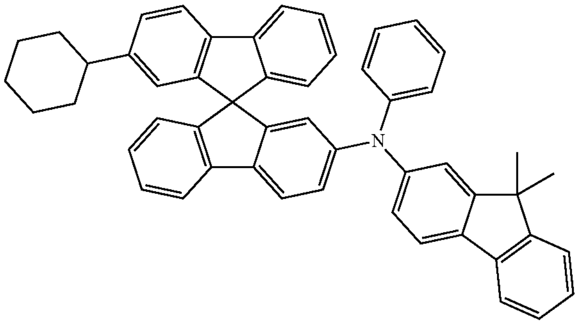
102
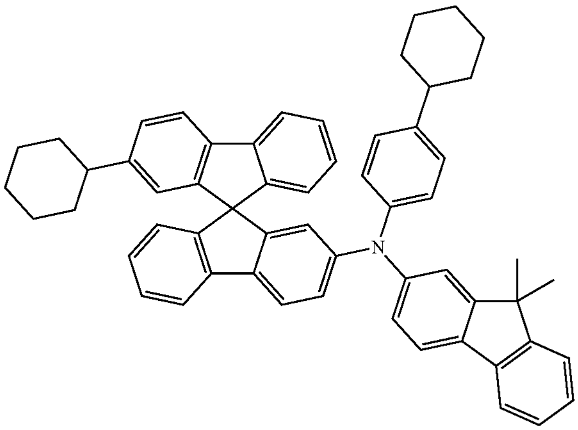

-continued
103
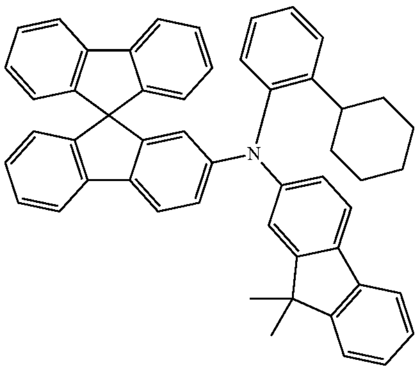
104
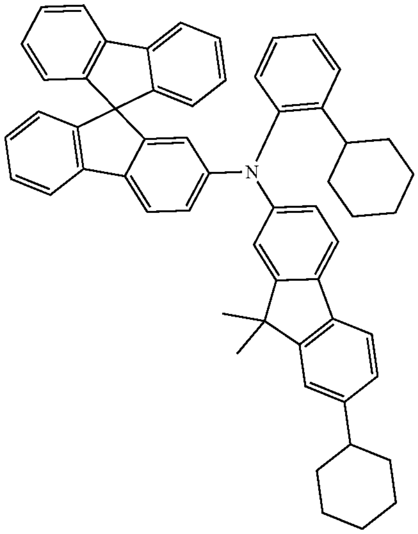
105
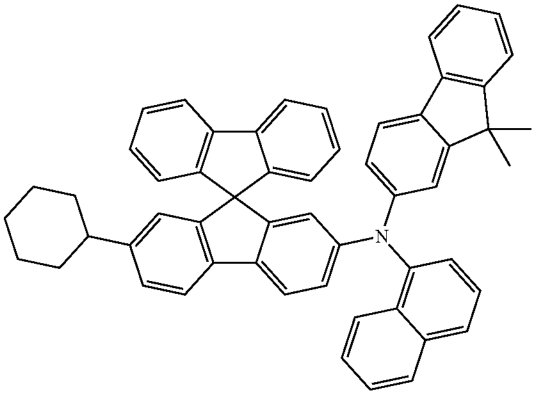
-continued
106
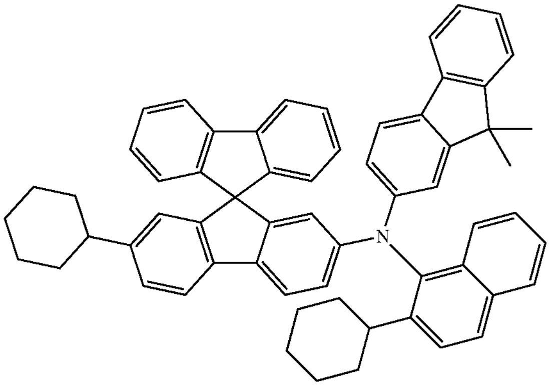
107
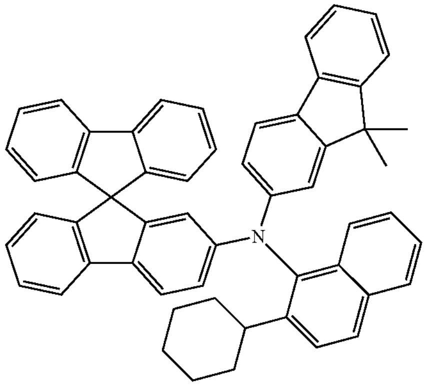
108
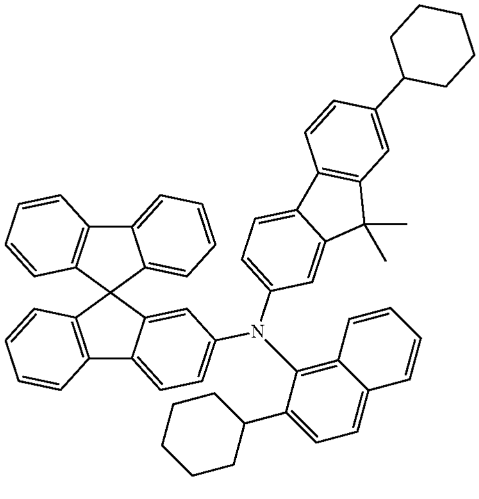
109
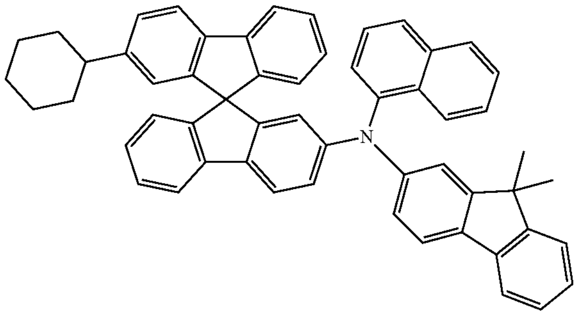

-continued
110
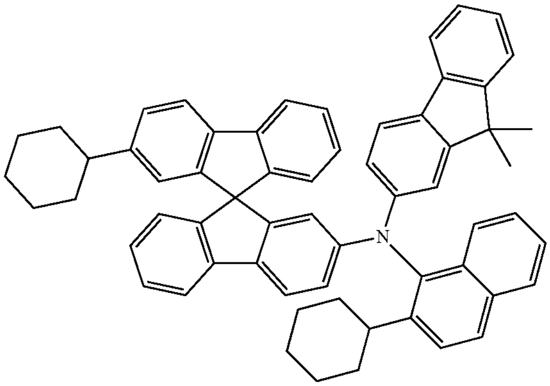
111
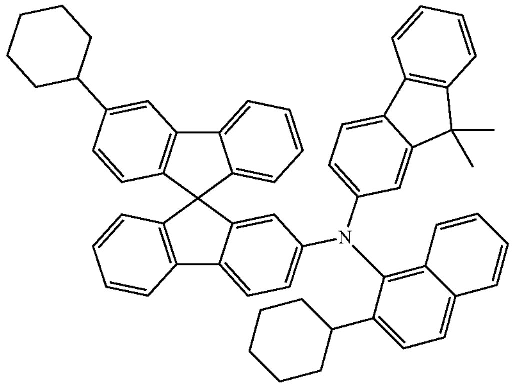
112
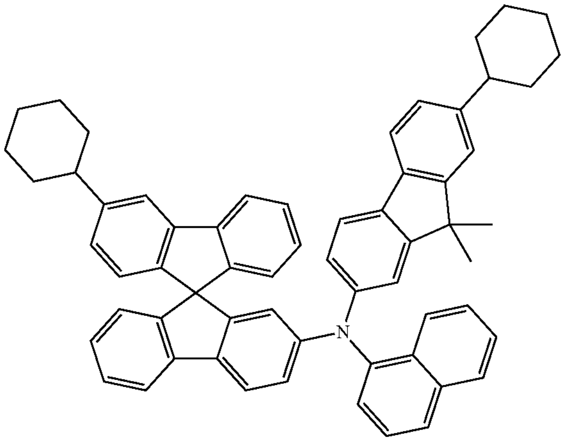
-continued
113
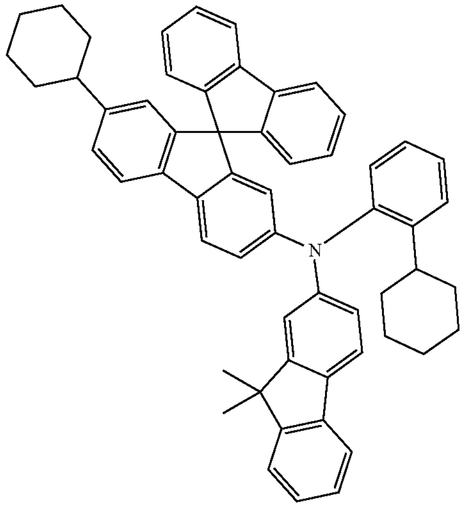
114
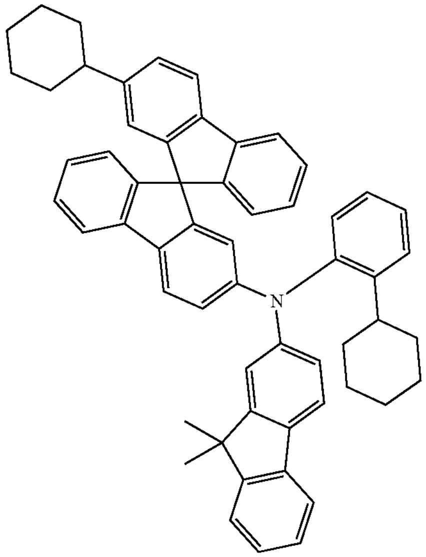

-continued
115
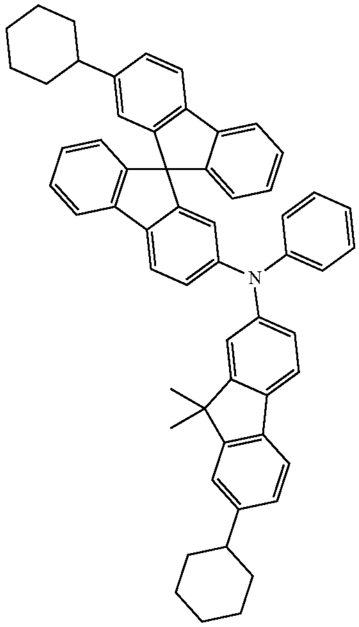
116
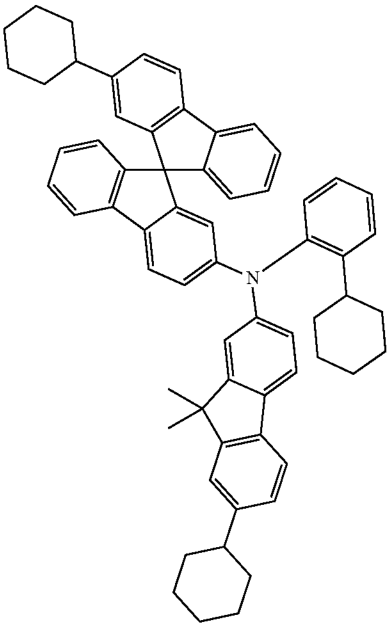
117
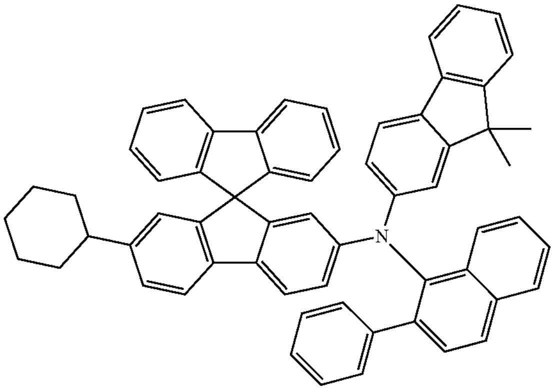
-continued
118
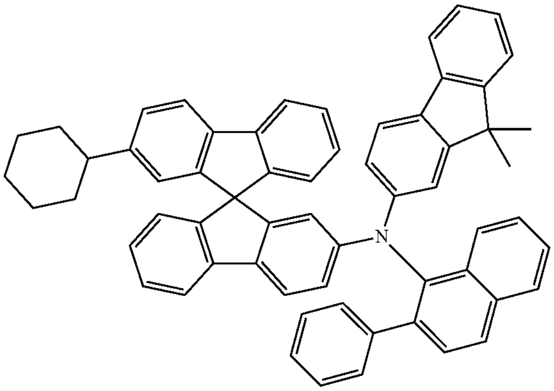
119
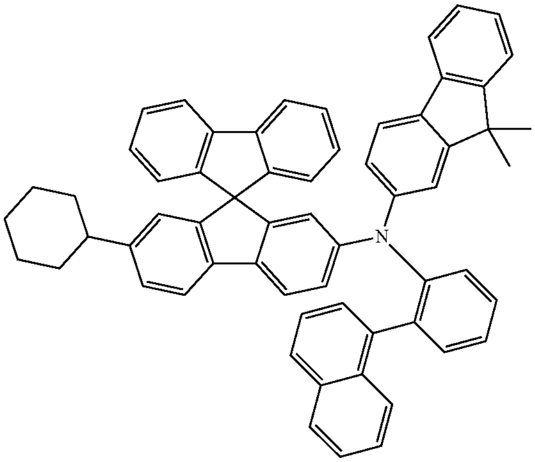
120
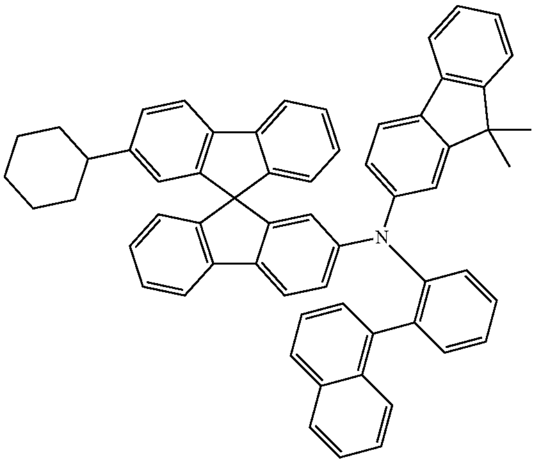

-continued
121
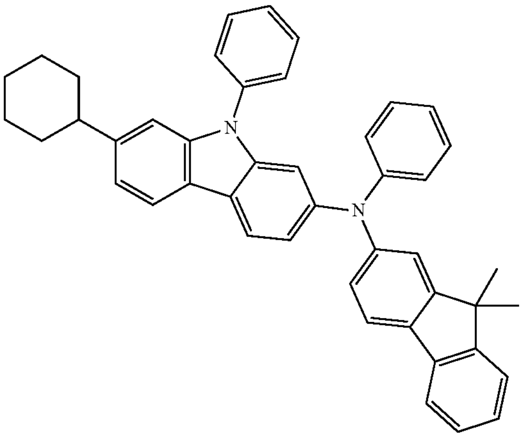
122
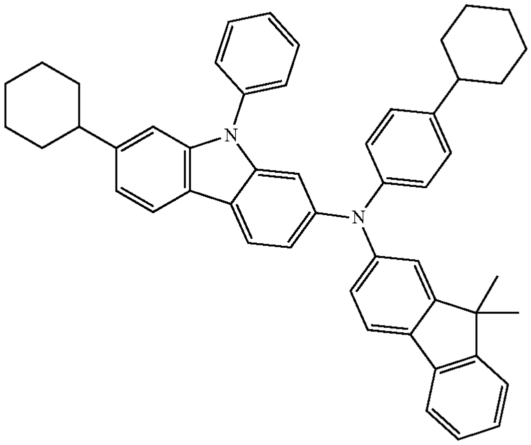
123
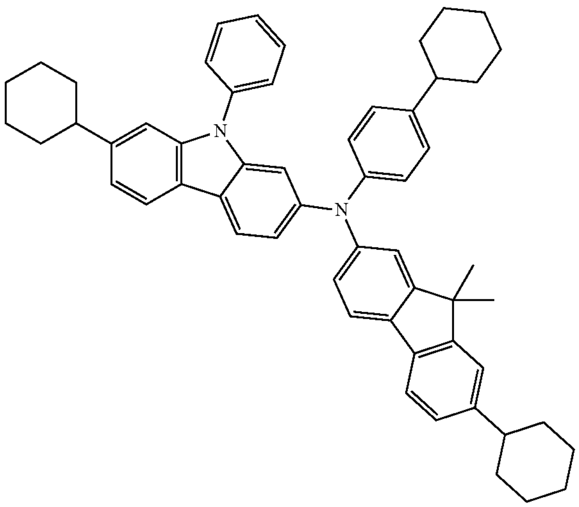
-continued
124
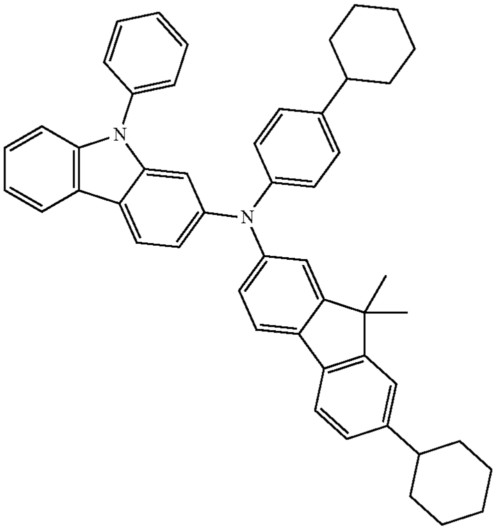
125
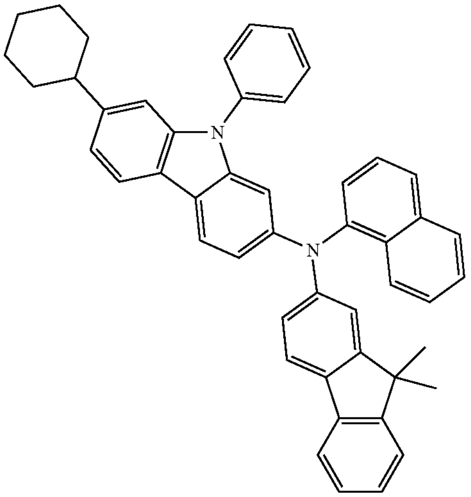
126
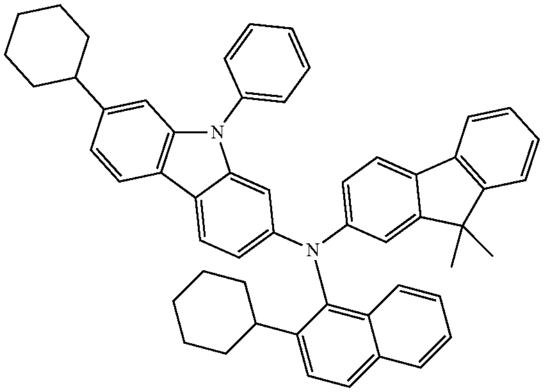

-continued
127
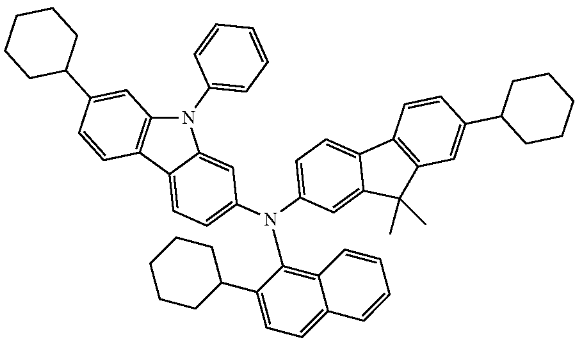
128
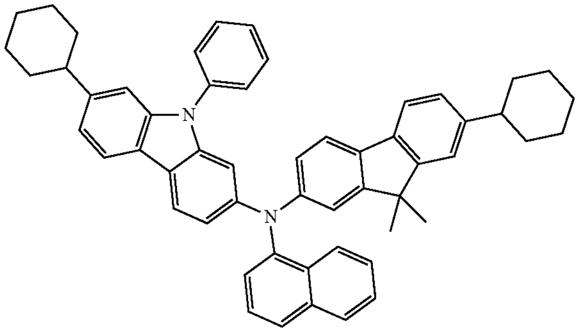
129
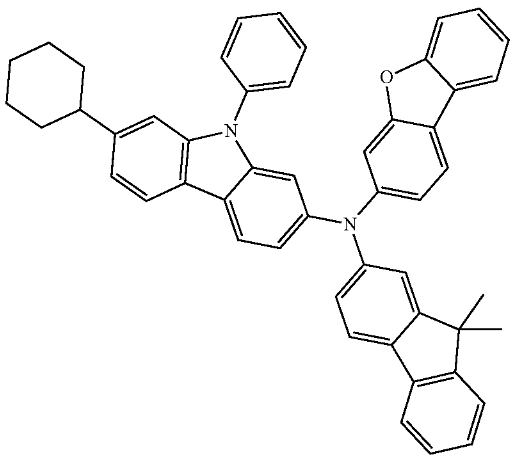
-continued
130
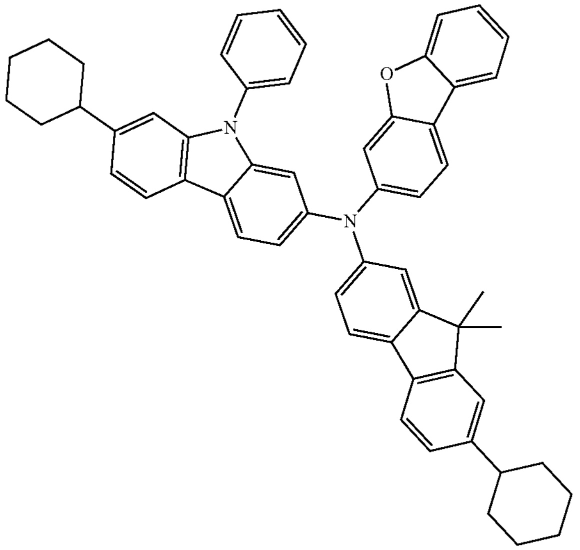
131
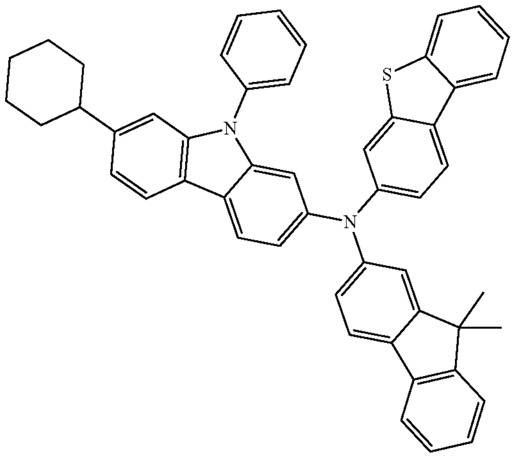
132
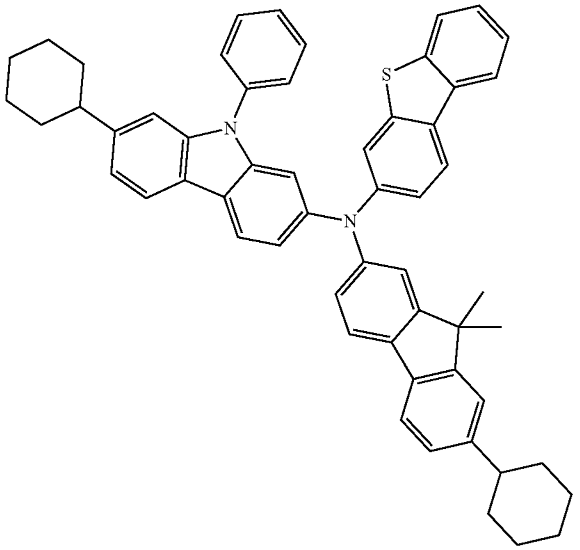

-continued
133
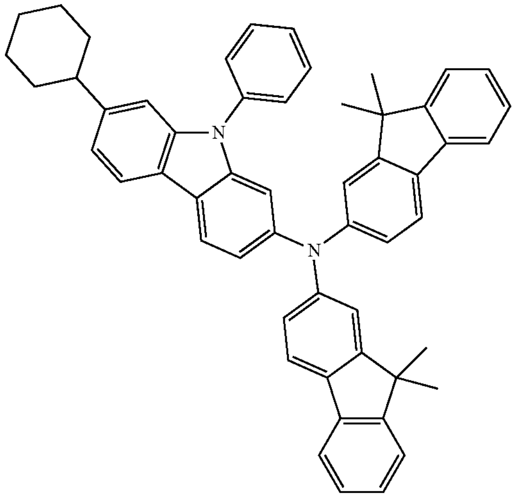
134
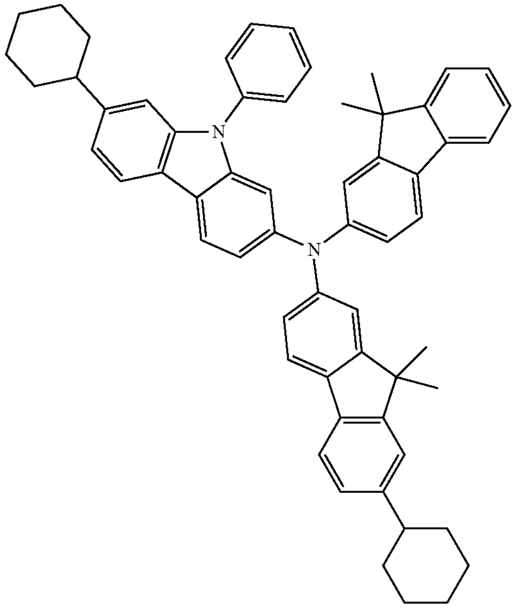
135
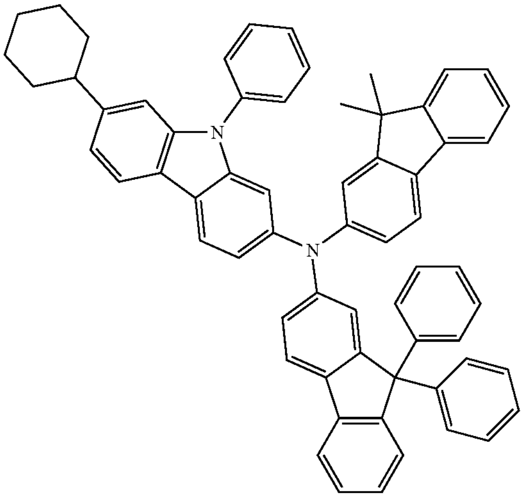
-continued
136
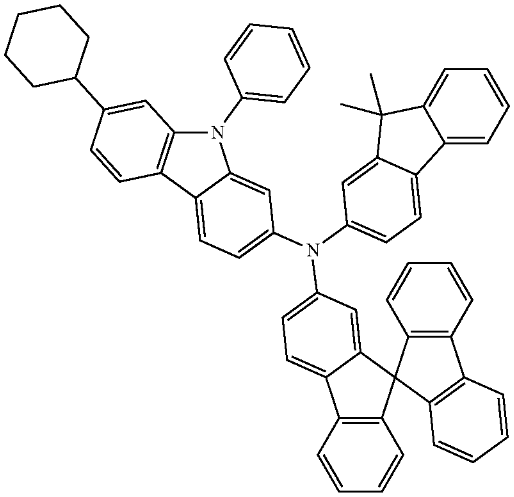
137
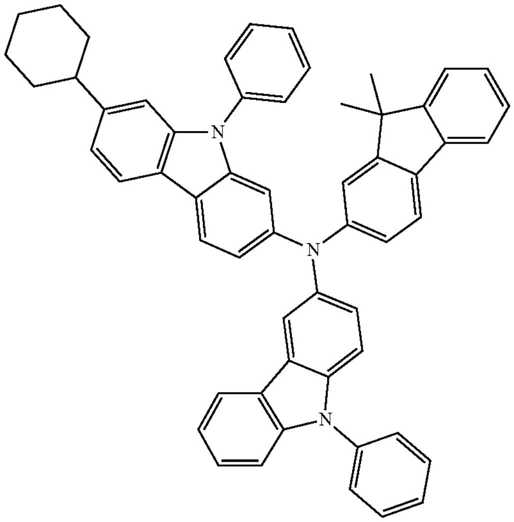
138
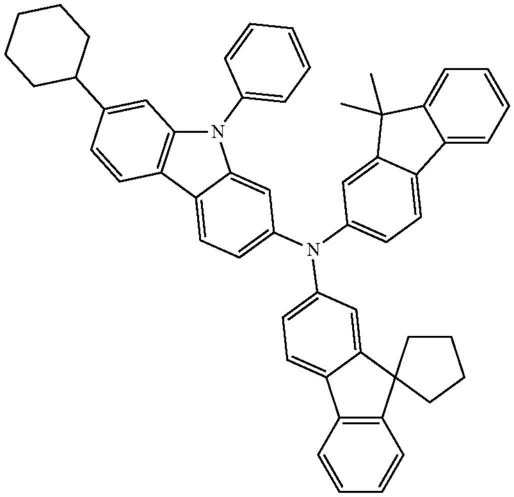

-continued
139
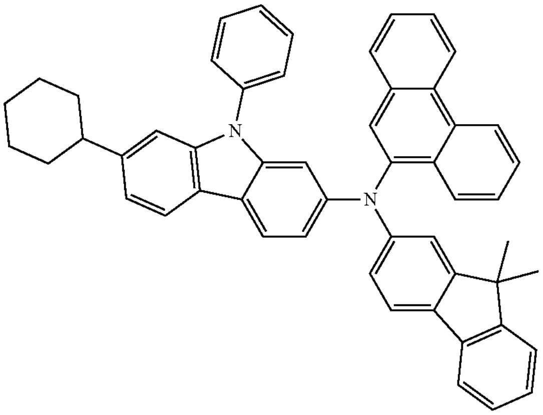
140
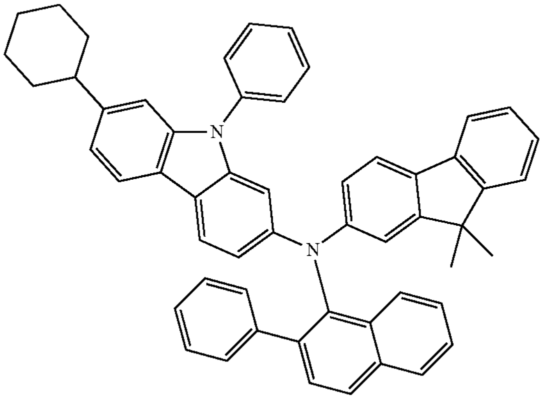
141
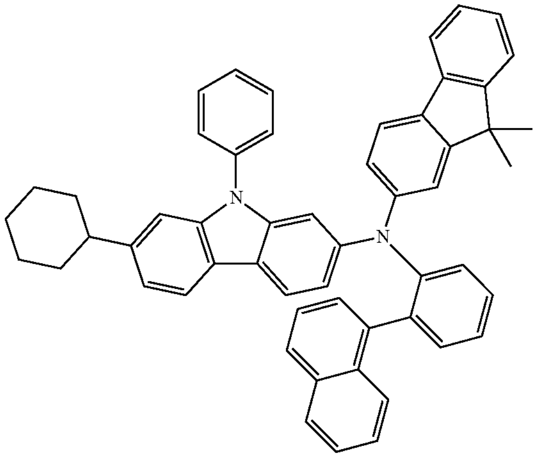
-continued
142
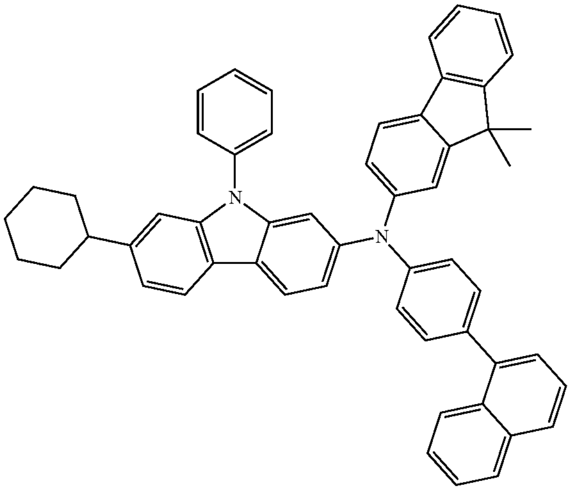
143
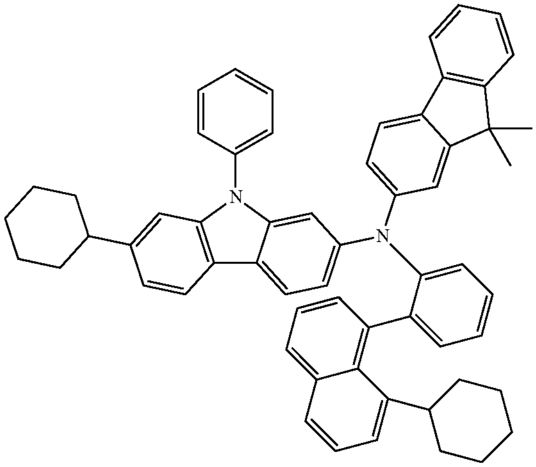
144
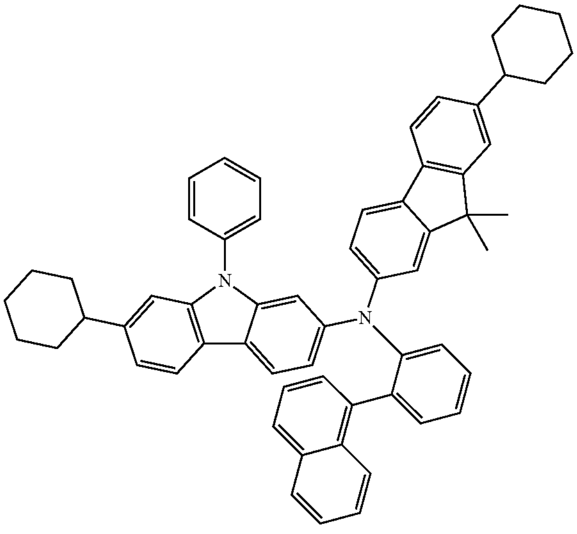

-continued
145
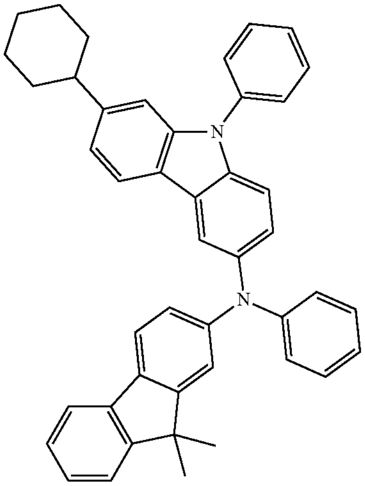
146
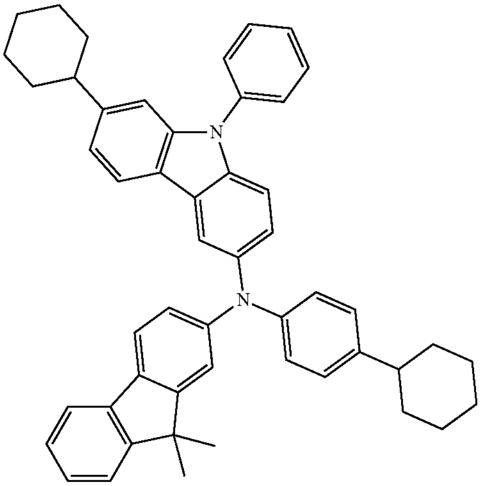
147
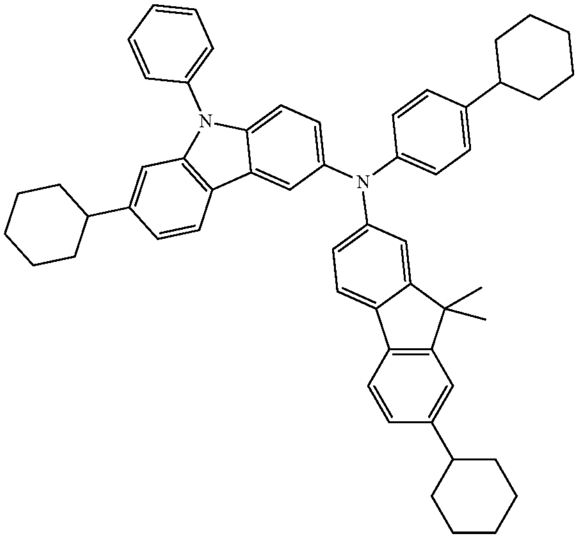
-continued
148
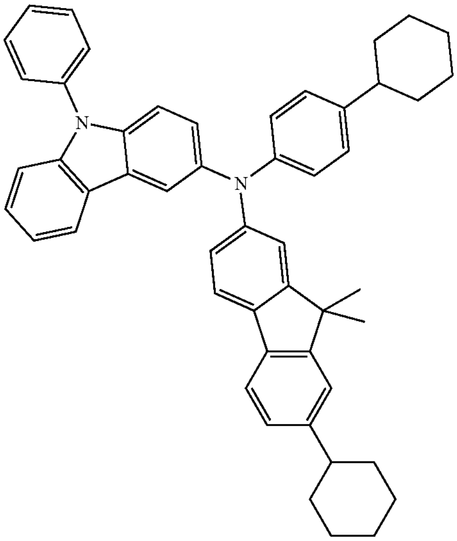
149
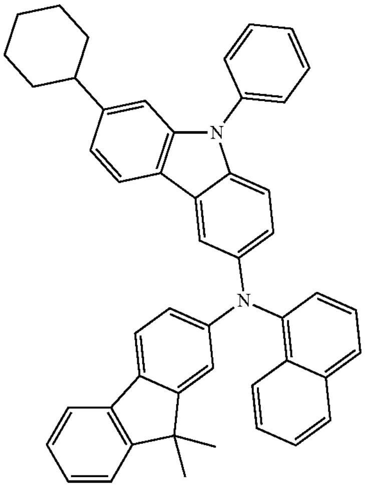
150
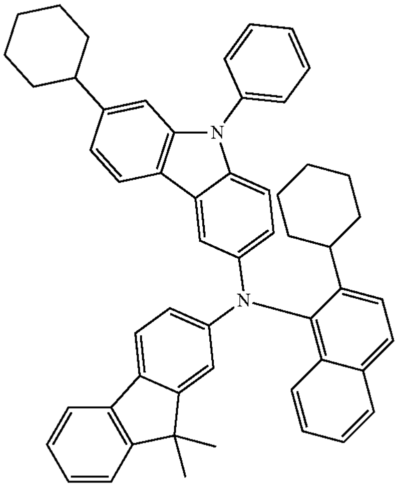

-continued
151
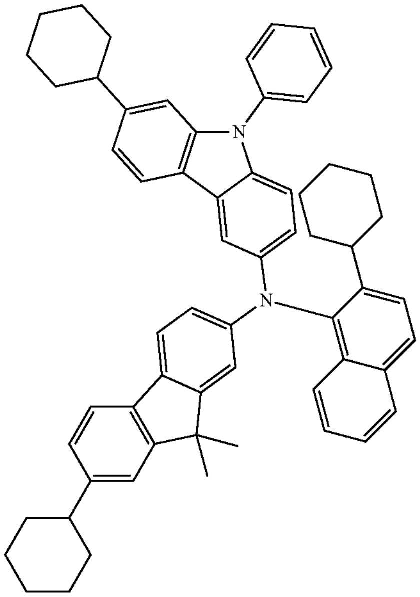
152
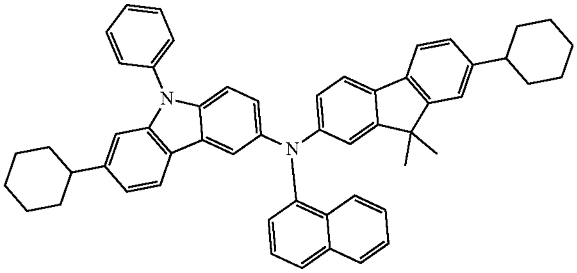
153
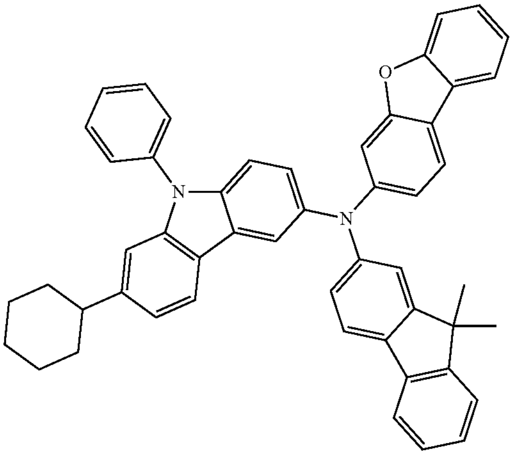
-continued
154
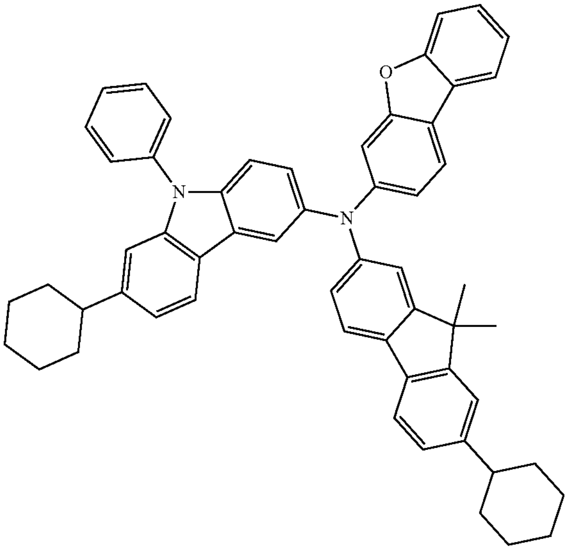
155
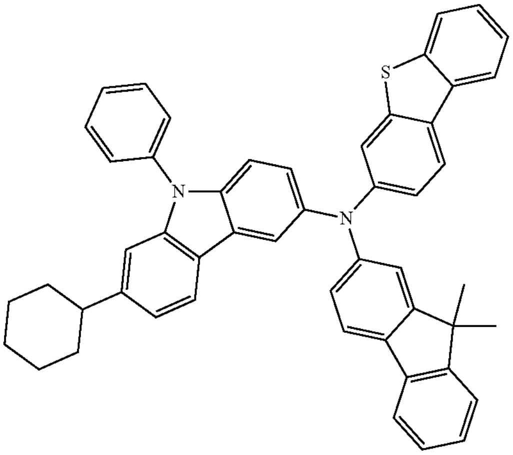
156
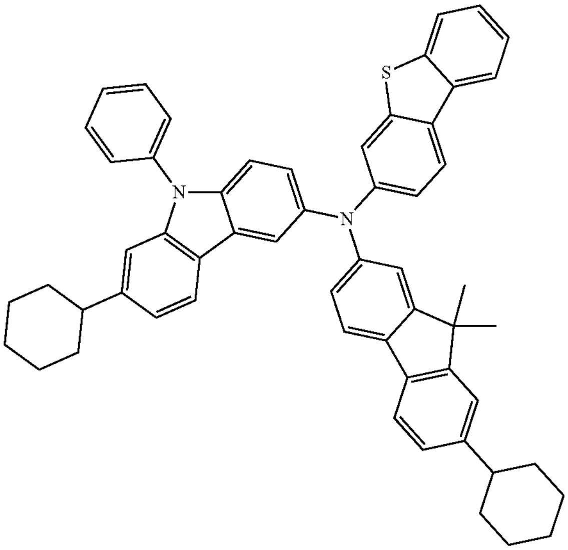

-continued
157
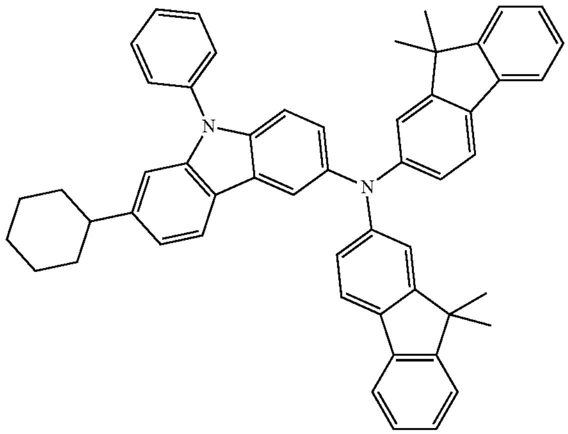
158
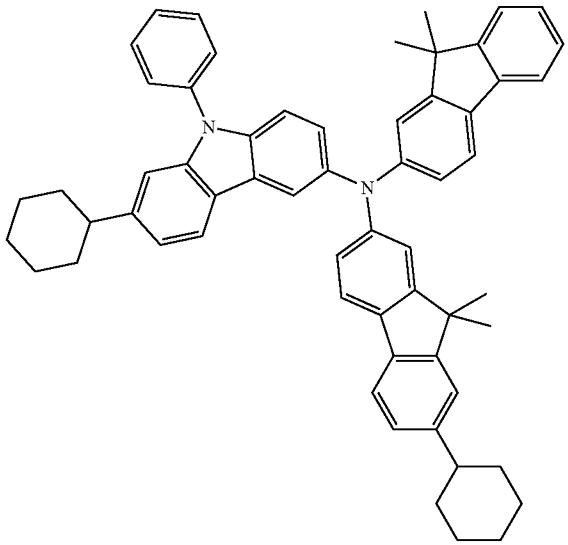
159
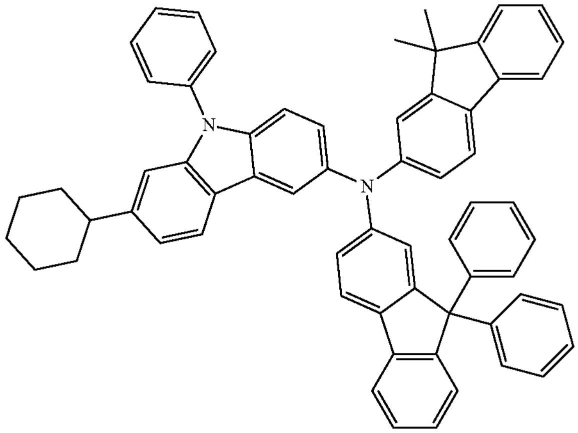
-continued
160
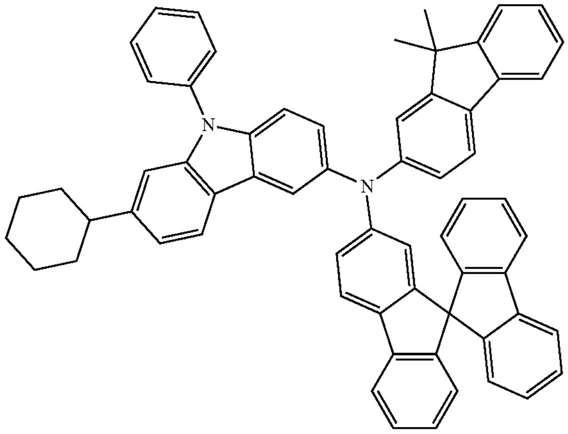
161
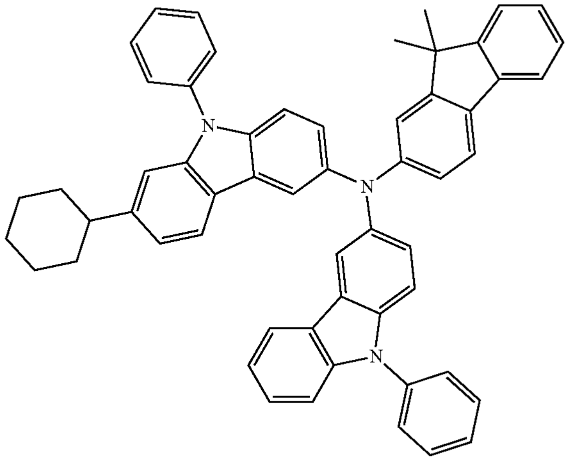
162
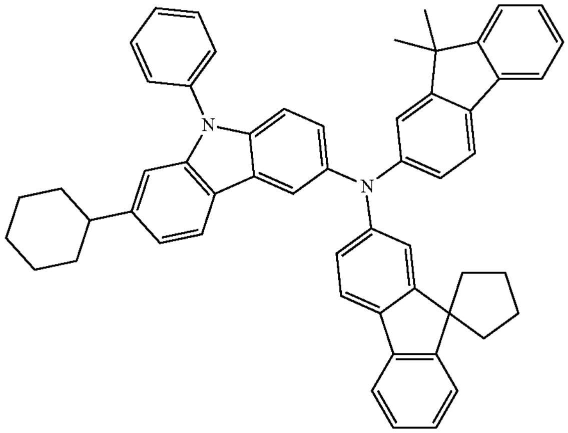

-continued
163
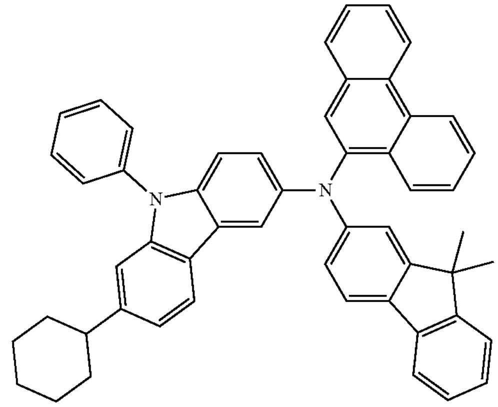
164
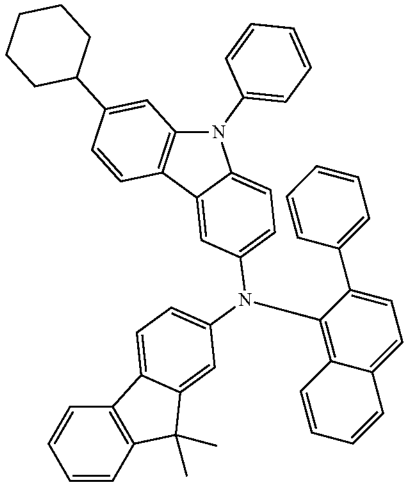
165
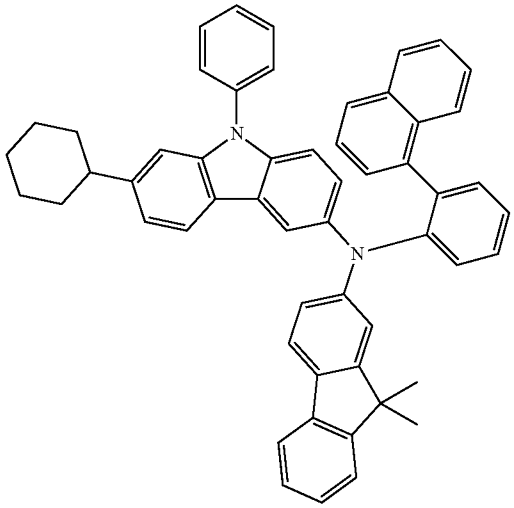
-continued
166
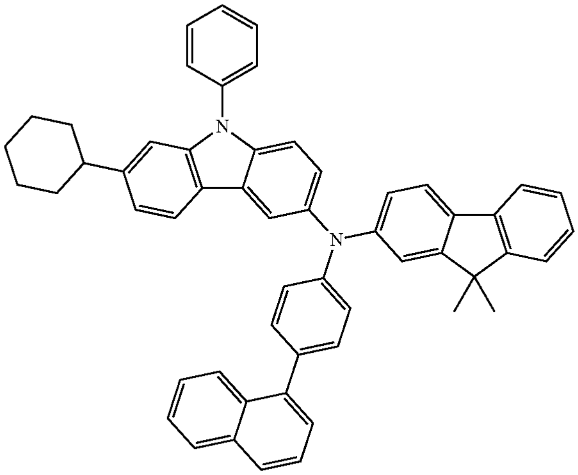
167
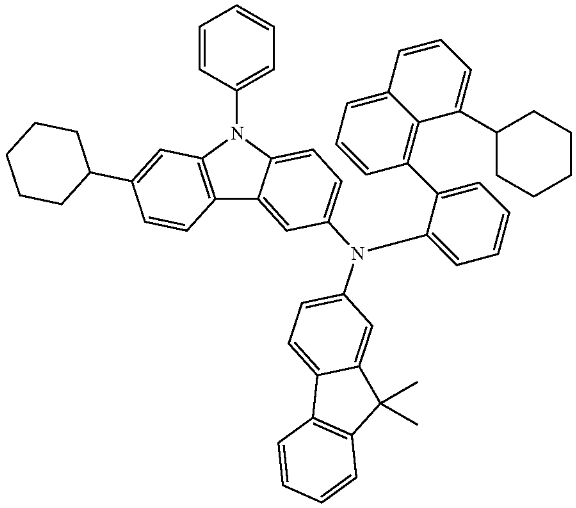
168
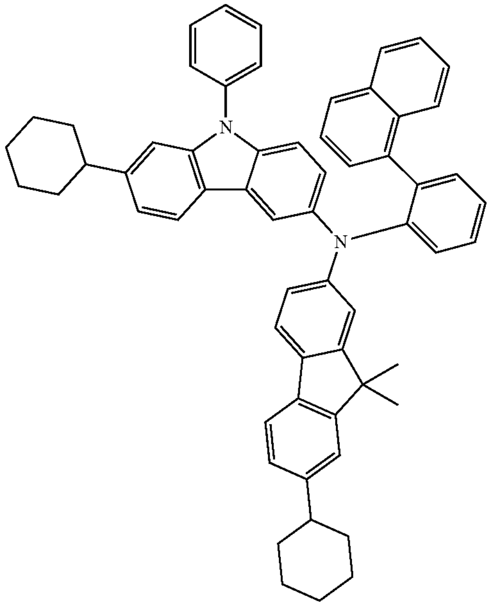
.

The amine compound represented by Formula 1 may include a substituted or unsubstituted cyclohexyl group in the molecule thereof. As the amine compound includes a cyclohexyl group, a π-π bond between a core and a substituent of the amine compound may be broken (e.g., there may not be resonance between the core and the substituent) and a refractive index may be lowered, and thus, the amine compound may be used a low refractive hole transporting material.

In addition, as the amine compound represented by Formula 1 includes a fluorene group substituted with a methyl group at a C-9 carbon atom, the highest occupied molecular orbital (HOMO) energy level and the lowest unoccupied molecular orbital (LUMO) energy level of the amine compound may be easily adjusted, as compared with a compound having a substituent including 2 or more carbon atoms at a C-9 carbon atom. For example, when the amine compound is used in a hole transport layer of a light-emitting device, a HOMO-LUMO energy level of the hole transport layer may be adjusted to facilitate hole injection and transport, in relation to organic layers adjacent to the hole transport layer (e.g., a hole injection layer and an emission layer), and thus, the light-emitting device may have long lifespan and/or high efficiency.

The amine compound may have a structure that may facilitate hole transport, thus improving hole transportability, heat resistance to Joule heat, and stability in a high temperature environment. Therefore, as a light-emitting device including the amine compound may have improved heat resistance, durability and lifespan of the device may be improved in a storage condition and a device-driving condition.

Further, the amine compound represented by Formula 1 may have excellent hole transportability and injectability by having a lone pair electron present in a nitrogen atom of the amine group. For example, a light-emitting device including the amine compound in a hole transport region may have a HOMO energy level suitable for hole transport and injection, thus lowering the driving voltage and improving the efficiency.

Therefore, an electronic device, e.g., a light-emitting device, including the amine compound may have a low driving voltage, high efficiency, and long lifespan.

Methods of synthesizing the amine compound represented by Formula 1 may be easily understood by those of ordinary skill in the art by referring to Synthesis Examples and Examples described herein.

At least one of the amine compounds represented by Formula 1 may be used in a light-emitting device (e.g., an organic light-emitting device). Accordingly, a light-emitting device may include a first electrode; a second electrode facing the first electrode; and an interlayer between the first electrode and the second electrode and including an emission layer, and the light-emitting device may include the amine compound represented by Formula 1 as described herein.

In some embodiments, the first electrode of the light-emitting device may be an anode, the second electrode of the light-emitting device may be a cathode, the interlayer may further include a hole transport region between the first electrode and the emission layer and an electron transport region between the emission layer and the second electrode, the hole transport region may include a hole injection layer, a hole transport layer, an emission auxiliary layer, an electron blocking layer, or any combination thereof, and The electron transport region may include a buffer layer, a hole blocking layer, an electron control layer, an electron transport layer, and/or an electron injection layer.

In some embodiments, the amine compound may be included in a pair of electrodes of the light-emitting device. Accordingly, the amine compound may be included in the interlayer of the light-emitting device, for example, in the hole transport region in the interlayer.

In some embodiments, the amine compound may be included in a hole transport region of the light-emitting device.

In some embodiments, the hole transport region may include at least one of a hole injection layer and a hole transport layer, wherein at least one of the hole injection layer and the hole transport layer may include the amine compound.

In one or more embodiments, an emission layer of the light-emitting device may include the amine compound represented by Formula 1.

In some embodiments, the emission layer may include a host and a dopant, wherein a content (e.g., an amount or weight) of the host in the emission layer may be greater than a content (e.g., an amount or weight) of the dopant in the emission layer, and the host may include the amine compound represented by Formula 1.

In one or more embodiments, the light-emitting device may include at least one of a first capping layer located outside the first electrode and a second capping layer located outside the second electrode.

In some embodiments, at least one of the first capping layer and the second capping layer may have a refractive index of 1.6 or higher at a wavelength of 589 nanometers (nm).

In some embodiments, at least one of the first capping layer and the second capping layer may include the amine compound represented by Formula 1. The first capping layer and the second capping layer may respectively be understood by referring to the descriptions of the first capping layer and the second capping layer provided herein.

In some embodiments, the light-emitting device may include:

a first capping layer located outside the first electrode and including the amine compound represented by Formula 1;

a second capping layer located outside the second electrode and including the amine compound represented by Formula 1; or the first capping layer and the second capping layer.

The expression that an "(interlayer and/or a capping layer) includes at least one amine compound," as used herein, may be construed as meaning that the "(interlayer and/or the capping layer) may include one amine compound of Formula 1 or two different amine compounds of Formula 1."

For example, the interlayer and/or the capping layer may include Compound 1 only as the amine compound. In this embodiment, Compound 1 may be included in the hole transport layer of the light-emitting device. In some embodiments, the interlayer may include Compounds 1 and 2 as the amine compounds. In this regard, Compounds 1 and 2 may be present in the same layer (for example, both Compounds 1 and 2 may be present in a hole transport layer), or in different layers (for example, Compound 1 may be present in a hole transport layer and Compound 2 may be present in an emission layer).

According to one or more embodiments, an electronic apparatus may include the light-emitting device. The electronic apparatus may further include a thin-film transistor. In some embodiments, the electronic apparatus may further include a thin-film transistor including a source electrode and drain electrode, and a first electrode of the light-emitting device may be electrically coupled to the source electrode or the drain electrode. The electronic apparatus may further include a color filter, a color-conversion layer, a touchscreen layer, a polarization layer, or any combination thereof. The electronic apparatus may be understood by referring to the description of the electronic apparatus provided herein.

Description of FIG. 1

FIG. 1 is a schematic view of a light-emitting device 10 according to an embodiment. The light-emitting device 10 may include a first electrode 110, an interlayer 130, and a second electrode 150.

Hereinafter, the structure of the light-emitting device 10 according to an embodiment and a method of manufacturing the light-emitting device 10 according to an embodiment will be described in connection with FIG. 1.

First Electrode 110

In FIG. 1, a substrate may be additionally located under the first electrode 110 and/or above the second electrode 150. The substrate may be a glass substrate and/or a plastic substrate. The substrate may be a flexible substrate including plastic having excellent heat resistance and durability, for example, polyimide, polyethylene terephthalate (PET), polycarbonate, polyethylene naphthalate, polyarylate (PAR), polyetherimide, or any combination thereof.

The first electrode 110 may be formed by vacuum-depositing and/or sputtering, onto the substrate, a material for forming the first electrode 11. When the first electrode 110 is an anode, a high work function material that may easily inject holes may be used as a material for a first electrode.

The first electrode 110 may be a reflective electrode, a semi-transmissive electrode, or a transmissive electrode. When the first electrode 110 is a transmissive electrode, as a material for forming the first electrode 110, indium tin oxide (ITO), indium zinc oxide (IZO), tin oxide ($SnO_2$), zinc oxide (ZnO), or any combination thereof may be used. In some embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combination thereof may be used as a material for forming the first electrode 110.

The first electrode 110 may have a single-layered structure including (e.g., consisting of) a single layer or a multi-layered structure including two or more layers. In some embodiments, the first electrode 110 may have a triple-layered structure of ITO/Ag/ITO.

Interlayer 130

The interlayer 130 may be on the first electrode 110. The interlayer 130 may include an emission layer.

The interlayer 130 may further include a hole transport region between the first electrode 110 and the emission layer and an electron transport region between the emission layer and the second electrode 150.

The interlayer 130 may further include metal-containing compounds such as organometallic compounds, inorganic materials such as quantum dots, and/or the like, in addition to various suitable organic materials.

The interlayer 130 may include: i) at least two emitting units sequentially stacked between the first electrode 110 and the second electrode 150; and ii) a charge-generation layer between the at least two emitting units. When the interlayer 130 includes the at least two emitting units and the charge generation layer, the light-emitting device 10 may be a tandem light-emitting device.

Hole Transport Region in Interlayer 130

The hole transport region may have i) a single-layered structure including (e.g., consisting of) a single layer including (e.g., consisting of) a single material, ii) a single-layered structure including (e.g., consisting of) a single layer including a plurality of different materials, or iii) a multi-layered structure having a plurality of layers including a plurality of different materials.

The hole transport region may include a hole injection layer, a hole transport layer, an emission auxiliary layer, an electron blocking layer, or any combination thereof.

For example, the hole transport region may have a multi-layered structure, e.g., a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein layers of each structure are sequentially stacked on the first electrode 110 in each stated order.

The hole transport region may include the amine compound represented by Formula 1.

In some embodiments the hole transport region may include the compound represented by Formula 201, the compound represented by Formula 202, or any combination thereof:

Formula 201

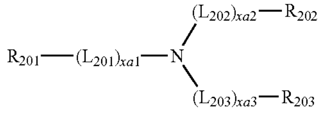

Formula 202

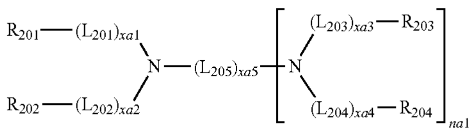

wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and 0201 may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be bound to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group (e.g., a carbazole group and/or the like) unsubstituted or substituted with at least one $R_{10a}$ (e.g., Compound HT16 described herein), $R_{203}$ and $R_{204}$ may optionally be bound to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group unsubstituted or substituted with at least one $R_{10a}$, and na1 may be an integer from 1 to 4.

In some embodiments, Formulae 201 and 202 may each include at least one of groups represented by Formulae CY201 to CY217:

CY201

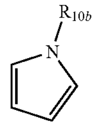

CY202

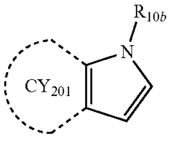

CY203

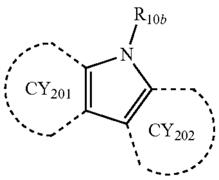

CY204

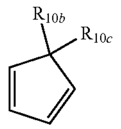

CY205

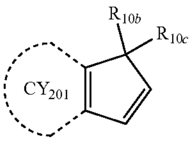

-continued

CY206

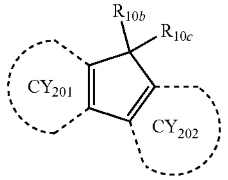

CY207

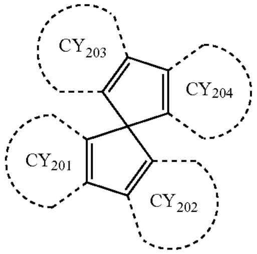

CY208

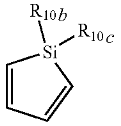

CY209

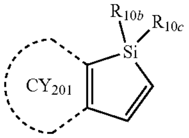

CY210

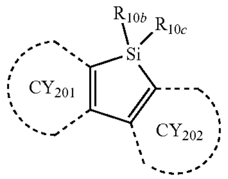

CY211

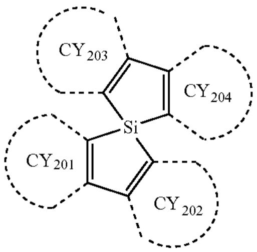

-continued

CY212

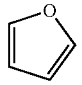

CY213

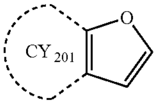

CY214

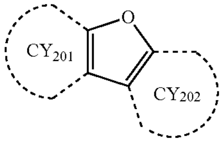

CY215

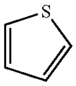

CY216

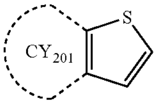

CY217

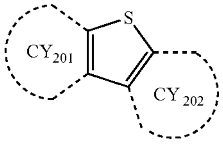

wherein, in Formulae CY201 to CY217, $R_{10b}$ and $R_{10c}$ may each be understood by referring to the descriptions of $R_{10a}$, rings CY201 to ring CY204 may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In an embodiment, in Formulae CY201 to CY217, rings CY201 to ring CY204 may each independently be a benzene group, a naphthalene group, a phenanthrene group, or an anthracene group.

In one or more embodiments, Formulae 201 and 202 may each include at least one of groups represented by Formula CY201 to CY203.

In one or more embodiments, Formula 201 may include at least one of groups represented by Formulae CY201 to CY203 and at least one of groups represented by Formulae CY204 to CY217.

In one or more embodiments, in Formula 201, xa1 may be 1, $R_{201}$ may be a group represented by any one of Formulae CY201 to CY203, xa2 may be 0, and $R_{202}$ may be a group represented by Formulae CY204 to CY207.

In one or more embodiments, Formula 201 and 202 may each not include groups represented by Formulae CY201 to CY203.

In one or more embodiments, Formula 201 and 202 may each not include groups represented by Formulae CY201 to CY203 and include at least one of groups represented by Formulae CY204 to CY217.

In one or more embodiments, Formula 201 and 202 may each not include groups represented by Formulae CY201 to CY217.

In some embodiments, the hole transport regions may include one of Compounds HT1 to HT44, m-MTDATA, TDATA, 2-TNATA, NPB (NPD), β-NPB, TPD, spiro-TPD, spiro-NPB, methylated-NPB, TAPC, HMTPD, 4,4',4"-tris (N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphorsulfonic acid (PANI/CSA), polyaniline/poly(4-styrenesulfonate) (PANI/PSS), or any combination thereof:

HT1

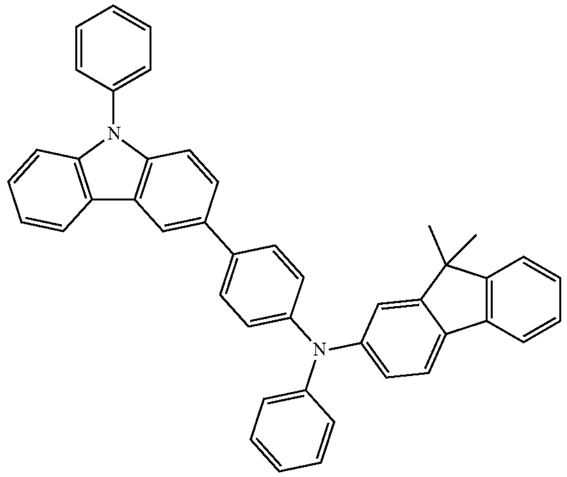

HT2

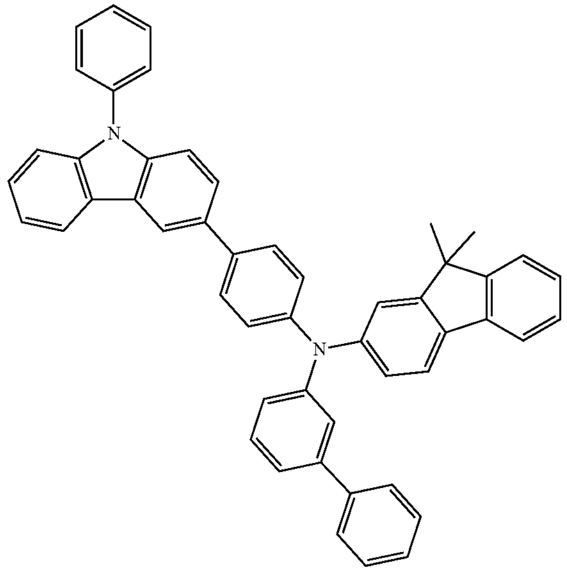

-continued
HT3
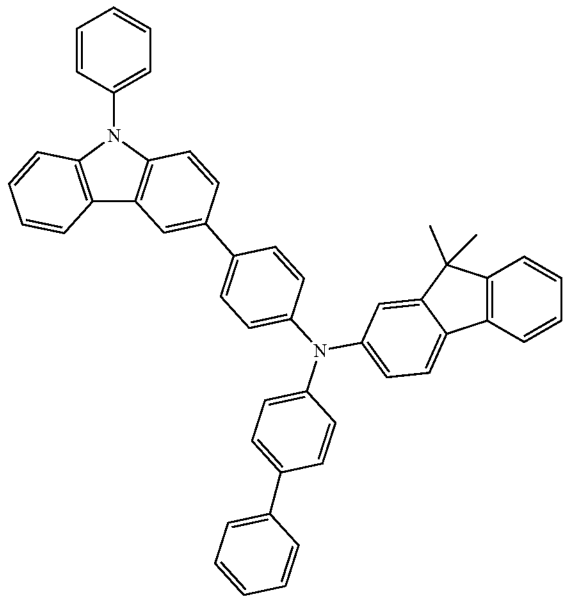
HT4
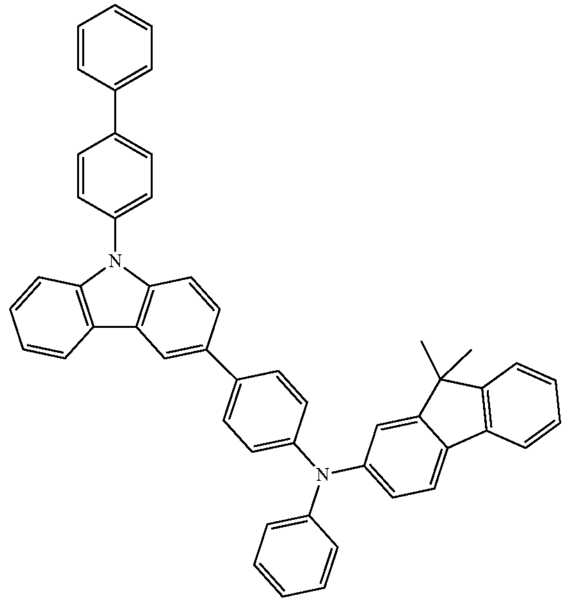
-continued
HT5
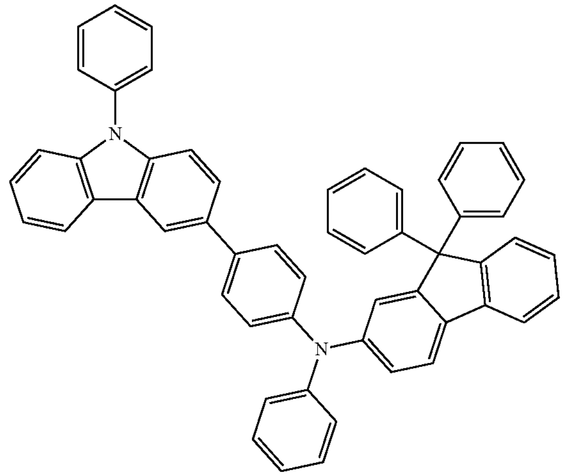
HT6
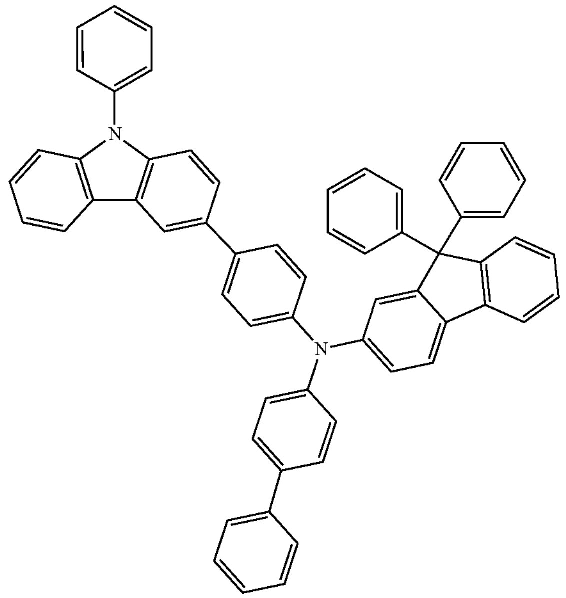

-continued
HT7
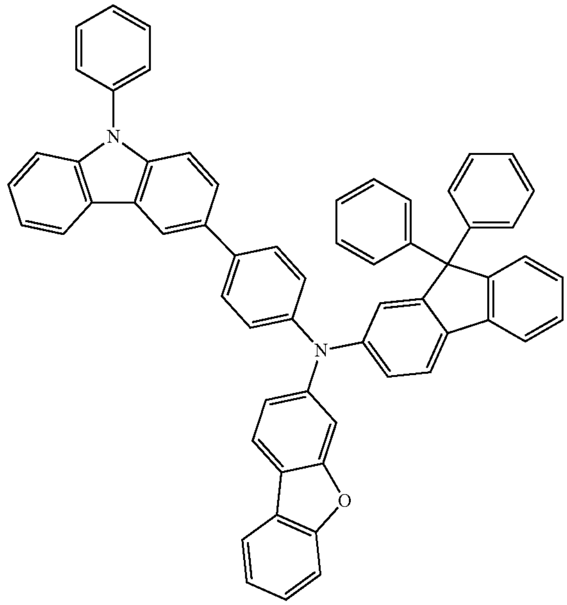
HT8
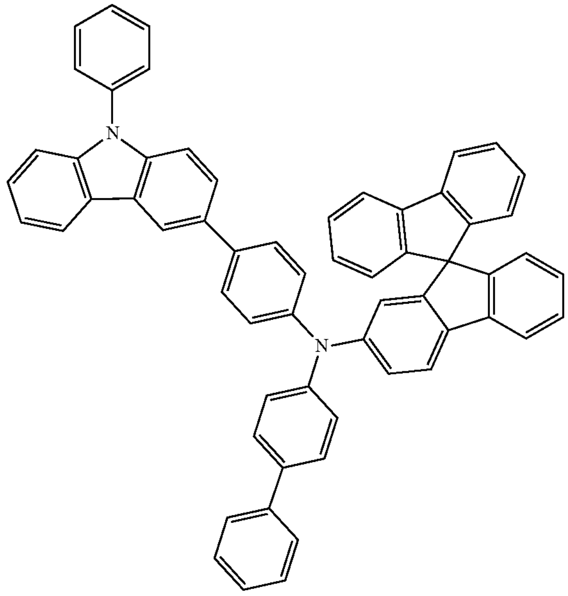
-continued
HT9
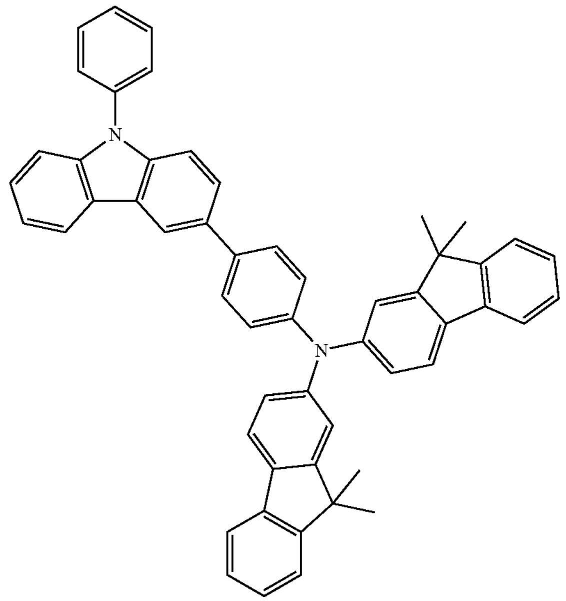
HT10
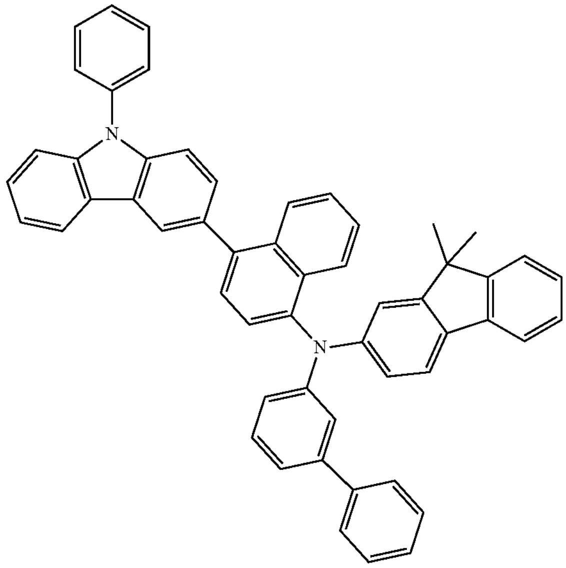

-continued
HT11
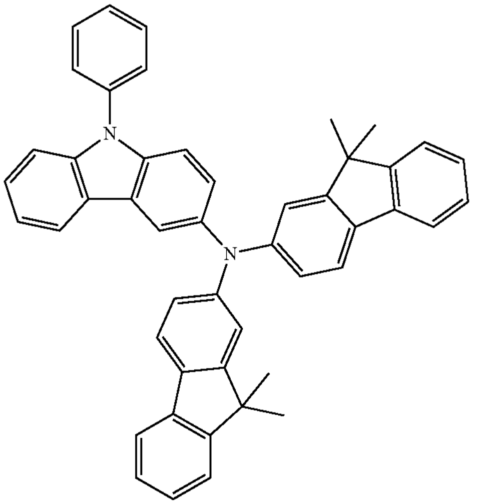
HT12
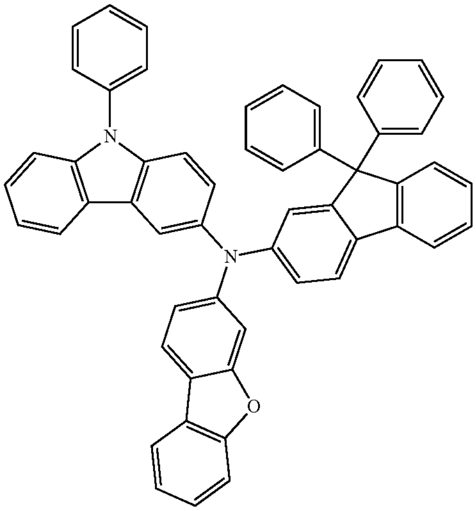
HT13
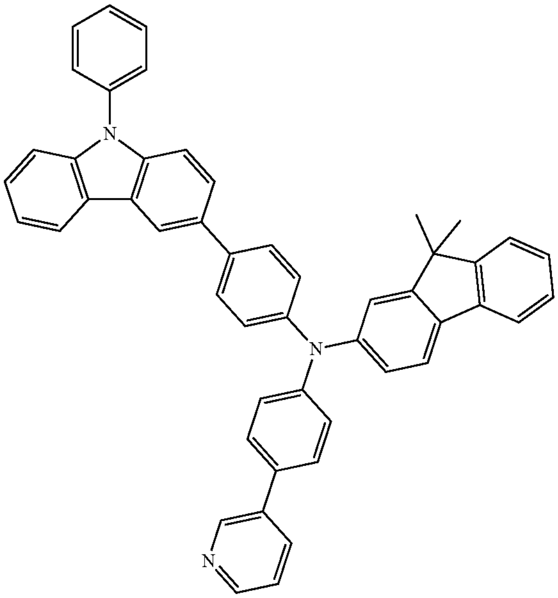
-continued
HT14
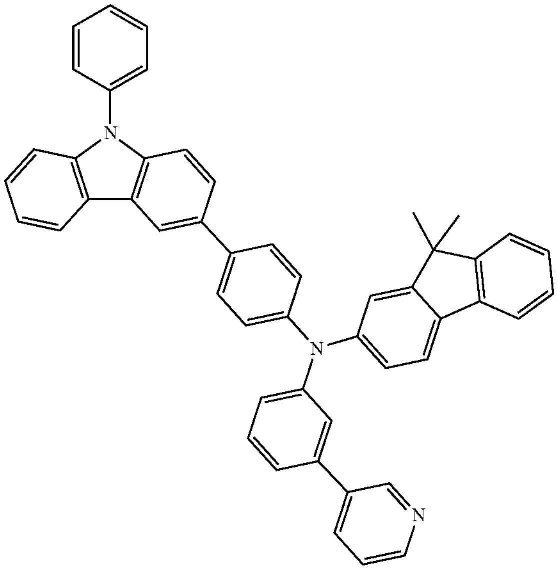
HT15
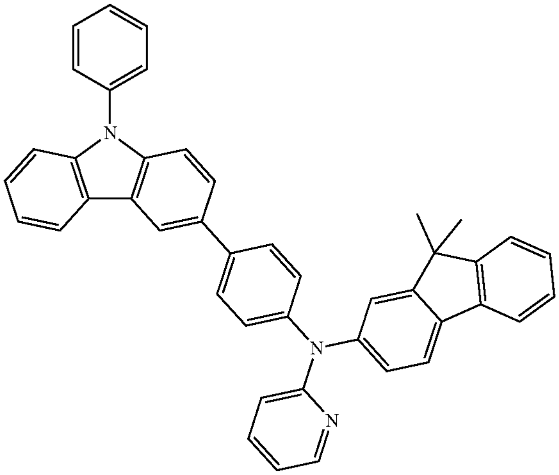
HT16
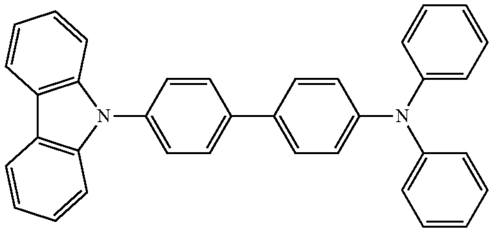

-continued
HT17
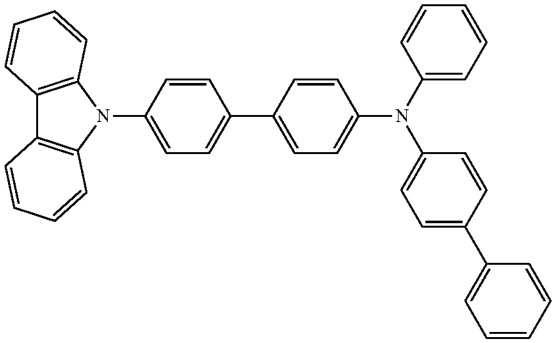
HT18
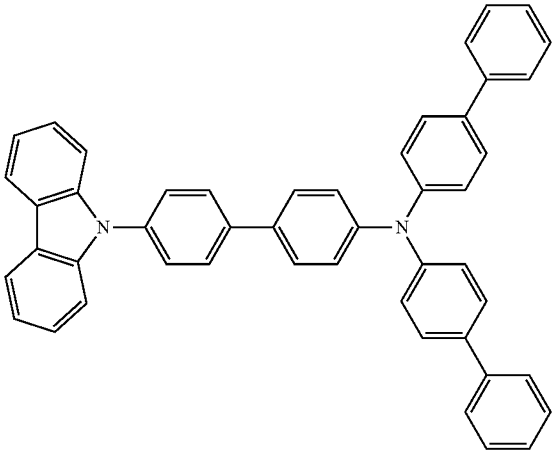
HT19
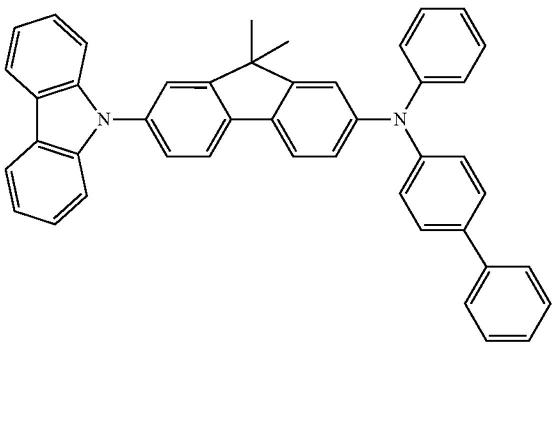
-continued
HT20
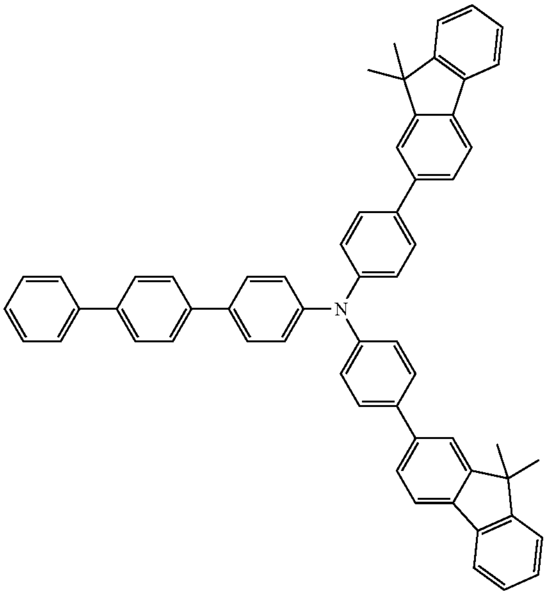
HT21
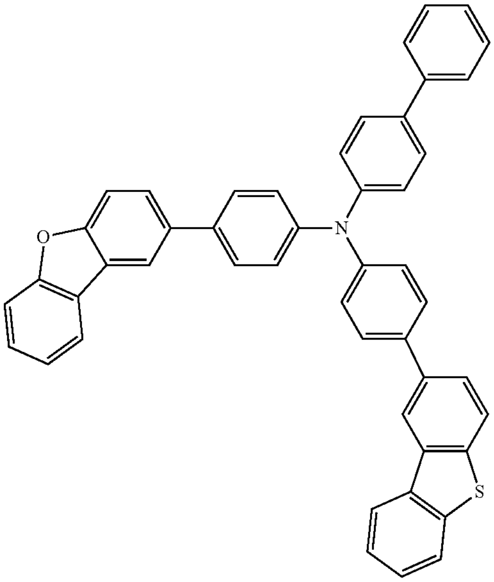
HT22
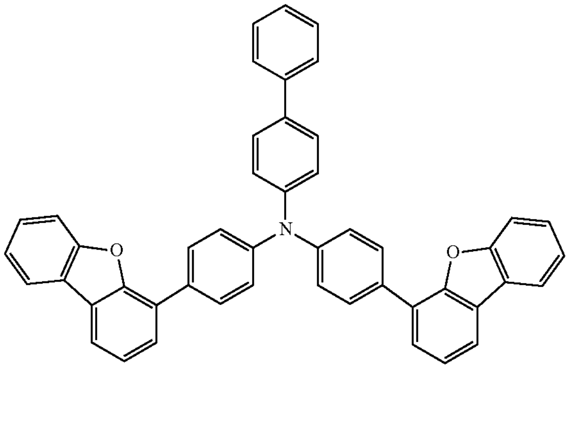

-continued
HT23
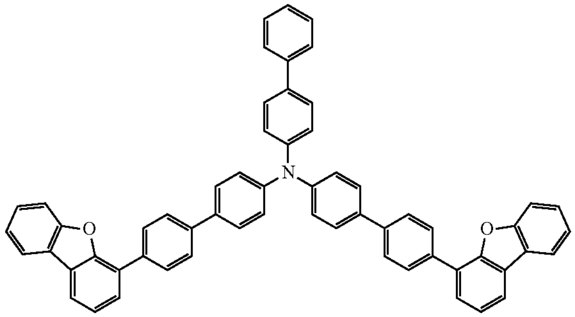
HT24
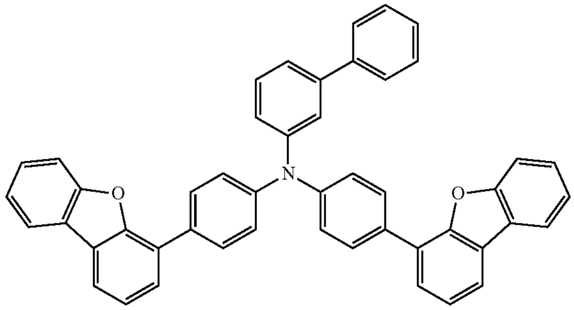
HT25
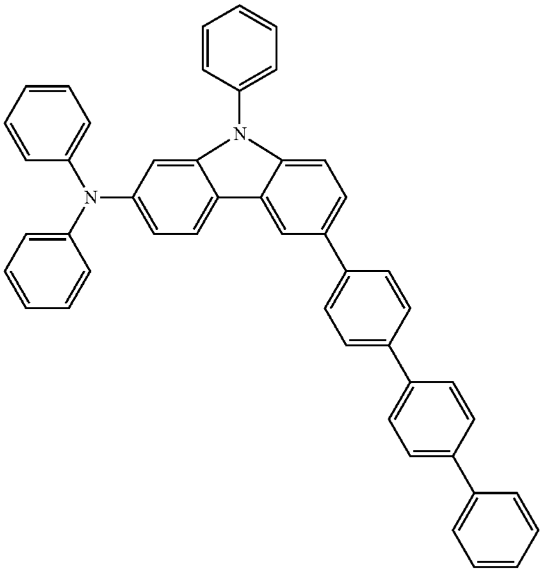
-continued
HT26
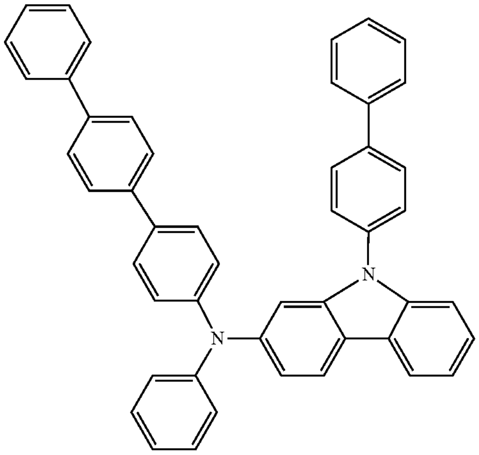
HT27
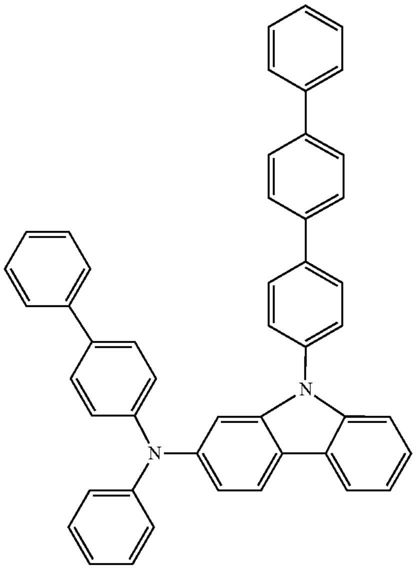
HT28
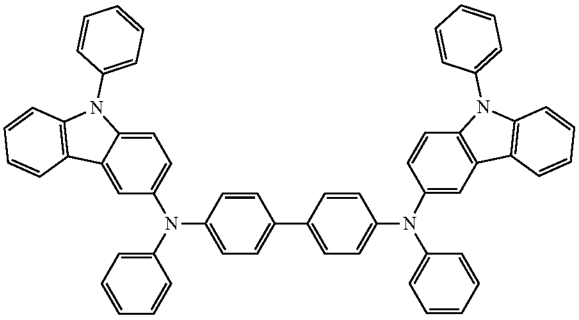

-continued
HT29
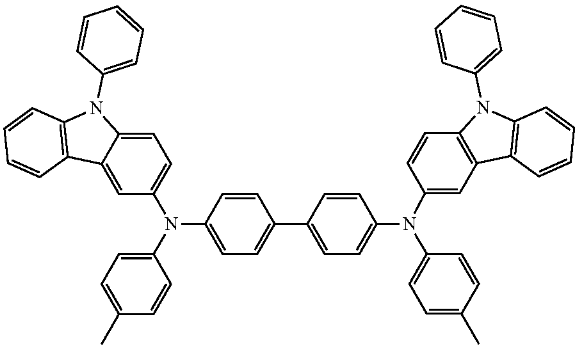
HT30
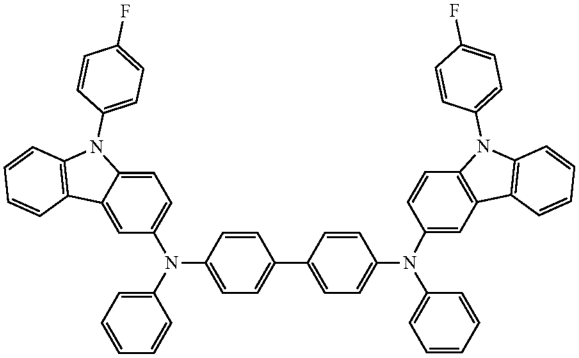
HT31
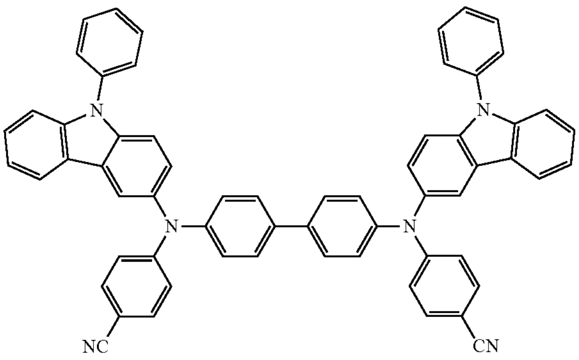
HT32
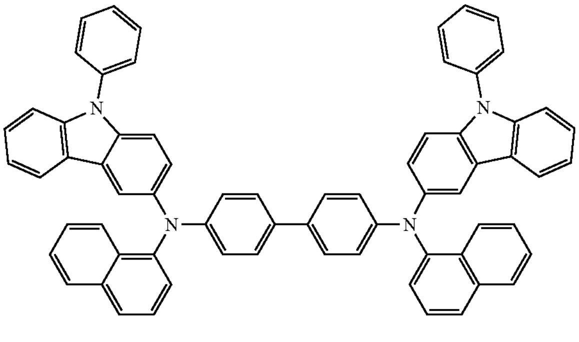
-continued
HT33
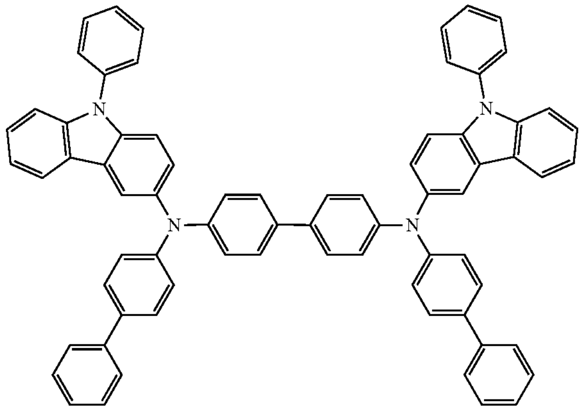
HT34
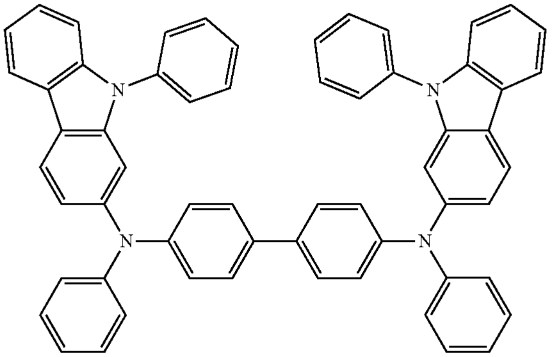
HT35
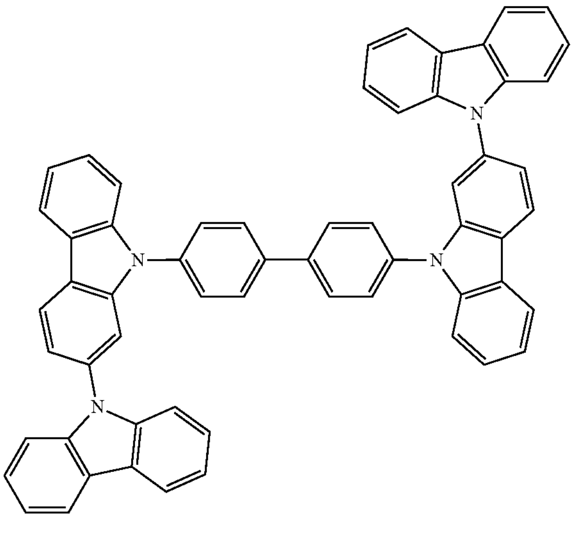

-continued
HT36
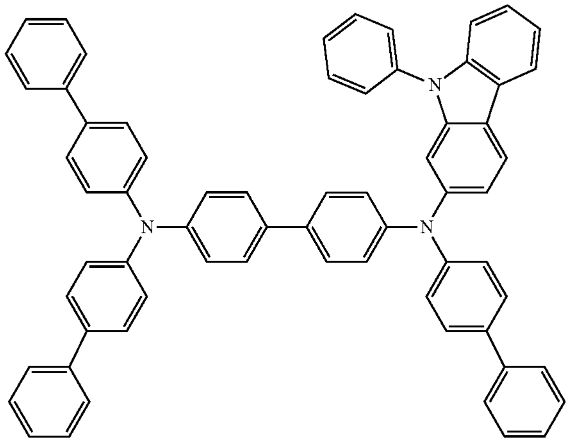
HT37
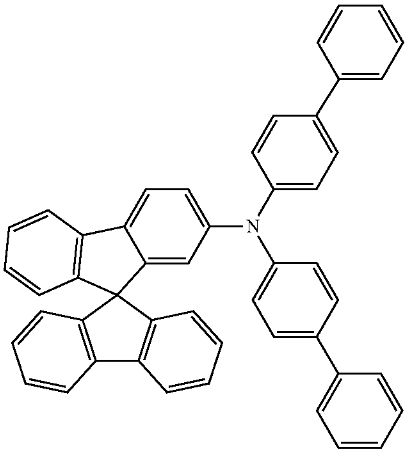
HT38
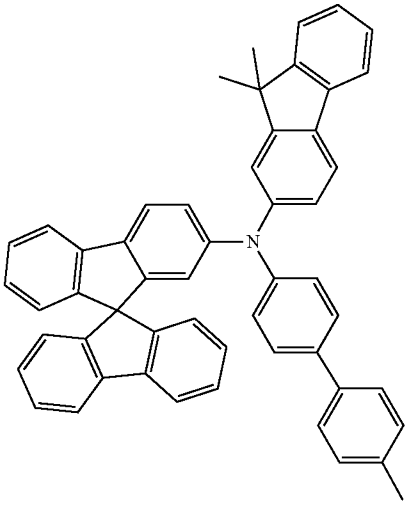
-continued
HT39
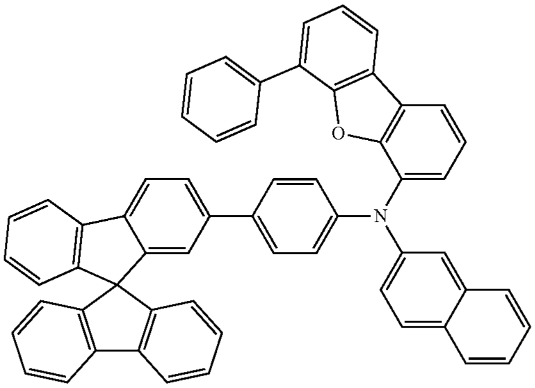
HT40
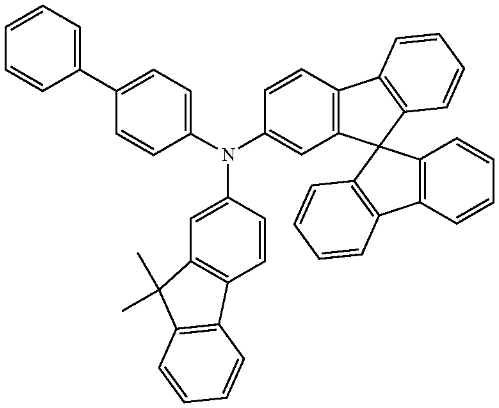
HT41
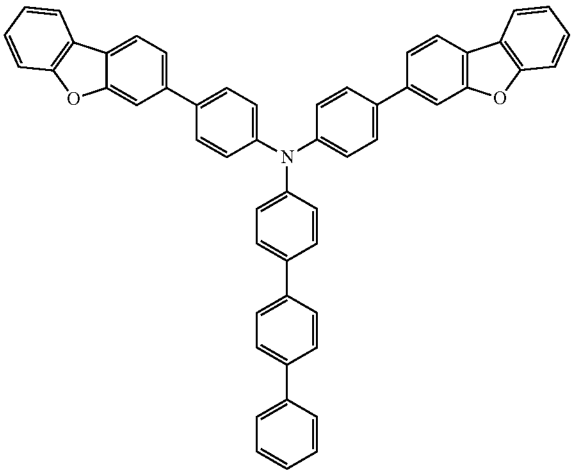
HT42
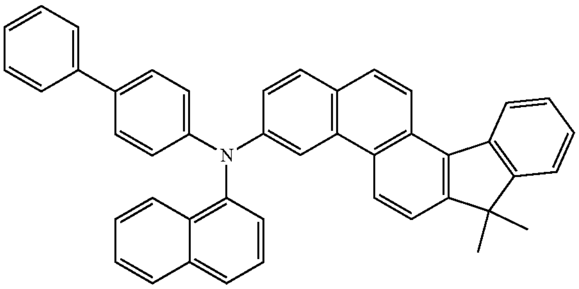

-continued
HT43
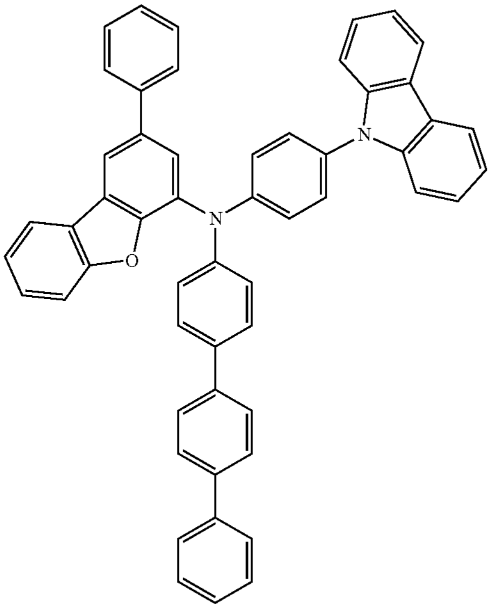
HT44
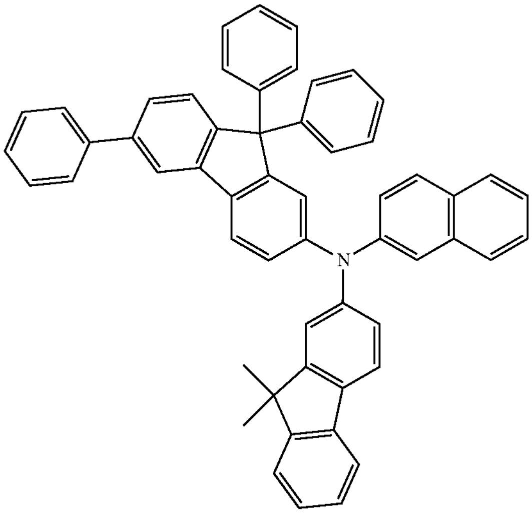
-continued
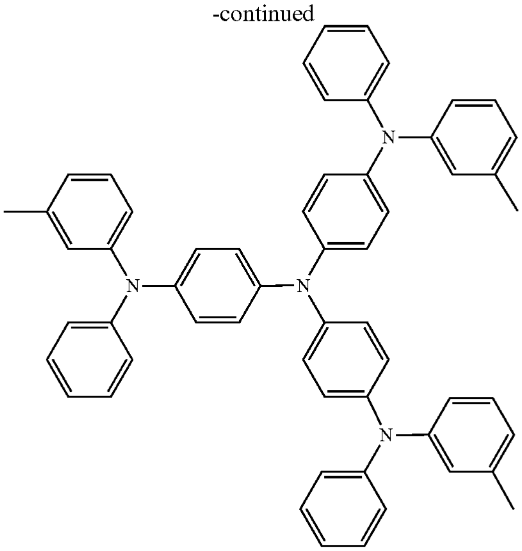
m-MTDATA
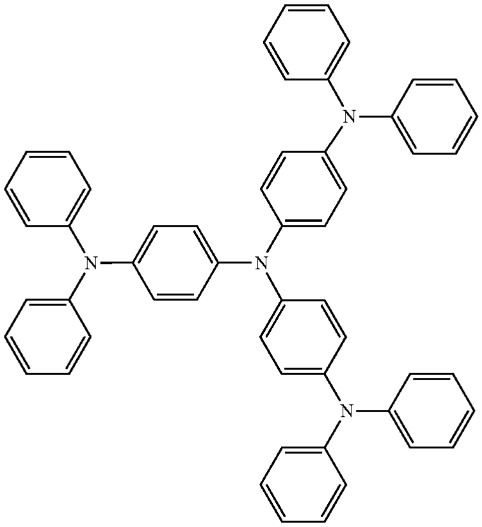
TDATA
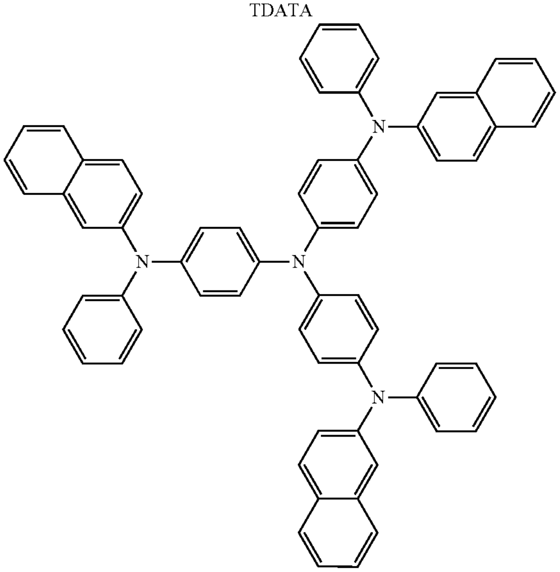
2-TNATA -continued

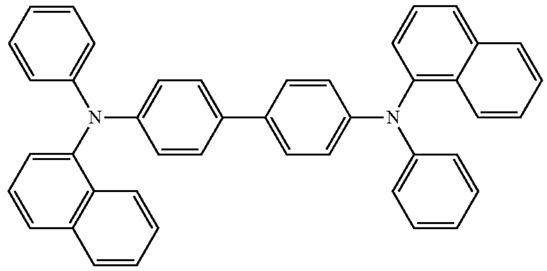

NPB

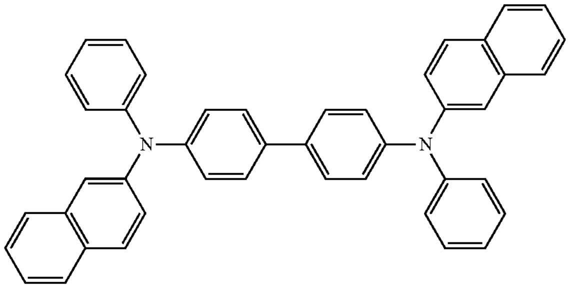

β-NPB

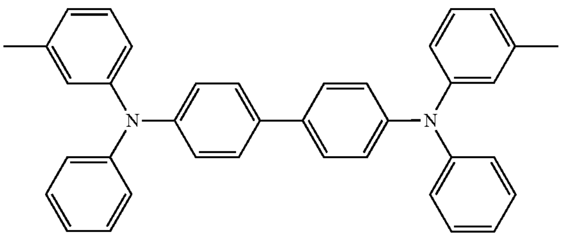

TPD

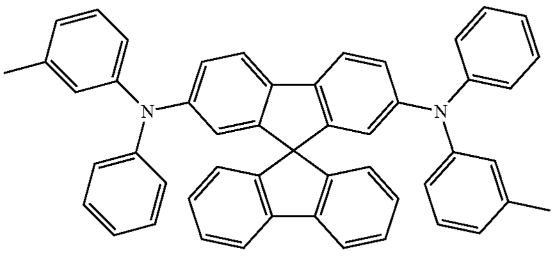

Spiro-TPD

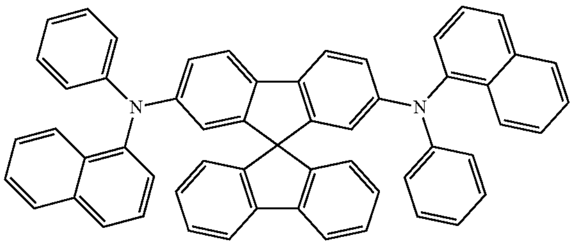

Spiro-NPB

-continued

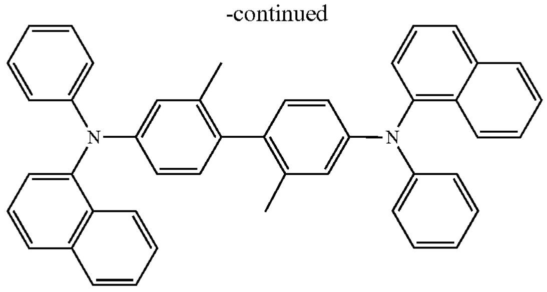

methylated-NPB

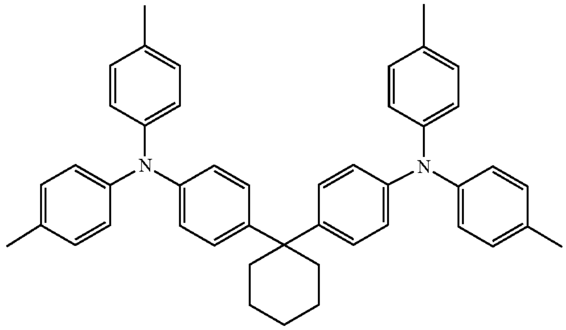

TAPC

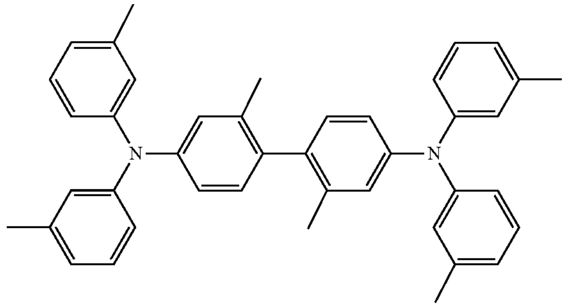

HMTPD

The thickness of the hole transport region may be in a range of about 50 (Angstroms) Å to about 10,000 Å, and in some embodiments, about 100 Å to about 4,000 Å. When the hole transport region includes a hole injection layer, a hole transport layer or any combination thereof, a thickness of the hole injection layer may be in a range of about 100 Å to about 9,000 Å, for example, about 100 Å to about 1,000 Å, and a thickness of the hole transport may be in a range of about 50 Å to about 2,000 Å, for example, about 100 Å to about 1,500 Å. When the thicknesses of the hole transport region, the hole injection layer, and the hole transport layer are within any of these ranges, excellent hole transport characteristics may be obtained without a substantial increase in driving voltage.

The emission auxiliary layer may increase light emission efficiency by compensating for an optical resonance distance according to the wavelength of light emitted by an emission layer. The electron blocking layer may reduce or eliminate the flow of electrons from an electron transport region. The emission auxiliary layer and the electron blocking layer may include the aforementioned materials.

p-Dopant

The hole transport region may include a charge generating material as well as the aforementioned materials, to improve conductive properties (e.g., electrically conductive properties) of the hole transport region. The charge generating material may be substantially homogeneously or non-homogeneously dispersed (for example, as a single layer including (e.g., consisting of) charge generating material) in the hole transport region.

The charge generating material may include, for example, a p-dopant.

In some embodiments, a lowest unoccupied molecular orbital (LUMO) energy level of the p-dopant may be −3.5 eV or less.

In some embodiments, the p-dopant may include a quinone derivative, a cyano group-containing compound, elements EL1 and EL2-containing compound, or any combination thereof.

Examples of the quinone derivative may include TCNQ, F4-TCNQ, and the like.

Examples of the cyano group-containing compound include HAT-CN, a compound represented by Formula 221, and the like:

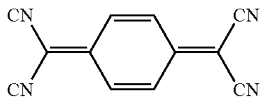

TCNQ

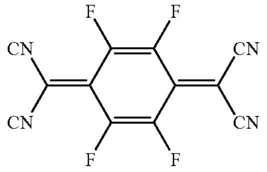

F4-TCNQ

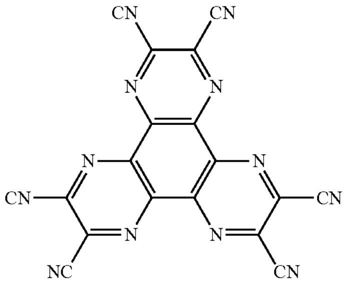

HAT-CN

Formula 221

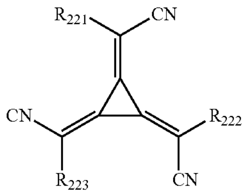

wherein, in Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, at least one of $R_{221}$ to $R_{223}$ may each independently be: a $C_3$-$C_{60}$ carbocyclic group or a $C_1$-$C_{60}$ heterocyclic group, substituted with a cyano group; —F; —Cl; —Br; —I; a $C_1$-$C_{20}$ alkyl group substituted with a cyano group, —F, —Cl, —Br, —I, or any combination thereof; or any combination thereof.

In the elements EL1 and EL2-containing compound, element EL1 may be a metal, a metalloid, or a combination thereof, and element EL2 may be non-a metal, a metalloid, or a combination thereof.

Examples of the metal may include: an alkali metal (e.g., lithium (Li), sodium (Na), potassium (K), rubidium (Rb), cesium (Cs), and/or the like); an alkaline earth metal (e.g., beryllium (Be), magnesium (Mg), calcium (Ca), strontium (Sr), barium (Ba), and/or the like); a transition metal (e.g., titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), and/or the like); post-transition metal (e.g., zinc (Zn), indium (In), tin (Sn), and/or the like); a lanthanide metal (e.g., lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), and/or the like); and the like.

Examples of the metalloid may include silicon (Si), antimony (Sb), tellurium (Te), and the like.

Examples of the non-metal may include oxygen (O), halogen (e.g., F, Cl, Br, I, and the like), and the like.

For example, the elements EL1 and EL2-containing compound may include a metal oxide, a metal halide (e.g., metal fluoride, metal chloride, metal bromide, metal iodide, and the like), a metalloid halide (e.g., a metalloid fluoride, a metalloid chloride, a metalloid bromide, a metalloid iodide, and the like), a metal telluride, or any combination thereof.

Examples of the metal oxide may include tungsten oxide (e.g., WO, $W_2O_3$, $WO_2$, $WO_3$, $W_2O_5$, and the like), vanadium oxide (e.g., VO, $V_2O_3$, $VO_2$, $V_2O_5$, and the like), molybdenum oxide (MoO, $Mo_2O_3$, $MoO_2$, $MoO_3$, $Mo_2O_5$, and the like), rhenium oxide (e.g., $ReO_3$, and the like), and the like.

Examples of the metal halide may include alkali metal halide, alkaline earth metal halide, transition metal halide, post-transition metal halide, lanthanide metal halide, and the like.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, CsI, and the like.

Examples of the alkaline earth metal halide may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, $BaI_2$, and the like.

Examples of the transition metal halide may include titanium halide (e.g., $TiF_4$, $TiCl_4$, $TiBr_4$, $TiI_4$, and the like), zirconium halide (e.g., $ZrF_4$, $ZrCl_4$, $ZrBr_4$, $ZrI_4$, and the like), hafnium halide (e.g., $HfF_4$, $HfCl_4$, $HfBr_4$, $HfI_4$, and the like), vanadium halide (e.g., $VF_3$, $VCl_3$, $VBr_3$, $VI_3$, and the like), niobium halide (e.g., $NbF_3$, $NbCl_3$, $NbBr_3$, $NbI_3$, and the like), tantalum halide (e.g., $TaF_3$, $TaCl_3$, $TaBr_3$, $TaI_3$, and the like), chromium halide (e.g., $CrF_3$, $CrC_{13}$, $CrBr_3$, $Cr_{13}$, and the like), molybdenum halide (e.g., $MoF_3$, $MoCl_3$, $MoBr_3$, $MoI_3$, and the like), tungsten halide (e.g., $WF_3$, $WCl_3$, $WBr_3$, $W_{13}$, and the like), manganese halide (e.g., $MnF_2$, $MnCl_2$, $MnBr_2$, $MnI_2$, and the like), technetium halide (e.g., $TcF_2$, $TcCl_2$, $TcBr_2$, $TcI_2$, and the like), rhenium halide (e.g., $ReF_2$, $ReCl_2$, $ReBr_2$, $ReI_2$, and the like), iron halide (e.g., $FeF_2$, $FeCl_2$, $FeBr_2$, $FeI_2$, and the like), ruthenium halide (e.g., $RuF_2$, $RuCl_2$, $RuBr_2$, $RuI_2$, and the like), osmium halide (e.g., $OsF_2$, $OSCl_2$, $OsBr_2$, $OsI_2$, and the like), cobalt halide (e.g., $CoF_2$, $COCl_2$, $CoBr_2$, $CoI_2$, and the like), rhodium halide (e.g., $RhF_2$, $RhCl_2$, $RhBr_2$, $RhI_2$, and the like), iridium halide (e.g., $IrF_2$, $IrCl_2$, $IrBr_2$, $IrI_2$, and the like), nickel halide (e.g., $NiF_2$, $NiCl_2$, $NiBr_2$, $NiI_2$, and the like), palladium halide (e.g., $PdF_2$, $PdCl_2$, $PdBr_2$, $PdI_2$, and the like), platinum halide (e.g., $PtF_2$, $PtCl_2$, $PtBr_2$, $PtI_2$, and the like), copper halide (e.g., CuF, CuCl, CuBr, CuI, and the like), silver halide (e.g., AgF, AgCl, AgBr, AgI, and the like), gold halide (e.g., AuF, AuCl, AuBr, AuI, and the like), and the like.

Examples of the post-transition metal halide may include zinc halide (e.g., $ZnF_2$, $ZnCl_2$, $ZnBr_2$, $ZnI_2$, and the like), indium halide (e.g., $InI_3$ and the like), tin halide (e.g., $SnI_2$ and the like), and the like.

Examples of the lanthanide metal halide may include YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, $SmI_3$, and the like.

Examples of the metalloid halide may include antimony halide (e.g., $SbCl_5$ and the like) and the like.

Examples of the metal telluride may include alkali metal telluride (e.g., $Li_2Te$, $Na_2Te$, $K_2Te$, $Rb_2Te$, $Cs_2Te$, and the like), alkaline earth metal telluride (e.g., BeTe, MgTe, CaTe, SrTe, BaTe, and the like), transition metal telluride (e.g., $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, and the like), post-transition metal telluride (e.g., ZnTe and the like), lanthanide metal telluride (e.g., LaTe, CeTe, PrTe, NdTe, PmTe, EuTe, GdTe, TbTe, DyTe, HoTe, ErTe, TmTe, YbTe, LuTe, and the like), and the like.

Emission Layer in Interlayer 130

When the light-emitting device 10 is a full color light-emitting device, the emission layer may be patterned into a red emission layer, a green emission layer, and/or a blue emission layer, according to a sub-pixel. In some embodiments, the emission layer may have a stacked structure. The stacked structure may include two or more layers of a red emission layer, a green emission layer, and a blue emission layer. The two or more layers may be in direct contact (e.g., physical contact) with each other. In some embodiments, the two or more layers may be separated from each other. In one or more embodiments, the emission layer may include two or more materials. The two or more materials may include a red light-emitting material, a green light-emitting material, or a blue light-emitting material. The two or more materials may be mixed together with each other in a single layer. The two or more materials mixed together with each other in the single layer may emit white light.

The emission layer may include a host and a dopant. The dopant may be a phosphorescent dopant, a fluorescent dopant, or any combination thereof.

The amount of the dopant in the emission layer may be in a range of about 0.01 parts to about 15 parts by weight based on 100 parts by weight of the host.

In some embodiments, the emission layer may include quantum dots.

The emission layer may include a delayed fluorescence material. The delayed fluorescence material may serve as a host or a dopant in the emission layer.

The thickness of the emission layer may be in a range of about 100 Å to about 1,000 Å, and in some embodiments, about 200 Å to about 600 Å. When the thickness of the emission layer is within any of these ranges, improved luminescence characteristics may be obtained without a substantial increase in driving voltage.

Host

The host may include a compound represented by Formula 301:

$$[Ar_{301}]_{xb11}\text{-}[(L_{301})_{xb1}\text{-}R_{301}]_{xb21} \qquad \text{Formula 301}$$

wherein, in Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{301})(Q_{302})(Q_{303})$, —$N(Q_{301})(Q_{302})$, —$B(Q_{301})(Q_{302})$, —$C(=O)(Q_{301})$, —$S(=O)_2(Q_{301})$, or —$P(=O)(Q_{301})(Q_{302})$, xb21 may be an integer from 1 to 5, and $Q_{301}$ to $Q_{303}$ may each be understood by referring to the description of $Q_1$ provided herein.

In some embodiments, when xb11 in Formula 301 is 2 or greater, at least two $Ar_{301}$(s) may be bound via a single bond.

In some embodiments, the host may include a compound represented by Formula 301-1, a compound represented by Formula 301-2, or any combination thereof:

Formula 301-1

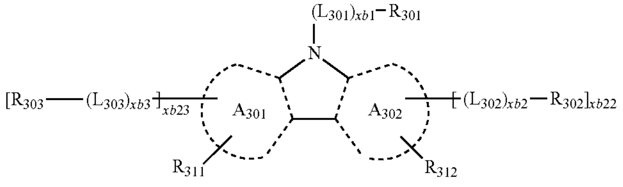

-continued

Formula 301-2

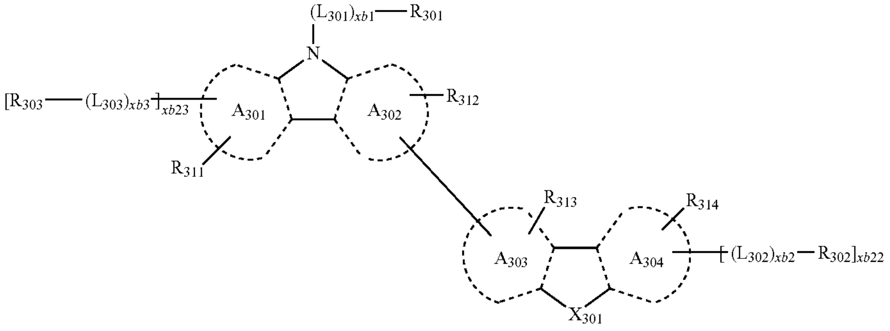

wherein, in Formulae 301-1 to 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[($L_{304}$)xb4-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ may respectively be understood by referring to the descriptions of $L_{301}$, xb1, and $R_{301}$ provided herein, $L_{302}$ to $L_{304}$ may each be understood by referring to the description of $L_{301}$ provided herein, xb2 to xb4 may each be understood by referring to the descriptions of xb1 provided herein, and $R_{302}$ to $R_{305}$ and $R_{311}$ to $R_{314}$ may each be understood by referring to the descriptions of $R_{301}$ provided herein.

In some embodiments, the host may include an alkaline earth metal complex, a post-transition metal complex, or any combination thereof. For example, the host may include a Be complex (e.g., Compound H55), a Mg complex, a Zn complex, or any combination thereof.

In some embodiments, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene TCP or an combination thereof:

H1

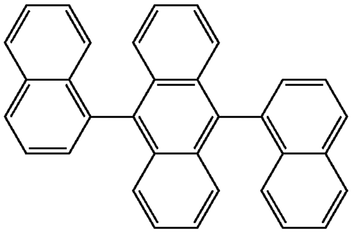

H2

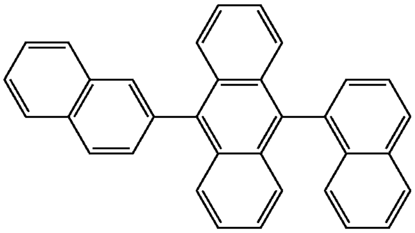

H3

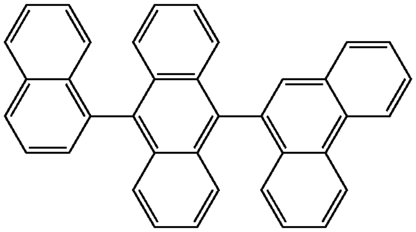

H4

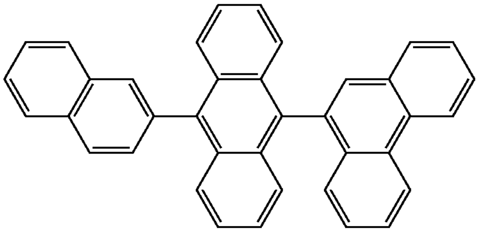

H5

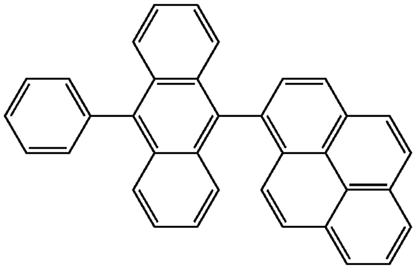

H6

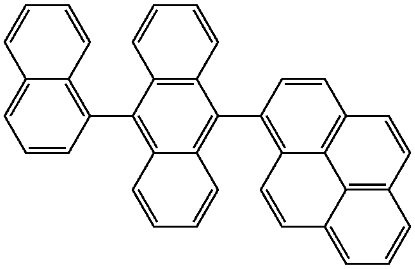

-continued
H7
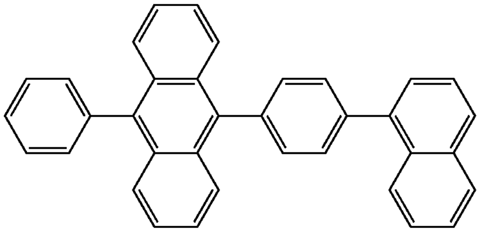
H8
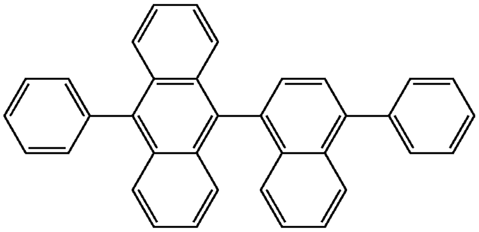
H9
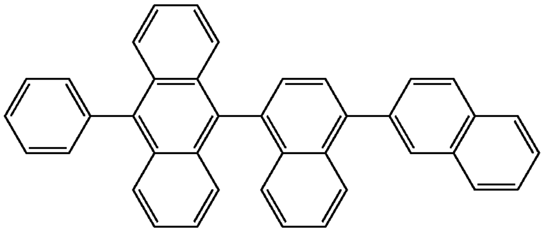
H10
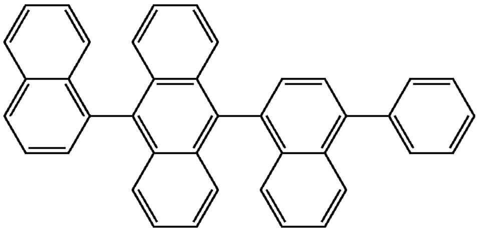
H11
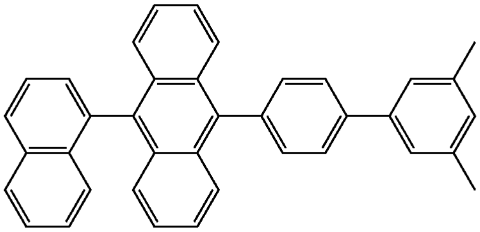
H12
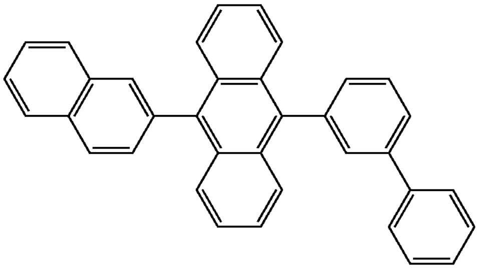
H13
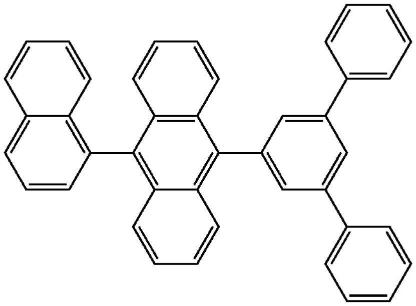
H14
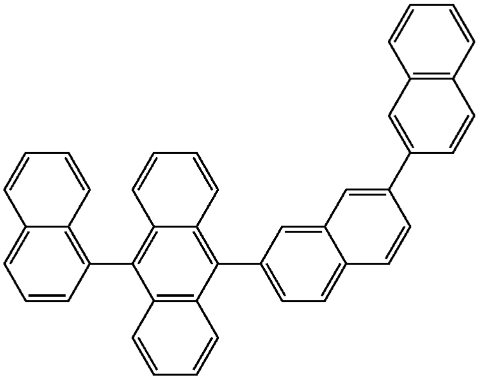
H15
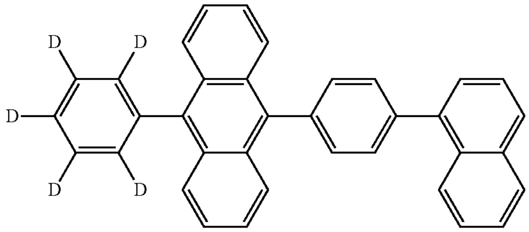
H16
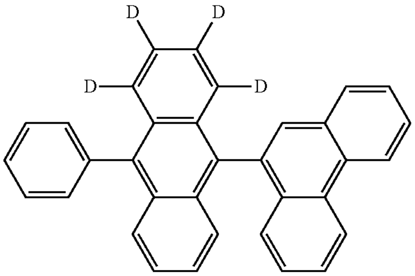

-continued
H17
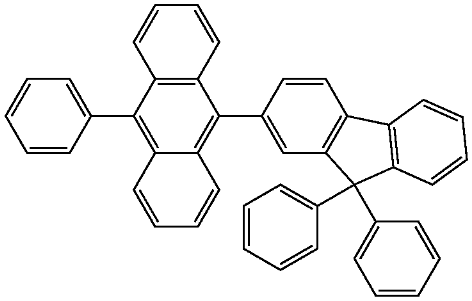
H18
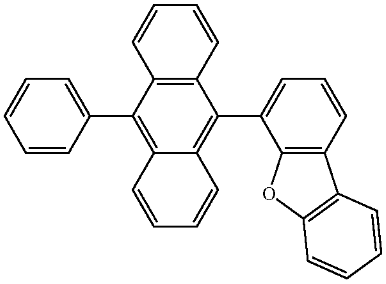
H19
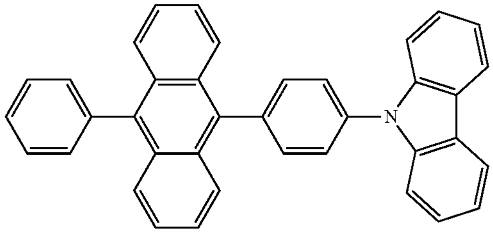
H20
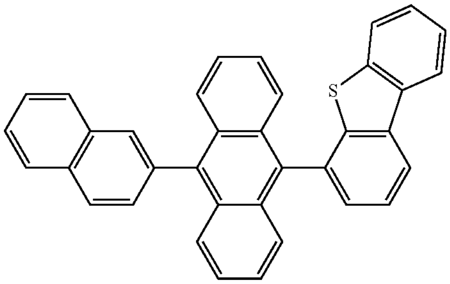
H21
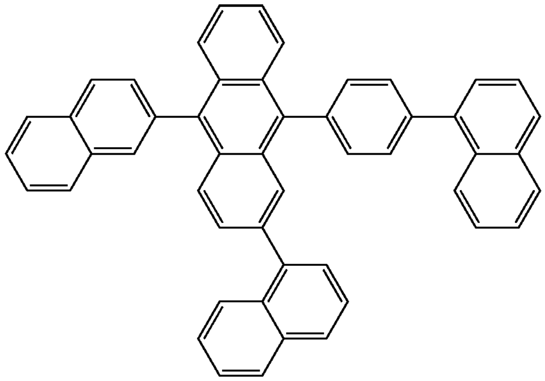
H22
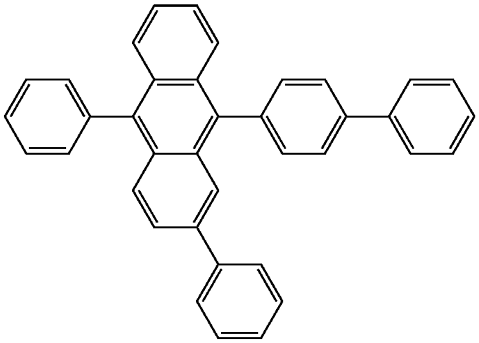
H23
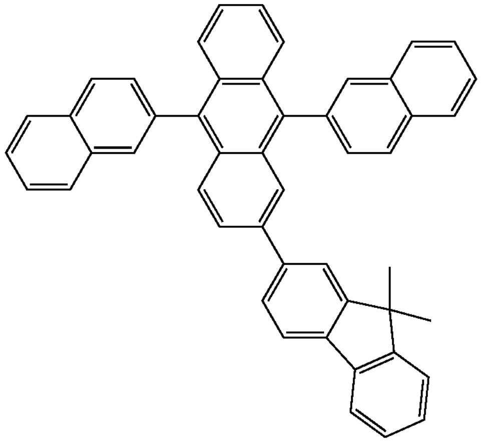
H24
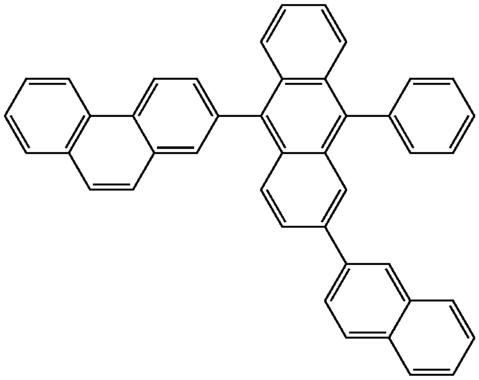

-continued
H25
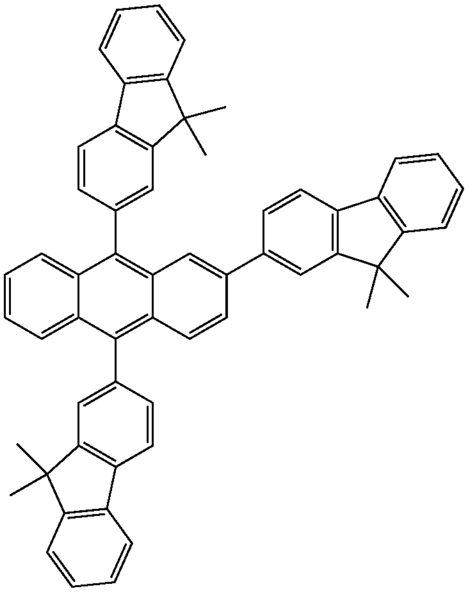
H26
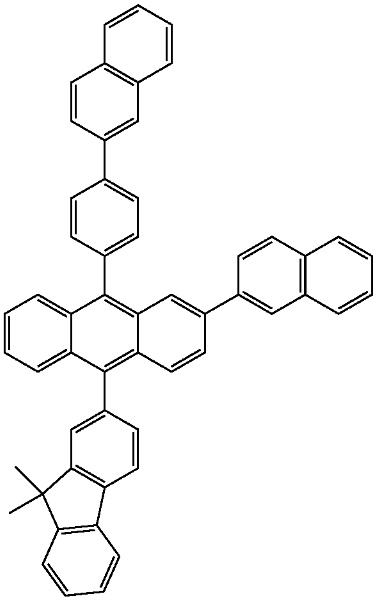
H27
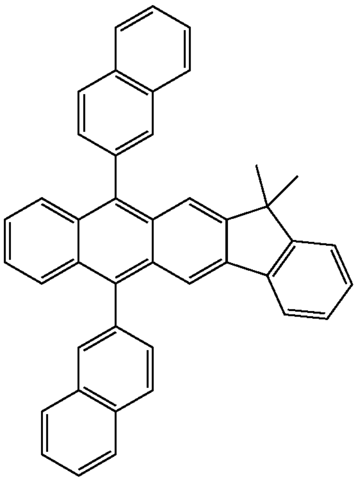
H28
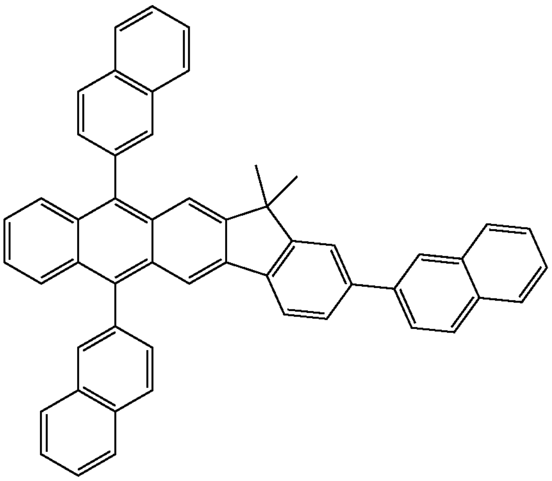
H29
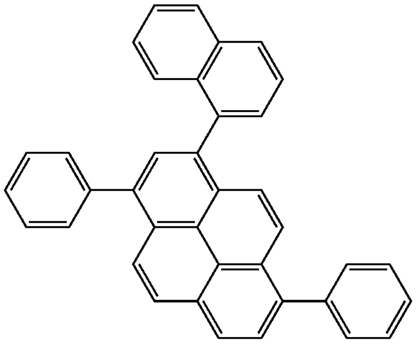
H30
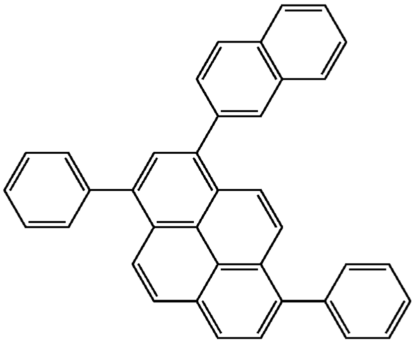

-continued
H31
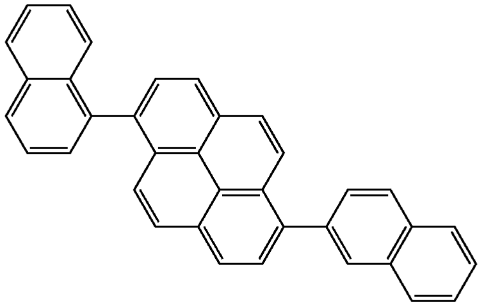
H32
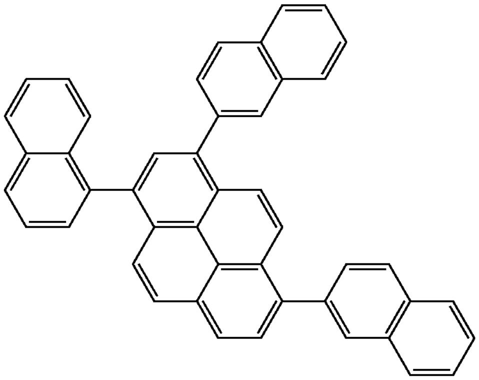
H33
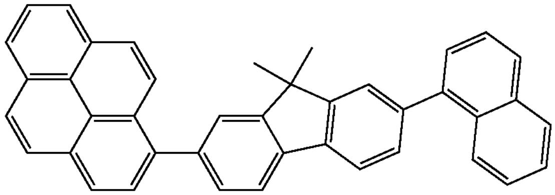
H34
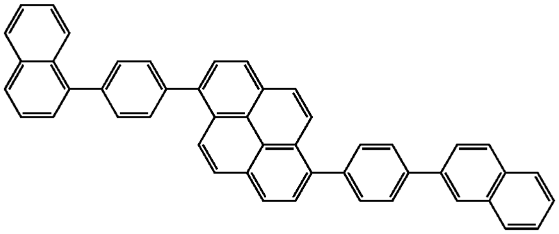
H35
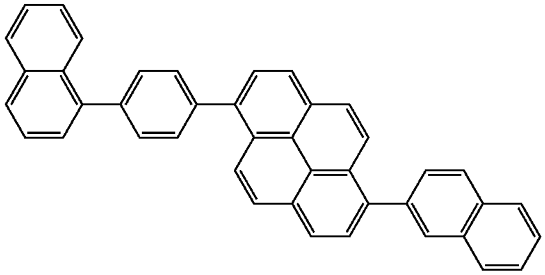
H36
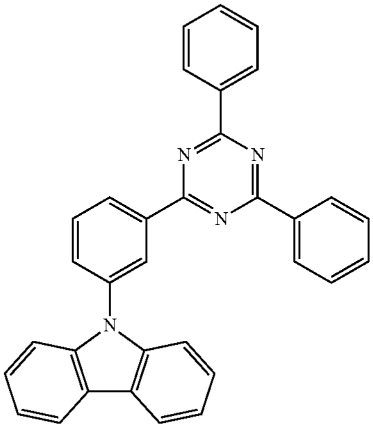
H37
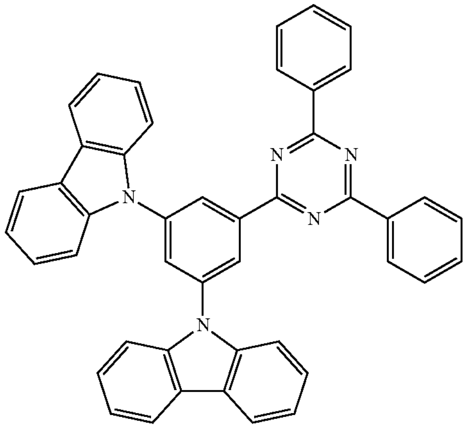
H38
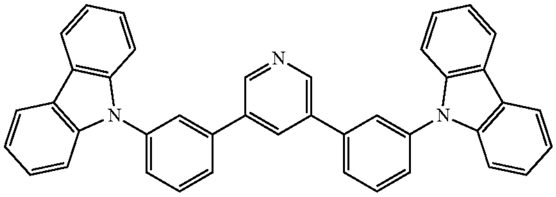

-continued
H39
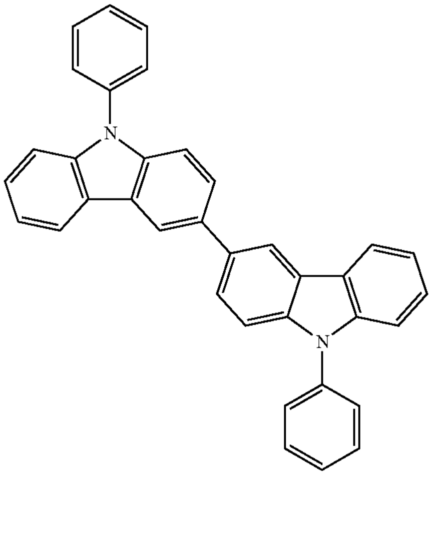
H40
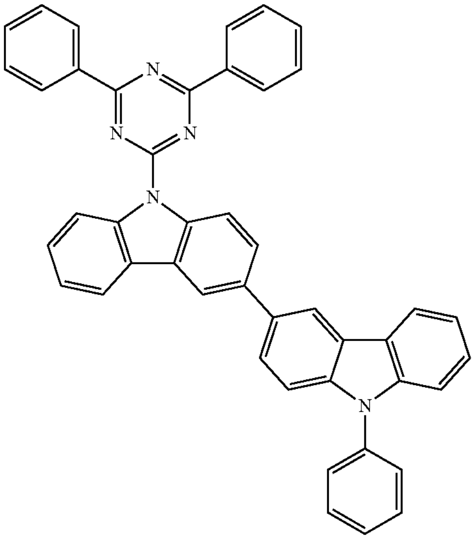
H41
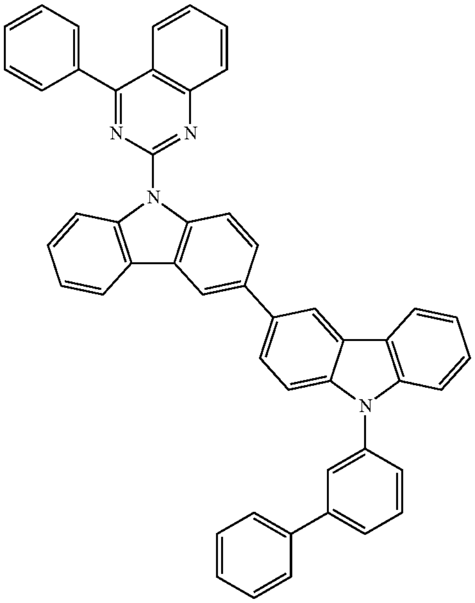
H42
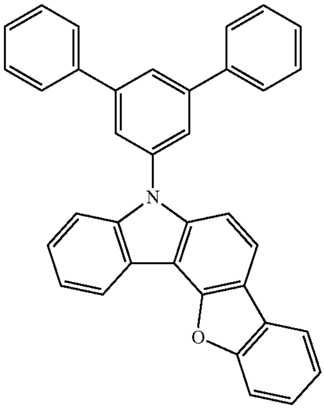
H43
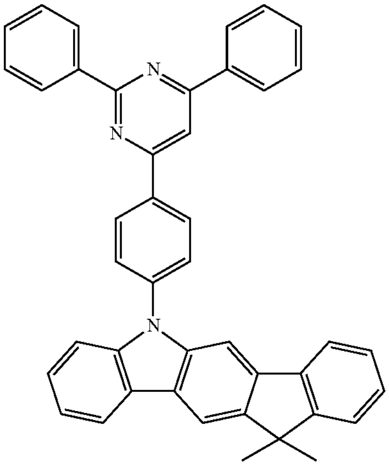
H44
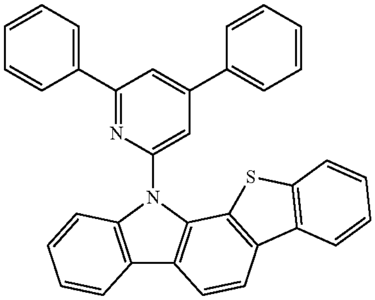

-continued
H45
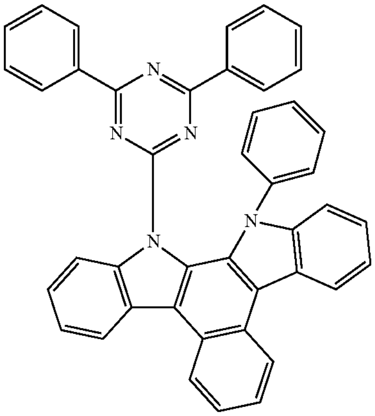
H46
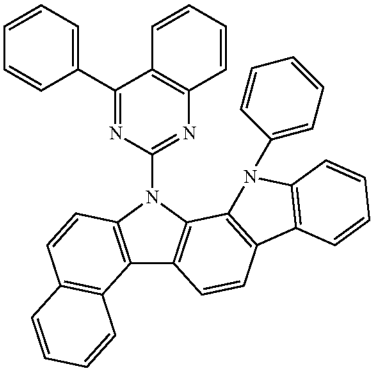
H47
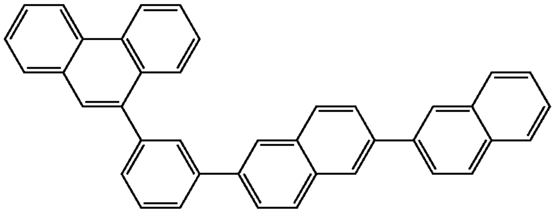
H48
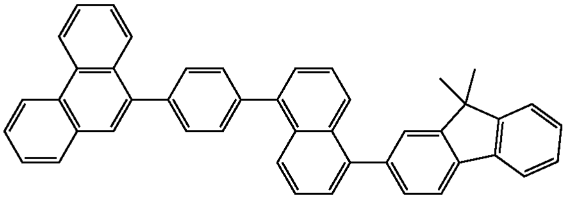
H49
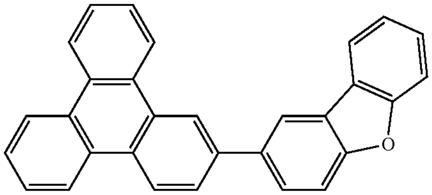
H50
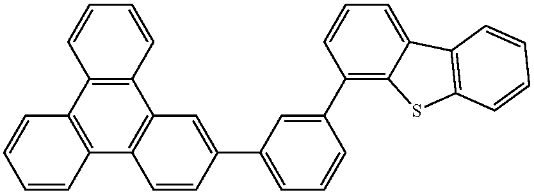
H51
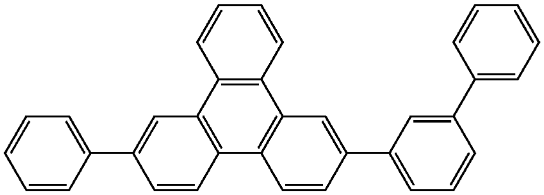
H52
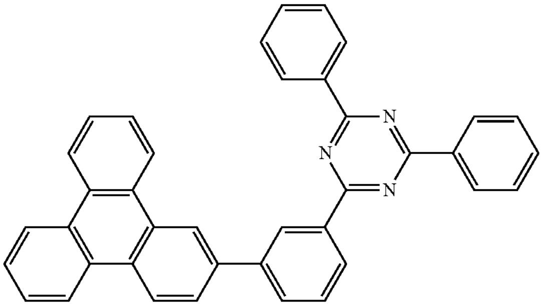
H53
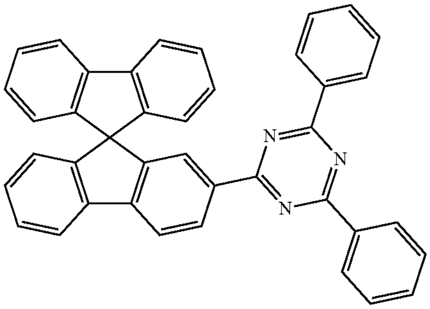
H54
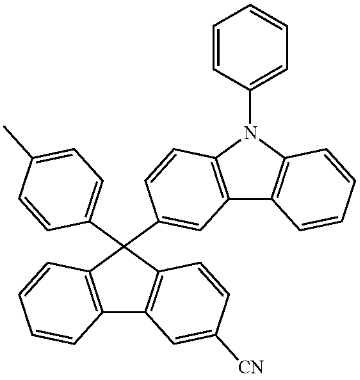

-continued
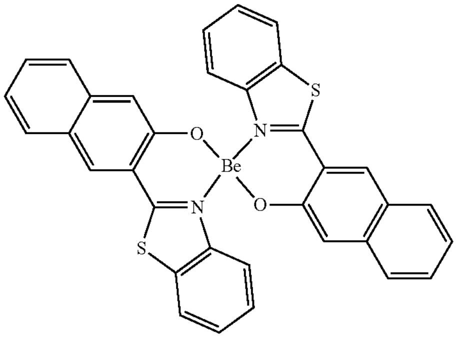
H55
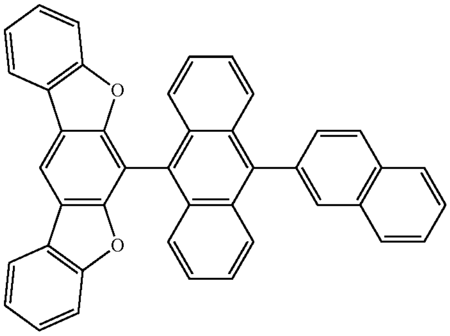
H56
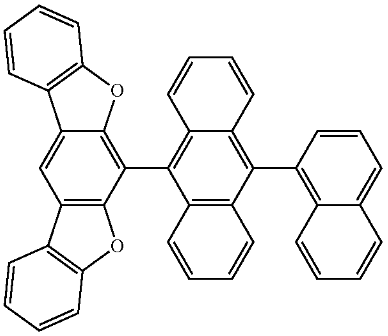
H57
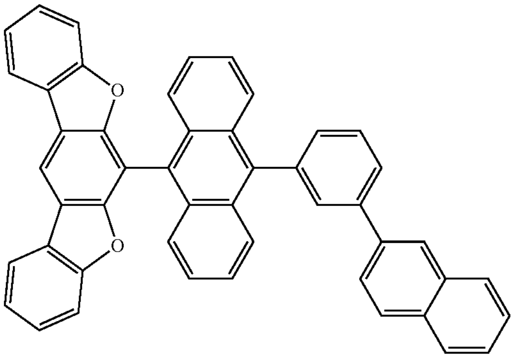
H58
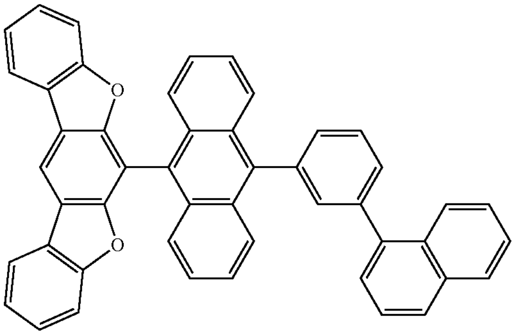
H59
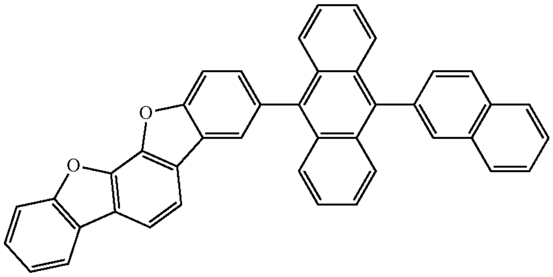
H60
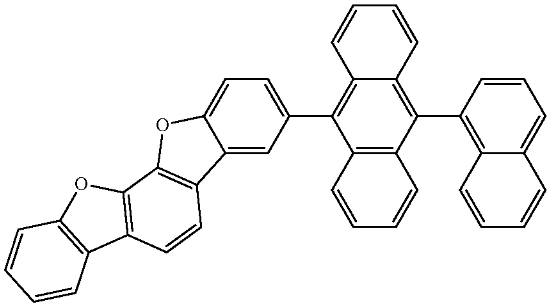
H61
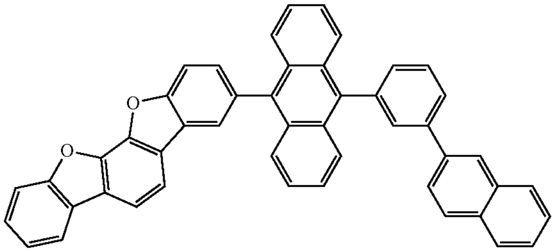
H62

-continued
H63
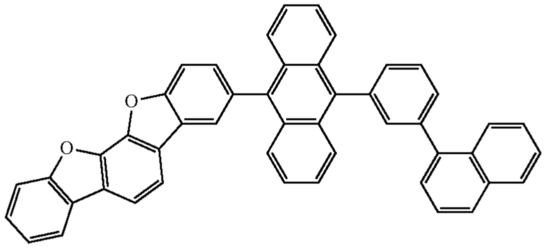
H64
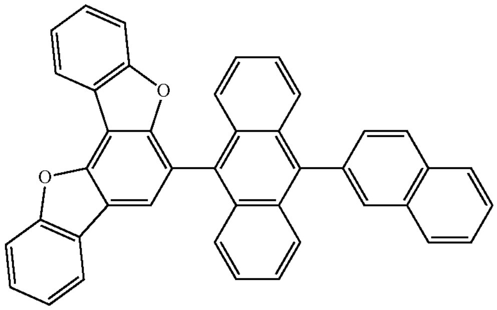
H65
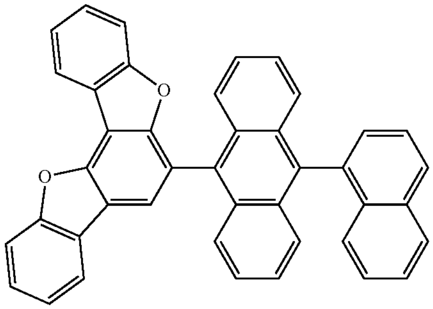
H66
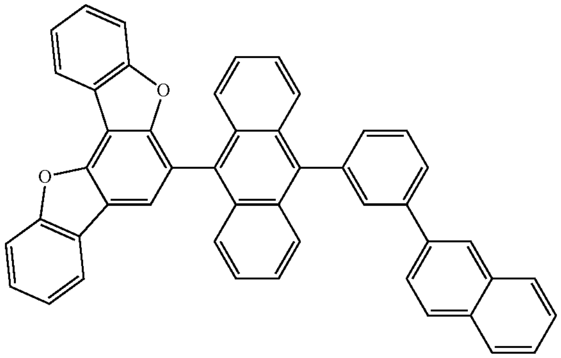
H67
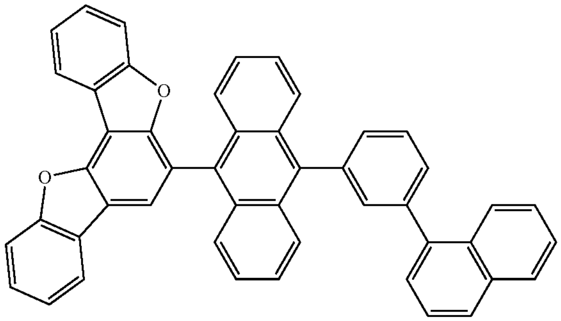
H68
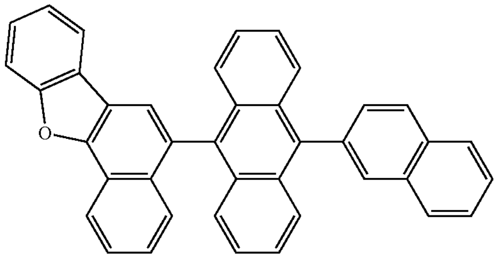
H69
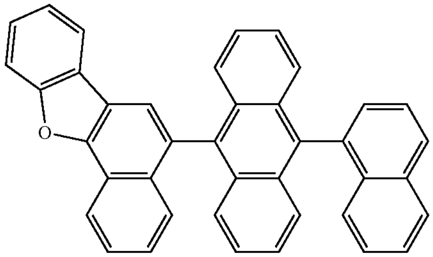
H70
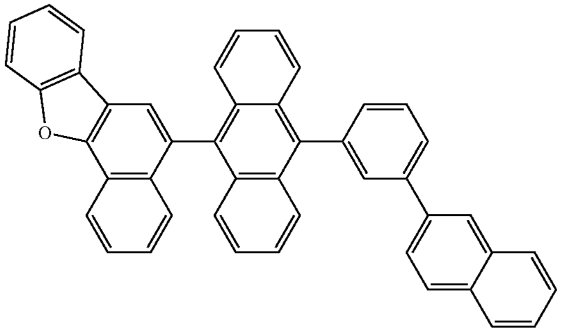

-continued
H71
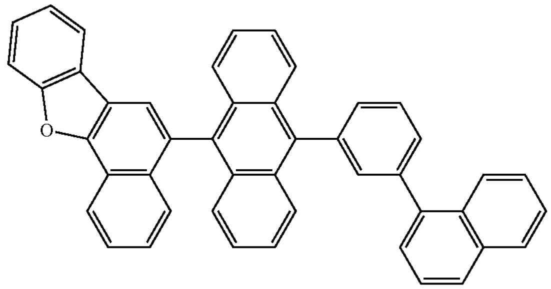
H72
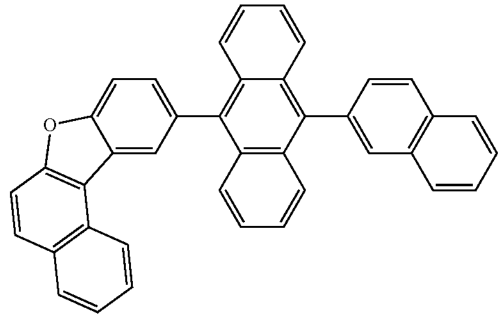
H73
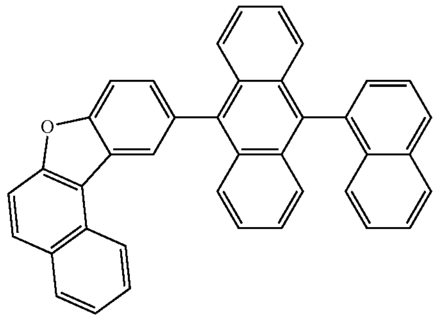
H74
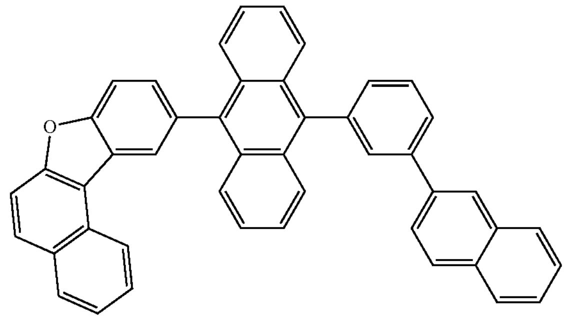
H75
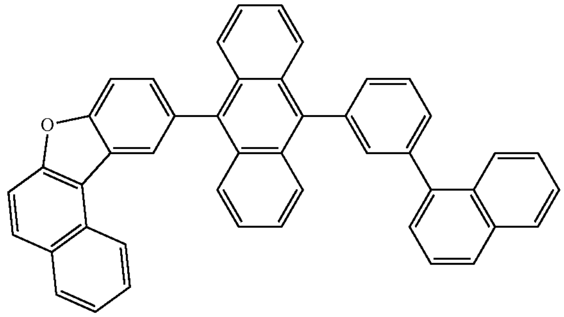
H76
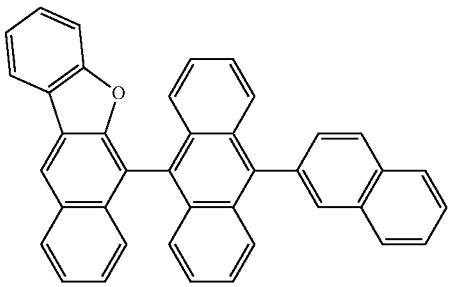
H77
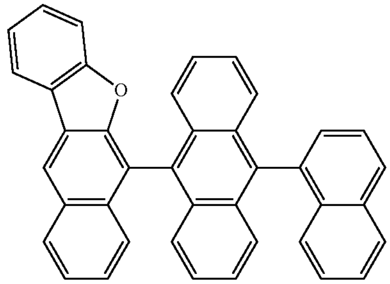
H78
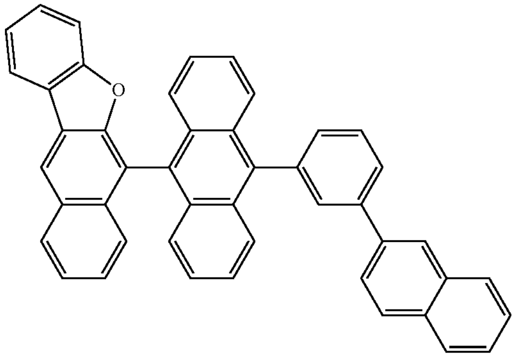

-continued
H79
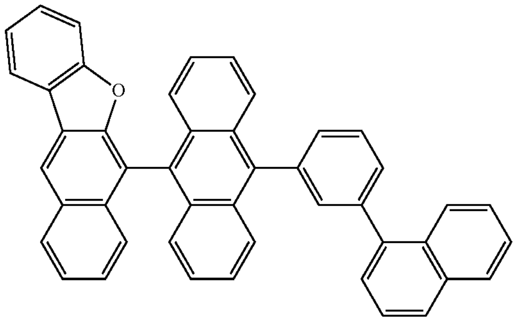
H80
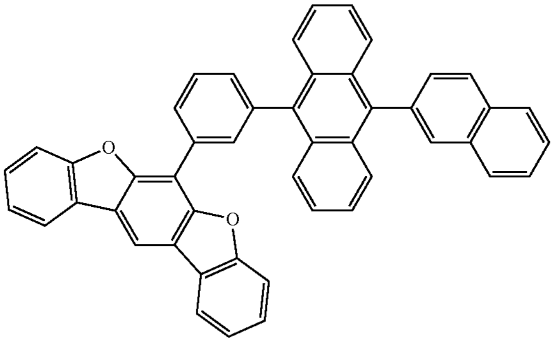
H81
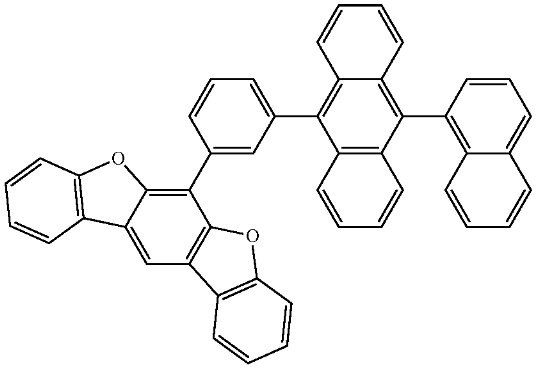
H82
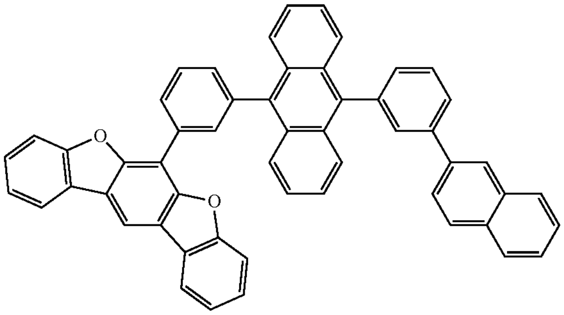
H83
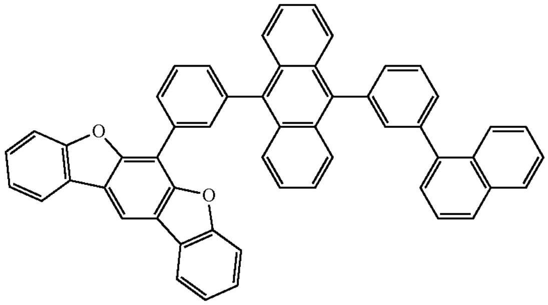
H84
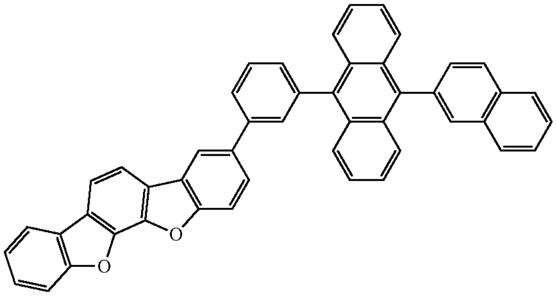
H85
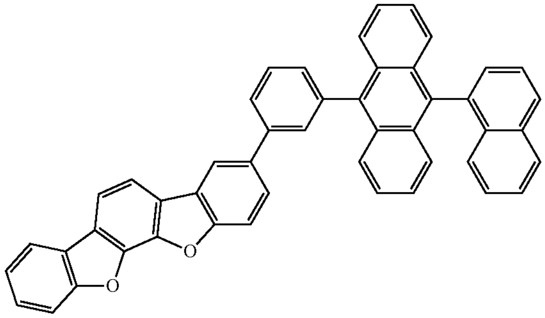
H86
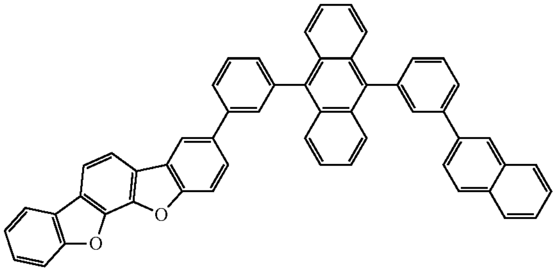

-continued
H87
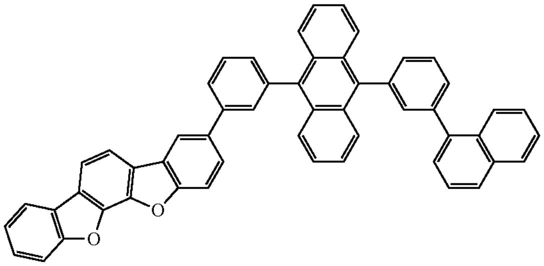
H88
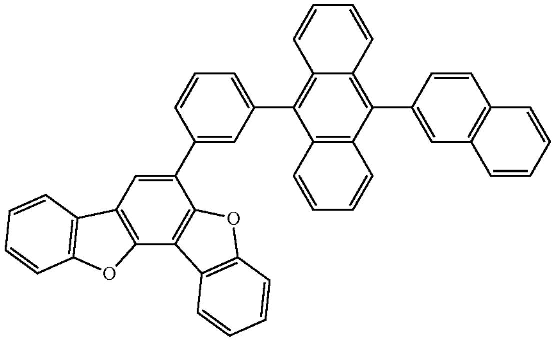
H89
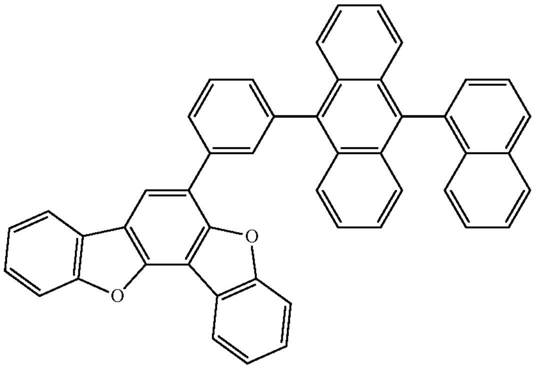
H90
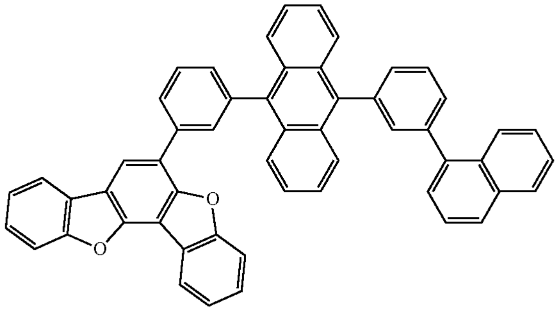
H91
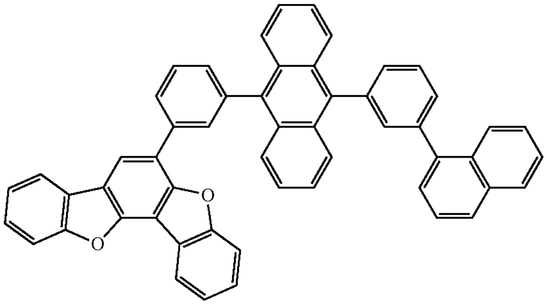
H92
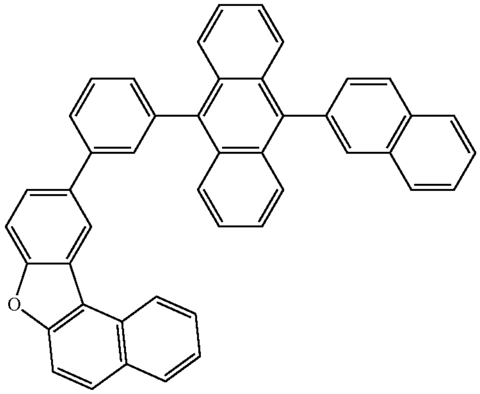
H93
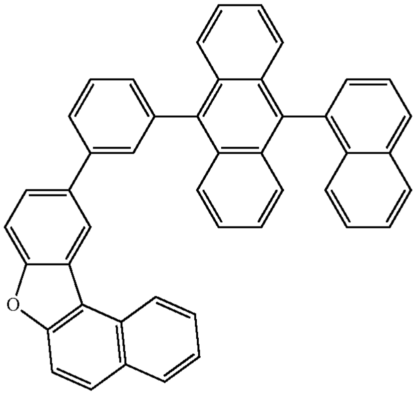
H94
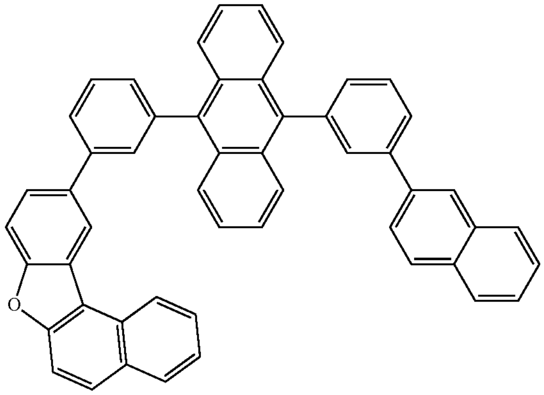

-continued
H95
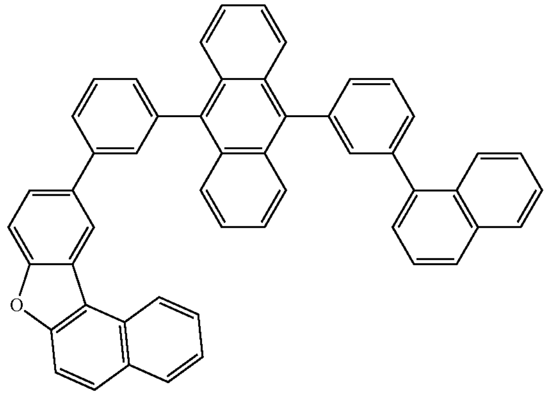
H96
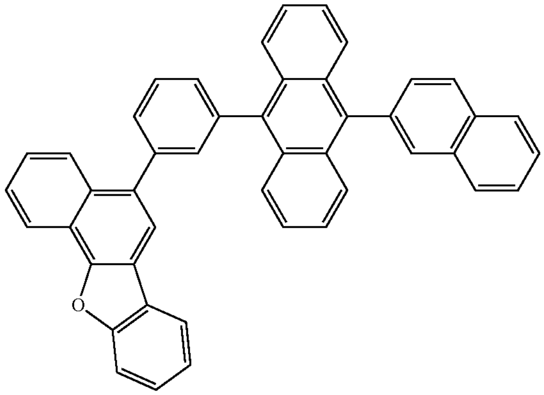
H97
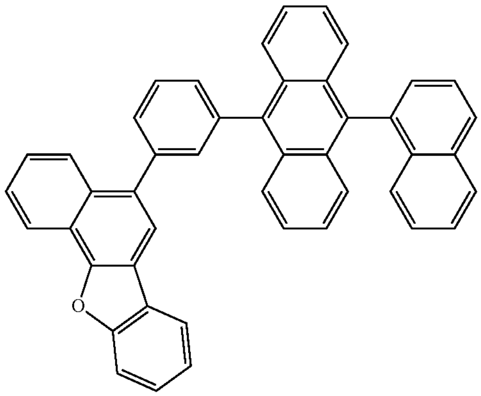
H98
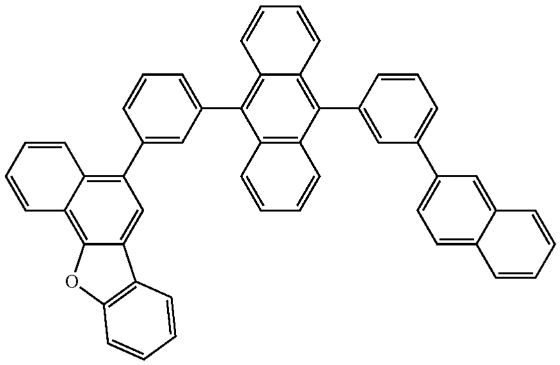
H99
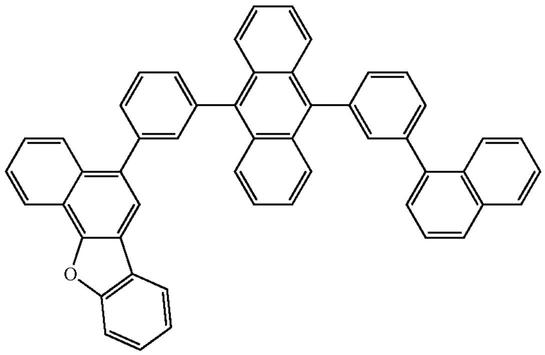
H100
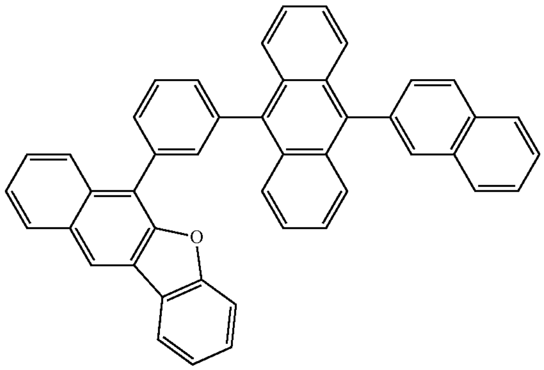
H101
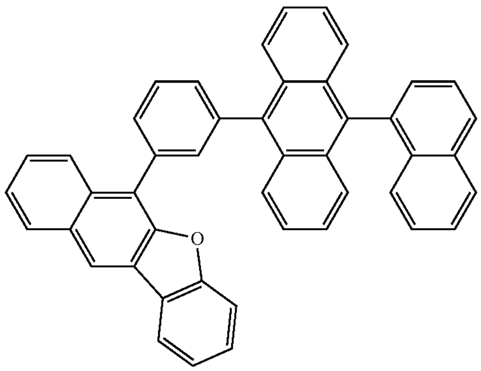
H102
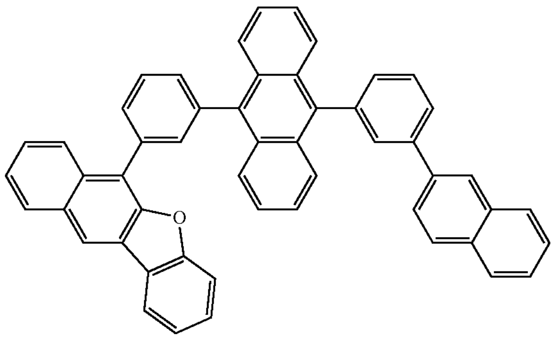

-continued
H103
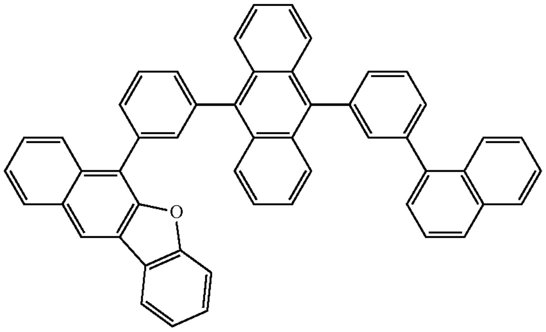
H104
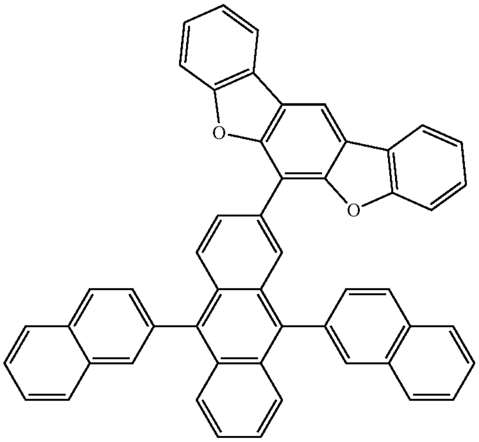
H105
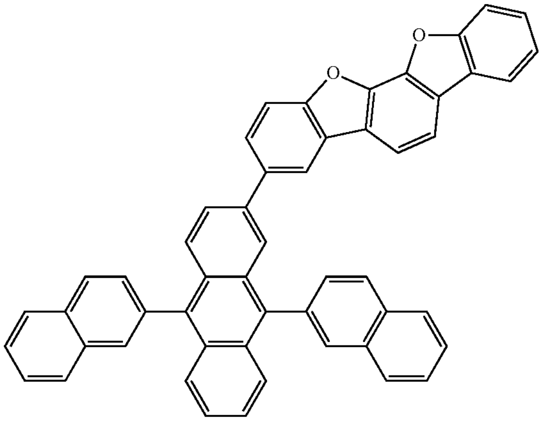
H106
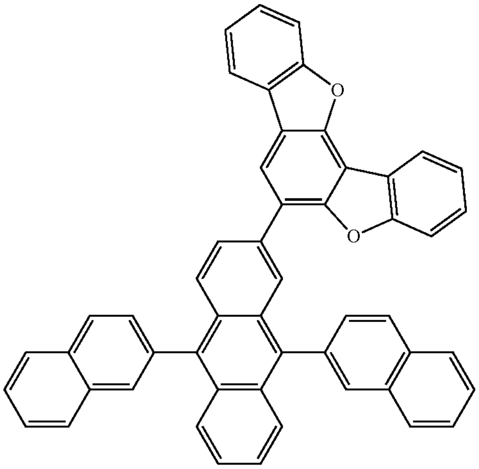
H107
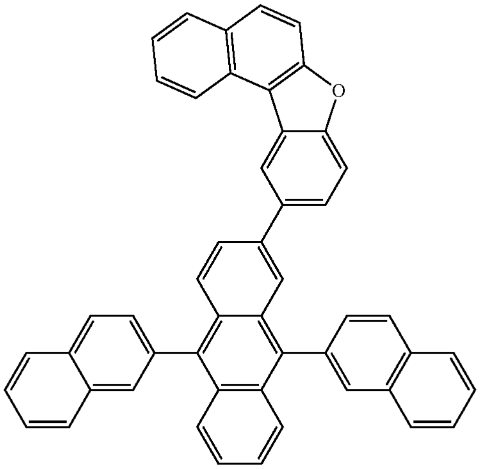
H108
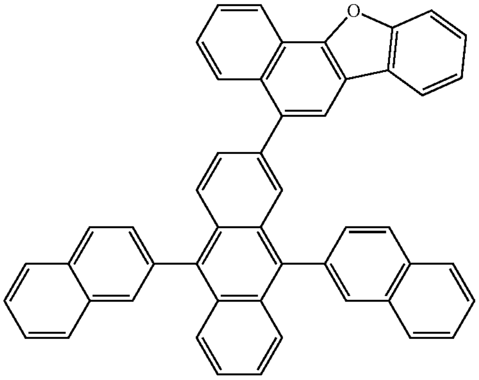

-continued
H109
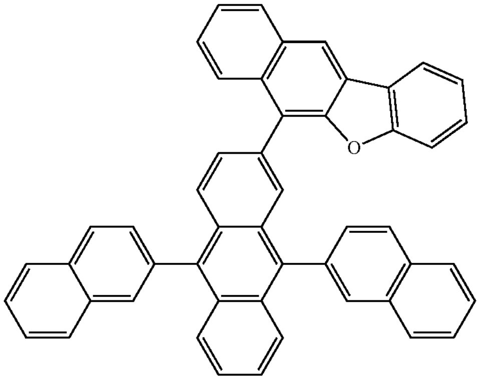
H110
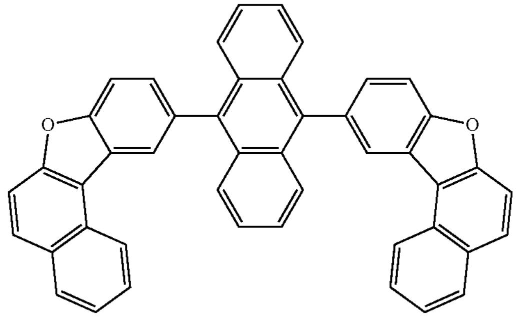
H111
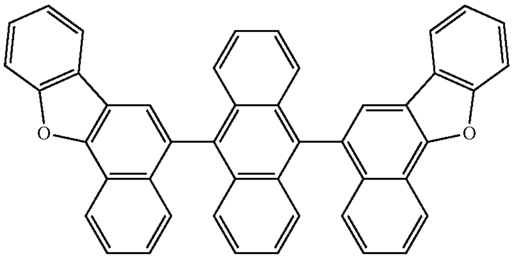
H112
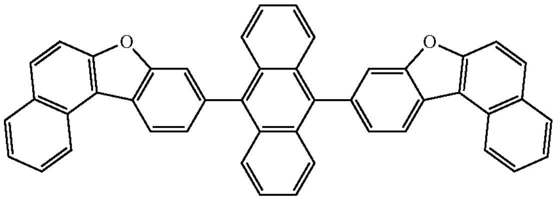
H113
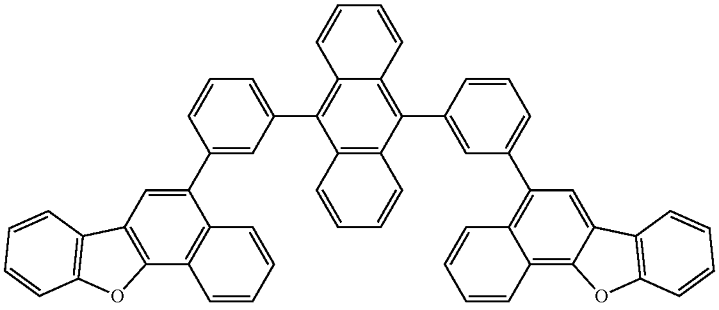

-continued
H114
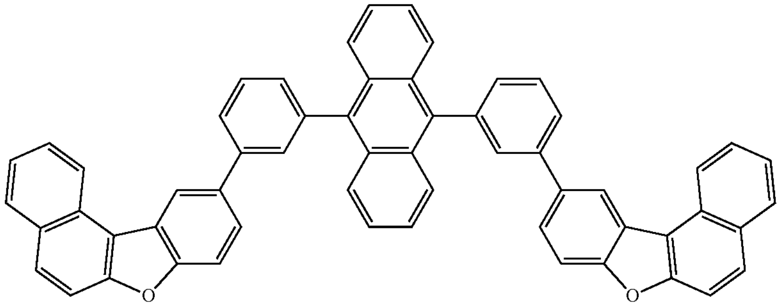
H115
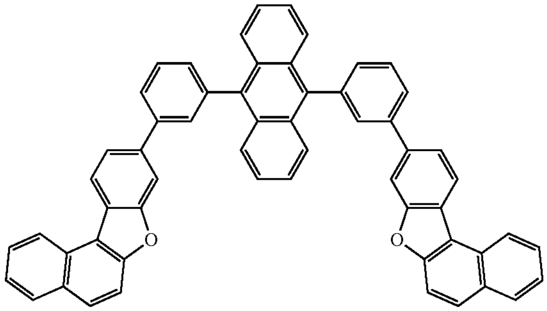
H116
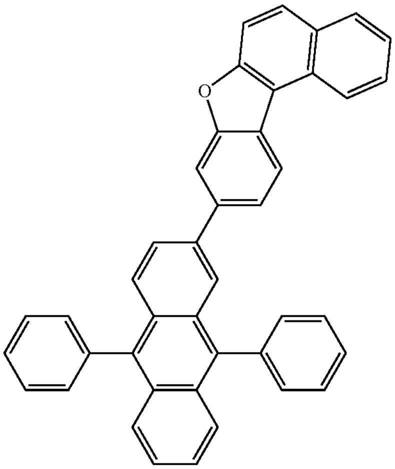
H117
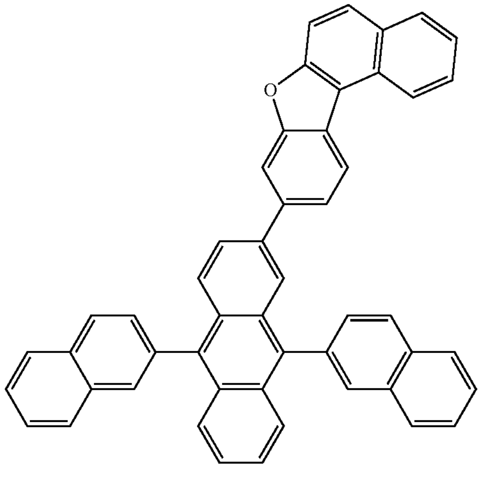
H118
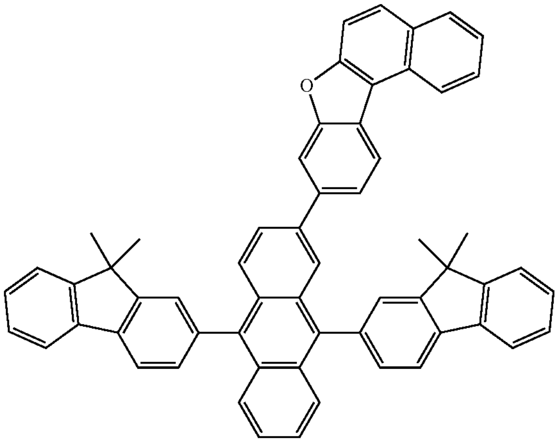

-continued
H119
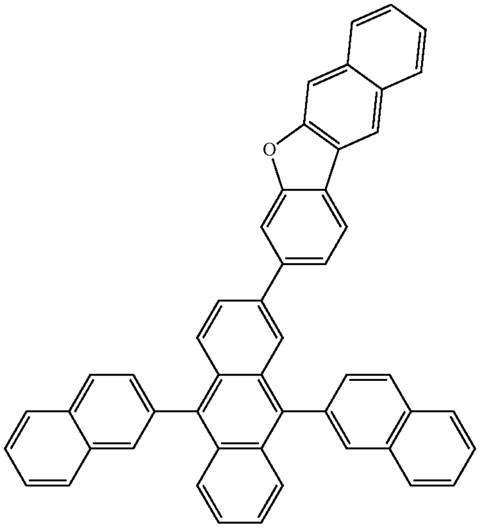
H120
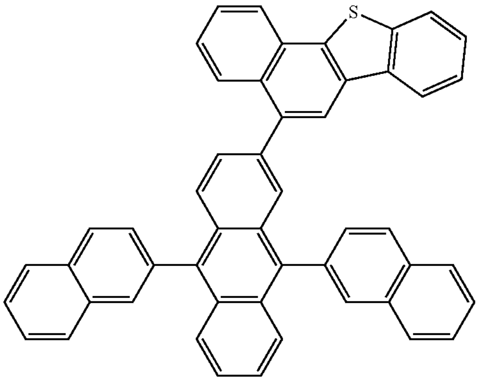
H121
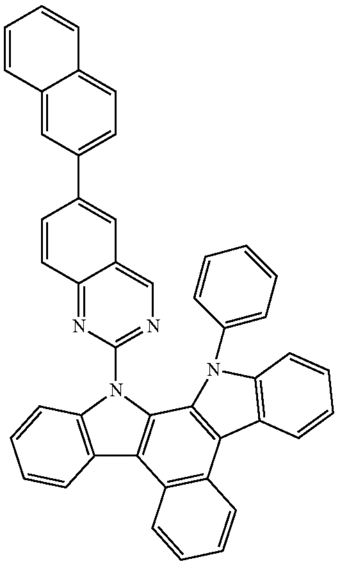
H122
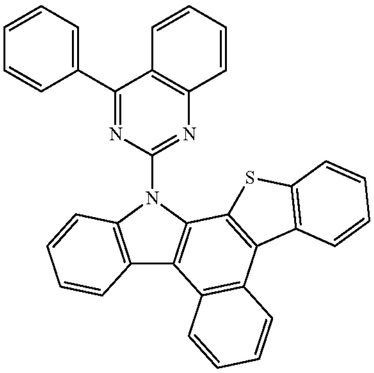
H123
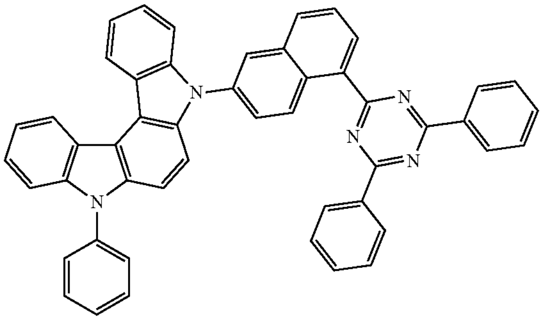
H124
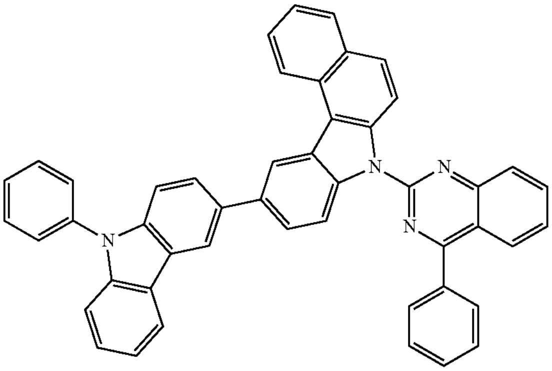
.

Phosphorescent Dopant

The phosphorescent dopant may be a center metal and may include at least one transition metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In some embodiments, the phosphorescent dopant may include an organometallic complex represented by Formula 401:

Formula 401

$$M(L_{401})_{xc1}(L_{402})_{xc2}$$

Formula 402

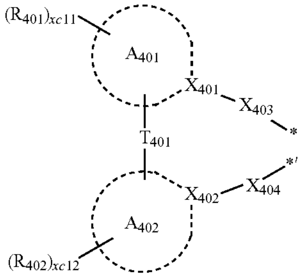

wherein, in Formulae 401 and 402,

M may be a transition metal (e.g., iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, and when xc1 is 2 or greater, at least two $L_{401}$(s) may be identical to or different from each other, $L_{402}$ may be an organic ligand, and xc2 may be an integer from 0 to 4, and when xc2 is 2 or greater, at least two $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S*', *—C(═O)—*', *—N($Q_{411}$)-*',*—C($Q_{411}$)($Q_{412}$)*', *—C($Q_{411}$)═C($Q_{412}$)-*', *—C($Q_{411}$)═*', or *═C═*', $X_{403}$ and $X_{404}$ may each independently be a chemical bond (e.g., a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each be understood by referring to the description of $Q_1$ provided herein, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(═O)($Q_{401}$), —S(═O)$_2$($Q_{401}$), or —P(═O)($Q_{401}$)($Q_{402}$), $Q_{401}$ to $Q_{403}$ may each be understood by referring to the description of $Q_1$ provided herein, xc11 and xc12 may each independently be an integer from 0 to 10, and

* and *' in Formula 402 each indicate a binding site to M in Formula 401.

In one or more embodiments, in Formula 402, i) $X_{401}$ may be nitrogen, and $X_{402}$ may be carbon, or ii) $X_{401}$ and $X_{402}$ may each be nitrogen.

In one or more embodiments, when xc1 in Formula 402 is 2 or greater, two ring $A_{401}$(s) of at least two $L_{401}$(s) may optionally be bound via $T_{402}$ as a linking group, or two ring $A_{402}$(s) may optionally be bound via $T_{403}$ as a linking group (see Compounds PD1 to PD4 and PD7). $T_{402}$ and $T_{403}$ may each be understood by referring to the description of $T_{401}$ provided herein.

$L_{402}$ in Formula 401 may be any suitable organic ligand. For example, $L_{402}$ may be a halogen group, a diketone group (e.g., an acetylacetonate group), a carboxylic acid group (e.g., a picolinate group), —C(═O), an isonitrile group, a —CN group, a phosphorus group (e.g., a phosphine group or a phosphite group), or any combination thereof.

The phosphorescent dopant may be, for example, one of Compounds PD1 to PD25 or any combination thereof:

PD1

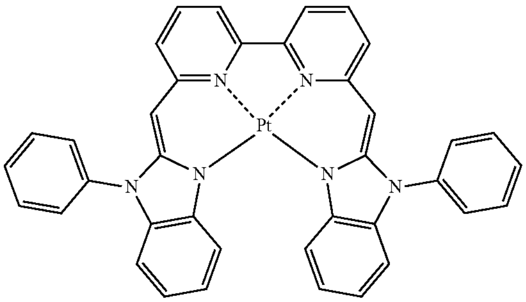

PD2

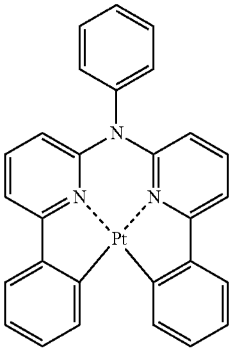

PD3

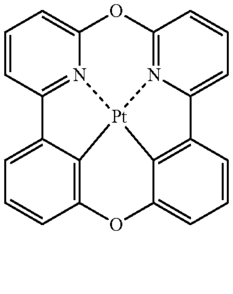

PD4
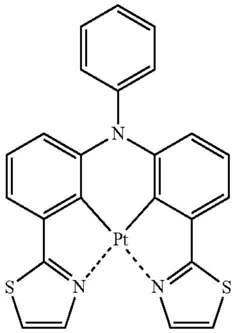
PD5
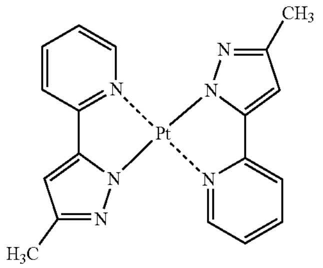
PD6
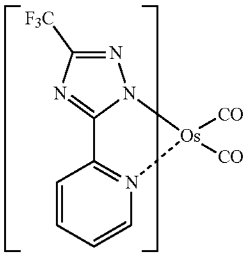
PD7
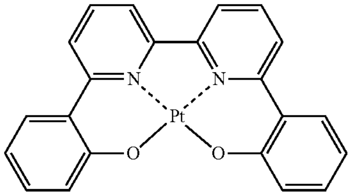
PD8
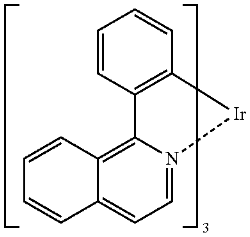
PD9
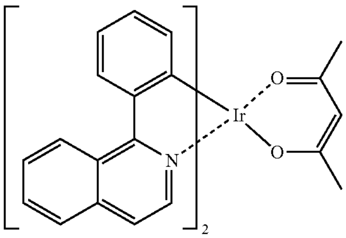
PD10
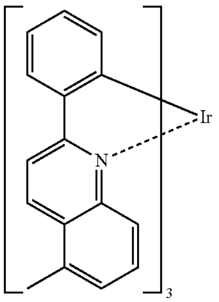
PD11
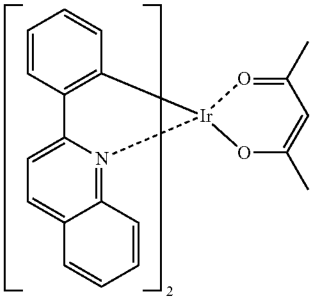
PD12
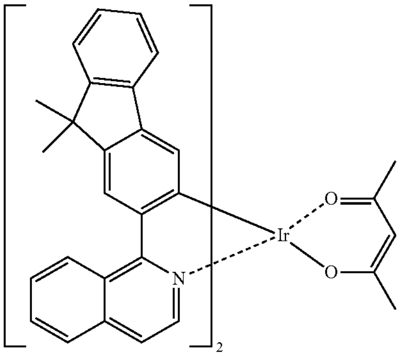
PD13
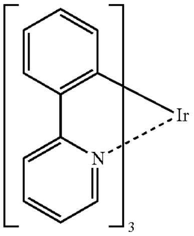
PD14
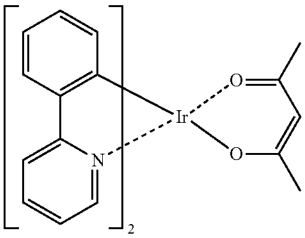

-continued
PD15
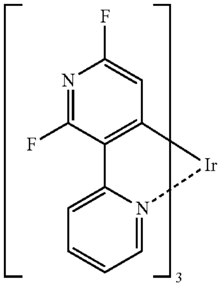
PD16
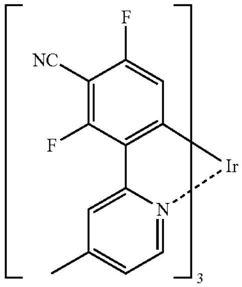
PD17
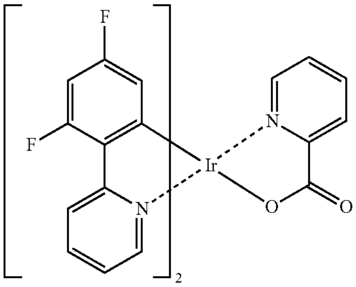
PD18
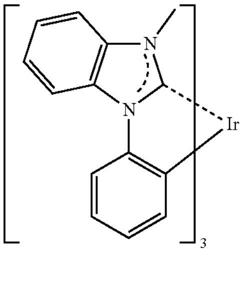
-continued
PD19
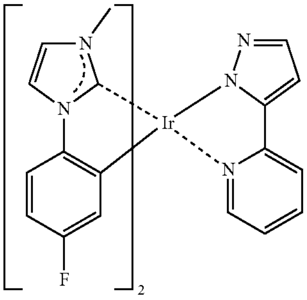
PD20
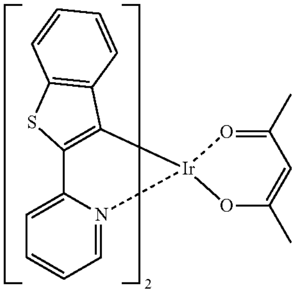
PD21
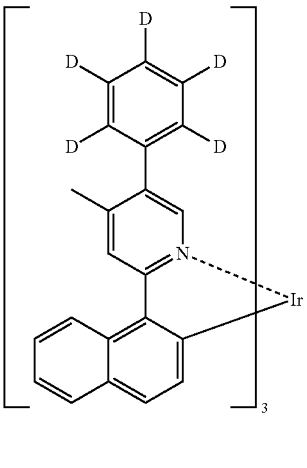

-continued

PD22

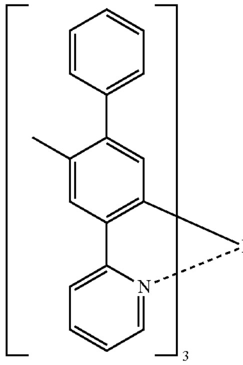

PD23

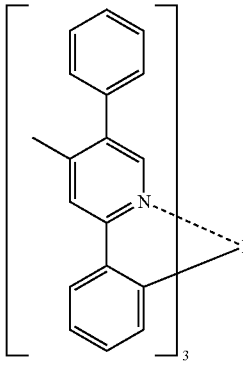

PD24

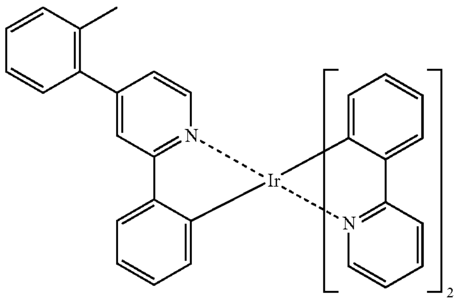

-continued

PD25

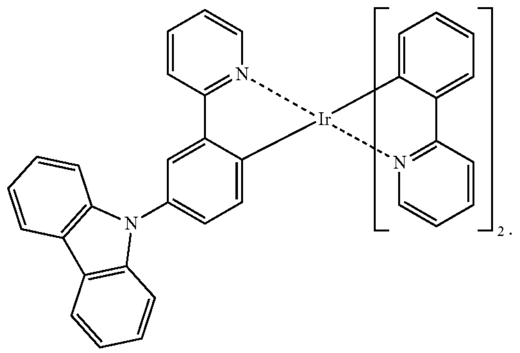

Fluorescent Dopant

The fluorescent dopant may include an amine group-containing compound, a styryl group-containing compound, or any combination thereof.

In some embodiments, the fluorescent dopant may include a compound represented by Formula 501:

Formula 501

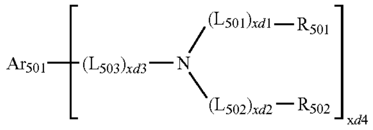

wherein, in Formula 501, $Ar_{501}$, $L_{501}$ to $L_{503}$, $R_{501}$ and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In some embodiments, in Formula 501, $Ar_{501}$ may include a condensed ring group (e.g., an anthracene group, a chrysene group, or a pyrene group) in which at least three monocyclic groups are condensed.

In some embodiments, xd4 in Formula 501 may be 2.

In some embodiments, the fluorescent dopant may include one of Compounds FD1 to FD36, DPVBi, DPAVBi, or an combination thereof:

FD1

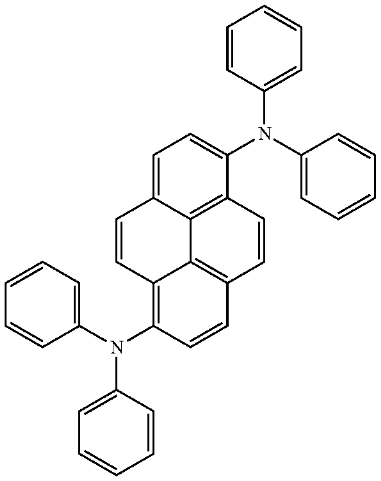

FD2

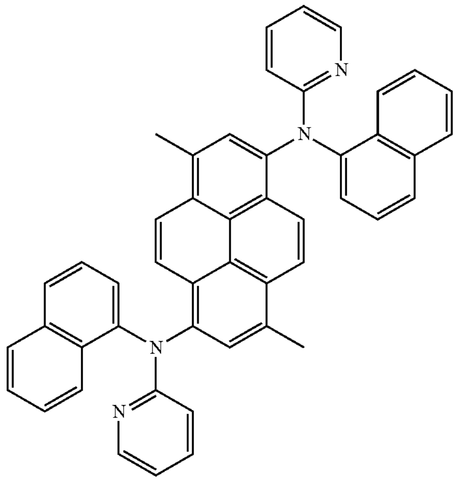

-continued
FD3
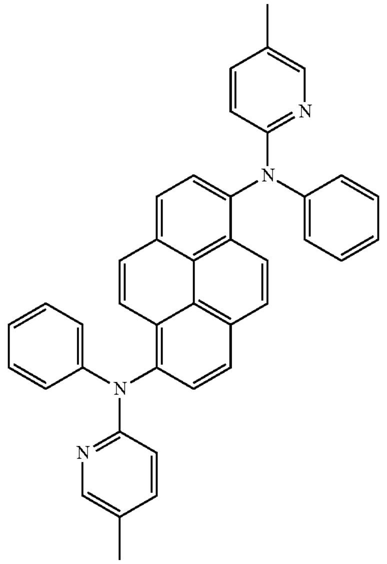
FD4
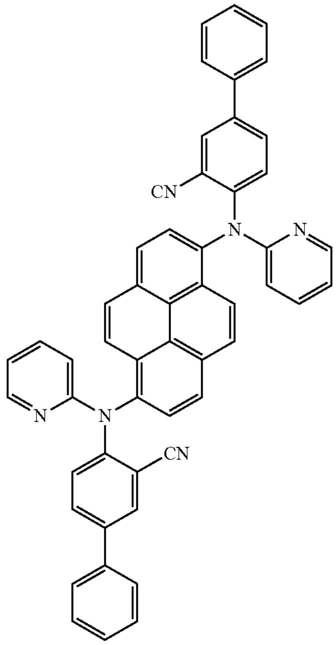
FD5
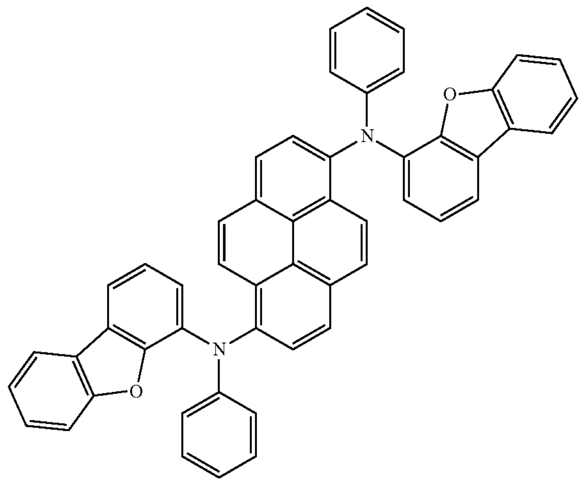
FD6
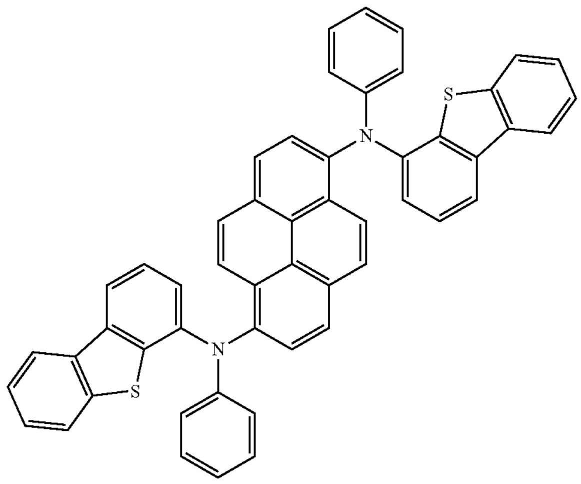

-continued
FD7
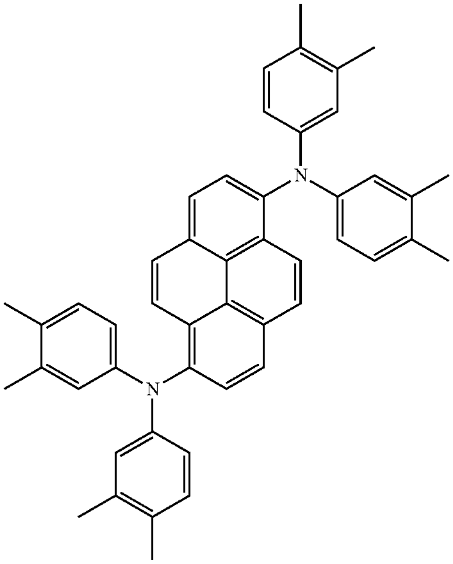
FD8
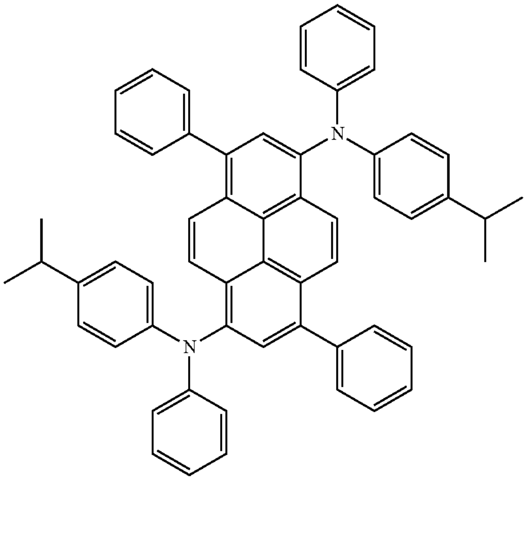
FD9
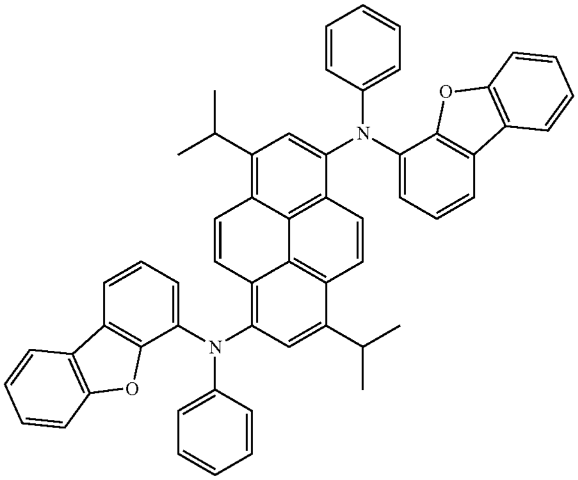
FD10
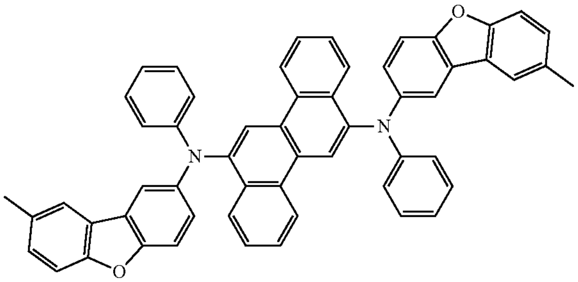
FD11
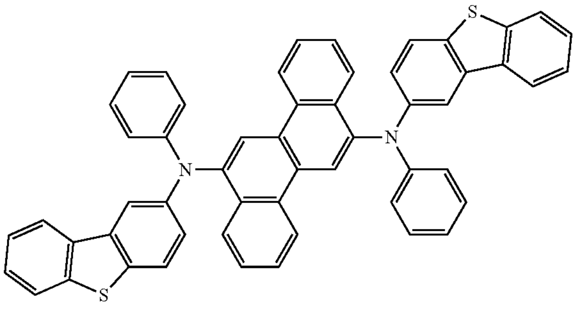
FD12
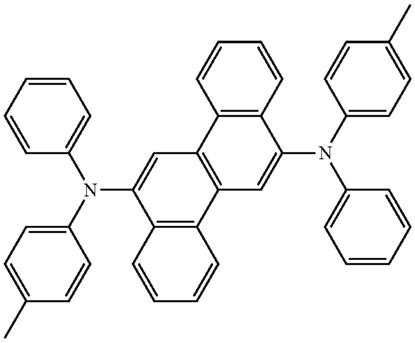

-continued
FD13
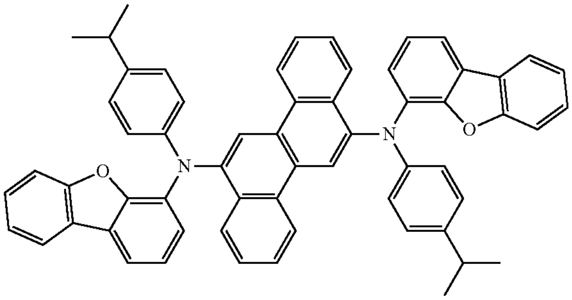
FD14
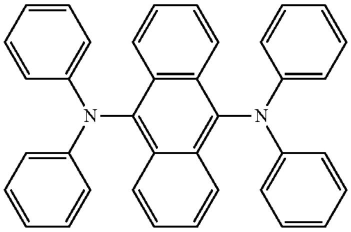
FD15
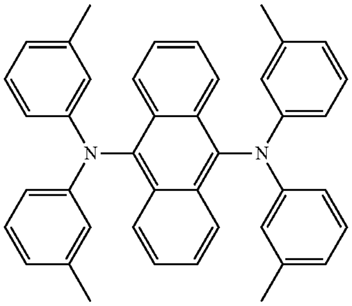
FD16
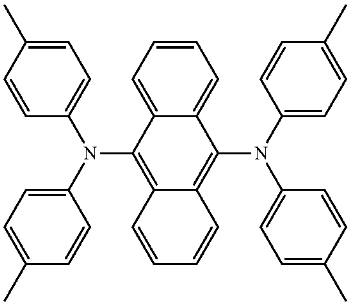
FD17
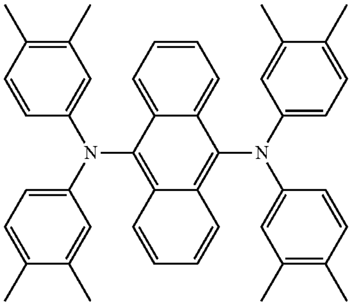
FD18
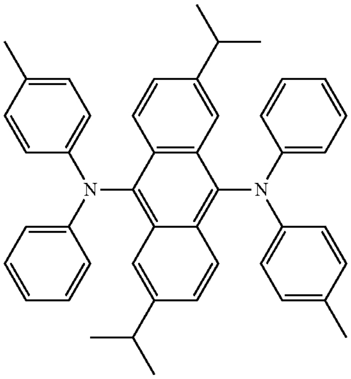
FD19
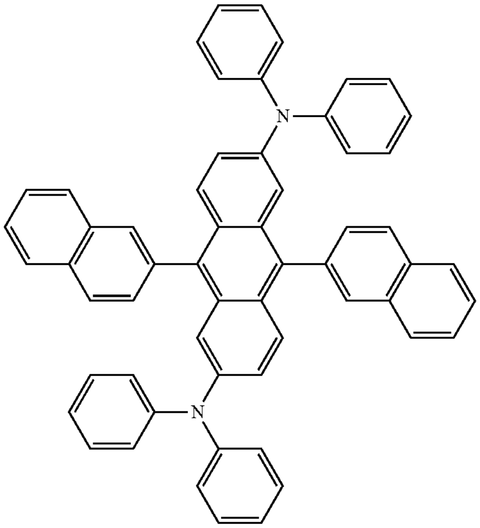
FD20
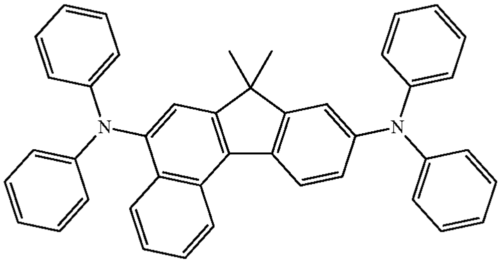

-continued
FD21
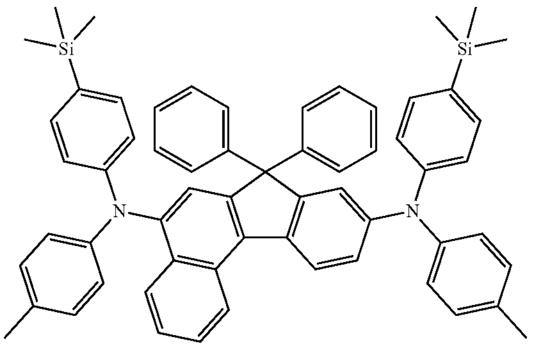
FD22
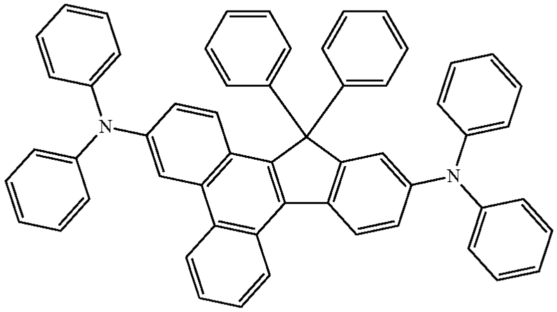
FD23
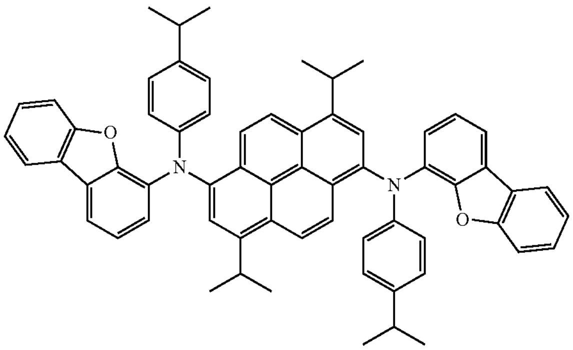
FD24
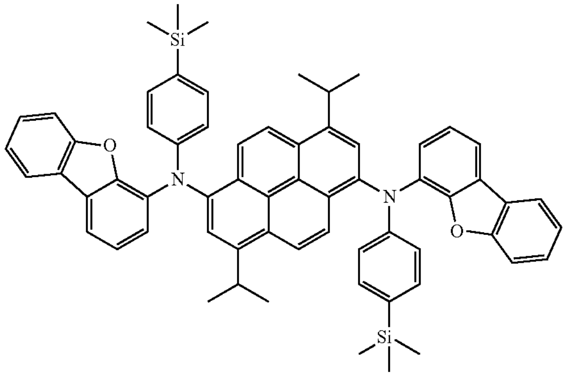
FD25
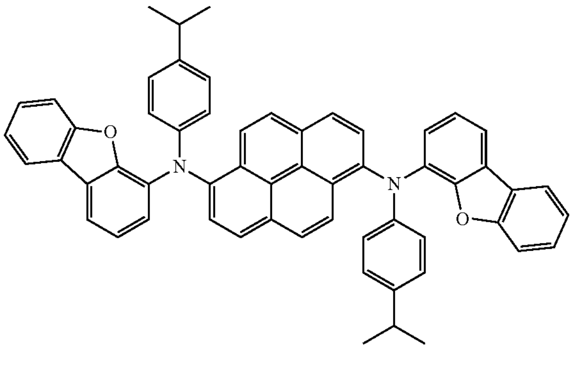
FD26
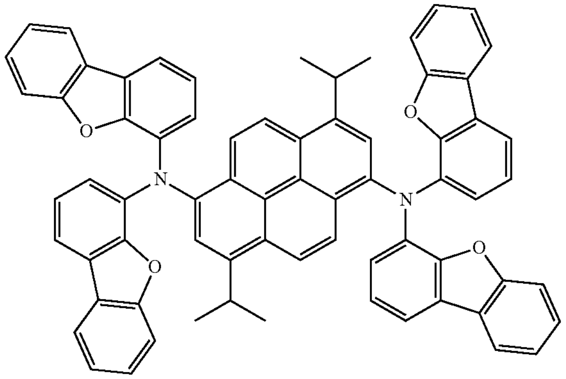
FD27
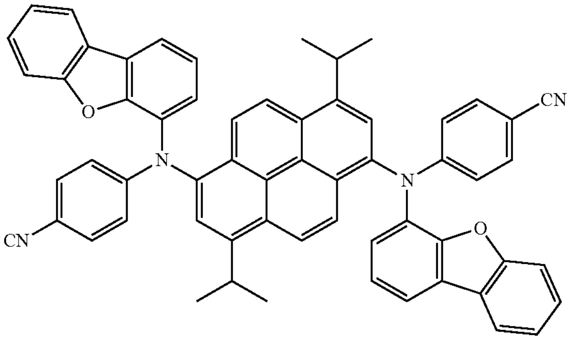
FD28
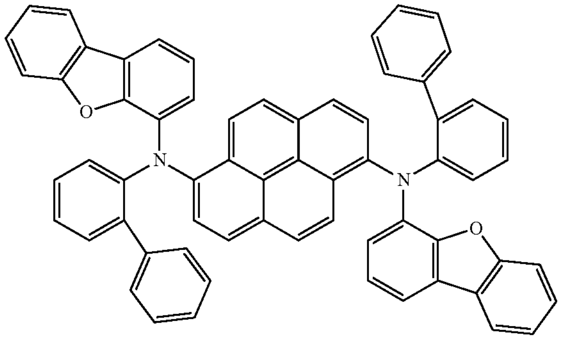

-continued
FD29
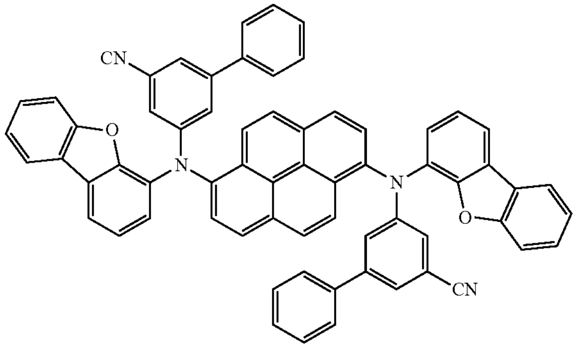
FD30
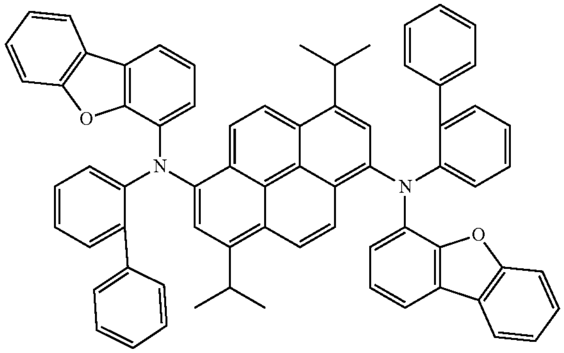
FD31
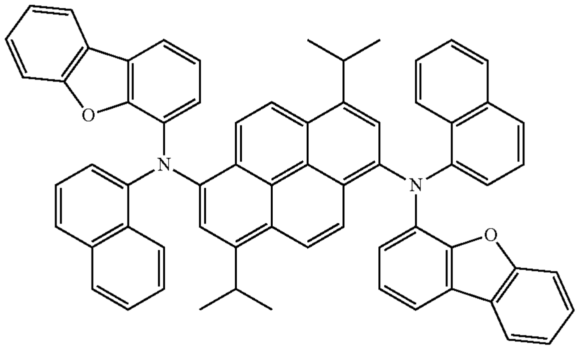
FD32
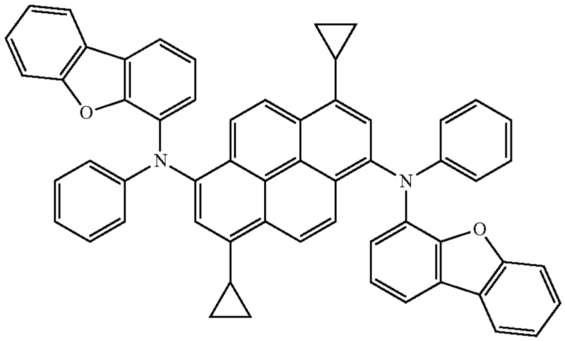
FD33
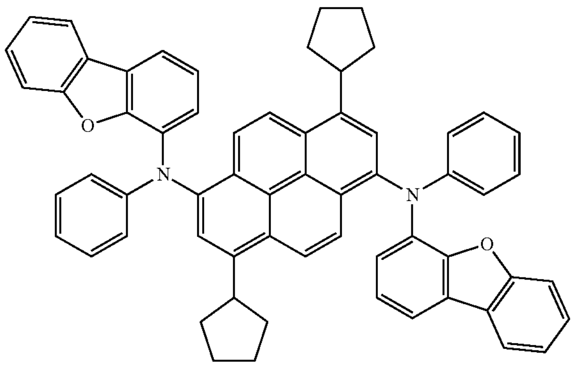
FD34
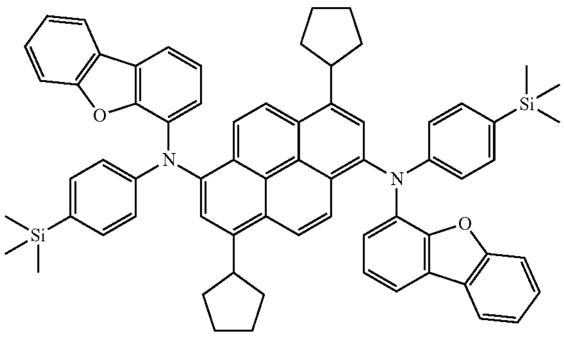
FD35
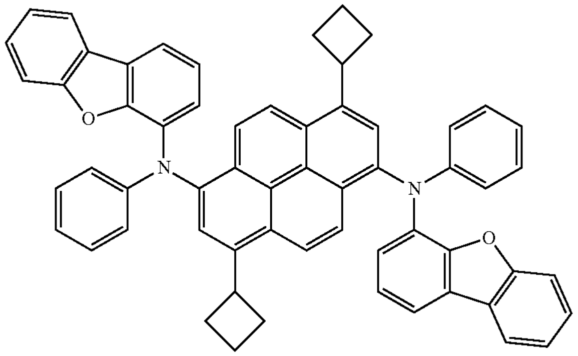
FD36
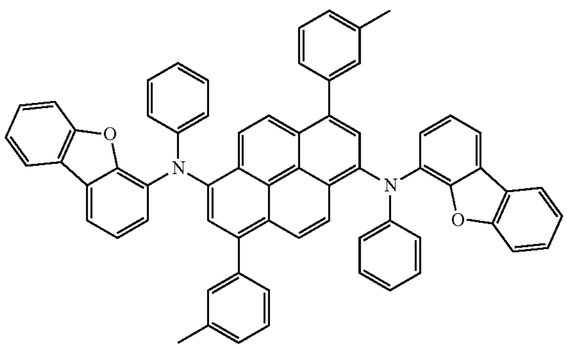

-continued

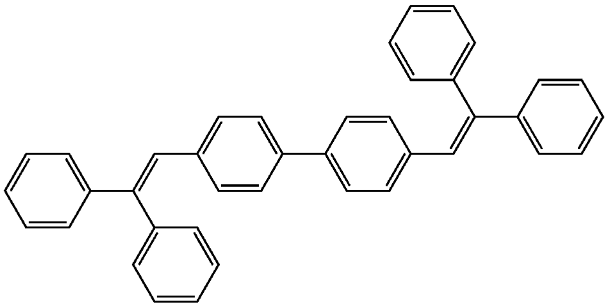

DPVBi

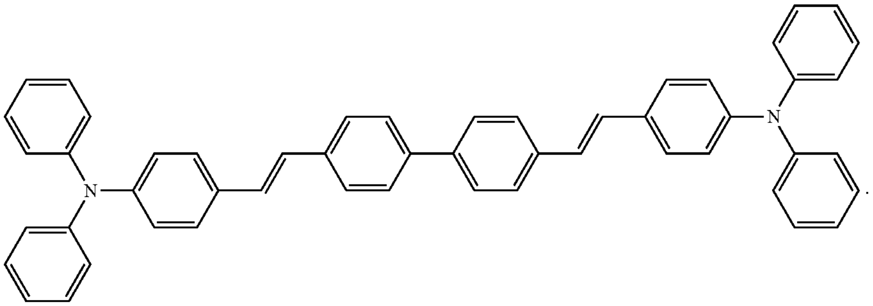

DPAVBi

Delayed Fluorescence Material

The emission layer may include a delayed fluorescence material.

The delayed fluorescence material described herein may be any suitable compound that may emit delayed fluorescence according to a delayed fluorescence emission mechanism.

The delayed fluorescence material included in the emission layer may serve as a host or a dopant, depending on types or kinds of other materials included in the emission layer.

In some embodiments, a difference between a triplet energy level (eV) of the delayed fluorescence material and a singlet energy level (eV) of the delayed fluorescence material may be about 0 eV or greater and about 0.5 eV or smaller. When the difference between a triplet energy level (eV) of the delayed fluorescence material and a singlet energy level (eV) of the delayed fluorescence material is within this range, up-conversion from a triplet state to a singlet state in the delayed fluorescence material may effectively occur, thus improving luminescence efficiency and/or the like of the light-emitting device 10.

In some embodiments, the delayed fluorescent material may include i) a material that includes at least one electron donor (e.g., a π electron-rich $C_3$-$C_{60}$ cyclic group, such as a carbazole group) and at least one electron acceptor (e.g., a sulfoxide group, a cyano group, or a π electron-deficient nitrogen-containing $C_1$-$C_{60}$ cyclic group), or ii) a material that includes a $C_8$-$C_{60}$ polycyclic group in which two or more cyclic groups share boron (B) and are condensed with each other (e.g., combined together with each other).

Examples of the delayed fluorescence material may include at least one of Compounds DF1 to DF9:

DF1

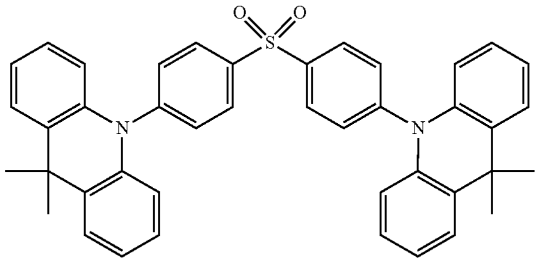

(DMAC-DPS)

DF2

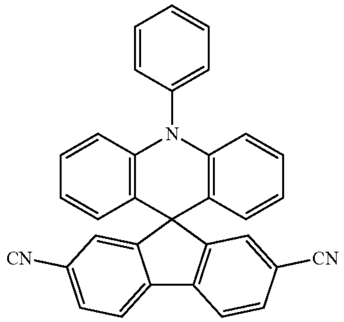

(ACRFLCN)

-continued

DF3

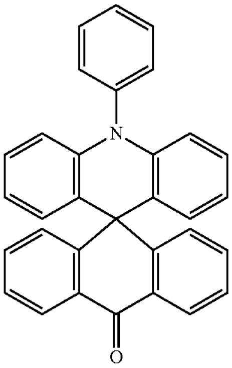

(ACRSA)

DF4

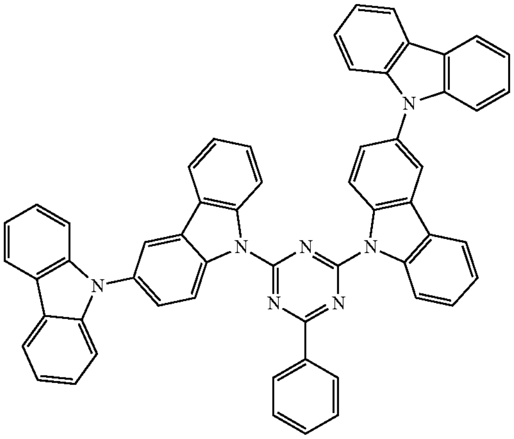

(CC2TA)

DF5

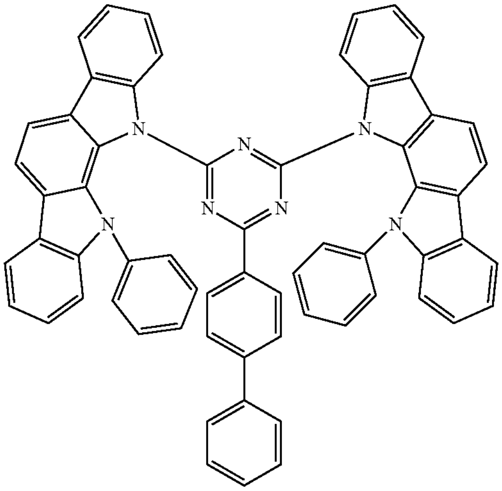

(PIC-TRZ)

-continued

DF6

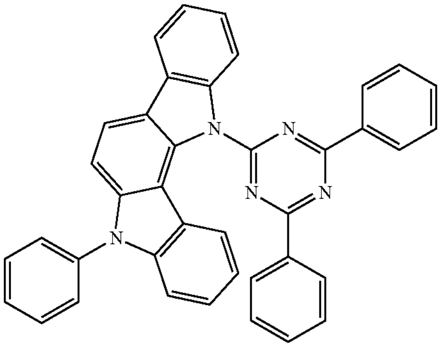

(PIC-TRZ2)

DF7

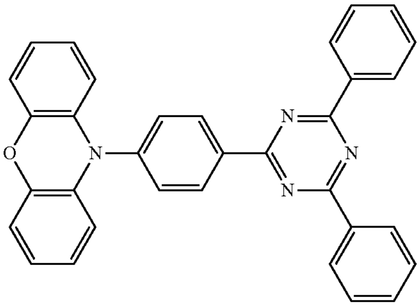

(PXZ-TRZ)

DF8

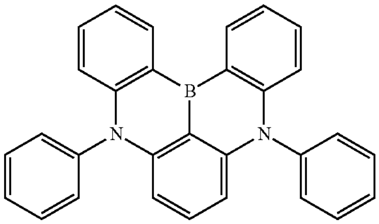

(DABNA-1)

DF9

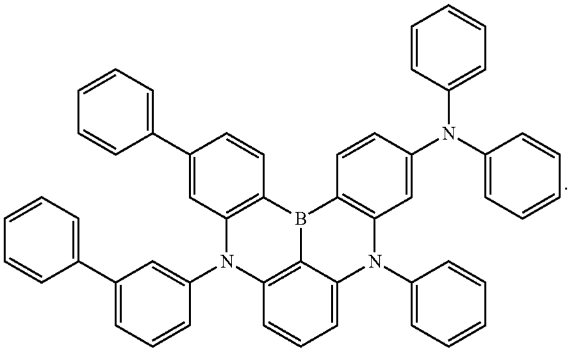

(DABNA-2)

Quantum Dot

In some embodiments, the emission layer may include quantum dots.

The term "quantum dot," as used herein, refers to a crystal of a semiconductor compound and may include any suitable material capable of emitting emission wavelengths of various suitable lengths according to the size of the crystal.

The diameter of the quantum dot may be, for example, in a range of about 1 nm to about 10 nm.

Quantum dots may be synthesized by a wet chemical process, an organic metal chemical vapor deposition process, a molecular beam epitaxy process, and/or any similar process.

The wet chemical process is a method of growing a quantum dot particle crystal by mixing a precursor material together with an organic solvent. When the crystal grows, the organic solvent may naturally serve as a dispersant coordinated on the surface of the quantum dot crystal and control the growth of the crystal. Thus, the wet chemical method may be easier than the vapor deposition process such as the metal organic chemical vapor deposition (MOCVD) or the molecular beam epitaxy (MBE) process. Further, the growth of quantum dot particles may be controlled with a lower manufacturing cost.

The quantum dot may include a Group II-VI semiconductor compound; a Group III-V semiconductor compound; a Group III-VI semiconductor compound; a Group I-III-VI semiconductor compound; a Group IV-VI semiconductor compound; a Group IV element or compound; or any combination thereof.

Examples of the Group II-VI semiconductor compound may include a binary compound such as CdS, CdSe, CdTe, ZnS, ZnSe, ZnTe, ZnO, HgS, HgSe, HgTe, MgSe, and/or MgS; a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS; a quaternary compound such as CdZnSeS, CdZnSeTe, CdZnSTe, CdHgSeS, CdHgSeTe, CdHgSTe, HgZnSeS, HgZnSeTe, and/or HgZnSTe; or any combination thereof.

Examples of the Group III-V semiconductor compound may include a binary compound such as GaN, GaP, GaAs, GaSb, AlN, AlP, AlAs, AlSb, InN, InP, InAs, and/or InSb; a ternary compound such as GaNP, GaNAs, GaNSb, GaPAs, GaPSb, AlNP, AlNAs, AlNSb, AlPAs, AlPSb, InGaP, InNP, InAlP, InNAs, InNSb, InPAs, and/or InPSb; a quaternary compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and/or InAlPSb; or any combination thereof. In some embodiments, the Group III-V semiconductor compound may further include a Group II element. Examples of the Group III-V semiconductor compound further including the II group element may include InZnP, InGaZnP, InAlZnP, and the like.

Examples of the Group III-VI semiconductor compound may include a binary compound such as GaS, GaSe, $Ga_2Se_3$, GaTe, InS, InSe, $In_2S_3$, $In_2Se_3$, InTe, and the like; a ternary compound such as $InGaS_3$, $InGaSe_3$, and the like; or any combination thereof.

Examples of the Group I-III-VI semiconductor compound may include a ternary compound such as AgInS, $AgInS_2$, CuInS, $CuInS_2$, $CuGaO_2$, $AgGaO_2$, $AgAlO_2$, or any combination thereof.

Examples of the Group IV-VI semiconductor compound may include a binary compound such as SnS, SnSe, SnTe, PbS, PbSe, and/or PbTe; a ternary compound such as SnSeS, SnSeTe, SnSTe, PbSeS, PbSeTe, PbSTe, SnPbS, SnPbSe, and/or SnPbTe; a quaternary compound such as SnPbSSe, SnPbSeTe, and/or SnPbSTe; or any combination thereof.

The Group IV element or compound may be a single element compound such as Si or Ge; a binary compound such as SiC and/or SiGe; or any combination thereof.

Individual elements included in the multi-element compound, such as a binary compound, a ternary compound, and a quaternary compound, may be present in a particle thereof at a uniform or non-uniform concentration.

The quantum dot may have a single structure in which the concentration of each element included in the quantum dot is uniform (e.g., substantially uniform) or a core-shell double structure. In some embodiments, materials included in the core may be different from materials included in the shell.

The shell of the quantum dot may serve as a protective layer for preventing or reducing chemical denaturation of the core to maintain semiconductor characteristics and/or as a charging layer for imparting electrophoretic characteristics to the quantum dot. The shell may be monolayer or multilayer. An interface between a core and a shell may have a concentration gradient where a concentration of elements present in the shell decreases along a direction toward the core.

Examples of the shell of the quantum dot include a metal oxide, a metalloid oxide, and/or a nonmetal oxide, a semiconductor compound, or a combination thereof. Examples of the metal oxide, the metalloid oxide or the nonmetal oxide may include: a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO; a ternary compound such as $MgAl_2O_4$, $CoFe_2O_4$, $NiFe_2O_4$, and/or $CoMn_2O_4$; and any combination thereof. Example of the semiconductor compound may include a Group II-VI group semiconductor compound; a Group III-V semiconductor compound; a Group III-VI semiconductor compound; a Group I-III-VI semiconductor compound; a Group IV-VI semiconductor compound; or any combination thereof. In some embodiments, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The quantum dot may have a full width of half maximum (FWHM) of a spectrum of an emission wavelength of about 45 nm or less, about 40 nm or less, or about 30 nm or less. When the FWHM of the quantum dot is within this range, color purity or color reproducibility may be improved. In addition, because light emitted through the quantum dot is emitted in all directions (e.g., substantially all directions), an optical viewing angle may be improved.

In addition, the quantum dot may be, for example, a spherical, pyramidal, multi-arm, and/or cubic nanoparticle, nanotube, nanowire, nanofiber, and/or nanoplate particle.

By adjusting the size of the quantum dot, the energy band gap may also be adjusted, thereby obtaining light of various suitable wavelengths in the quantum dot emission layer. By using quantum dots of various suitable sizes, a light-emitting device that may emit light of various suitable wavelengths may be realized. In some embodiments, the size of the quantum dot may be selected such that the quantum dot may emit red, green, and/or blue light. In addition, the size of the quantum dot may be selected such that the quantum dot may emit white light by combining various suitable light of colors.

Electron Transport Region in Interlayer 130

The electron transport region may have i) a single-layered structure including (e.g., consisting of) a single layer including (e.g., consisting of) a single material, ii) a single-layered structure including (e.g., consisting of) a single layer including a plurality of different materials, or iii) a multi-layered structure having a plurality of layers including a plurality of different materials.

The electron transport region may include a buffer layer, a hole blocking layer, an electron control layer, an electron transport layer, and/or an electron injection layer.

In some embodiments, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein layers of each structure are sequentially stacked on the emission layer in each stated order.

The electron transport region (e.g., a buffer layer, a hole blocking layer, an electron control layer, and/or an electron transport layer in the electron transport region) may include a metal-free compound including at least one π electron-deficient nitrogen-containing $C_1$-$C_{60}$ cyclic group.

In some embodiments, the electron transport region may include a compound represented by Formula 601:

$$[Ar_{601}]_{xe11}\text{-}[(L_{601})_{xe1}\text{-}R_{601}]_{xe21}$$ Formula 601 wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{601})(Q_{602})(Q_{603})$, —$C(=O)(Q_{601})$, —$S(=O)_2(Q_{601})$, or —$P(=O)(Q_{601})(Q_{602})$, $Q_{601}$ to $Q_{603}$ may each be understood by referring to the description of $Q_1$ provided herein, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

In some embodiments, when xe11 in Formula 601 is 2 or greater, at least two $Ar_{601}$(s) may be bound via a single bond.

In some embodiments, in Formula 601, $Ar_{601}$ may be a substituted or unsubstituted anthracene group.

In some embodiments, the electron transport region may include a compound represented by Formula 601-1:

Formula 601-1

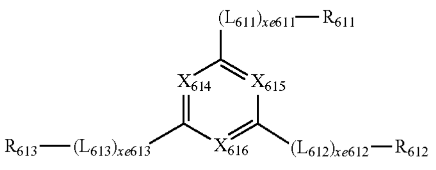

wherein, in Formula 601-1, $X_{614}$ may be N or $C(R_{614})$, $X_{615}$ may be N or $C(R_{615})$, $X_{616}$ may be N or $C(R_{616})$, at least one selected from $X_{614}$ to $X_{616}$ may be N, $L_{611}$ to $L_{613}$ may each be understood by referring to the description of $L_{601}$ provided herein, xe611 to xe613 may each be understood by referring to the description of xe1 provided herein, $R_{611}$ to $R_{613}$ may each be understood by referring to the description of $R_{601}$ provided herein, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, in Formulae 601 and 601-1, xe1 and xe611 to xe613 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, or any combination thereof:

ET1

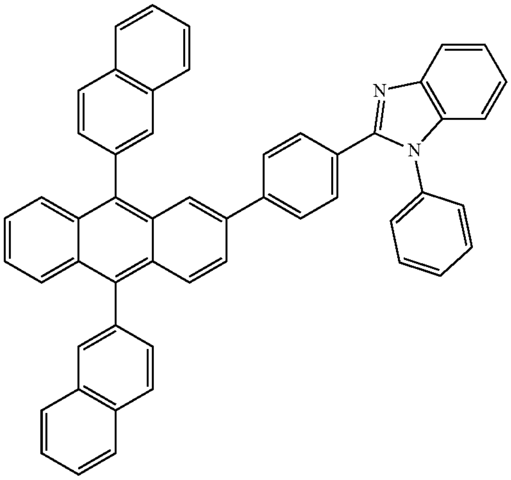

ET2

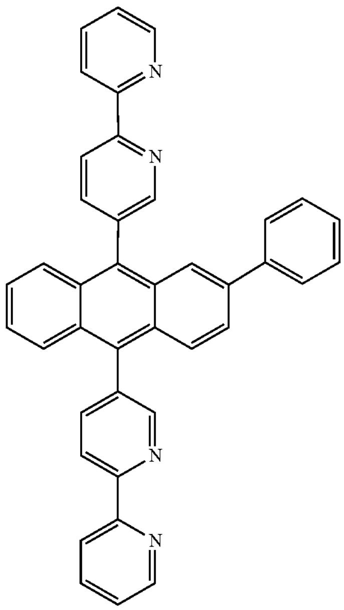

-continued
ET3
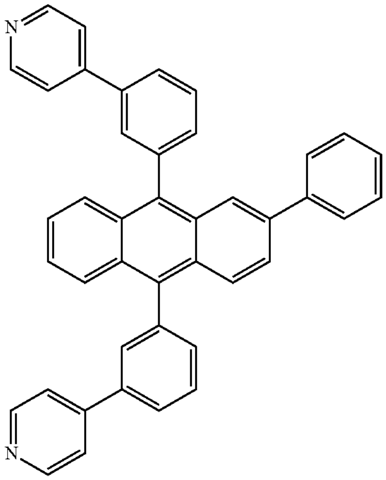
ET4
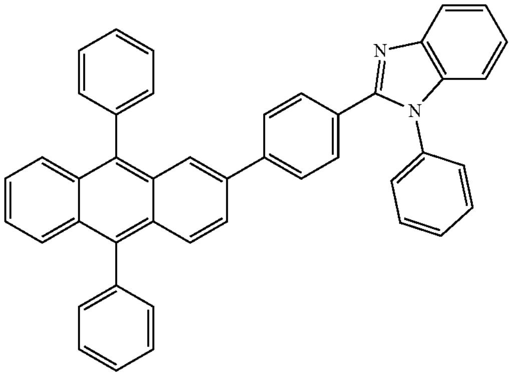
ET5
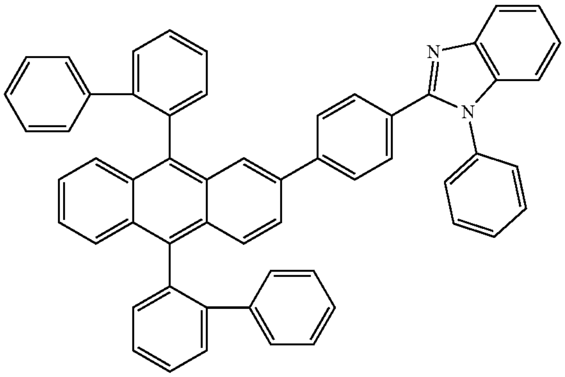
-continued
ET6
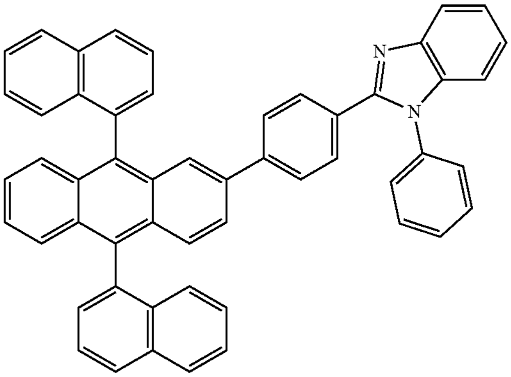
ET7
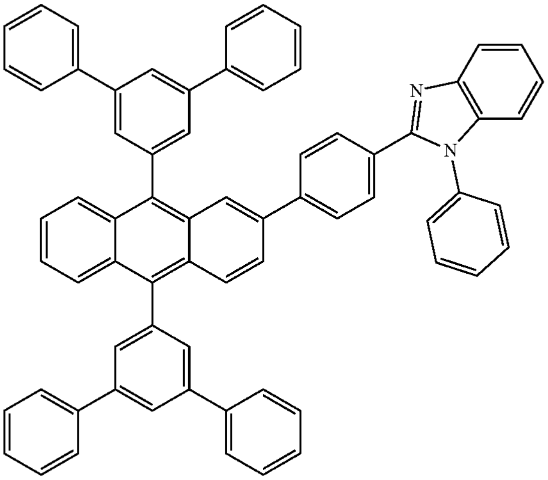
ET8
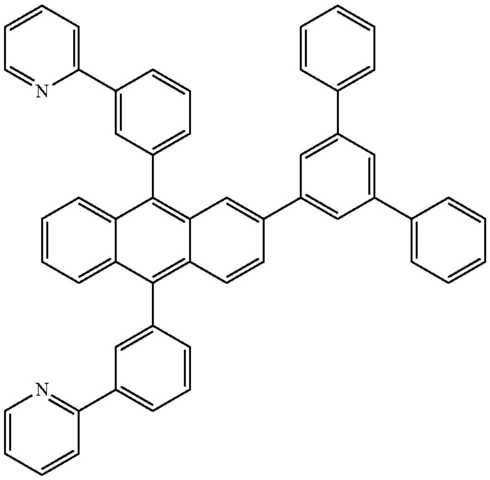

-continued
ET9
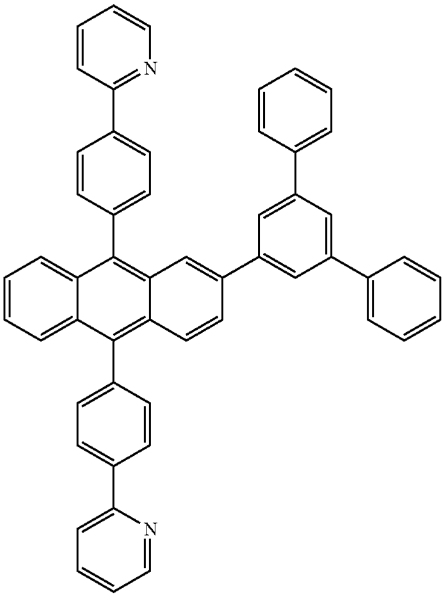
ET10
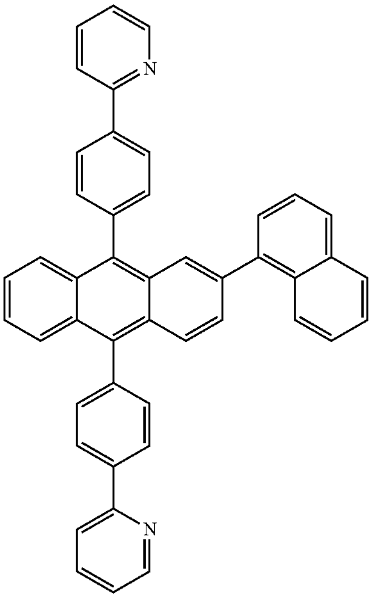
-continued
ET11
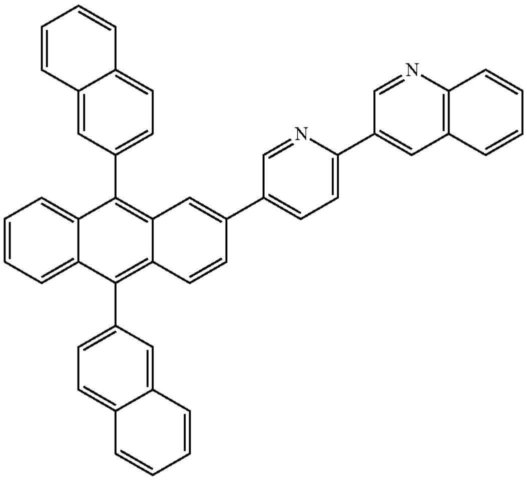
ET12
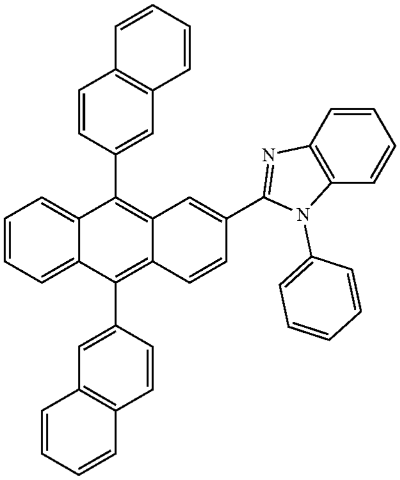
ET13
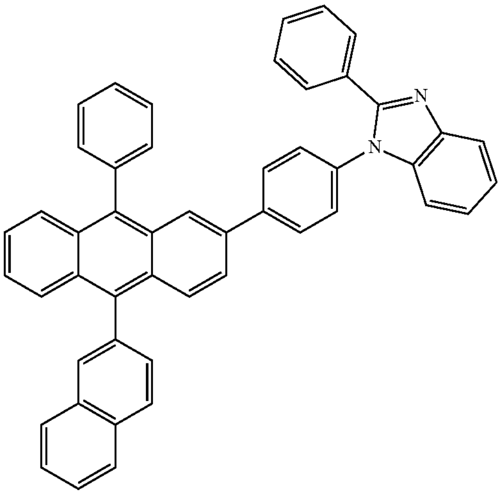

-continued
ET14
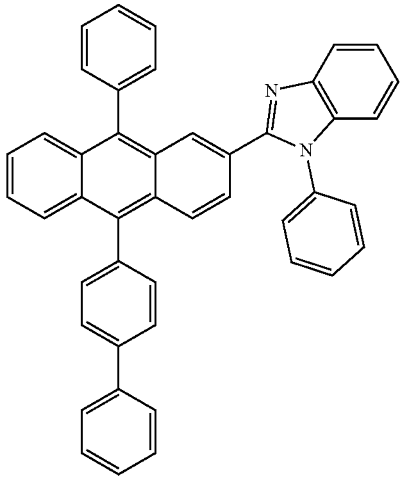
ET15
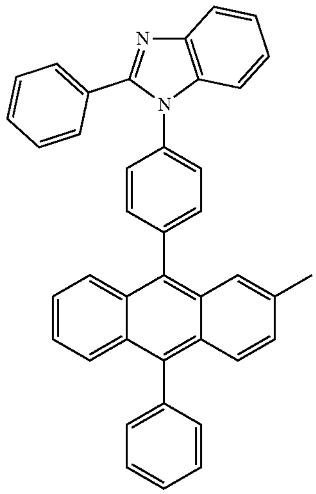
ET16
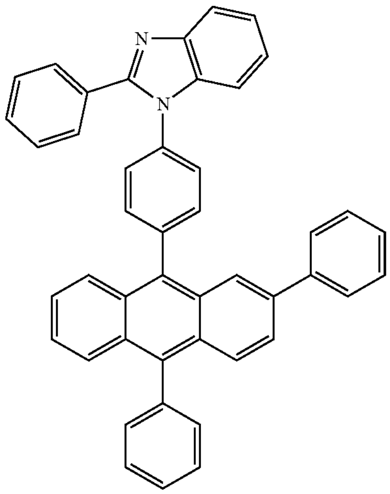
-continued
ET17
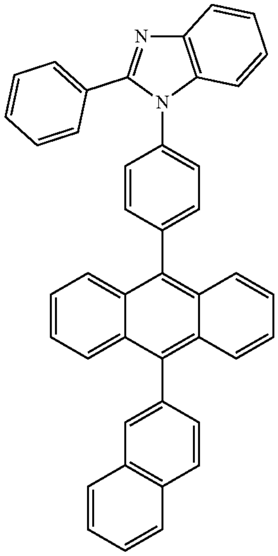
ET18
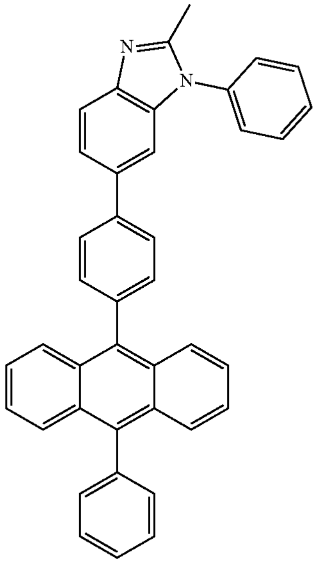
ET19
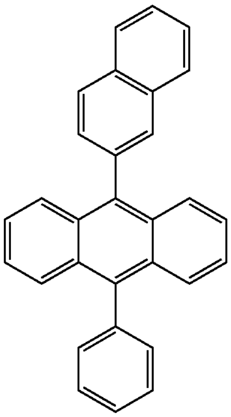

-continued
ET20
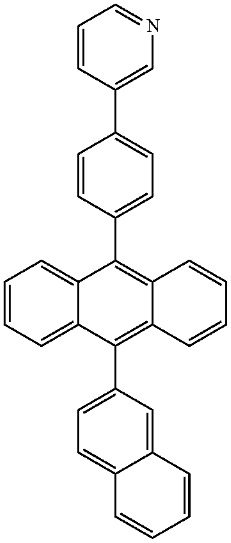
ET21
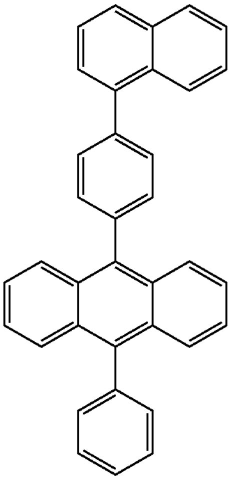
ET22
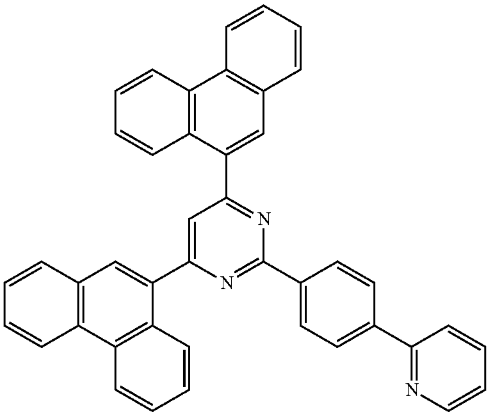
-continued
ET23
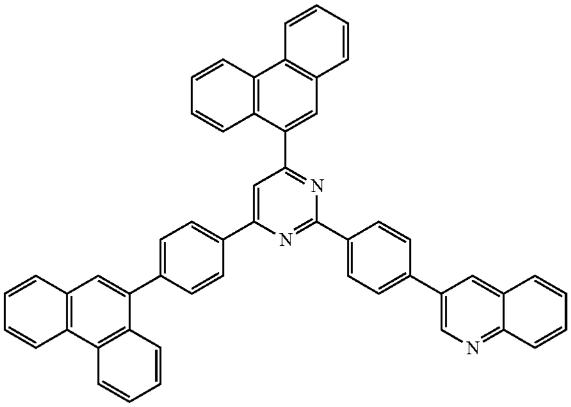
ET24
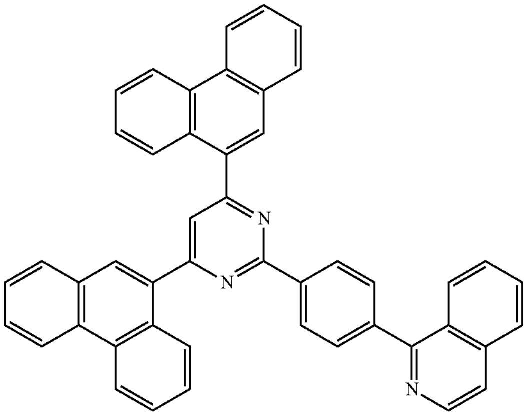
ET25
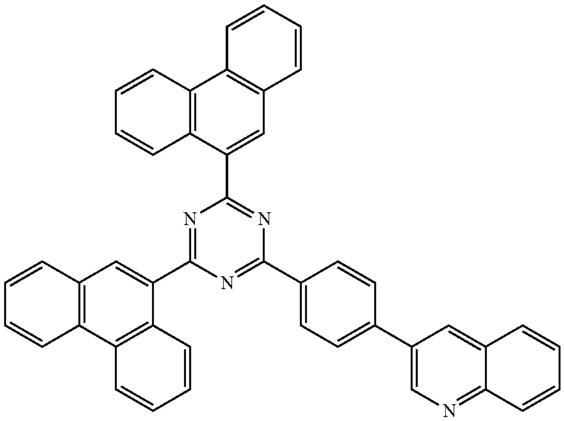

ET26
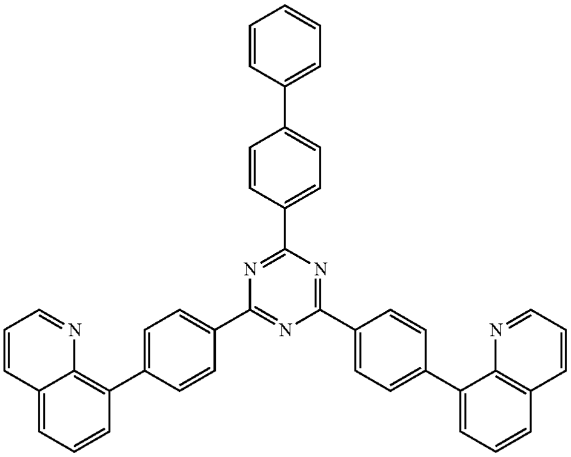
ET27
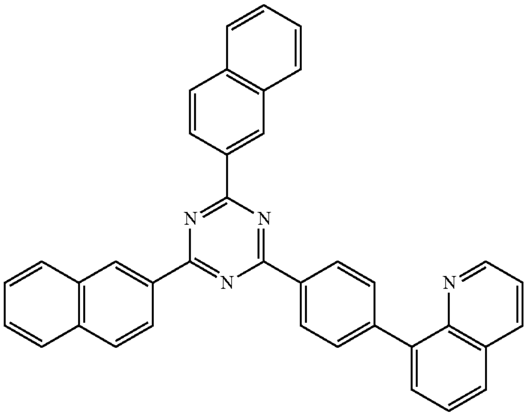
ET28
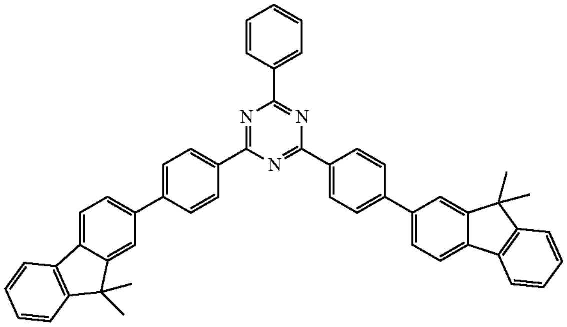
ET29
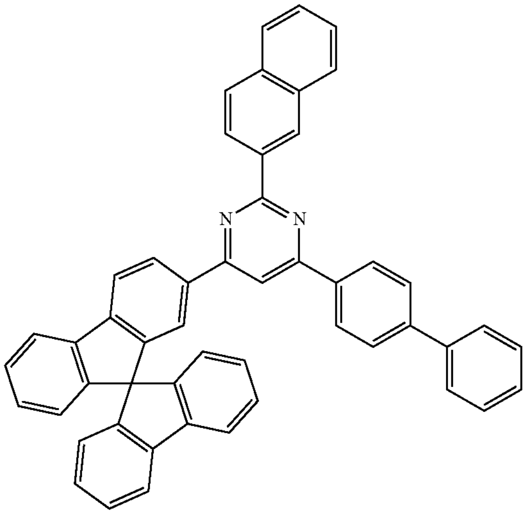
ET30
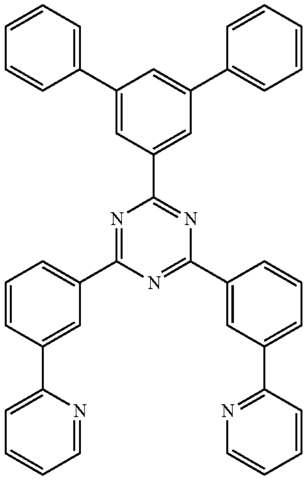
ET31
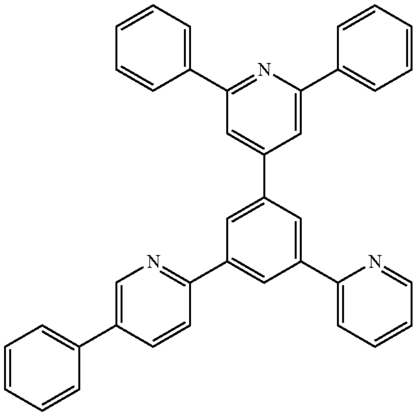

-continued
ET32
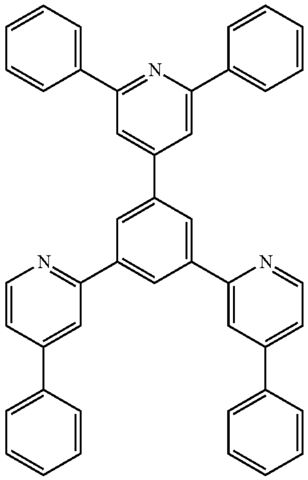
ET33
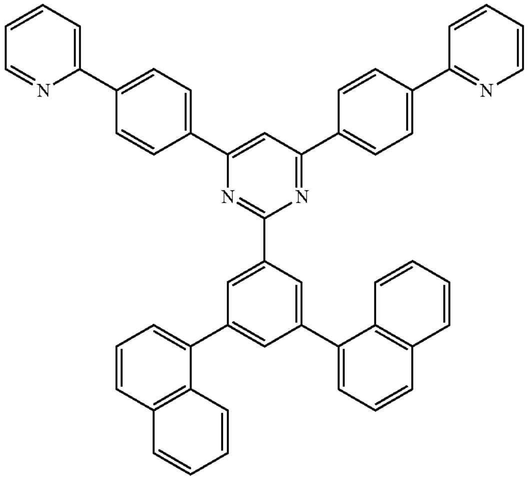
ET34
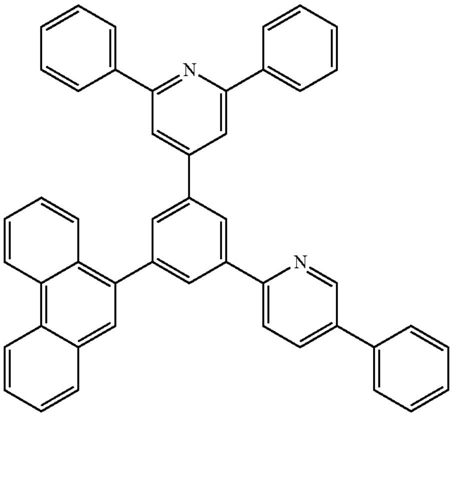
-continued
ET35
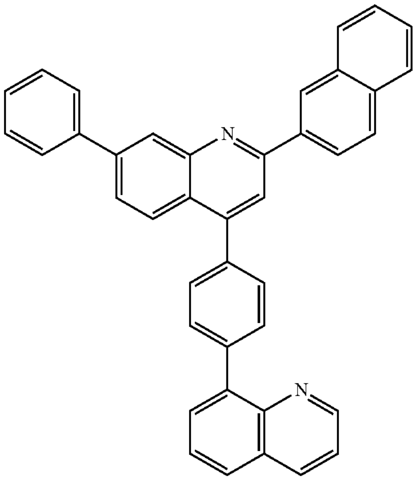
ET36
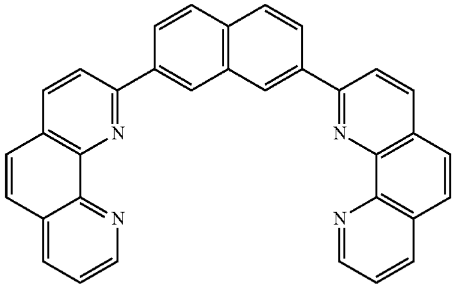
ET37
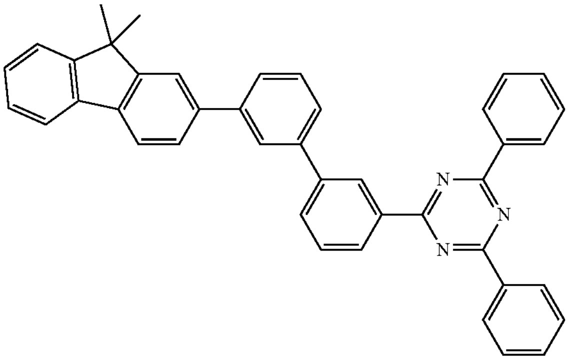
ET38
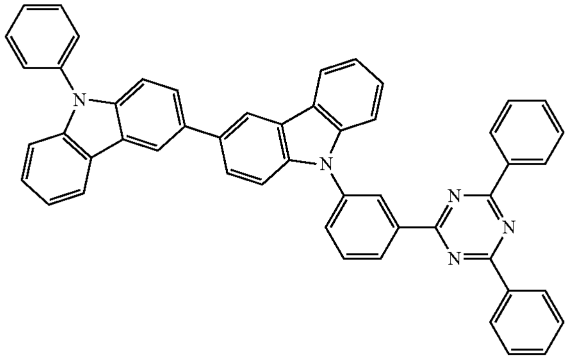

-continued
ET39
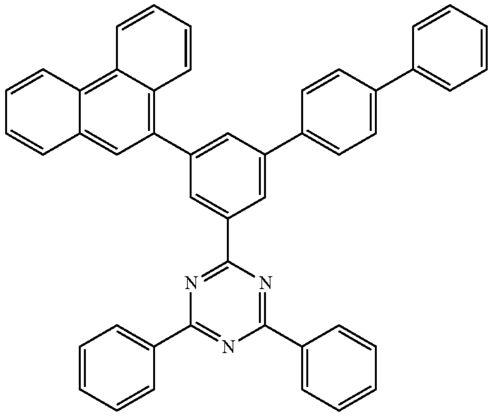
ET40
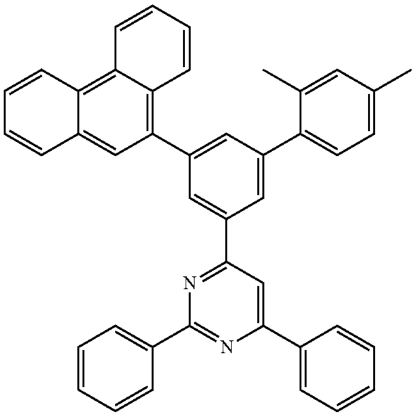
ET41
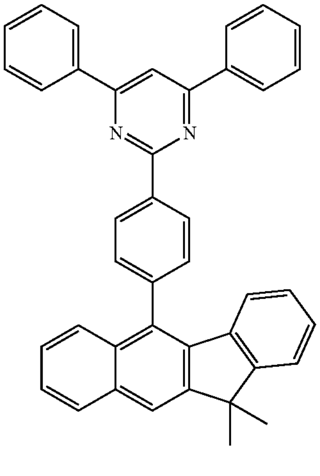
-continued
ET42
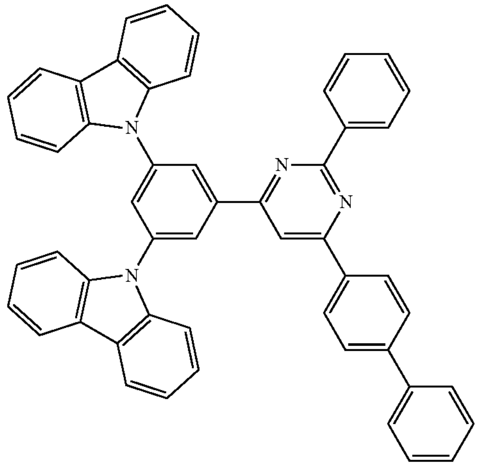
ET43
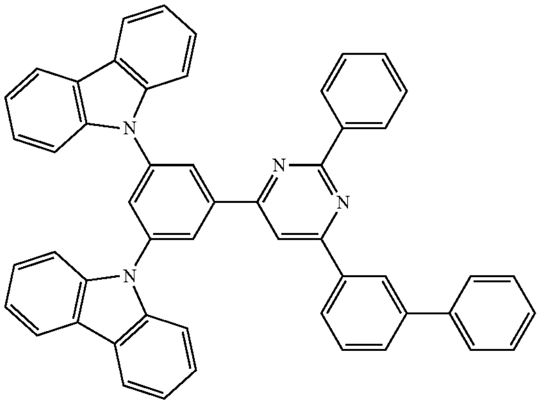
ET44
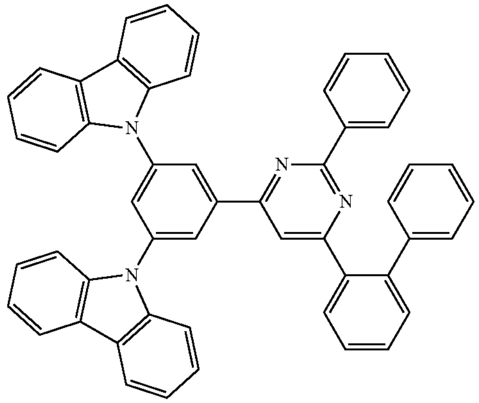
ET45
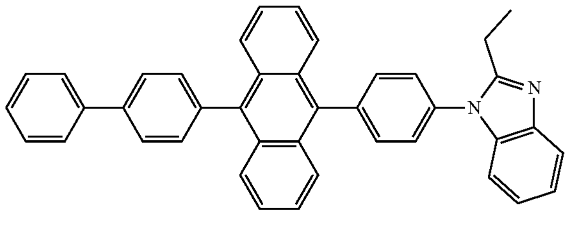

-continued

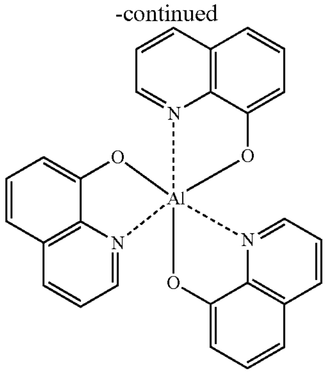

Alq3

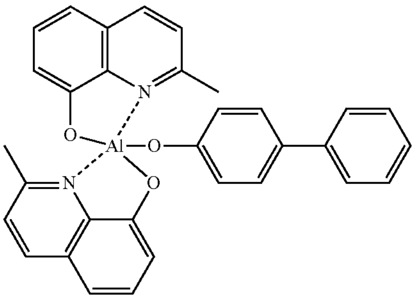

BAlq

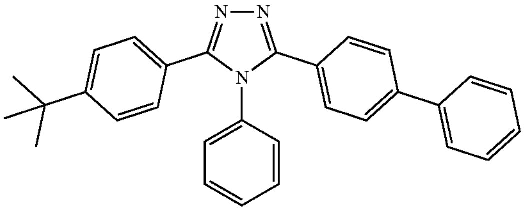

TAZ

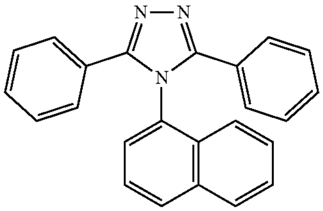

NTAZ .

The thickness of the electron transport region may be in a range of about 100 (Angstroms) A to about 5,000 Å, and in some embodiments, about 160 Å to about 4,000 Å. When the electron transport region includes a buffer layer, a hole blocking layer, an electron control layer, an electron transport layer, or any combination thereof, a thickness of the buffer layer, the hole blocking layer, or the electron control layer may each independently be in a range of about 20 Å to about 1,000 Å, for example, about 30 Å to about 300 Å, and a thickness of the electron transport layer may be in a range of about 100 Å to about 1,000 Å, for example, about 150 Å to about 500 Å. When the thicknesses of the buffer layer, the hole blocking layer, the electron control layer, the electron transport layer, and/or the electron transport layer are each within these ranges, excellent electron transport characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a lithium (Li) ion, a sodium (Na) ion, a potassium (K) ion, a rubidium (Rb) ion, and/or a cesium (Cs) ion. A metal ion of the alkaline earth metal complex may be a beryllium (Be) ion, a magnesium (Mg) ion, a calcium (Ca) ion, a strontium (Sr) ion, and/or a barium (Ba) ion. Each ligand coordinated with the metal ion of the alkali metal complex and the alkaline earth metal complex may independently be hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof.

For example, the metal-containing material may include a Li complex. The Li complex may include, e.g., Compound ET-D1 (LiQ) and/or Compound ET-D2:

ET-D1

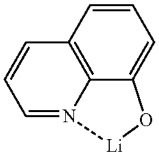

ET-D2

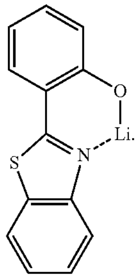

The electron transport region may include an electron injection layer that facilitates injection of electrons from the second electrode 150. The electron injection layer may be in direct contact (e.g., physical contact) with the second electrode 150.

The electron injection layer may have i) a single-layered structure including (e.g., consisting of) a single layer including (e.g., consisting of) a single material, ii) a single-layered structure including (e.g., consisting of) a single layer including a plurality of different materials, or iii) a multi-layered structure having a plurality of layers including a plurality of different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may be Li, Na, K, Rb, Cs, or any combination thereof. The alkaline earth metal may be Mg, Ca, Sr, Ba, or any combination thereof. The rare earth metal may be Sc, Y, Ce, Tb, Yb, Gd, or any combination thereof.

The alkali metal-containing compound, the alkaline earth metal-containing compound, and the rare earth metal-containing compound may respectively be oxides, halides (e.g., fluorides, chlorides, bromides, and/or iodines), or any combination thereof of each of the alkali metal, the alkaline earth metal, and/or the rare earth metal.

The alkali metal-containing compound may be alkali metal oxides such as $Li_2O$, $Cs_2O$, and/or $K_2O$, alkali metal halides such as LiF, NaF, CsF, KF, LiI, NaI, CsI, and/or KI, or any combination thereof. The alkaline earth-metal-containing compound may include alkaline earth-metal compounds, such as BaO, SrO, CaO, $BaxSr_{1-x}O$ (wherein x is a real number that satisfying $0<x<1$), and/or $BaxCa_{1-x}O$ (wherein x is a real number that satisfying $0<x<1$). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In some embodiments, the rare earth metal-containing compound may include a lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, $Lu_2Te_3$, and/or the like.

The alkali metal complex, the alkaline earth metal complex, and the rare earth metal complex may include: i) one of ions of the alkali metal, alkaline earth metal, and/or rare earth metal described above and ii) a ligand bound to the metal ion, e.g., hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof as described above, or may further include an organic material (e.g., a compound represented by Formula 601).

In some embodiments, the electron injection layer may include (e.g., consist of) i) an alkali metal-containing compound (e.g., alkali metal halide), or ii) a) an alkali metal-containing compound (e.g., alkali metal halide); and b) an alkali metal, an alkaline earth metal, a rare earth metal, or any combination thereof. In some embodiments, the electron injection layer may be a KI:Yb co-deposition layer, a RbI:Yb co-deposition layer, and/or the like.

When the electron injection layer may further include an organic material, the alkali metal, the alkaline earth metal, the rare earth metal, the alkali metal-containing compound, the alkaline earth metal-containing compound, the rare earth metal-containing compound, the alkali metal complex, the alkaline earth metal complex, the rare earth metal complex, or any combination thereof may be homogeneously or non-homogeneously dispersed in a matrix including the organic material.

The thickness of the electron injection layer may be in a range of about 1 Å to about 1,000 Å, and in some embodiments, about 3 Å to about 90 Å. When the thickness of the electron injection layer is within any of these ranges, excellent electron injection characteristics may be obtained without a substantial increase in driving voltage.

Second Electrode 150

The second electrode 150 may be on the interlayer 130. In an embodiment, the second electrode 150 may be a cathode (e.g., an electron injection electrode). In this embodiment, a material for forming the second electrode 150 may be a material having a low work function, for example, a metal, an alloy, an electrically conductive compound, or any combination thereof.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure, or a multi-layered structure including two or more layers.

Capping Layer

A first capping layer may be located outside the first electrode 110, and/or a second capping layer may be located outside the second electrode 150. In some embodiments, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

In the light-emitting device 10, light emitted from the emission layer in the interlayer 130 may pass through the first electrode 110 (which may be a semi-transmissive electrode or a transmissive electrode) and through the first capping layer to the outside. In the light-emitting device 10, light emitted from the emission layer in the interlayer 130 may pass through the second electrode 150 (which may be a semi-transmissive electrode or a transmissive electrode) and through the second capping layer to the outside.

The first capping layer and the second capping layer may improve the external luminescence efficiency based on the principle of constructive interference. Accordingly, the optical extraction efficiency of the light-emitting device 10 may be increased, thus improving luminescence efficiency of the light-emitting device 10.

The first capping layer and the second capping layer may each include a material having a refractive index of 1.6 or higher (at 589 nm).

The first capping layer and the second capping layer may each independently be a capping layer including an organic material, an inorganic capping layer including an inorganic material, or an organic-inorganic composite capping layer including an organic material and an inorganic material.

At least one selected from the first capping layer and the second capping layer may each independently include carbocyclic compounds, heterocyclic compounds, amine group-containing compounds, porphine derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may optionally each independently be substituted with a substituent of O, N, S, Se, Si, F, Cl, Br, I, or any combination thereof. In some embodiments, at least one selected from the first capping layer and the second capping layer may each independently include an amine group-containing compound.

In some embodiments, at least one selected from the first capping layer and the second capping layer may each independently include the compound represented by Formula 201, the compound represented by Formula 202, or any combination thereof.

In one or more embodiments, at least one selected from the first capping layer and the second capping layer may each independently include one of Compounds HT28 to HT33, one of Compounds CP1 to CP6, β-NPB, or any combination thereof:

CP1

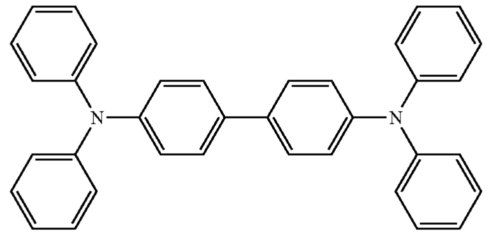

CP2

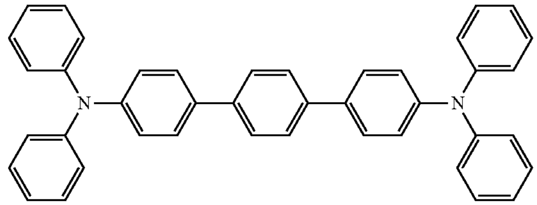

CP3

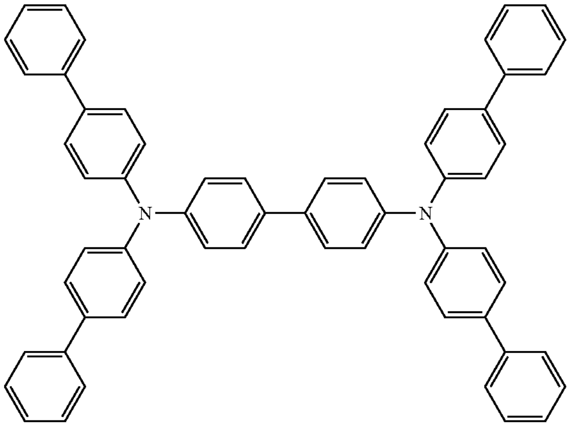

CP4

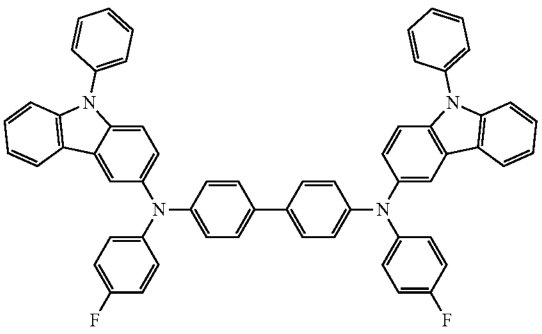

-continued

CP5

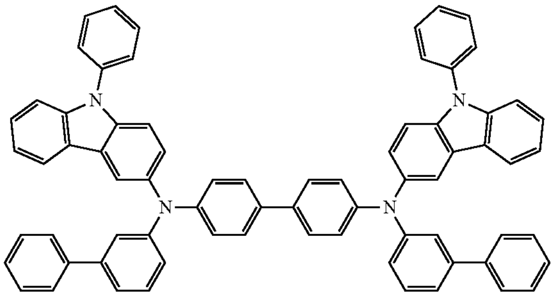

CP6

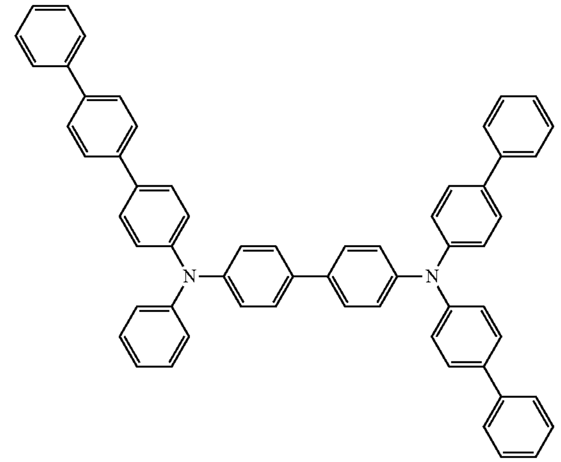

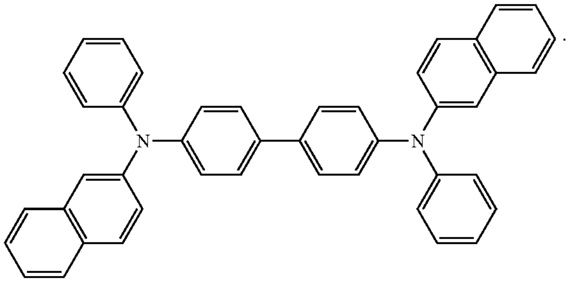

β-NPB

Electronic Apparatus

The light-emitting device may be included in various suitable electronic apparatuses. In some embodiments, an electronic apparatus including the light-emitting device may be an emission apparatus and/or an authentication apparatus.

The electronic apparatus (e.g., an emission apparatus) may further include, in addition to the light-emitting device, i) a color filter, ii) a color-conversion layer, or iii) a color filter and a color-conversion layer. The color filter and/or the color-conversion layer may be on at least one traveling direction of light emitted from the light-emitting device. For example, light emitted from the light-emitting device may be blue light and/or white light. The light-emitting device may be understood by referring to the descriptions provided herein. In some embodiments, the color-conversion layer may include quantum dots. The quantum dot may be, for example, the quantum dot described herein.

The electronic apparatus may include a first substrate. The first substrate may include a plurality of sub-pixel areas, the color filter may include a plurality of color filter areas respectively corresponding to the plurality of sub-pixel areas, and the color-conversion layer may include a plurality of color-conversion areas respectively corresponding to the plurality of sub-pixel areas.

A pixel defining film may be between the plurality of sub-pixel areas to define each sub-pixel area.

The color filter may further include a plurality of color filter areas and light-blocking patterns between the plurality of color filter areas, and the color-conversion layer may further include a plurality of color-conversion areas and light-blocking patterns between the plurality of color-conversion areas.

The plurality of color filter areas (or a plurality of color-conversion areas) may include: a first area that emits a first color light; a second area that emits a second color light; and/or a third area that emits a third color light, and the first color light, the second color light, and/or the third color light may have different maximum emission wavelengths. In some embodiments, the first color light may be red light, the second color light may be green light, and the third color light may be blue light. In some embodiments, the plurality of color filter areas (or the plurality of color-conversion areas) may each include quantum dots. In some embodiments, the first area may include red quantum dots, the second area may include green quantum dots, and the third area may not include a quantum dot. The quantum dot may be understood by referring to the description of the quantum dot provided herein. The first area, the second area, and/or the third area may each further include an emitter.

In some embodiments, the light-emitting device may emit a first light, the first area may absorb the first light to emit a 1-1 color light (e.g., a first-first color light), the second area may absorb the first light to emit a 2-1 color light (e.g., a second-first color light), and the third area may absorb the first light to emit a 3-1 color light (e.g., a third-first color light). In this embodiment, the 1-1 color light, the 2-1 color light, and the 3-1 color light may each have a different maximum emission wavelength. In some embodiments, the first light may be blue light, the 1-1 color light may be red light, the 2-1 color light may be green light, and the 3-1 light may be blue light.

The electronic apparatus may further include a thin-film transistor, in addition to the light-emitting device. The thin-film transistor may include a source electrode, a drain electrode, and an active layer, wherein one selected from the source electrode and the drain electrode may be electrically coupled to one selected from the first electrode and the second electrode of the light-emitting device.

The thin-film transistor may further include a gate electrode, a gate insulating film, and/or the like.

The active layer may include a crystalline silicon, an amorphous silicon, an organic semiconductor, and/or an oxide semiconductor.

The electronic apparatus may further include an encapsulation unit that seals the light-emitting device. The encapsulation unit may be between the color filter and/or the color-conversion layer and the light-emitting device. The encapsulation unit may allow light to pass to the outside from the light-emitting device and prevent or reduce permeation of air and/or moisture to the light-emitting device at the same time. The encapsulation unit may be a sealing substrate including a transparent glass and/or a plastic substrate. The encapsulation unit may be a thin-film encapsulating layer including at least one of an organic layer and/or an inorganic layer. When the encapsulation unit is a thin film encapsulating layer, the electronic apparatus may be flexible.

In addition to the color filter and/or the color-conversion layer, various suitable functional layers may be on the encapsulation unit depending on the use of an electronic apparatus. Examples of the functional layer may include a touch screen layer, a polarization layer, and/or the like. The touch screen layer may be a resistive touch screen layer, a capacitive touch screen layer, and/or an infrared beam touch screen layer. The authentication apparatus may be, for example, a biometric authentication apparatus that identifies an individual according biometric information (e.g., a fingertip, a pupil, and/or the like).

The authentication apparatus may further include a biometric information collecting unit, in addition to the light-emitting device described above.

The electronic apparatus may be applicable to various suitable displays, an optical source, lighting, a personal computer (e.g., a mobile personal computer), a cellphone, a digital camera, an electronic note, an electronic dictionary, an electronic game console, a medical device (e.g., an electronic thermometer, a blood pressure meter, a glucometer, a pulse measuring device, a pulse wave measuring device, an electrocardiograph recorder, an ultrasonic diagnosis device, and/or an endoscope display device), a fish finder, various suitable measurement devices, gauges (e.g., gauges of an automobile, an airplane, and/or a ship), and/or a projector.

Figure 2:
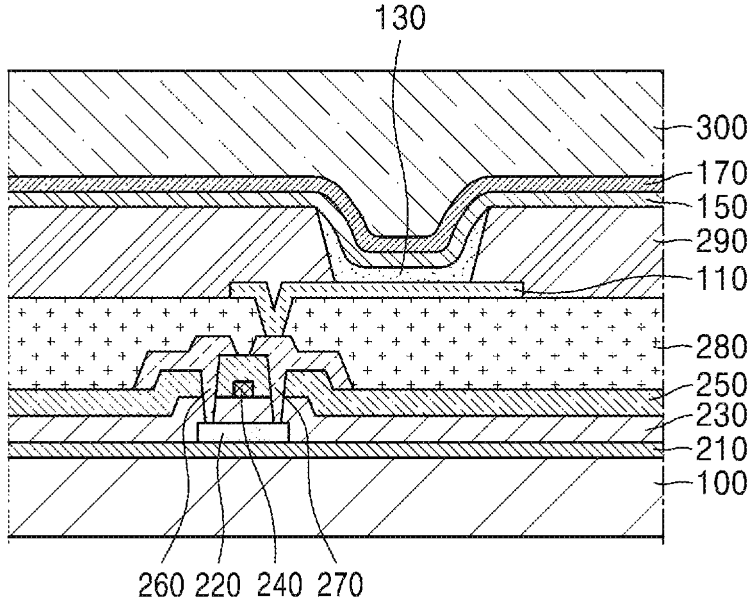
FIG. 2 is a schematic cross-sectional view of a light-emitting apparatus according to an embodiment.
Figure 3:
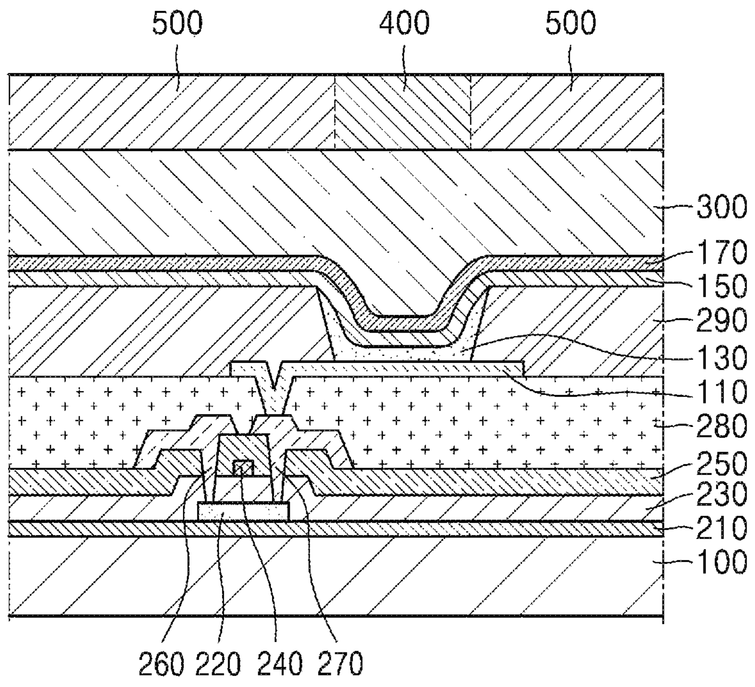
FIG. 3 is a schematic cross-sectional view of another light-emitting apparatus according to an embodiment.

Descriptions of FIGS. 2 and 3

FIG. 2 is a schematic cross-sectional view of a light-emitting apparatus according to an embodiment.

An emission apparatus in FIG. 2 may include a substrate 100, a thin-film transistor, a light-emitting device, and an encapsulation unit 300 sealing the light-emitting device.

The substrate 100 may be a flexible substrate, a glass substrate, and/or a metal substrate. A buffer layer 210 may be on the substrate 100. The buffer layer 210 may prevent or reduce penetration of impurities through the substrate 100 and provide a flat surface on the substrate 100.

A thin-film transistor may be on the buffer layer 210. The thin-film transistor may include an active layer 220, a gate electrode 240, a source electrode 260, and a drain electrode 270.

The active layer 220 may include an inorganic semiconductor such as silicon and/or polysilicon, an organic semiconductor, and/or an oxide semiconductor and include a source area, a drain area, and a channel area.

A gate insulating film 230 for insulating the active layer 220 and the gate electrode 240 may be on the active layer 220, and the gate electrode 240 may be on the gate insulating film 230.

An interlayer insulating film 250 may be on the gate electrode 240. The interlayer insulating film 250 may be between the gate electrode 240 and the source electrode 260 and between the gate electrode 240 and the drain electrode 270 to provide insulation therebetween.

The source electrode 260 and the drain electrode 270 may be on the interlayer insulating film 250. The interlayer insulating film 250 and the gate insulating film 230 may expose the source area and the drain area of the active layer 220, and the source electrode 260 and the drain electrode 270 may be adjacent to the exposed source area and the exposed drain area of the active layer 220.

Such a thin-film transistor may be electrically coupled to a light-emitting device to drive the light-emitting device and may be protected by a passivation layer 280. The passivation layer 280 may include an inorganic insulating film, an organic insulating film, or a combination thereof. A light-emitting device may be on the passivation layer 280. The light-emitting device may include a first electrode 110, an interlayer 130, and a second electrode 150.

The first electrode 110 may be on the passivation layer 280. The passivation layer 280 may not fully cover the drain electrode 270 and expose a specific area of the drain electrode 270, and the first electrode 110 may be coupled to the exposed drain electrode 270.

A pixel-defining film 290 may be on the first electrode 110. The pixel-defining film 290 may expose a specific area of the first electrode 110, and the interlayer 130 may be formed in the exposed area. The pixel-defining film 290 may be a polyimide and/or polyacryl organic film. In some embodiments, some layers of the interlayer 130 may extend to the upper portion of the pixel-defining film 290 and may be a common layer.

The second electrode 150 may be on the interlayer 130, and a capping layer 170 may be additionally formed on the second electrode 150. The capping layer 170 may cover the second electrode 150.

The encapsulation unit 300 may be on the capping layer 170. The encapsulation unit 300 may be on the light-emitting device to protect a light-emitting device from moisture and/or oxygen. The encapsulation unit 300 may include: an inorganic film including silicon nitride ($SiN_x$), silicon oxide ($SiO_x$), indium tin oxide, indium zinc oxide, or any combination thereof; an organic film including polyethylene terephthalate, polyethylene naphthalate, polycarbonate, polyimide, polyethylene sulfonate, polyoxy methylene, poly aryllate, hexamethyl disiloxane, an acrylic resin (e.g., polymethyl methacrylate, polyacrylic acid, and/or the like), an epoxy resin (e.g., aliphatic glycidyl ether (AGE), and/or the like), or any combination thereof; or a combination of the inorganic film and the organic film.

FIG. 3 is a schematic cross-sectional view of another light-emitting apparatus according to an embodiment.

The emission apparatus shown in FIG. 3 may be substantially identical to the emission apparatus shown in FIG. 2, except that a light-shielding pattern 500 and a functional area 400 are additionally located on the encapsulation unit 300. The functional area 400 may be i) a color filter area, ii) a color-conversion area, or iii) a combination of a color filter area and a color-conversion area. In some embodiments, the light-emitting device shown in FIG. 3 included in the emission apparatus may be a tandem light-emitting device.

Manufacturing Method

The layers constituting the hole transport region, the emission layer, and the layers constituting the electron transport region may be formed in a set or specific region by using one or more suitable methods such as vacuum deposition, spin coating, casting, Langmuir-Blodgett (LB) deposition, ink-jet printing, laser printing, and/or laser-induced thermal imaging.

When the layers constituting the hole transport region, the emission layer, and the layers constituting the electron transport region are each formed by vacuum deposition, the vacuum deposition may be performed at a deposition temperature in a range of about 100° C. to about 500° C. at a vacuum degree in a range of about 10-8 torr to about 10-3 torr, and at a deposition rate in a range of about 0.01 Angstroms per second (Å/sec) to about 100 Å/sec, depending on the material to be included in each layer and the structure of each layer to be formed.

General Definitions of at Least Some of the Terms

The term "$C_3$-$C_{60}$ carbocyclic group," as used herein, refers to a cyclic group consisting of carbon atoms only and having 3 to 60 carbon atoms. The term "$C_1$-$C_{60}$ heterocyclic group," as used herein, refers to a cyclic group having 1 to 60 carbon atoms in addition to a heteroatom other than carbon atoms. The $C_3$-$C_{60}$ carbocyclic group and the $C_1$-$C_{60}$ heterocyclic group may each be a monocyclic group consisting of one ring or a polycyclic group in which at least two rings are condensed (e.g., combined together with each other). For example, the number of ring-forming atoms in the $C_1$-$C_{60}$ heterocyclic group may be in a range of 3 to 61.

The term "cyclic group," as used herein, may include the $C_3$-$C_{60}$ carbocyclic group and the $C_1$-$C_{60}$ heterocyclic group.

The term "π electron-rich $C_3$-$C_{60}$ cyclic group," as used herein, refers to a cyclic group having 3 to 60 carbon atoms and not including *—N=*' as a ring-forming moiety. The term "π electron-deficient nitrogen-containing $C_1$-$C_{60}$ cyclic group," as used herein, refers to a heterocyclic group having 1 to 60 carbon atoms and *—N=*' as a ring-forming moiety.

In some embodiments, the $C_3$-$C_{60}$ carbocyclic group may be i) a T1 group or ii) a group in which at least two T1 groups are condensed (e.g., combined together) with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, and/or an indenoanthracene group), the $C_1$-$C_{60}$ heterocyclic group may be i) a T2 group, ii) a group in which at least two T2 groups are condensed (e.g., combined together), or iii) a group in which at least one T2 group is condensed with (e.g., combined together with) at least one T1 group (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and/or the like), the π electron-rich $C_3$-$C_{60}$ cyclic group may be i) a T1 group, ii) a condensed group in which at least two T1 groups are condensed (e.g., combined together), iii) a T3 group, iv) a condensed group in which at least two T3 groups are condensed (e.g., combined together), or v) a condensed group in which at least one T3 group is condensed with (e.g., combined together with) at least one T1 group (for example, a $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, a benzothienodibenzothiophene group, and/or the like), and the π electron-deficient nitrogen-containing $C_1$-$C_{60}$ cyclic group may be i) a T4 group, ii) a group in which at least twos T4 groups are condensed (e.g., combined together), iii) a group in which at least one T4 group is condensed with (e.g., combined together with) at least one T1 group, iv) a group in which at least one T4 group is condensed with (e.g., combined together with) at least one T3 group, or v) a group in which at least one T4 group, at least one T1 group, and at least one T3 group are condensed (e.g., combined together) with (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and/or the like), the T1 group may be a cyclopentane group, a cyclohexane group, a cycloheptane group, a cyclooctane group, a cyclopentene group, a cyclohexene group, a cycloheptene group, a cyclooctene group, an adamantane group, a norbornene group, a norobornane group, a bicyclo[1.1.1]pentane group, a bicyclo[2.1.1]hexane group, a bicyclo[2.2.2]octane group, or a benzene group, the group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group or a tetrazine group, the group T3 may be a furan group, a thiophene group, a 1H-pyrrole group, a silole group, or a borole group, and the group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or tetrazine group.

The term "cyclic group," "$C_3$-$C_{60}$ carbocyclic group," "$C_1$-$C_6$ heterocyclic group," "π electron-rich $C_3$-$C_{60}$ cyclic group," or "π electron-deficient nitrogen-containing $C_1$-$C_{60}$ cyclic group," as used herein, may be a group condensed with (e.g., combined together with) any suitable cyclic group, a monovalent group, or a polyvalent group (e.g., a divalent group, a trivalent group, a quadvalent group, or the like), depending on the structure of the formula to which the term is applied. For example, a "benzene group" may be a benzo group, a phenyl group, a phenylene group, or the like, and this may be understood by one of ordinary skill in the art, depending on the structure of the formula including the "benzene group".

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_6$ alkyl group," as used herein, refers to a linear or branched aliphatic hydrocarbon monovalent group having 1 to 60 carbon atoms, and examples thereof include a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, and a tert-decyl group. The term "$C_1$-$C_6$ alkylene group," as used herein, refers to a divalent group having substantially the same structure as the $C_1$-$C_{60}$ alkyl group.

The term "$C_2$-$C_{60}$ alkenyl group," as used herein, refers to a monovalent hydrocarbon group having at least one carbon-carbon double bond at a main chain (e.g., in the middle) or at a terminal end (e.g., the terminus) of the $C_2$-$C_{60}$ alkyl group. Examples thereof include an ethenyl group, a propenyl group, and a butenyl group. The term "$C_2$-$C_{60}$ alkenylene group," as used herein, refers to a divalent group having substantially the same structure as the $C_2$-$C_{60}$ alkenyl group.

The term "$C_2$-$C_{60}$ alkynyl group," as used herein, refers to a monovalent hydrocarbon group having at least one carbon-carbon triple bond at a main chain (e.g., in the middle) or at a terminal end (e.g., the terminus) of the $C_2$-$C_{60}$ alkyl group. Examples thereof include an ethynyl group and a propynyl group. The term "$C_2$-$C_{60}$ alkynylene group," as used herein, refers to a divalent group having substantially the same structure as the $C_2$-$C_{60}$ alkynyl group.

The term "$C_1$-$C_6$ alkoxy group," as used herein, refers to a monovalent group represented by —$OA_{101}$ (wherein $A_{101}$ is a $C_1$-$C_{60}$ alkyl group). Examples thereof include a methoxy group, an ethoxy group, and an isopropyloxy group.

The term "$C_3$-$C_{10}$ cycloalkyl group," as used herein, refers to a monovalent saturated hydrocarbon monocyclic group including 3 to 10 carbon atoms. Examples of the "$C_3$-$C_{10}$ cycloalkyl group," as used herein include a cyclopropyl group, a cyclobutyl group, a cyclopentyl group, a cyclohexyl group, a cycloheptyl group, a cyclooctyl group, an adamantanyl group, a norbornanyl (bicyclo[2.2.1]heptyl) group, a bicyclo[1.1.1]pentyl group, a bicyclo[2.1.1]hexyl group, or a bicyclo[2.2.2]octyl group. The term "$C_3$-$C_{10}$ cycloalkylene group," as used herein, refers to a divalent group having substantially the same structure as the $C_3$-$C_{10}$ cycloalkyl group.

The term "$C_1$-$C_{10}$ heterocycloalkyl group," as used herein, refers to a monovalent cyclic group including at least one heteroatom other than carbon atoms as a ring-forming atom and having 1 to 10 carbon atoms. Examples thereof include a 1,2,3,4-oxatriazolidinyl group, a tetrahydrofuranyl group, and a tetrahydrothiophenyl group. The term "$C_1$-$C_{10}$ heterocycloalkylene group," as used herein, refers to a divalent group having substantially the same structure as the $C_1$-$C_{10}$ heterocycloalkyl group.

The term "$C_3$-$C_{10}$ cycloalkenyl group," as used herein, refers to a monovalent cyclic group including 3 to 10 carbon atoms and at least one carbon-carbon double bond in its ring, wherein the molecular structure is non-aromatic when considered as a whole. Examples thereof include a cyclopentenyl group, a cyclohexenyl group, and a cycloheptenyl group. The term "$C_3$-$C_{10}$ cycloalkenylene group," as used herein, refers to a divalent group having substantially the same structure as the $C_3$-$C_{10}$ cycloalkenyl group.

The term "$C_1$-$C_{10}$ heterocycloalkenyl group," as used herein, refers to a monovalent cyclic group including at least one heteroatom other than carbon atoms as a ring-forming atom, 1 to 10 carbon atoms, and at least one double bond in its ring. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group," as used herein, refers to a divalent group having substantially the same structure as the $C_1$-$C_{10}$ heterocycloalkenyl group.

The term "$C_6$-$C_{60}$ aryl group," as used herein, refers to a monovalent group having a carbocyclic aromatic system having 6 to 60 carbon atoms. The term "$C_6$-$C_{60}$ arylene group," as used herein, refers to a divalent group having a carbocyclic aromatic system having 6 to 60 carbon atoms. Examples of the $C_6$-$C_{60}$ aryl group include a fluorenyl group, a spiro-bifluorenyl group, a benzofluorenyl group, a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each independently include two or more rings, the respective rings may be fused (e.g., combined together).

The term "$C_1$-$C_6$ heteroaryl group," as used herein, refers to a monovalent group having a heterocyclic aromatic system further including at least one heteroatom other than carbon atoms as a ring-forming atom and 1 to 60 carbon atoms. The term "$C_1$-$C_6$ heteroarylene group," as used herein, refers to a divalent group having a heterocyclic aromatic system further including at least one heteroatom other than carbon atoms as a ring-forming atom and 1 to 60 carbon atoms. Examples of the $C_1$-$C_{60}$ heteroaryl group include a carbazolyl group, a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each independently include two or more rings, the respective rings may be fused (e.g., combined together).

The term "monovalent non-aromatic condensed polycyclic group," as used herein, refers to a monovalent group that has two or more rings condensed (e.g., combined together) and only carbon atoms as ring forming atoms (e.g., 8 to 60 carbon atoms), wherein the entire molecular structure is non-aromatic (e.g., is not aromatic when the entire molecular structure is considered as a whole). Examples of the monovalent non-aromatic condensed polycyclic group include an adamantyl group, an indenyl group, an indenophenanthrenyl group, and an indenoanthracenyl group. The term "divalent non-aromatic condensed polycyclic group," as used herein, refers to a divalent group having substantially the same structure as the monovalent non-aromatic condensed polycyclic group.

The term "monovalent non-aromatic condensed heteropolycyclic group," as used herein, refers to a monovalent group that has two or more condensed rings and at least one heteroatom, in addition to carbon atoms (e.g., 1 to 60 carbon atoms), as a ring-forming atom, wherein the entire molecular structure is non-aromatic (e.g., is not aromatic when the entire molecular structure is considered as a whole). Examples of the monovalent non-aromatic condensed heteropolycyclic group include an azaadamantyl group and 9H-xanthenyl group. The term "divalent non-aromatic condensed heteropolycyclic group," as used herein, refers to a divalent group having substantially the same structure as the monovalent non-aromatic condensed heteropolycyclic group.

The term "$C_6$-$C_{60}$ aryloxy group," as used herein, refers to a group represented by —$OA_{102}$ (where $A_{102}$ is a $C_6$-$C_{60}$ aryl group). The term "$C_6$-$C_{60}$ arylthio group," as used herein, refers to a group represented by —$SA_{103}$ (where $A_{103}$ is a $C_6$-$C_{60}$ aryl group).

The term "heteroatom," as used herein, refers to any suitable atom other than a carbon atom. Examples of the heteroatom may include O, S, N, P, Si, B, Ge, Se, or any combination thereof.

The term "Ph," as used herein, represents a phenyl group. The term "Me," as used herein, represents a methyl group. The term "Et," as used herein, represents an ethyl group. The term "ter-Bu" or "$Bu^t$," as used herein, represents a tert-butyl group. The term "OMe," as used herein, represents a methoxy group.

The term "biphenyl group," as used herein, refers to a phenyl group substituted with at least one phenyl group. The "biphenyl group" belongs to "a substituted phenyl group" having a "$C_6$-$C_{60}$ aryl group" as a substituent.

The term "terphenyl group," as used herein, refers to a phenyl group substituted with at least one phenyl group. The "terphenyl group" belongs to "a substituted phenyl group" having a "$C_6$-$C_{60}$ aryl group substituted with a $C_6$-$C_{60}$ aryl group" as a substituent.

The symbols * and *', as used herein, unless defined otherwise, each indicate a binding site to an adjacent atom in the corresponding formula.

Hereinafter, compounds and a light-emitting device according to one or more embodiments will be described in more detail with reference to Synthesis Examples and Examples. The wording "B was used instead of A" used in describing Synthesis Examples means that an amount of B used was identical to an amount of A used in terms of molar equivalents.

EXAMPLES

Synthesis Examples

Synthesis Example 1: Synthesis of Compound 1

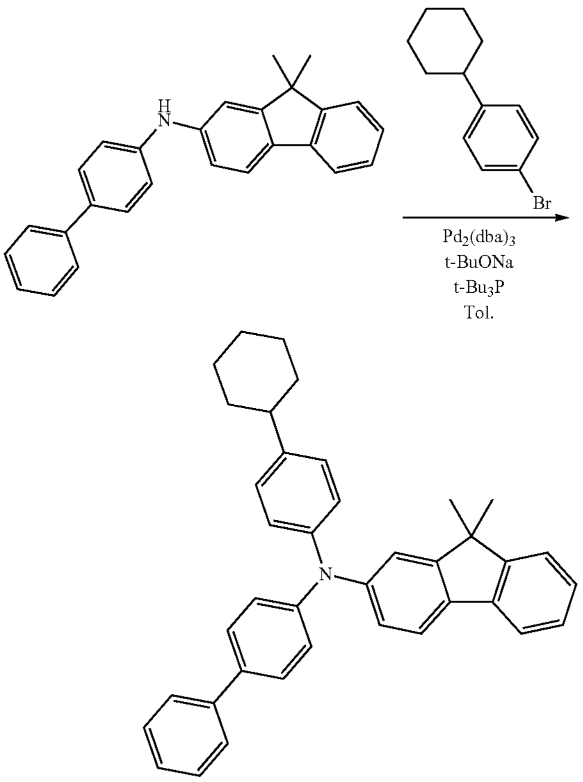

1

10 millimoles (mmol) of N-([1,1'-biphenyl]-4-yl)-9,9-dimethyl-9H-fluoren-2-amine (1 eq.), 11 mmol of 1-bromo-4-cyclohexylbenzene (1.1 eq.), 0.3 mmol of $Pd_2(dba)_3$ (0.03 eq.), 30 mmol of t-BuONa (3 eq.), 0.6 mmol of t-$Bu_3P$ (0.06 eq.), and 100 milliliters (mL) of toluene were added to a 1-neck round-bottom flask, followed by stirring at a temperature of 110° C. for 2 hours.

Once the reaction was complete, a work-up process was performed using $H_2O$ and ether, followed by separation of a resultant organic layer through column chromatography (eluent: methylene chloride and hexane at a volumetric ratio of 1:5).

The resulting organic layer was recrystallized using ether to thereby obtain 3.5 grams (g) of Compound 1. (yield=70%, purity≥99.9%)

Synthesis Example 2: Synthesis of Compound 5

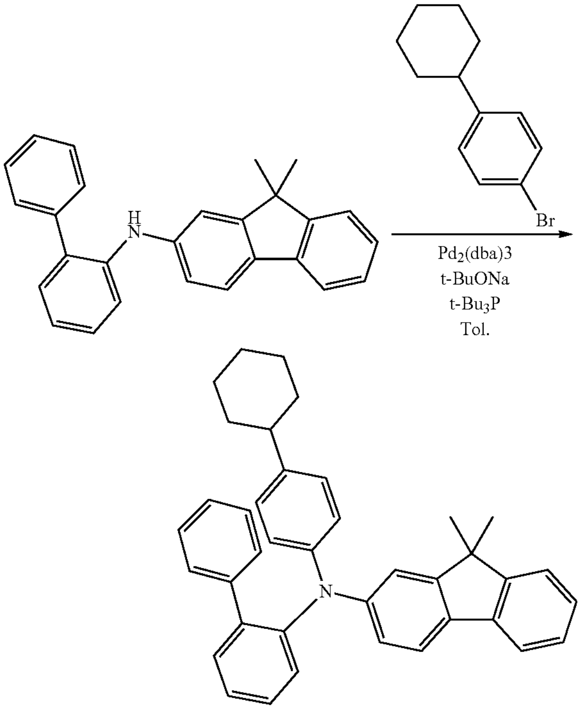

5

10 mmol of N-([1,1'-biphenyl]-2-yl)-9,9-dimethyl-9H-fluoren-2-amine (1 eq.), 11 mmol of 1-bromo-4-cyclohexylbenzene (1.1 eq.), 0.3 mmol of $Pd_2(dba)_3$ (0.03 eq.), 30 mmol of t-BuONa (3 eq.), 0.6 mmol of t-$Bu_3P$ (0.06 eq.), and 100 mL of toluene were added to a 1-neck round-bottom flask, followed by stirring at a temperature of 110° C. for 2 hours.

Once the reaction was complete, a work-up process was performed using $H_2O$ and ether, followed by separation of a resultant organic layer through column chromatography (eluent: methylene chloride and hexane at a volumetric ratio of 1:5).

The resulting organic layer was recrystallized using ether to thereby obtain 3.8 g of Compound 5. (yield=75%, purity≥99.9%)

Synthesis Example 3: Synthesis of Compound 13

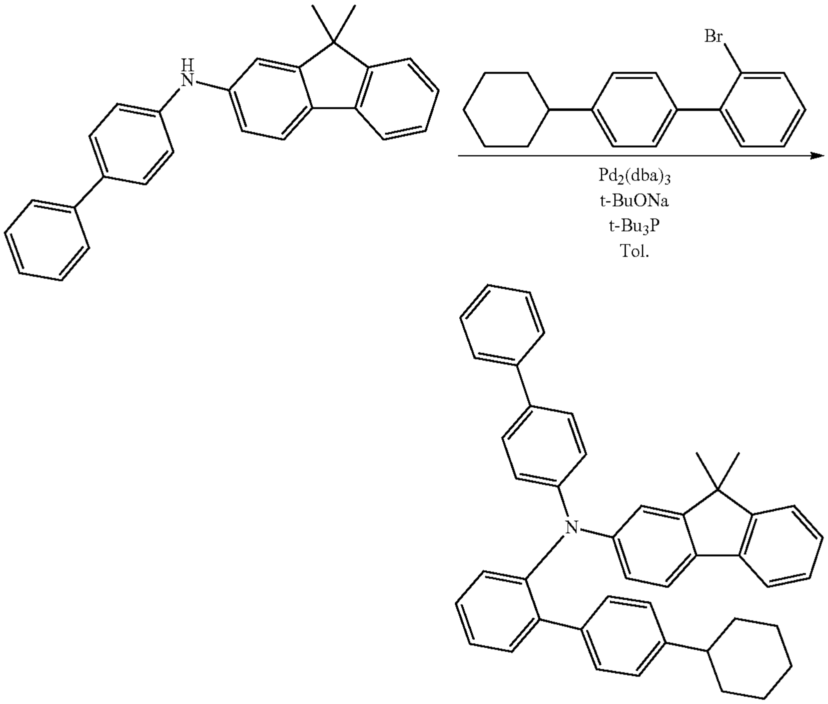

13

10 mmol of N-([1,1'-biphenyl]-4-yl)-9,9-dimethyl-9H-fluoren-2-amine (1 eq.), 11 mmol of 2-bromo-4'-cyclohexyl-1,1'-biphenyl (1.1 eq.), 0.3 mmol of $Pd_2(dba)_3$ (0.03 eq.), 30 mmol of t-BuONa (3 eq.), 0.6 mmol of t-$Bu_3P$ (0.06 eq.), and 100 mL of toluene were added to a 1-neck round-bottom flask, followed by stirring for 2 hours.

Once the reaction was complete, a work-up process was performed using $H_2O$ and ether, followed by separation of a resultant organic layer through column chromatography (eluent: methylene chloride and hexane at a volumetric ratio of 1:5).

The resulting organic layer was recrystallized using ether to thereby obtain 3.9 g of Compound 13. (yield=66%, purity≥99.9%)

Synthesis Example 4: Synthesis of Compound 21

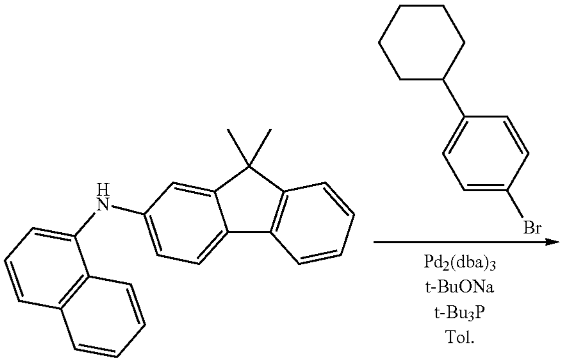

-continued

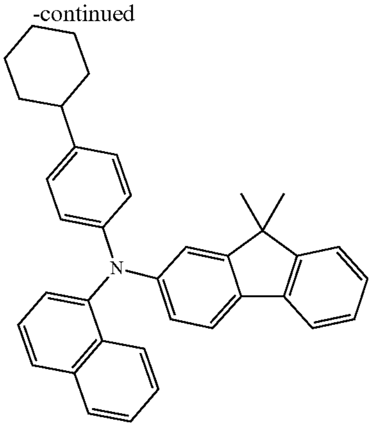

21

10 mmol of 9,9-dimethyl-N-(naphthalen-1-yl)-9H-fluoren-2-amine (1 eq.), 11 mmol of 1-bromo-4-cyclohexylbenzene (1.1 eq.), 0.3 mmol of $Pd_2(dba)_3$ (0.03 eq.), 30 mmol of t-BuONa (3 eq.), 0.6 mmol of t-$Bu_3P$ (0.06 eq.), and 100 mL of toluene were added to a 1-neck round-bottom flask, followed by stirring at a temperature of 110° C. for 2 hours.

Once the reaction was complete, a work-up process was performed using $H_2O$ and ether, followed by separation of a resultant organic layer through column chromatography (eluent: methylene chloride and hexane at a volumetric ratio of 1:5).

The resulting organic layer was recrystallized using ether to thereby obtain 3.2 g of Compound 21. (yield=65%, purity≥99.9%)

Synthesis Example 5: Synthesis of Compound 25

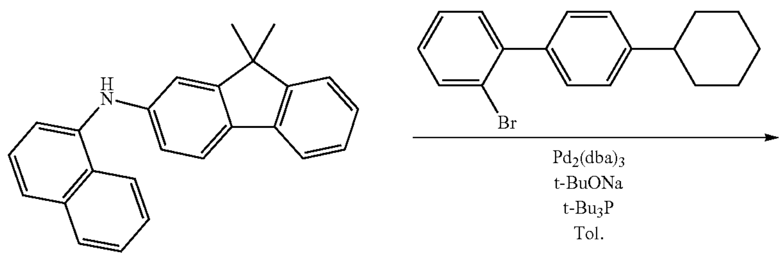

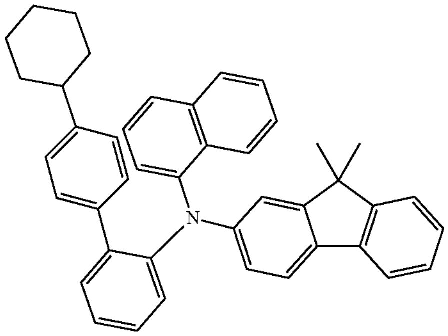

25

10 mmol of 9,9-dimethyl-N-(naphthalen-1-yl)-9H-fluoren-2-amine (2 eq.), 11 mmol of 2-bromo-4'-cyclohexyl-1,1'-biphenyl (1.1 eq.), 0.3 mmol of $Pd_2(dba)_3$ (0.03 eq.), 30 mmol of t-BuONa (3 eq.), 0.6 mmol of t-$Bu_3P$ (0.06 eq.), and 100 mL of toluene were added to a 1-neck round-bottom flask, followed by stirring at a temperature of 110° C. for 2 hours.

Once the reaction was complete, a work-up process was performed using $H_2O$ and ether, followed by separation of a resultant organic layer through column chromatography (eluent: methylene chloride and hexane at a volumetric ratio of 1:5).

The resulting organic layer was recrystallized using ether to thereby obtain 3.8 g of Compound 25. (yield=67%, purity≥99.9%)

Synthesis Example 6: Synthesis of Compound 75

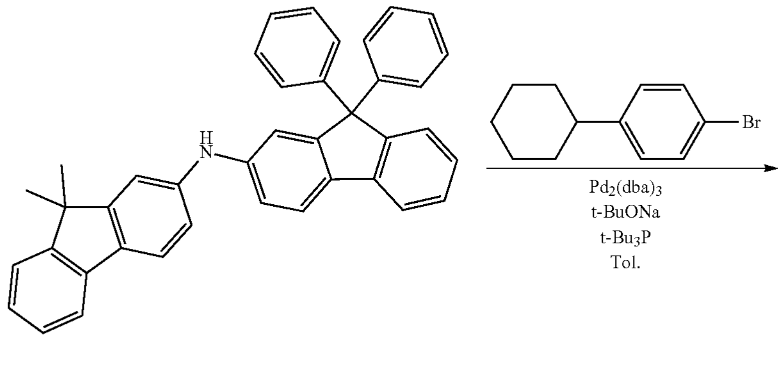

-continued

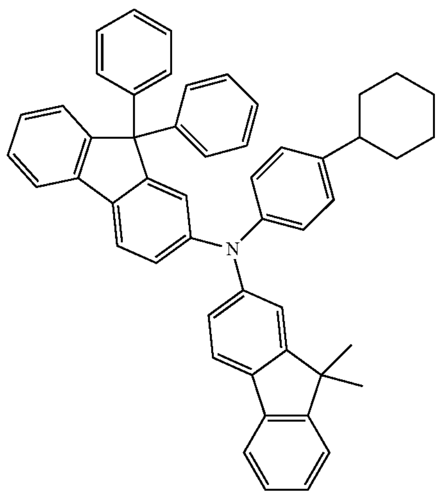

75

10 mmol of N-(9,9-dimethyl-9H-fluoren-2-yl)-9,9-diphenyl-9H-fluoren-2-amine (1 eq.), 11 mmol of 1-bromo-4-cyclohexylbenzene (1.1 eq.), 0.3 mmol of $Pd_2(dba)_3$ (0.03 eq.), 30 mmol of t-BuONa (3 eq.), 0.6 mmol of t-$Bu_3P$ (0.06 eq.), and 100 mL of toluene were added to a 1-neck round-bottom flask, followed by stirring at a temperature of 110° C. for 2 hours.

Once the reaction was complete, a work-up process was performed using $H_2O$ and ether, followed by separation of a resultant organic layer through column chromatography (eluent: methylene chloride and hexane at a volumetric ratio of 1:5).

The resulting organic layer was recrystallized using ether to thereby obtain 4.4 g of Compound 75. (yield=69%, purity≥99.9%)

Synthesis Example 7: Synthesis of Compound 79

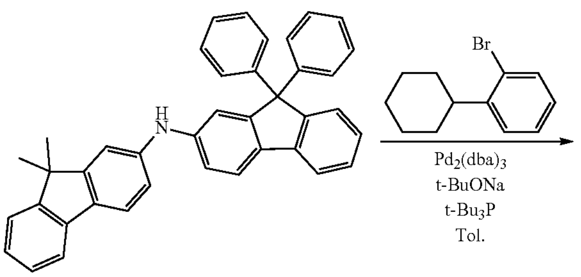

-continued

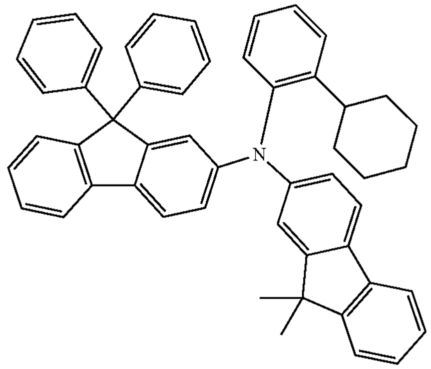

79

10 mmol of N-(9,9-dimethyl-9H-fluoren-2-yl)-9,9-diphenyl-9H-fluoren-2-amine (1 eq.), 11 mmol of 1-bromo-2-cyclohexylbenzene (1.1 eq.), 0.3 mmol of $Pd_2(dba)_3$ (0.03 eq.), 30 mmol of t-BuONa (3 eq.), 0.6 mmol of t-$Bu_3P$ (0.06 eq.), and 100 mL of toluene were added to a 1-neck round-bottom flask, followed by stirring at a temperature of 110° C. for 2 hours.

Once the reaction was complete, a work-up process was performed using $H_2O$ and ether, followed by separation of a resultant organic layer through column chromatography (eluent: methylene chloride and hexane at a volumetric ratio of 1:5).

The resulting organic layer was recrystallized using ether to thereby obtain 4.4 g of Compound 79. (yield=69%, purity≥99.9%)

Synthesis Example 8: Synthesis of Compound 99

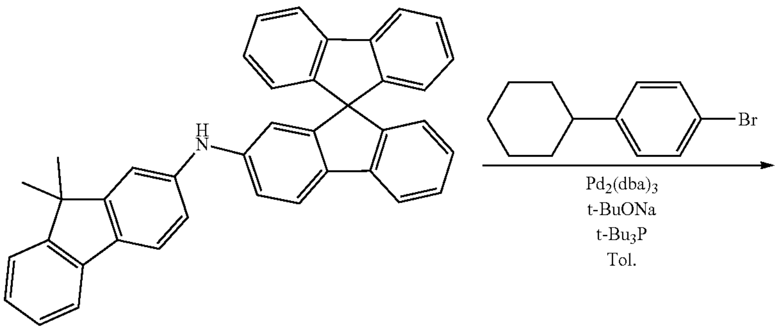

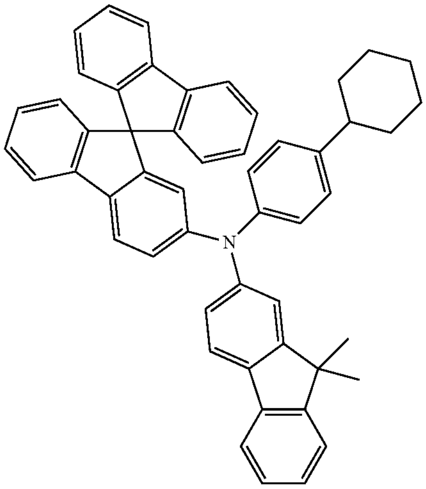

99

10 mmol of N-(9,9-dimethyl-9H-fluoren-2-yl)-9,9'-spirobi[fluoren]-2-amine (1 eq.), 11 mmol of 1-bromo-4-cyclohexylbenzene (1.1 eq.), 0.3 mmol of $Pd_2(dba)_3$ (0.03 eq.), 30 mmol of t-BuONa (3 eq.), 0.6 mmol of t-$Bu_3$P (0.06 eq.), and 100 mL of toluene were added to a 1-neck round-bottom flask, followed by stirring at a temperature of 110° C. for 2 hours.

Once the reaction was complete, a work-up process was performed using $H_2O$ and ether, followed by separation of a resultant organic layer through column chromatography (eluent: methylene chloride and hexane at a volumetric ratio of 1:5).

The resulting organic layer was recrystallized using ether to thereby obtain 4.1 g of Compound 99. (yield=64%, purity≥99.9%)

Synthesis Example 9: Synthesis of Compound 103

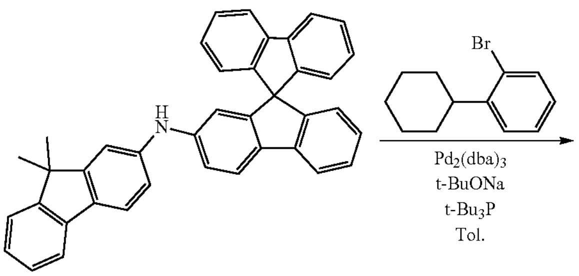

-continued

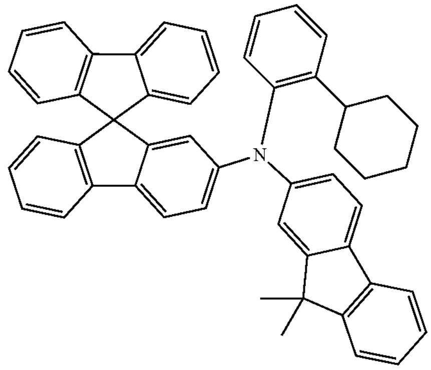

103

10 mmol of N-(9,9-dimethyl-9H-fluoren-2-yl)-9,9'-spirobi[fluoren]-2-amine (1 eq.), 11 mmol of 1-bromo-2-cyclohexylbenzene (1.1 eq.), 0.3 mmol of $Pd_2(dba)_3$ (0.03 eq.), 30 mmol of t-BuONa (3 eq.), 0.6 mmol of $t\text{-}Bu_3P$ (0.06 eq.), and 100 mL of toluene were added to a 1-neck round-bottom flask, followed by stirring at a temperature of 110° C. for 2 hours.

Once the reaction was complete, a work-up process was performed using $H_2O$ and ether, followed by separation of a resultant organic layer through column chromatography (eluent: methylene chloride and hexane at a volumetric ratio of 1:5).

The resulting organic layer was recrystallized using ether to thereby obtain 4.0 g of Compound 103. (yield=63%, purity≥99.9%)

Synthesis Example 10: Synthesis of Compound 121

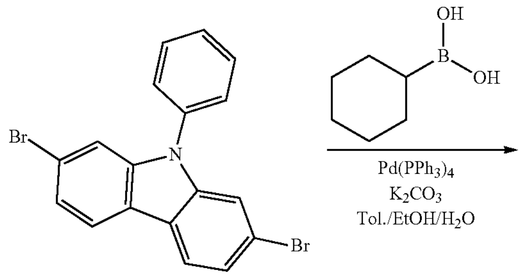

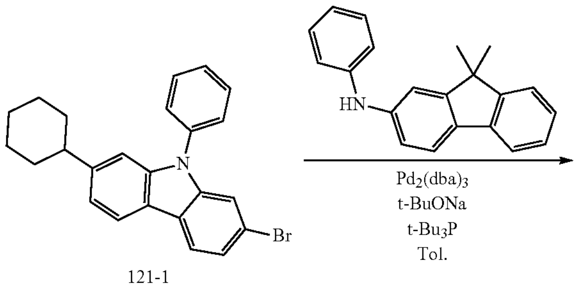

121-1

-continued

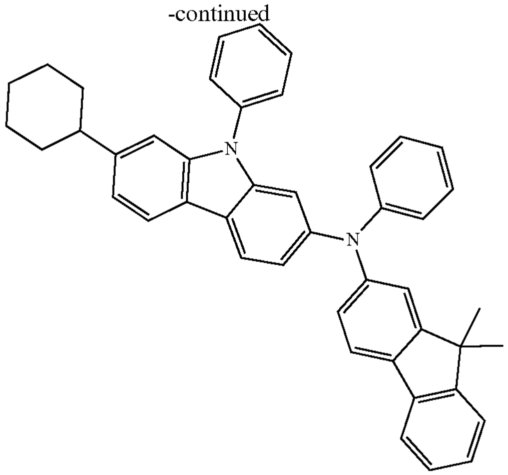

121

(1) Synthesis of Intermediate 121-1

10 mmol of 2,7-dibromo-9-phenyl-9H-carbazole (1 eq.), 11 mmol of cyclohexylboronic acid (1.1 eq.), 0.3 mmol of $Pd(PPh_3)_4$ (0.03 eq.), 20 mmol of $K_2CO_3$ (2 eq.), and toluene, ethanol, and $H_2O$ (100 mL, 10 mL, and 20 mL, respectively) were added to 1-neck round-bottom flask, followed by stirring at a temperature of 70° C. for 6 hours.

Once the reaction was complete, a work-up process was performed using $H_2O$ and ether, followed by separation of a resultant organic layer through column chromatography (eluent: methylene chloride and hexane at a volumetric ratio of 1:10).

The resulting organic layer was recrystallized using ether to thereby obtain 2.0 g of Intermediate 121-1. (yield=50%, purity≥99.9%)

(2) Synthesis of Compound 121

5 mmol of Intermediate 121-1 (1 eq.), 5.5 mmol of 9,9-dimethyl-N-phenyl-9H-fluoren-2-amine (1.1 eq.), 0.15 mmol of $Pd_2(dba)_3$ (0.03 eq.), 15 mmol of t-BuONa (3 eq.), 0.3 mmol of $t\text{-}Bu_3P$ (0.06 eq.), and 50 mL of toluene were added to a 1-neck round-bottom flask, followed by stirring at a temperature of 110° C. for 2 hours.

Once the reaction was complete, a work-up process was performed using $H_2O$ and ether, followed by separation of a resultant organic layer through column chromatography (eluent: methylene chloride and hexane at a volumetric ratio of 1:5).

The resulting organic layer was recrystallized using ether to thereby obtain 2.0 g of Compound 121. (yield=67%, purity≥99.9%)

Synthesis Example 11: Synthesis of Compound 125

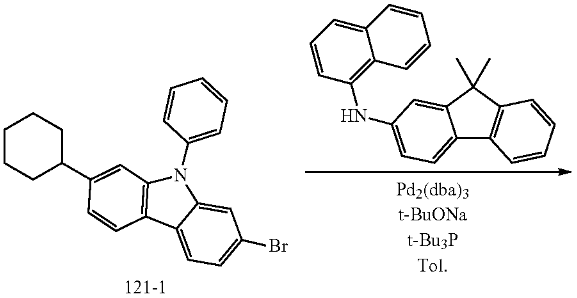

121-1

-continued

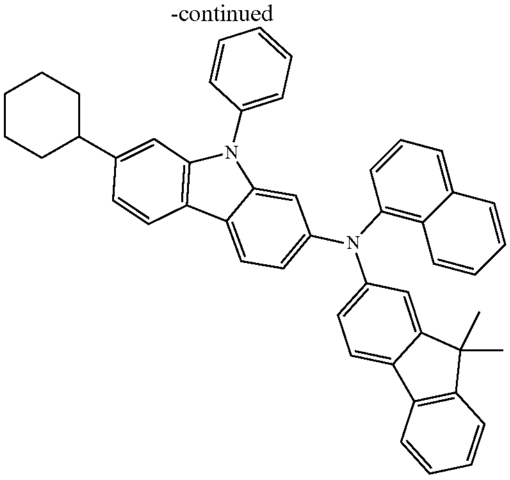

125

5 mmol of Intermediate 121-1 (1 eq.), 5.5 mmol of 9,9-dimethyl-N-(naphthalen-1-yl)-9H-fluoren-2-amine (1.1 eq.), 0.15 mmol of $Pd_2(dba)_3$ (0.03 eq.), 15 mmol of t-BuONa (3 eq.), 0.3 mmol of $t\text{-}Bu_3P$ (0.06 eq.), and 50 mL of toluene were added to a 1-neck round-bottom flask, followed by stirring at a temperature of 110° C. for 2 hours.

Once the reaction was complete, a work-up process was performed using $H_2O$ and ether, followed by separation of a resultant organic layer through column chromatography (eluent: methylene chloride and hexane at a volumetric ratio of 1:5).

The resulting organic layer was recrystallized using ether to thereby obtain 2.4 g of Compound 125. (yield=74%, purity≥99.9%)

Synthesis Example 12: Synthesis of Compound 129

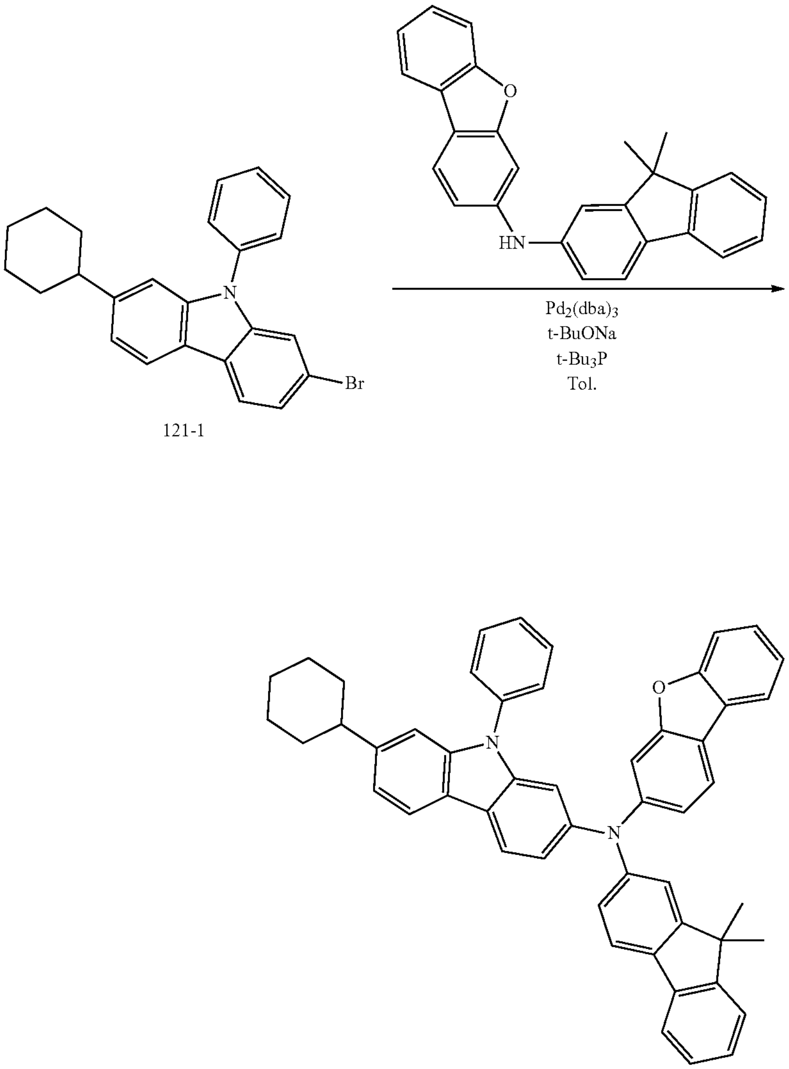

121-1

129

5 mmol of Intermediate 121-1 (1 eq.), 5.5 mmol of N-(9,9-dimethyl-9H-fluoren-2-yl)dibenzo[b,d]furan-3-amine (1.1 eq.), 0.15 mmol of $Pd_2(dba)_3$ (0.03 eq.), 15 mmol of t-BuONa (3 eq.), 0.3 mmol of t-$Bu_3P$ (0.06 eq.), and 50 mL of toluene were added to a 1-neck round-bottom flask, followed by stirring at a temperature of 110° C. for 2 hours.

Once the reaction was complete, a work-up process was performed using $H_2O$ and ether, followed by separation of a resultant organic layer through column chromatography (eluent: methylene chloride and hexane at a volumetric ratio of 1:5).

The resulting organic layer was recrystallized using ether to thereby obtain 2.5 g of Compound 129. (yield=71%, purity≥99.9%)

Synthesis Example 13: Synthesis of Compound 133

5 mmol of Intermediate 121-1 (1 eq.), 5.5 mmol of bis(9,9-dimethyl-9H-fluoren-2-yl)amine (1.1 eq.), 0.15 mmol of $Pd_2(dba)_3$ (0.03 eq.), 15 mmol of t-BuONa (3 eq.), 0.3 mmol of t-$Bu_3P$ (0.06 eq.), and 50 mL of toluene were added to a 1-neck round-bottom flask, followed by stirring at a temperature of 110° C. for 2 hours.

Once the reaction was complete, a work-up process was performed using $H_2O$ and ether, followed by separation of a resultant organic layer through column chromatography (eluent: methylene chloride and hexane at a volumetric ratio of 1:5).

The resulting organic layer was recrystallized using ether to thereby obtain 3.0 g of Compound 133. (yield=83%, purity≥99.9%)

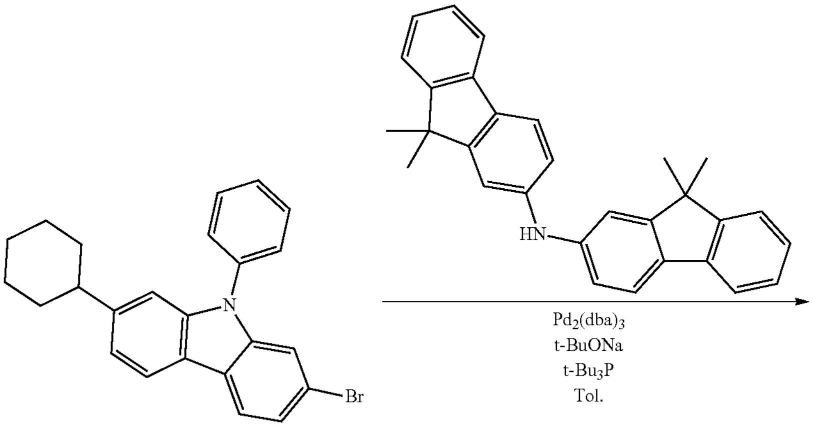

121-1

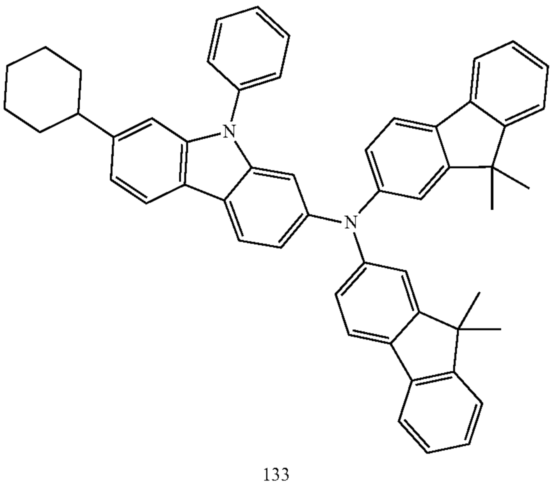

133

Synthesis Example 14: Synthesis of Compound 135

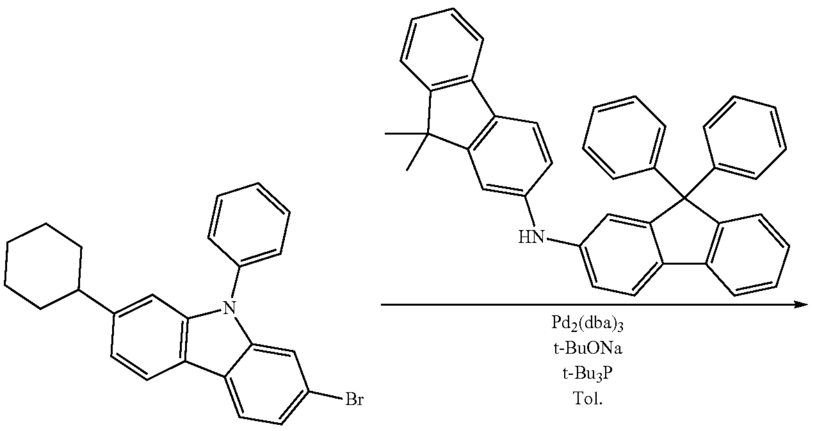

121-1

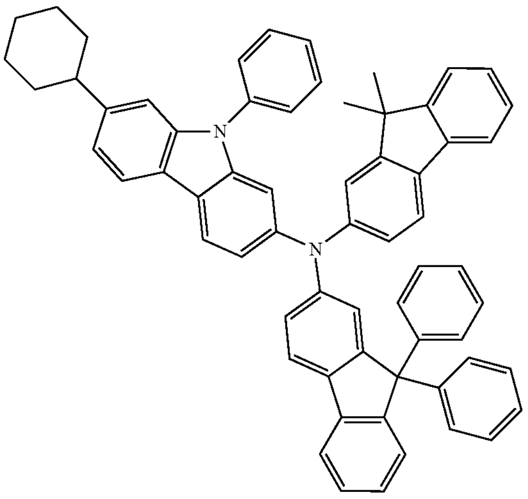

135

5 mmol of Intermediate 121-1 (1 eq.), 5.5 mmol of N-(9,9-dimethyl-9H-fluoren-2-yl)-9,9-diphenyl-9H-fluoren-2-amine (1.1 eq.), 0.15 mmol of $Pd_2(dba)_3$ (0.03 eq.), 15 mmol of t-BuONa (3 eq.), 0.3 mmol of $t\text{-}Bu_3P$ (0.06 eq.), and 50 mL of toluene were added to a 1-neck round-bottom flask, followed by stirring at a temperature of 110° C. for 2 hours.

Once the reaction was complete, a work-up process was performed using $H_2O$ and ether, followed by separation of a resultant organic layer through column chromatography (eluent: methylene chloride and hexane at a volumetric ratio of 1:5).

The resulting organic layer was recrystallized using ether to thereby obtain 3.2 g of Compound 135. (yield=74%, purity≥99.9%)

Synthesis Example 15: Synthesis of Compound 136

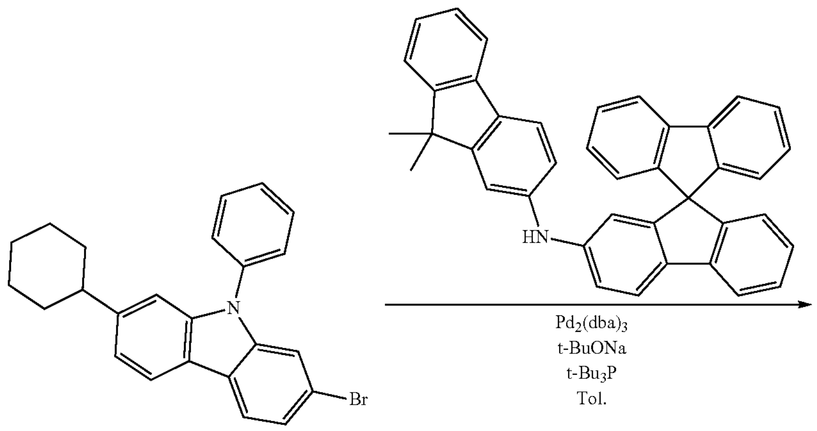

121-1

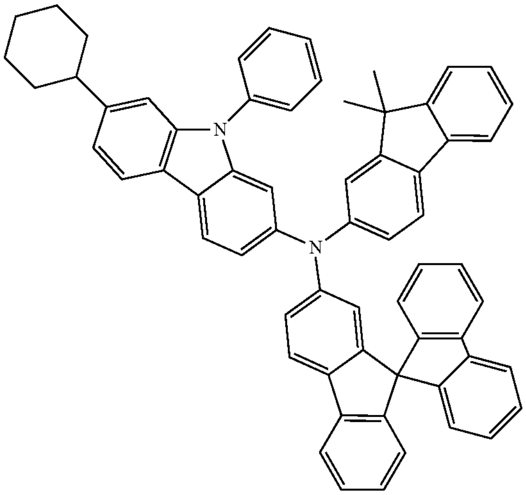

136

5 mmol of Intermediate 121-1 (1 eq.), 5.5 mmol of N-(9,9-dimethyl-9H-fluoren-2-yl)-9,9'-spirobi[fluoren]-2-amine (1.1 eq.), 0.15 mmol of $Pd_2(dba)_3$ (0.03 eq.), 15 mmol of t-BuONa (3 eq.), 0.3 mmol of t-$Bu_3P$ (0.06 eq.), and 50 mL of toluene were added to a 1-neck round-bottom flask, followed by stirring at a temperature of 110° C. for 2 hours.

Once the reaction was complete, a work-up process was performed using $H_2O$ and ether, followed by separation of a resultant organic layer through column chromatography (eluent: methylene chloride and hexane at a volumetric ratio of 1:5).

The resulting organic layer was recrystallized using ether to thereby obtain 3.2 g of Compound 136. (yield=74%, purity≥99.9%)

Compounds synthesized in Synthesis Examples 1 to 15 were identified by $^1H$ nuclear magnetic resonance (NMR) and mass spectroscopy/fast atom bombardment (MS/FAB). The results thereof are shown in Table 1.

Methods of synthesizing compounds other than compounds shown in Table 1 may be easily understood by those skilled in the art by referring to the synthesis schemes and raw materials described herein above.

TABLE 1

| Compound | $^1$H NMR ($CDCl_3$, 400 MHZ) | MS/FAB found | MS/FAB calc. |
|---|---|---|---|
| Compound 1 | 7.90~7.86 (2H, m), 7.75 (2H, d), 7.55~7.28 (11H, m), 7.18~7.16 (3H, m), 7.06 (2H, d), 2.72 (1H, t), 1.69~1.43(16H, m) | 519.73 | 519.29 |
| Compound 5 | 8.1 (1H, d), 7.90~7.86 (2H, m), 7.55 (1H, d), 7.43~7.28 (8H, m), 7.14~7.06 (8H, m), 2.72 (1H, t), 1.69~1.43(16H, m) | 519.73 | 519.29 |
| Compound 13 | 8.1 (1H, d), 7.90~7.86 (2H, m), 7.75 (2H, d), 7.55~7.28 (17H, m), 7.16~7.14 (2H, m), 2.72 (1H, t), 1.69~1.43(16H, m) | 595.83 | 595.32 |
| Compound 21 | 8.22~8.15 (2H, m), 7.90~7.81 (3H, m), 7.63~7.49 (5H, m), 7.38~7.28 (3H, m), 7.18~7.16 (3H, m), 7.06 (2H, d) 2.72 (1H, t), 1.69~1.43(16H, m) | 493.69 | 493.28 |
| Compound 25 | 8.22~8.10 (3H, m), 7.90~7.81 (3H, m), 7.63~7.49 (7H, m), 7.39~7.28 (7H, m), 7.18~7.14 (2H, m), 2.72 (1H, t), 1.69~1.43(16H, m) | 569.79 | 569.31 |
| Compound 75 | 7.90~7.86 (4H, m), 7.55 (2H, d), 7.38~7.06 (22H, m), 2.72 (1H, t), 1.69~1.43(16H, m) | 683.96 | 683.36 |
| Compound 79 | 7.90~7.86 (4H, m), 7.55 (2H, d), 7.38~7.06 (21H, m), 6.96 (1H, t), 2.72 (1H, t), 1.69~1.43(16H, m) | 683.96 | 683.36 |
| Compound 99 | 7.90~7.86 (6H, m), 7.55 (2H, d), 7.38~7.16 (16H, m), 7.06 (2H, d), 2.72 (1H, t), 1.69~1.43(16H, m) | 681.96 | 681.36 |
| Compound 103 | 7.90~7.86 (6H, m), 7.55 (2H, d), 7.38~7.16 (17H, m), 6.96 (1H, d), 2.72 (1H, t), 1.69~1.43(16H, m) | 681.96 | 681.36 |
| Compound 121 | 8.39 (1H, d), 8.12 (1H, d), 7.90~7.86 (2H, m), 7.62~7.16 (15H, m), 7.08~7.00 (3H, m), 6.40 (1H, d), 2.72 (1H, t), 1.69~1.43(16H, m) | 608.83 | 608.32 |
| Compound 125 | 8.39 (1H, d), 8.22~8.12 (3H, m), 7.90~7.81 (3H, m), 7.63~7.28 (14H, m), 7.16~7.08 (2H, m), 6.40 (1H, d), 2.72 (1H, t), 1.69~1.43(16H, m) | 658.89 | 658.33 |
| Compound 129 | 8.39 (1H, d), 8.12 (1H, m), 7.90~7.80 (3H, m), 7.62~7.28 (14H, m), 7.16~7.08 (2H, m), 6.91 (1H, d), 2.72 (1H, t), 1.69~1.43(16H, m) | 698.91 | 698.31 |
| Compound 133 | 8.39 (1H, d), 8.12 (1H, m), 7.90~7.86 (4H, m), 7.62~7.51 (8H, m), 7.44~7.28 (7H, m), 7.16 (2H, d), 6.40 (1H, d), 2.72 (1H, t), 1.69~1.43(22H, m) | 724.99 | 724.38 |
| Compound 135 | 8.39 (1H, d), 8.12 (1H, m), 7.90~7.80 (4H, m), 7.62~7.10 (27H, m), 6.40 (1H, d), 2.72 (1H, t), 1.69~1.43(16H, m) | 849.13 | 848.41 |
| Compound 136 | 8.39 (1H, d), 8.12 (1H, m), 7.90~7.86 (6H, m), 7.62~7.27 (21H, m), 7.18~7.16 (3H, m), 6.40 (1H, d), 2.72 (1H, t), 1.69~1.43(16H, m) | 847.12 | 846.40 |

Comparative Example 1

A Corning 15 Ohms per square centimeter (Ω/$cm^2$) (1,200 Å) ITO glass substrate was cut to a size of 50 millimeters (mm)×50 mm×0.7 mm, sonicated in isopropyl alcohol and pure water for 5 minutes in each solvent, and cleaned by exposure to ultraviolet rays with ozone to use the glass substrate as an anode. Then, the glass substrate was mounted to a vacuum-deposition apparatus.

2-TNATA was vacuum-deposited on the glass substrate to form a hole injection layer having a thickness of 600 Å. Thereafter, 4,4'-bis[N-(1-naphthyl)-N-phenylamino]biphenyl (hereinafter referred to as "NPB"), which is a hole transport material, as a hole transporting compound was vacuum-deposited on the hole injection layer to form a hole transport layer having a thickness of 300 Å.

9,10-di(naphthalen-2-yl)anthracene (hereinafter referred to as "DNA"), which is an existing blue fluorescent host, and 4,4'-bis[2-(4-(N,N-diphenylamino)phenyl)vinyl]biphenyl (hereinafter referred to as "DPAVBi"), which is an existing blue fluorescent dopant, were co-deposited on the hole transport layer to a weight ratio of about 98:2 to form an emission layer having a thickness of 300 Å.

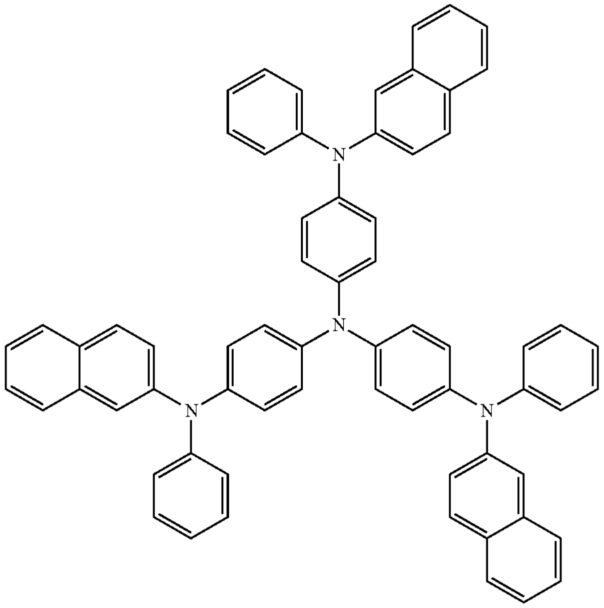
2-TNATA
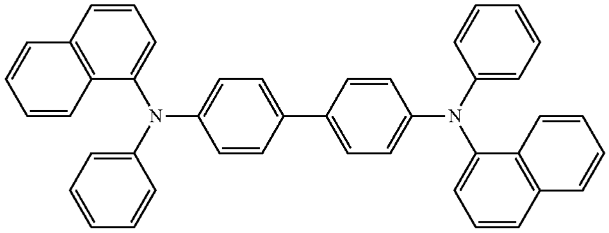
NPB
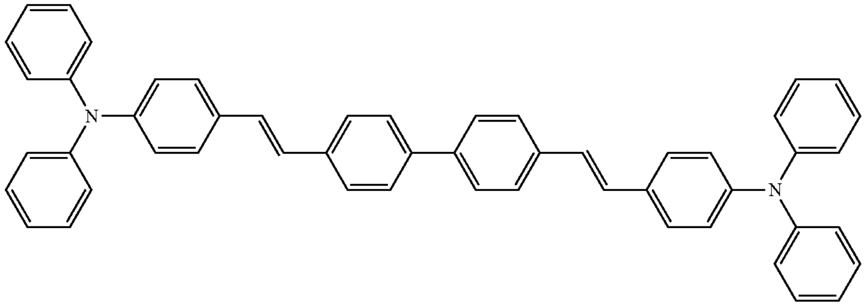
DPAVBi
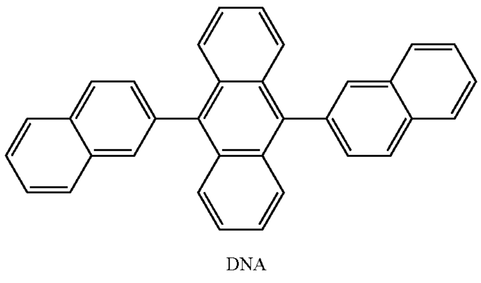
DNA

Subsequently, $Alq_3$ was deposited on the emission layer to form an electron transport layer having a thickness of 300 Å. Subsequently, LiF was deposited on the electron transport layer to form an electron injection layer having a thickness of 10 Å. Finally, Al was vacuum-deposited on the electron injection layer to form a cathode having a thickness of 3,000 Å to form an LiF/AI electrode, thereby completing the manufacture of a light-emitting device.

Comparative Examples 2 to 7

Light-emitting devices were manufactured in substantially the same manner as in Comparative Example 1, except that Compounds A to F were respectively used instead of NPB in the formation of a hole transport layer.

Compound A

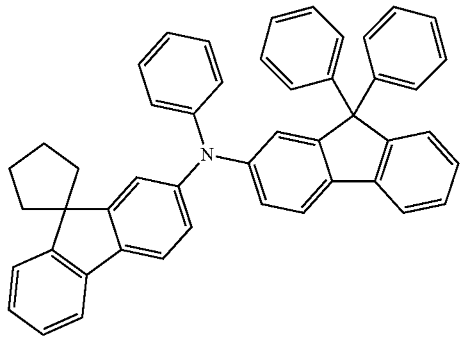

Compound B

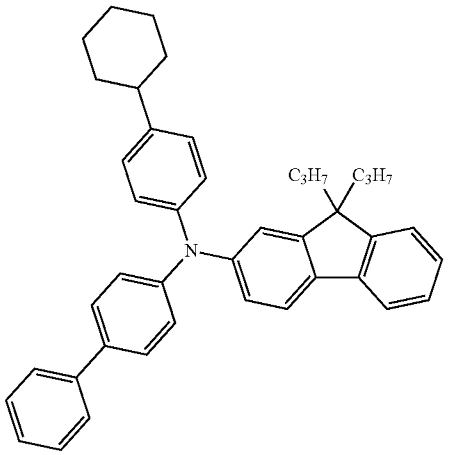

Compound C

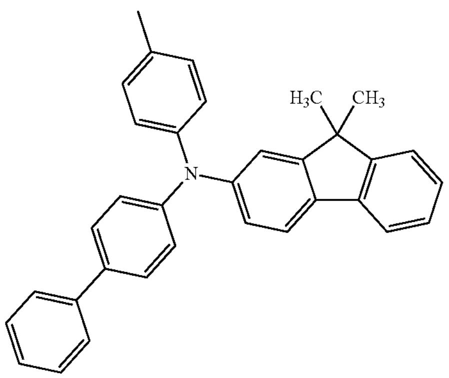

-continued

Compound D

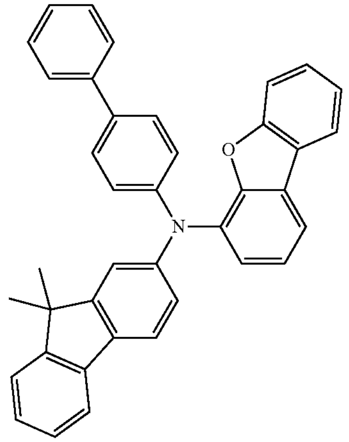

Compound E

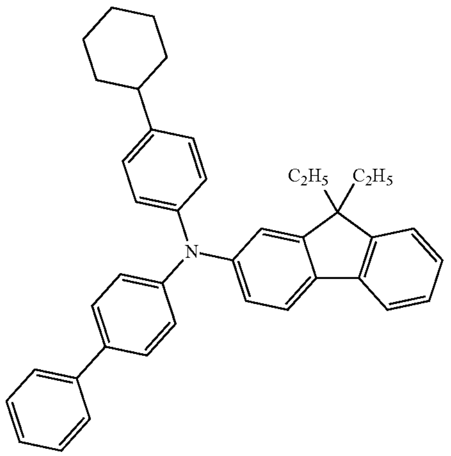

Compound F

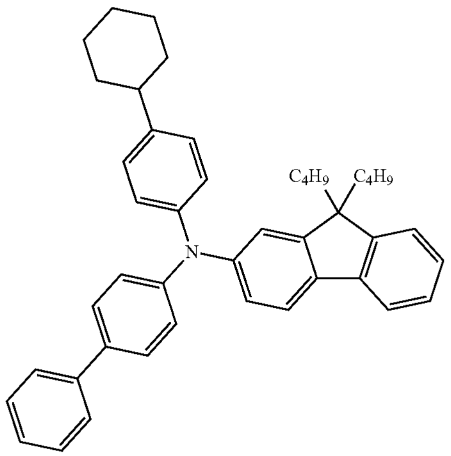

Examples 1 to 15

Light-emitting devices were manufactured in substantially the same manner as in Comparative Example 1, except that compounds shown in Table 2 were respectively used instead of NPB in the formation of a hole transport layer.

Evaluation Example

The performances (driving voltage, luminance, efficiency, and color-coordinate) of the light-emitting devices manufactured in Examples 1 to 15 and Comparative Examples 1 to 7 while driving at a current density of 50 $mA/cm^2$ were evaluated. The half lifespan was also measured at a current density of 100 $mA/cm^2$, which indicates time (hour) for the luminance of each light-emitting device to decline to 50% of its initial luminance. The evaluation results are shown in Table 2.

The luminance was measured using a luminance meter PR650 powered by a current voltmeter (Keithley SMU 236).

The efficiency was measured using a luminance meter PR650 powered by a current voltmeter (Keithley SMU 236).

TABLE 2

| | Hole transport material | Driving voltage (V) | Current density ($mA/cm^2$) | Luminance ($cd/m^2$) | Efficiency (cd/A) | Emission color | Half lifespan (hr @100 $mA/cm^2$) |
|---|---|---|---|---|---|---|---|
| Comparative Example 1 | NPB | 7.01 | 50 | 2645 | 5.29 | Blue | 258 |
| Comparative Example 2 | Compound A | 4.53 | 50 | 3020 | 6.34 | Blue | 237 |
| Comparative Example 3 | Compound B | 4.75 | 50 | 2836 | 5.33 | Blue | 250 |
| Comparative Example 4 | Compound C | 4.50 | 50 | 3102 | 5.74 | Blue | 241 |
| Comparative Example 5 | Compound D | 4.63 | 50 | 2985 | 6.04 | Blue | 249 |
| Comparative Example 6 | Compound E | 4.55 | 50 | 2896 | 5.33 | Blue | 222 |
| Comparative Example 7 | Compound F | 4.61 | 50 | 2876 | 5.33 | Blue | 237 |
| Example 1 | Compound 1 | 4.32 | 50 | 3650 | 7.34 | Blue | 362 |
| Example 2 | Compound 5 | 4.21 | 50 | 3715 | 7.43 | Blue | 363 |
| Example 3 | Compound 13 | 4.22 | 50 | 3765 | 7.33 | Blue | 372 |
| Example 4 | Compound 21 | 4.26 | 50 | 3730 | 7.46 | Blue | 370 |
| Example 5 | Compound 25 | 4.26 | 50 | 3760 | 7.46 | Blue | 374 |
| Example 6 | Compound 75 | 4.25 | 50 | 3730 | 7.26 | Blue | 381 |
| Example 7 | Compound 79 | 4.22 | 50 | 3765 | 7.33 | Blue | 372 |
| Example 8 | Compound 99 | 4.31 | 50 | 3725 | 7.45 | Blue | 358 |
| Example 9 | Compound 103 | 4.24 | 50 | 3771 | 7.35 | Blue | 366 |
| Example 10 | Compound 121 | 4.26 | 50 | 3700 | 7.43 | Blue | 364 |
| Example 11 | Compound 125 | 4.20 | 50 | 3725 | 7.33 | Blue | 370 |
| Example 12 | Compound 129 | 4.25 | 50 | 3739 | 7.46 | Blue | 367 |
| Example 13 | Compound 133 | 4.22 | 50 | 3720 | 7.46 | Blue | 370 |
| Example 14 | Compound 135 | 4.25 | 50 | 3730 | 7.26 | Blue | 381 |
| Example 15 | Compound 136 | 4.31 | 50 | 3725 | 7.45 | Blue | 358 |

As shown in Table 2, it was found that the light-emitting devices using the compound according to one or more embodiments as hole transport materials in Examples 1 to 15 may have improved driving voltage, efficiency, and lifespan, as compared with the light-emitting devices of Comparative Examples 1 to 7.

In other words, when the compounds according to one or more embodiments are used in a light-emitting device, the device may have excellent driving voltage, efficiency, and lifespan.

The light-emitting device including the amine compound may have a low driving voltage, high efficiency, and long lifespan.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims, or equivalents thereof.

What is claimed is:

1. A light-emitting device comprising:

a first electrode;

a second electrode facing the first electrode; and an interlayer between the first electrode and the second electrode and comprising an emission layer, wherein the light-emitting device comprises an amine compound represented by Formula 1:

Formula 1

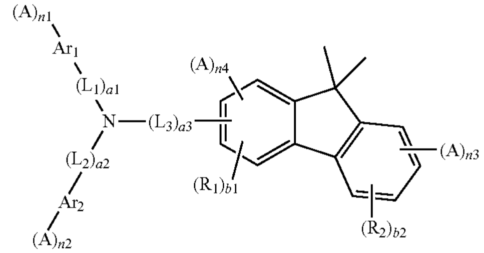

wherein, in Formula 1, each A is independently a cyclohexyl group unsubstituted or substituted with at least one $R_{10a}$, n1 to n4 are each independently an integer from 0 to 3, provided that n1+n2+n3+n4≥1, $L_3$ is a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_1$ and $L_2$ are each independently a benzene group, a pentalene group, an indene group, a naphthalene group, an azulene group, a heptalene group, an indacene group, an acenaphthalene group, a phenalene group, a phenanthrene group, an anthracene group, a fluoranthene group, a pyrene group, a chrysene group, a naphthacene group, a picene group, a perylene group, a pyrrole group, a thiophene group, a furan group, a silole group, an imidazole group, a pyrazole group, a thiazole group, an isothiazole group, an oxazole group, an isoxazole group, a pyridine group, a pyrazine group, a pyrimidine group, a pyridazine group, a triazine group, a benzofuran group, a benzothiophene group, a dibenzofuran group, a dibenzothiophene group, a carbazole group, a benzosilole group, a dibenzosilole group, a quinoline group, an isoquinoline group, a benzimidazole group, an imidazopyridine group, or an imidazopyrimidine group, each unsubstituted or substituted with deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-benzofluorene-fluorenyl group, a benzofluorenyl group, a dibenzofluorenyl group, a phenalenyl group, a phenanthrenyl group, an anthracenyl group, a fluoranthenyl group, a pyrenyl group, a chrysenyl group, a naphthacenyl group, a picenyl group, a perylenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a triazinyl group, a benzofuranyl group, a benzothiophenyl group, a dibenzofuranyl group, a dibenzothiophenyl group, a carbazolyl group, a benzosilolyl group, a dibenzosilolyl group, a quinolinyl group, an isoquinolinyl group, a benzimidazolyl group, an imidazopyridinyl group, an imidazopyrimidinyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, $—P(=O)(Q_{31})(Q_{32})$, or any combination thereof, $Ar_1$ and $Ar_2$ are each independently a cyclopentyl group, a cyclohexyl group, a cycloheptyl group, a cyclopentenyl group, a cyclohexenyl group, a phenyl group, a biphenyl group, a terphenyl group, a naphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a triazinyl group, an indolyl group, an isoindolyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a dibenzofuranyl group, a dibenzothiophenyl group, a dibenzosilolyl group, a carbazolyl group, a benzocarbazolyl group, a dibenzocarbazolyl group, an azafluorenyl group, an azaspiro-bifluorenyl group, an azacarbazolyl group, a diazacarbazolyl group, an azadibenzofuranyl group, an azadibenzothiophenyl group, an azadibenzosilolyl group, an imidazopyridinyl group, or an imidazopyrimidinyl group, each unsubstituted or substituted with deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkyl group substituted with at least one phenyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a naphthyl group, a fluorenyl group, a spiro-bifluorenyl group, a spiro-cyclopentane-fluorenyl group, a spiro-cyclohexane-fluorenyl group, a spiro-fluorene-benzofluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a triazinyl group, an indolyl group, an isoindolyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a dibenzofuranyl group, a dibenzothiophenyl group, a dibenzosilolyl group, a carbazolyl group, a benzocarbazolyl group, a dibenzocarbazolyl group, an azafluorenyl group, an azaspiro-bifluorenyl group, an azacarbazolyl group, a diazacarbazolyl group, an azadibenzofuranyl group, an azadibenzothiophenyl group, an azadibenzosilolyl group, an imidazopyridinyl group, an imidazopyrimidinyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, $—P(=O)(Q_{31})(Q_{32})$, or any combination thereof, a1 to a3 are each independently an integer from 0 to 5, $R_1$ and $R_2$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $—Si(Q_1)(Q_2)(Q_3)$, —N($Q_1$)($Q_2$), —B($Q_1$)($Q_2$), —C(═O)($Q_1$), —S(═O)$_2$($Q_1$), or —P(═O)($Q_1$)($Q_2$), b1 is an integer from 0 to 3, b2 is an integer from 0 to 4, and $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), —P(═O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

2. The light-emitting device of claim 1, wherein:

the first electrode is an anode, the second electrode is a cathode, the interlayer further comprises a hole transport region between the first electrode and the emission layer and an electron transport region between the emission layer and the second electrode, the hole transport region comprises a hole injection layer, a hole transport layer, an emission auxiliary layer, an electron blocking layer, or any combination thereof, and the electron transport region comprises a buffer layer, a hole blocking layer, an electron control layer, an electron transport layer, an electron injection layer, or a combination thereof.

3. The light-emitting device of claim 2, wherein the hole transport region comprises the amine compound represented by Formula 1.

4. The light-emitting device of claim 2, wherein the hole transport region comprises at least one selected from a hole injection layer and a hole transport layer, and at least one selected from the hole injection layer and the hole transport layer comprises the amine compound represented by Formula 1.

5. The light-emitting device of claim 1, wherein the emission layer comprises the amine compound represented by Formula 1.

6. The light-emitting device of claim 5, wherein the emission layer comprises a host and a dopant, a content of the host is greater than a content of the dopant in the emission layer, and the host comprises the amine compound represented by Formula 1.

7. The light-emitting device of claim 1, wherein the light-emitting device further comprises a first capping layer located outside the first electrode and a second capping layer located outside the second electrode, and at least one selected from the first capping layer and the second capping layer has a refractive index of 1.6 or higher at a wavelength of 589 nanometers (nm).

8. The light-emitting device of claim 1, further comprising:

a first capping layer located outside the first electrode and comprising the amine compound represented by Formula 1;

a second capping layer located outside the second electrode and comprising the amine compound represented by Formula 1; or the first capping layer and the second capping layer.

9. An amine compound represented by Formula 1:

Formula 1

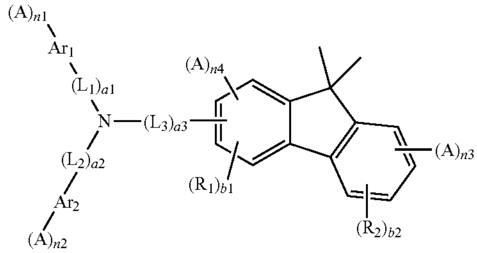

wherein, in Formula 1, each A is independently a cyclohexyl group unsubstituted or substituted with at least one $R_{10a}$, n1 to n4 are each independently an integer from 0 to 3, provided that n1+n2+n3+n4≥1, $L_3$ is a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_1$ and $L_2$ are each independently a benzene group, a pentalene group, an indene group, a naphthalene group, an azulene group, a heptalene group, an indacene group, an acenaphthalene group, a phenalene group, a phenanthrene group, an anthracene group, a fluoranthene group, a pyrene group, a chrysene group, a naphthacene group, a picene group, a perylene group, a pyrrole group, a thiophene group, a furan group, a silole group, an imidazole group, a pyrazole group, a thiazole group, an isothiazole group, an oxazole group, an isoxazole group, a pyridine group, a pyrazine group, a pyrimidine group, a pyridazine group, a triazine group, a benzofuran group, a benzothiophene group, a dibenzofuran group, a dibenzothiophene group, a carbazole group, a benzosilole group, a dibenzosilole group, a quinoline group, an isoquinoline group, a benzimidazole group, an imidazopyridine group, or an imidazopyrimidine group, each unsubstituted or substituted with deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-benzofluorene-fluorenyl group, a benzofluorenyl group, a dibenzofluorenyl group, a phenalenyl group, a phenanthrenyl group, an anthracenyl group, a fluoranthenyl group, a pyrenyl group, a chrysenyl group, a naphthacenyl group, a picenyl group, a perylenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a triazinyl group, a benzofuranyl group, a benzothiophenyl group, a dibenzofuranyl group, a dibenzothiophenyl group, a carbazolyl group, a benzosilolyl group, a dibenzosilolyl group, a quinolinyl group, an isoquinolinyl group, a benzimidazolyl group, an imidazopyridinyl group, an imidazopyrimidinyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, $—P(=O)(Q_{31})(Q_{32})$, or any combination thereof, $Ar_1$ and $Ar_2$ are each independently a cyclopentyl group, a cyclohexyl group, a cycloheptyl group, a cyclopentenyl group, a cyclohexenyl group, a phenyl group, a biphenyl group, a terphenyl group, a naphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a triazinyl group, an indolyl group, an isoindolyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a dibenzofuranyl group, a dibenzothiophenyl group, a dibenzosilolyl group, a carbazolyl group, a benzocarbazolyl group, a dibenzocarbazolyl group, an azafluorenyl group, an azaspiro-bifluorenyl group, an azacarbazolyl group, a diazacarbazolyl group, an azadibenzofuranyl group, an azadibenzothiophenyl group, an azadibenzosilolyl group, an imidazopyridinyl group, or an imidazopyrimidinyl group, each unsubstituted or substituted with deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkyl group substituted with at least one phenyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a naphthyl group, a fluorenyl group, a spiro-bifluorenyl group, a spiro-cyclopentane-fluorenyl group, a spiro-cyclohexane-fluorenyl group, a spiro-fluorene-benzofluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a triazinyl group, an indolyl group, an isoindolyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a dibenzofuranyl group, a dibenzothiophenyl group, a dibenzosilolyl group, a carbazolyl group, a benzocarbazolyl group, a dibenzocarbazolyl group, an azafluorenyl group, an azaspiro-bifluorenyl group, an azacarbazolyl group, a diazacarbazolyl group, an azadibenzofuranyl group, an azadibenzothiophenyl group, an azadibenzosilolyl group, an imidazopyridinyl group, an imidazopyrimidinyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, $—P(=O)(Q_{31})(Q_{32})$, or any combination thereof, a1 to a3 are each independently an integer from 0 to 5, $R_1$ and $R_2$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, b1 is an integer from 0 to 3, b2 is an integer from 0 to 4, and $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $—Si(Q_{11})(Q_{12})(Q_{13})$, $—N(Q_{11})(Q_{12})$, $—B(Q_{11})(Q_{12})$, $—C(=O)(Q_{11})$, $—S(=O)_2(Q_1)$, $—P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $—Si(Q_{21})(Q_{22})(Q_{23})$, $—N(Q_{21})(Q_{22})$, $—B(Q_{21})(Q_{22})$, —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

10. The amine compound of claim 9, wherein, in Formula 1, n1+n2+n3+n4 is 1, 2, or 3.

11. The amine compound of claim 9, wherein, n4 is 0, and n1+n2+n3 is 1, 2, or 3.

12. The amine compound of claim 9, wherein $L_3$ in Formula 1 is a benzene group, a pentalene group, an indene group, a naphthalene group, an azulene group, a heptalene group, an indacene group, an acenaphthalene group, a fluorene group, a spiro-bifluorene group, a spiro-benzofluorene-fluorene group, a benzofluorene group, a dibenzofluorene group, a phenalene group, a phenanthrene group, an anthracene group, a fluoranthene group, a pyrene group, a chrysene group, a naphthacene group, a picene group, a perylene group, a pyrrole group, a thiophene group, a furan group, a silole group, an imidazole group, a pyrazole group, a thiazole group, an isothiazole group, an oxazole group, an isoxazole group, a pyridine group, a pyrazine group, a pyrimidine group, a pyridazine group, a triazine group, a benzofuran group, a benzothiophene group, a dibenzofuran group, a dibenzothiophene group, a carbazole group, a benzosilole group, a dibenzosilole group, a quinoline group, an isoquinoline group, a benzimidazole group, an imidazopyridine group, or an imidazopyrimidine group, each unsubstituted or substituted with deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-benzofluorene-fluorenyl group, a benzofluorenyl group, a dibenzofluorenyl group, a phenalenyl group, a phenanthrenyl group, an anthracenyl group, a fluoranthenyl group, a pyrenyl group, a chrysenyl group, a naphthacenyl group, a picenyl group, a perylenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a triazinyl group, a benzofuranyl group, a benzothiophenyl group, a dibenzofuranyl group, a dibenzothiophenyl group, a carbazolyl group, a benzosilolyl group, a dibenzosilolyl group, a quinolinyl group, an isoquinolinyl group, a benzimidazolyl group, an imidazopyridinyl group, an imidazopyrimidinyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), —P(=O)($Q_{31}$)($Q_{32}$), or any combination thereof, wherein $Q_{31}$ to $Q_{33}$ are each independently a $C_1$-$C_{10}$ alkyl group, a $C_1$-$C_{10}$ alkoxy group, a phenyl group, a phenyl group substituted with a cyano group, a biphenyl group, a terphenyl group, or a naphthyl group.

13. The amine compound of claim 9, wherein a1 to a3 are each independently 0 or 1.

14. The amine compound of claim 9, wherein at least one of $Ar_1$ and $Ar_2$ in Formula 1 is a π electron-rich $C_3$-$C_{60}$ cyclic group unsubstituted or substituted with $R_{10a}$.

15. The amine compound of claim 9, wherein in Formula 1, *—$Ar_1$-$(A)_{n1}$ is represented by one of Formulae 2-1A to 2-1D, and *—$Ar_2$-$(A)_{n2}$ is represented by one of Formulae 2-2A to 2-2D:

2-1A

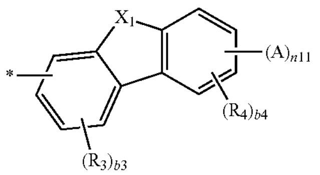

2-1B

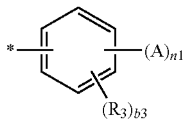

2-1C

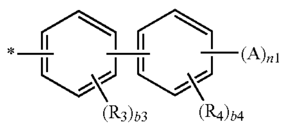

2-1D

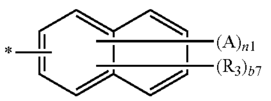

2-2A

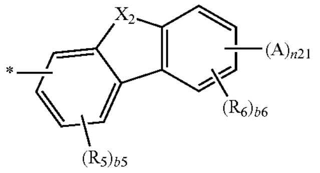

2-2B

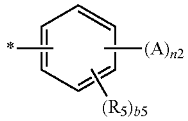

2-2C

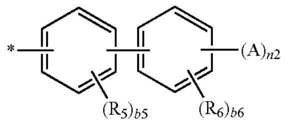

2-2D

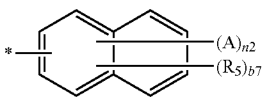

wherein in Formulae 2-1A to 2-1D and 2-2A to 2-2D, $X_1$ is O or S, $X_2$ is O or S, $R_3$ to $R_6$ are each defined by the description of $R_{10a}$ provided in claim 9, b3 and b5 are each independently an integer from 0 to 3, b4 and b6 are each independently an integer from 0 to 4, b7 is an integer from 0 to 7, in Formula 2-1 Å, n11=n1, in Formula 2-2 Å, n21=n2, and

* indicates a binding site to an adjacent atom.

16. The amine compound of claim 9, wherein *—$Ar_1$-$(A)_{n1}$ and *—$Ar_2$-$(A)_{n2}$ in Formula 1 are each independently represented by one of Formulae 6-1 to 6-24, 6-41, 6-42, and 6-50 to 6-52:
6-1
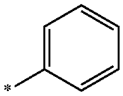
6-2
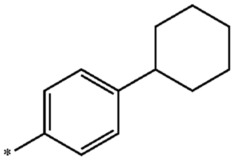
6-3
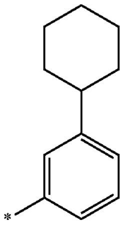
6-4
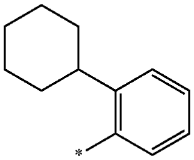
6-5
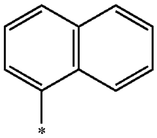
6-6
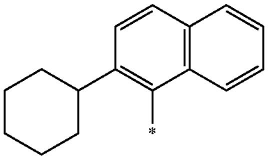
6-7
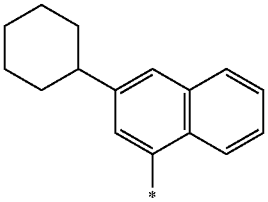
6-8
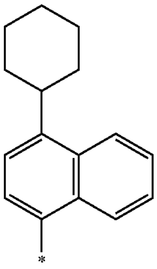
-continued
6-9
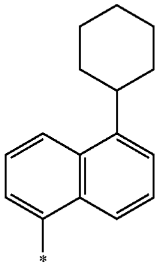
6-10
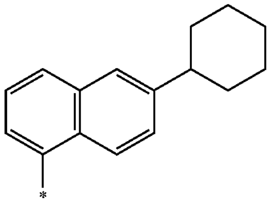
6-11
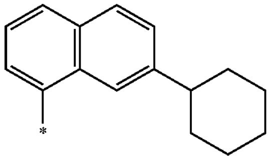
6-12
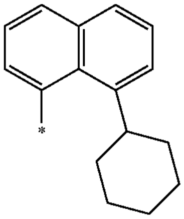
6-13
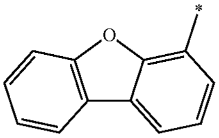
6-14
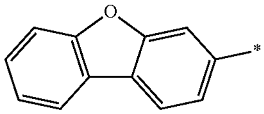
6-15
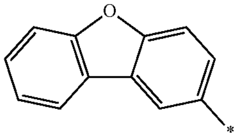
6-16
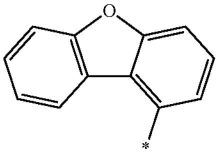
6-17
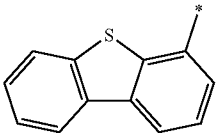

-continued 6-18

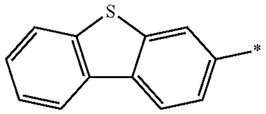

6-19

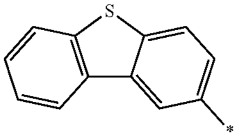

6-20

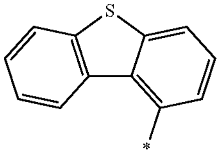

6-21

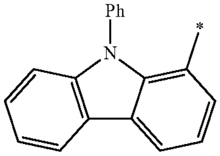

6-22

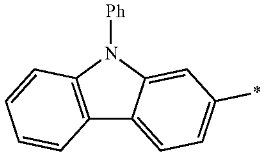

6-23

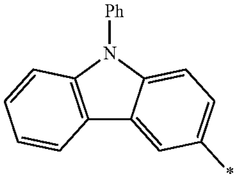

6-24

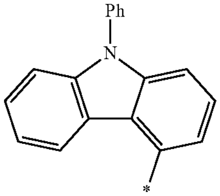

6-41

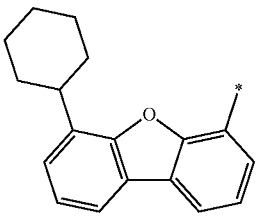

-continued 6-42

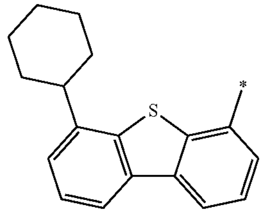

6-50

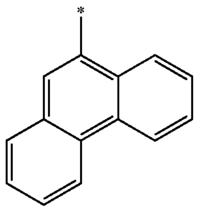

6-51

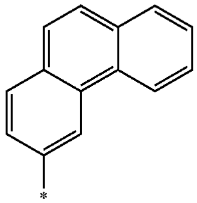

6-52

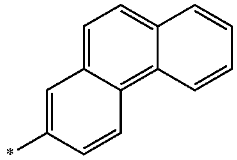

wherein, in Formulae 6-1 to 6-24, 6-41, 6-42, and 6-50 to 6-52,

Ph represents a phenyl group, and

* indicates a binding site to an adjacent atom.

17. The amine compound of claim 9, wherein, in Formula 1, $R_1$ and $R_2$ are each independently hydrogen, deuterium, —F, —Cl, —Br, —I, a hydroxyl group, a cyano group, or a nitro group;

a $C_1$-$C_{20}$ alkyl group or a $C_1$-$C_{20}$ alkoxy group, each unsubstituted or substituted with deuterium, —F, —Cl, —Br, —I, a cyano group, a phenyl group, a biphenyl group, or any combination thereof;

a cyclopentyl group, a cyclohexyl group, a cycloheptyl group, a cyclopentenyl group, a cyclohexenyl group, a phenyl group, a biphenyl group, a terphenyl group, a naphthyl group, a fluorenyl group, a spiro-bifluorenyl group, a spiro-cyclopentane-fluorenyl group, a spiro-cyclohexane-fluorenyl group, a spiro-fluorene-benzo-fluorenyl group, a benzofluorenyl group, a dibenzofluorenyl group, a pyrenyl group, a phenalenyl group, a phenanthrenyl group, an anthracenyl group, a fluoranthenyl group, a triphenylenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, a diazacarbazolyl group, an azadibenzofuranyl group, an azadibenzothiophenyl group, or an azadibenzosilolyl group, each unsubstituted or substituted with deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a naphthyl group, a fluorenyl group, a spiro-bifluorenyl group, a spiro-cyclopentane-fluorenyl group, a spiro-cyclohexane-fluorenyl group, a spiro-fluorene-benzofluorenyl group, a benzofluorenyl group, a dibenzofluorenyl group, a pyrenyl group, a phenalenyl group, a phenanthrenyl group, an anthracenyl group, a fluoranthenyl group, a triphenylenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, a diazacarbazolyl group, an azadibenzofuranyl group, an azadibenzothiophenyl group, an azadibenzosilolyl group, or any combination thereof; or —$Si(Q_1)(Q_2)(Q_3)$, —$N(Q_1)(Q_2)$, or —$B(Q_1)(Q_2)$, wherein $Q_1$ to $Q_3$ are each independently a $C_1$-$C_{10}$ alkyl group, a $C_1$-$C_{10}$ alkoxy group, a phenyl group, a biphenyl group, a terphenyl group, or a naphthyl group.

18. The amine compound of claim 9, wherein the amine compound is represented by one of Formulae 1-1 to 1-4:

1-1

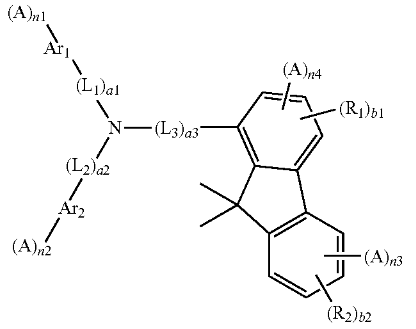

1-2

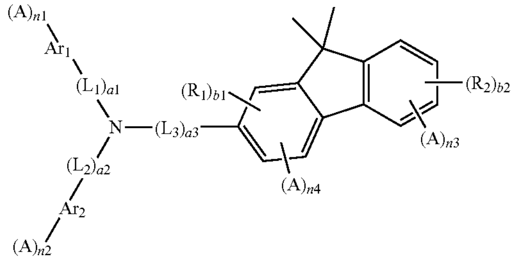

1-3

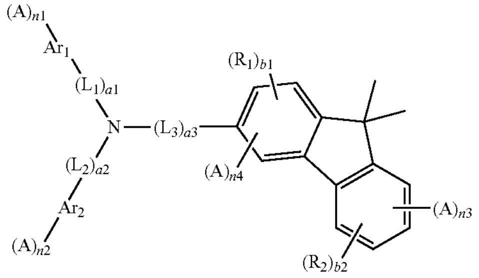

1-4

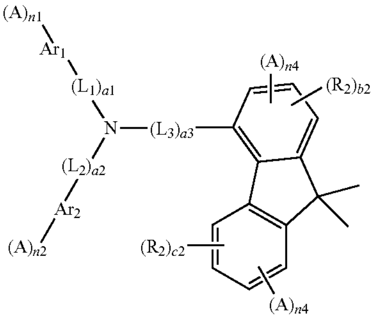

wherein, in Formulae 1-1 to 1-4,

A, n1 to n4, $L_1$ to $L_3$, a1 to a3, $Ar_1$, $Ar_2$, $R_1$, $R_2$, b1, and b2 are respectively defined by the descriptions of A, n1 to n4, $L_1$ to $L_3$, a1 to a3, $Ar_1$, $Ar_2$, $R_1$, $R_2$, b1, and b2.

19. The amine compound of claim 9, wherein the amine compound is selected from Compounds 1-44, 121-132, 137, 139-156, 161, and 163-168:
1
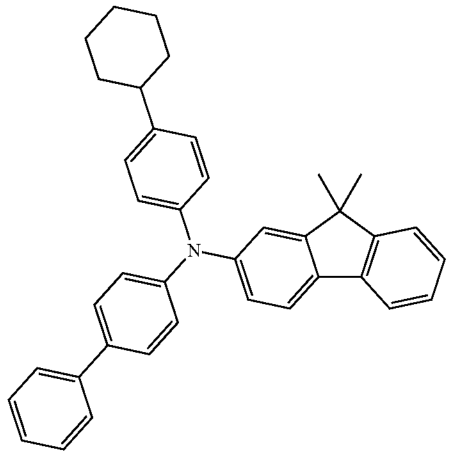
2
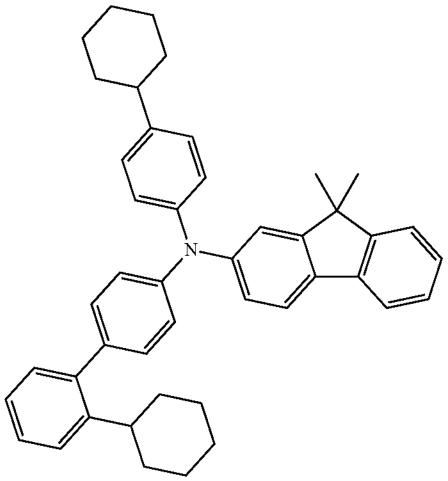
3
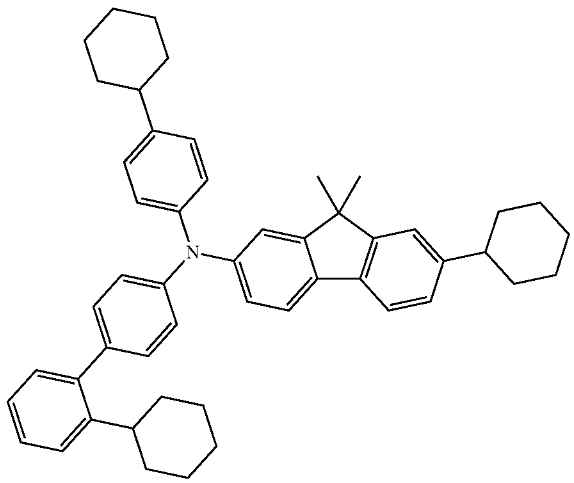
-continued
4
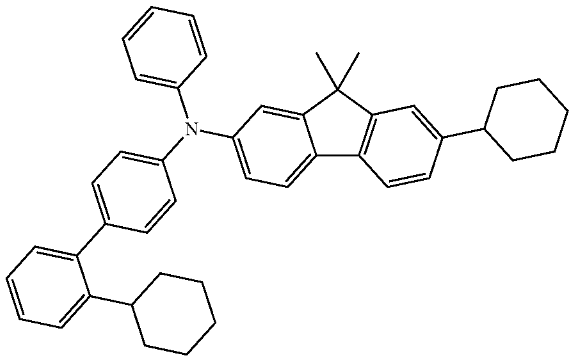
5
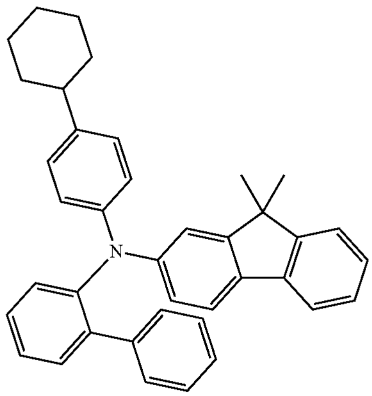
6
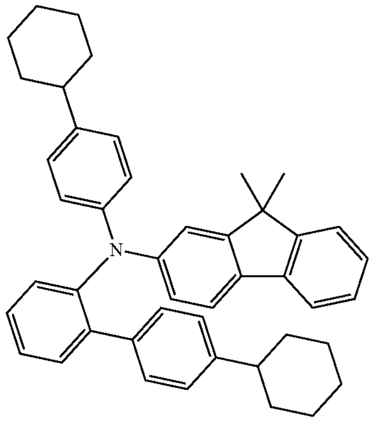
7
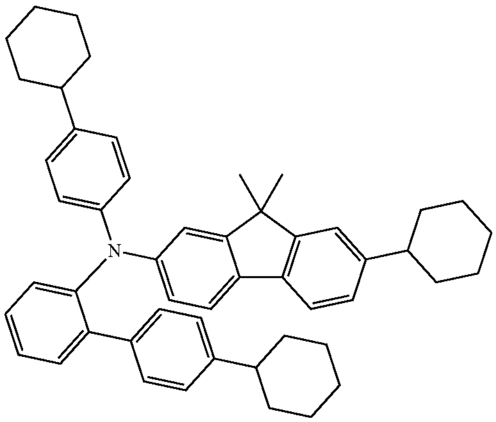

-continued
8
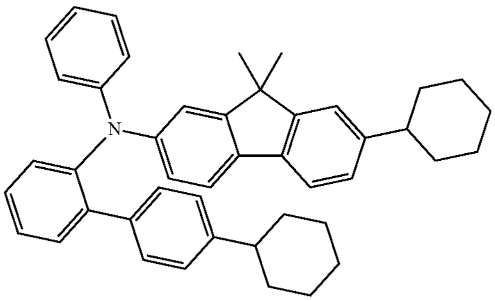
9
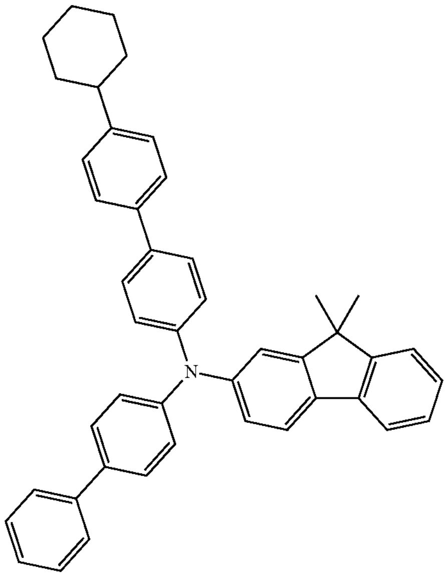
10
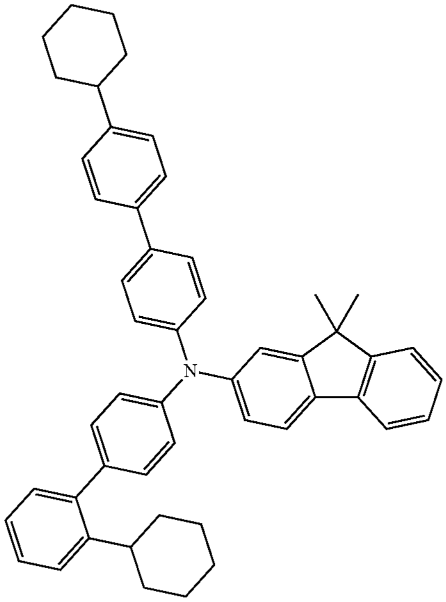
-continued
11
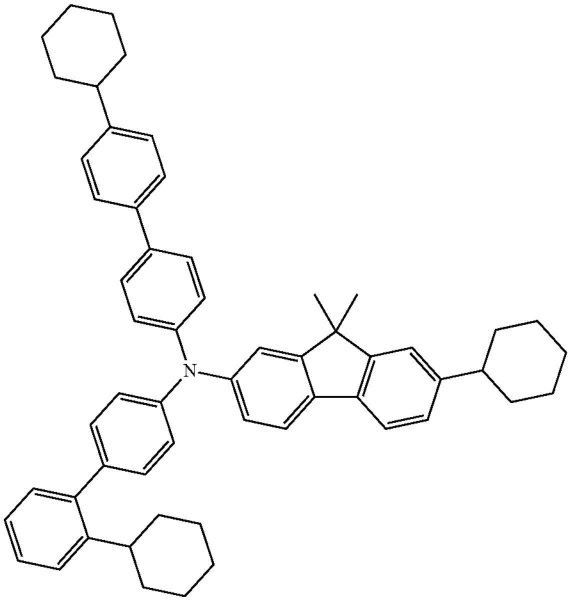
12
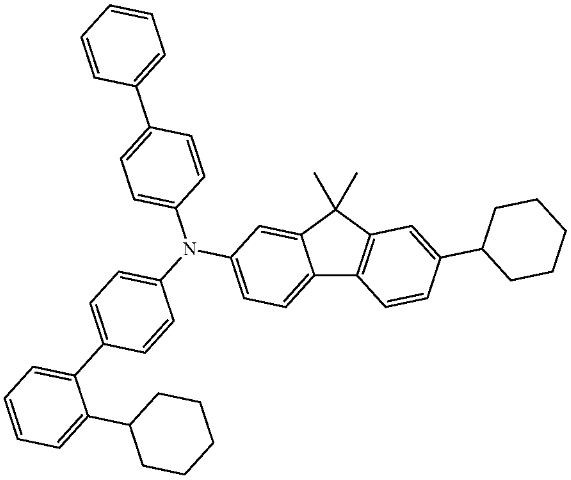
13
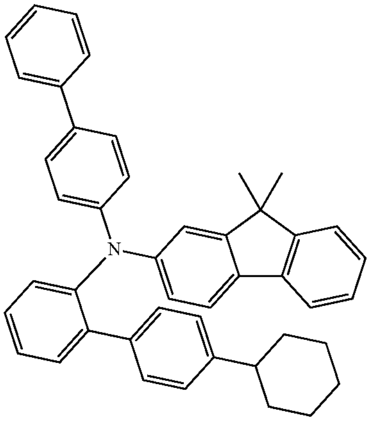

-continued
14
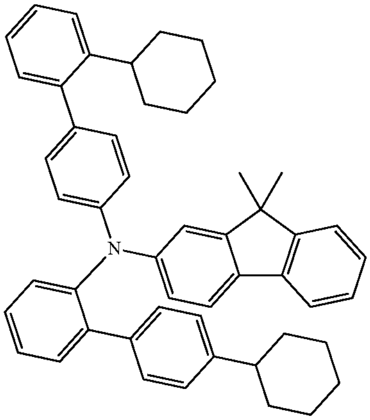
15
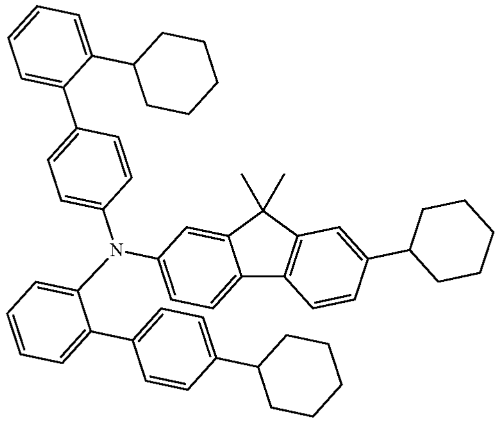
16
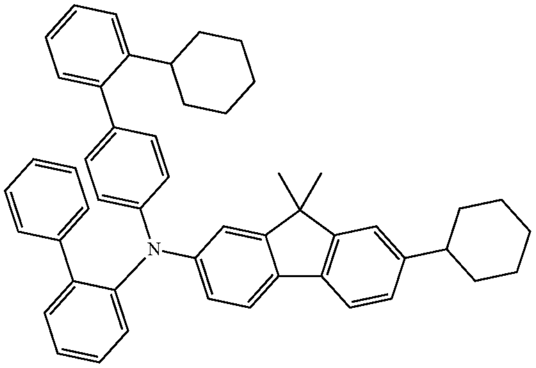
17
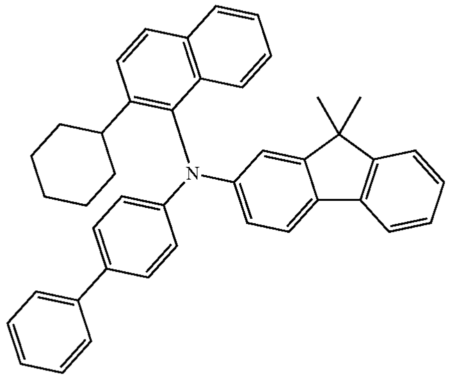
-continued
18
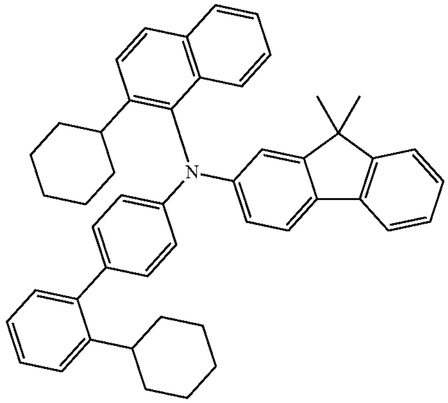
19
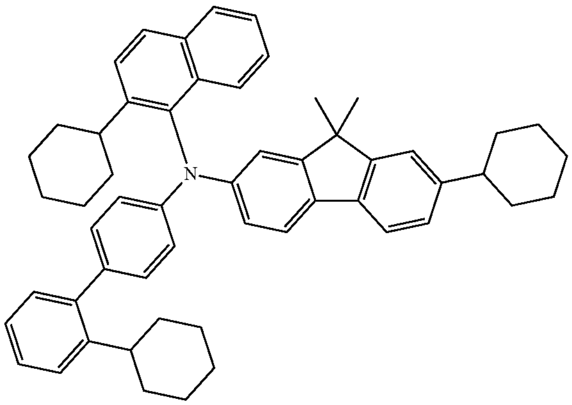
20
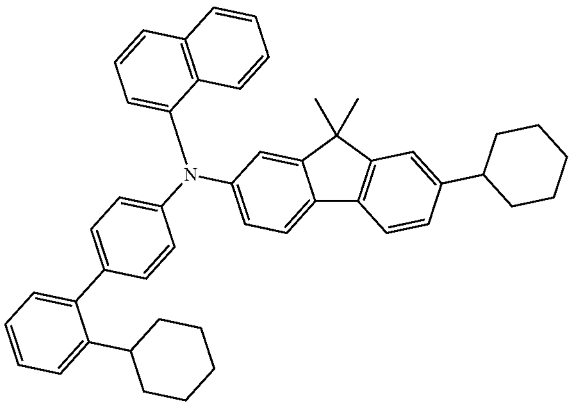

21
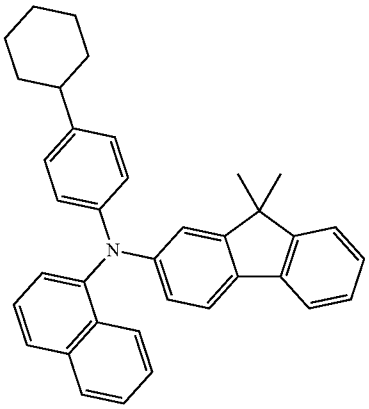
22
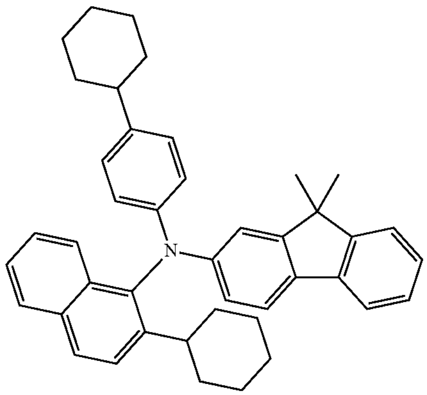
23
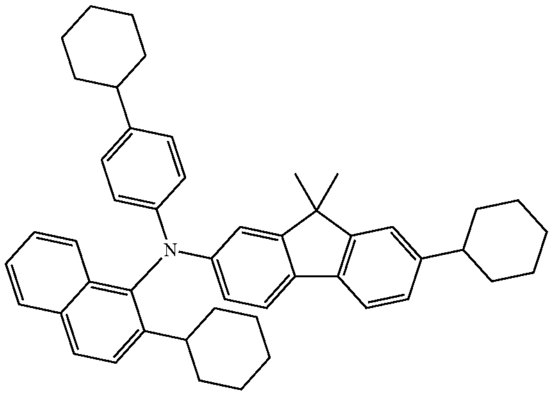
24
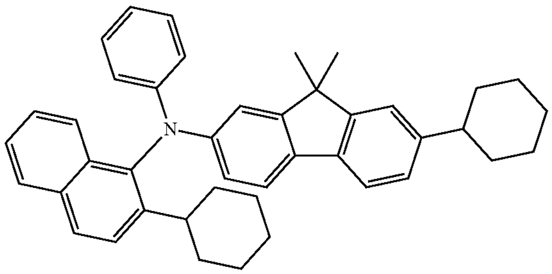
25
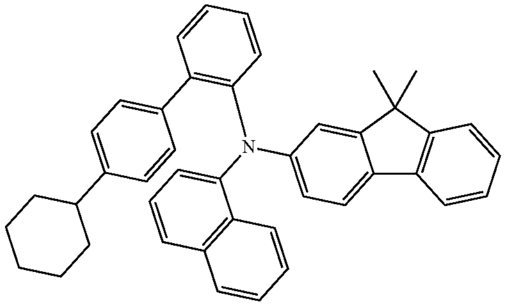
26
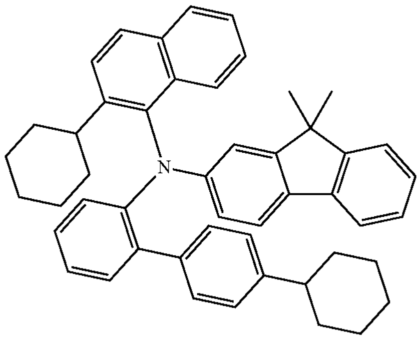
27
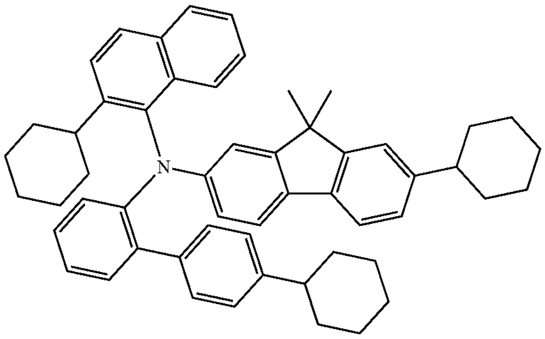
28
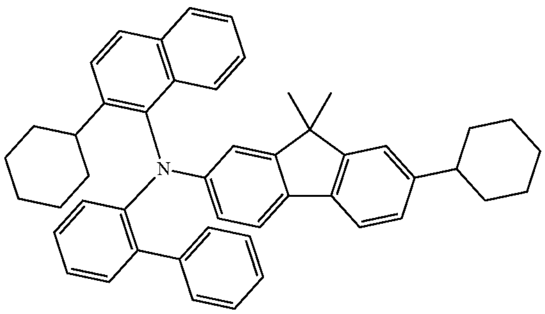

-continued
29
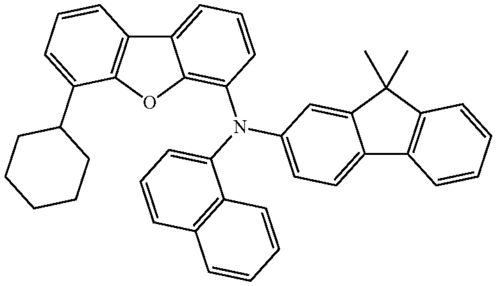
30
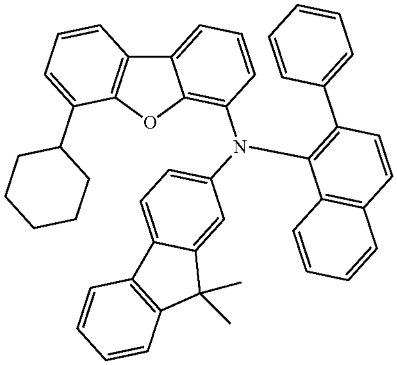
31
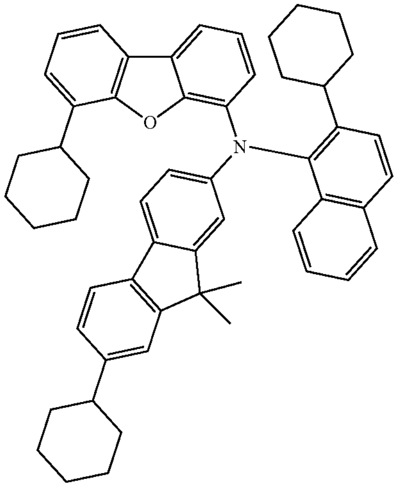
32
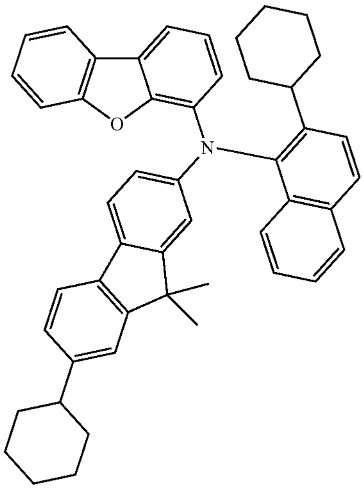
-continued
33
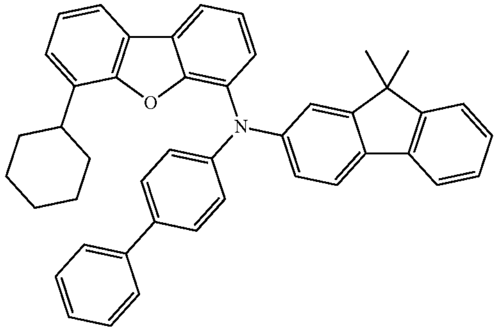
34
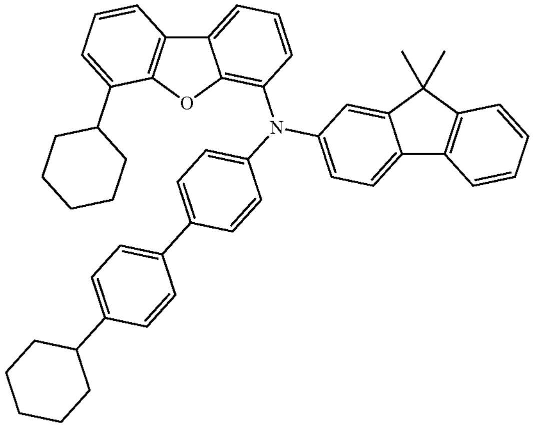
35
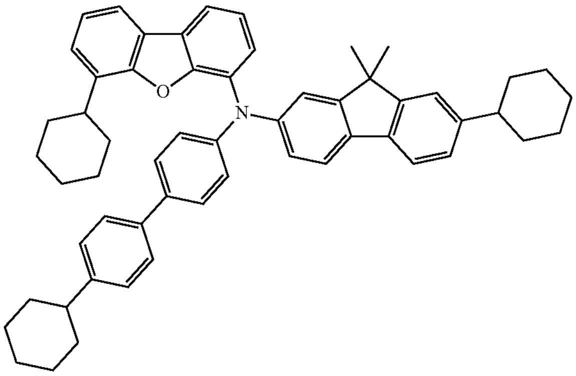
36
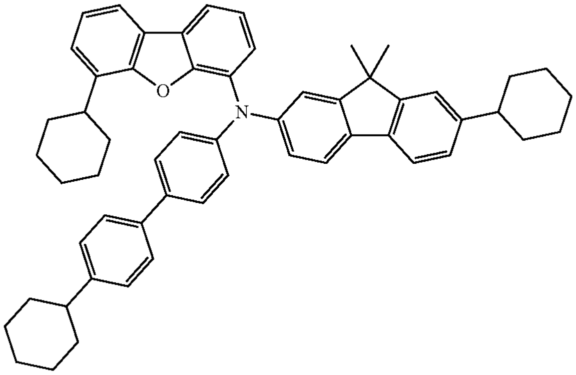

-continued
37
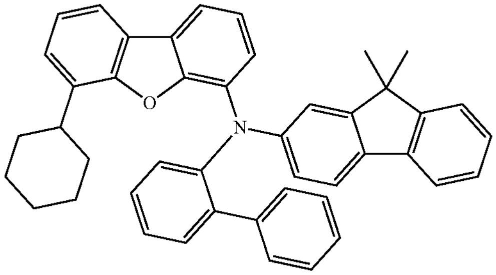
38
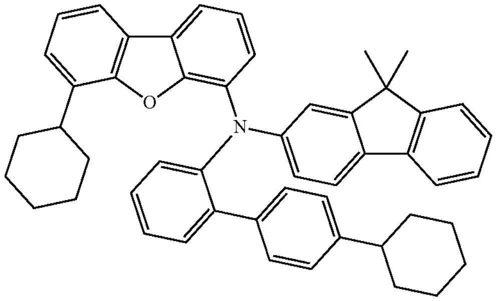
39
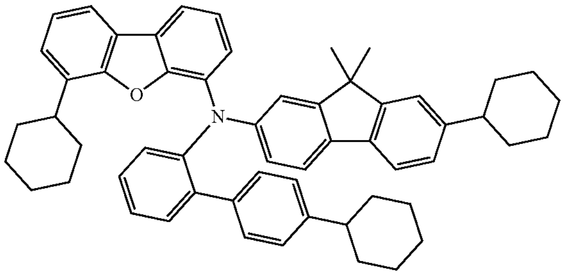
40
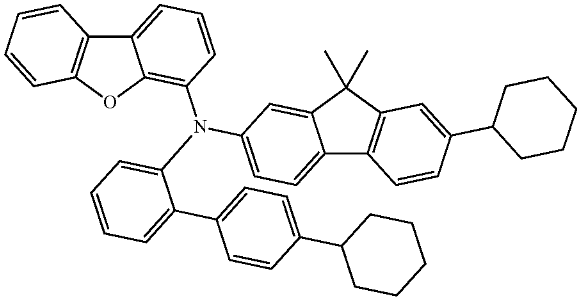
41
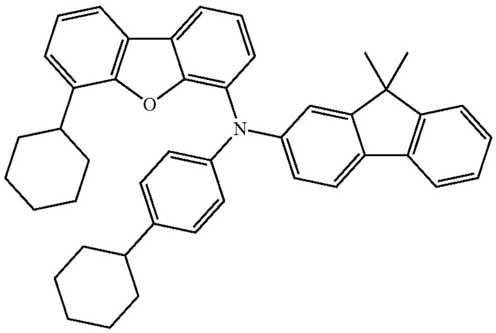
-continued
42
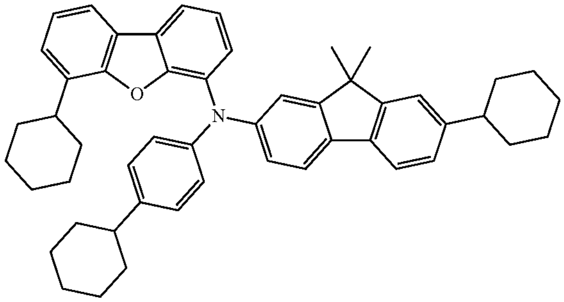
43
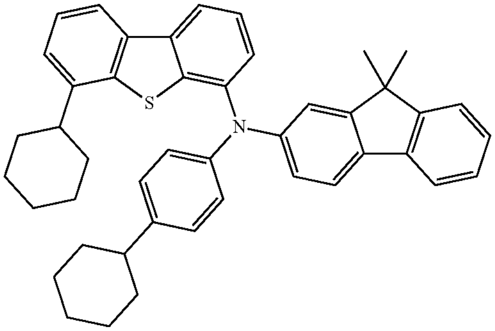
44
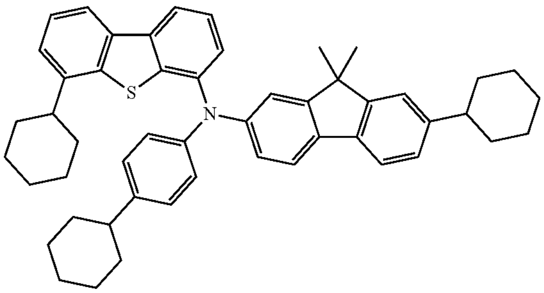
121
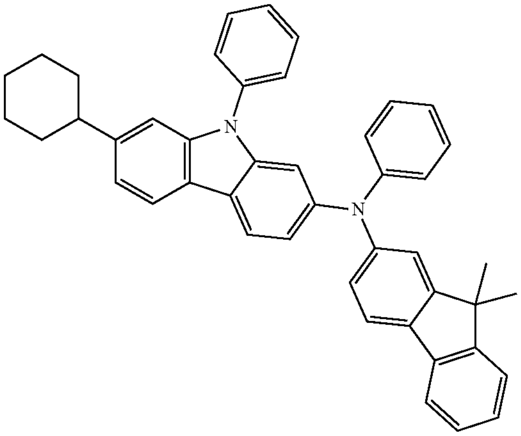

-continued
122
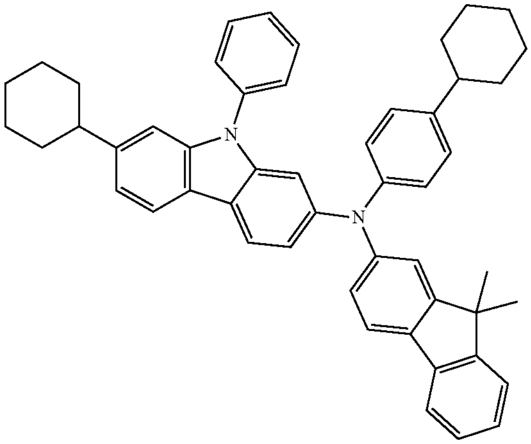
123
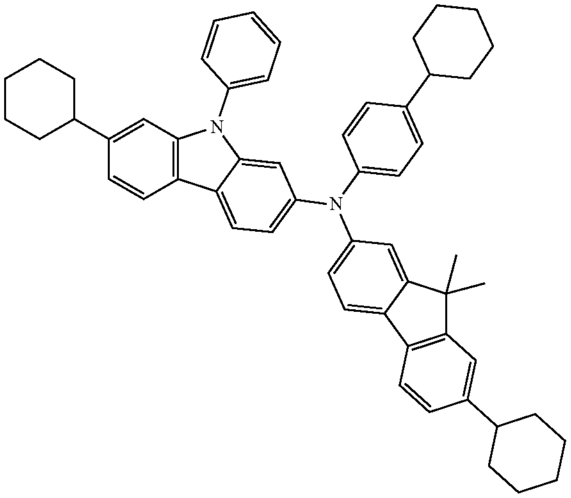
124
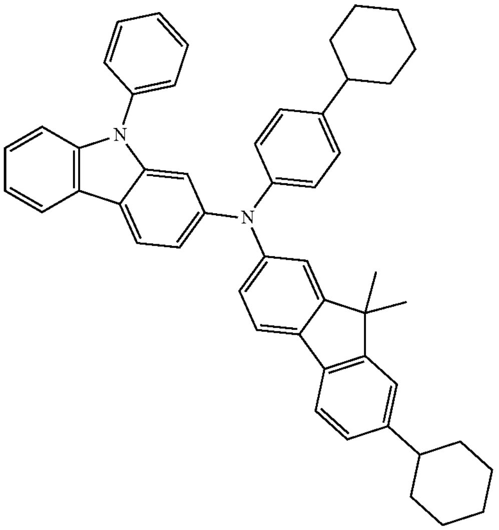
-continued
125
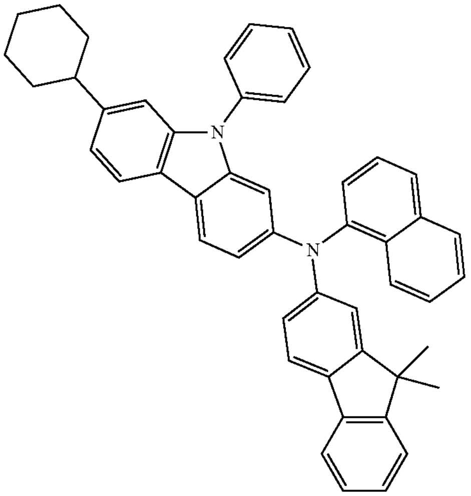
126
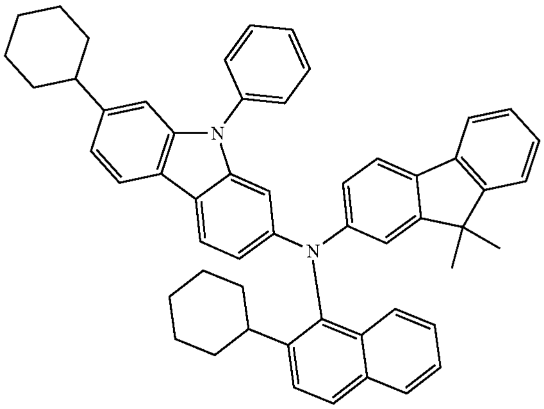
127
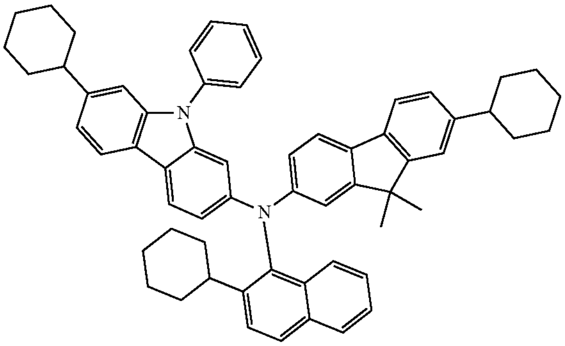
128
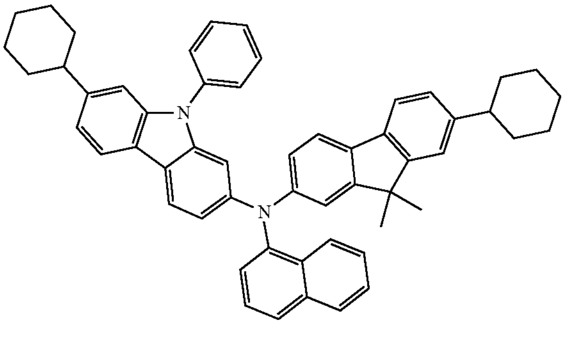

-continued
129
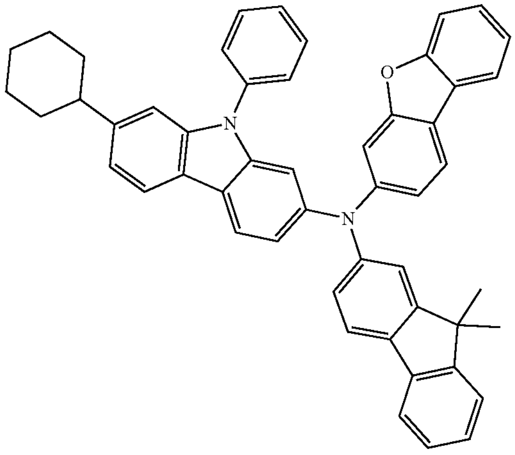
130
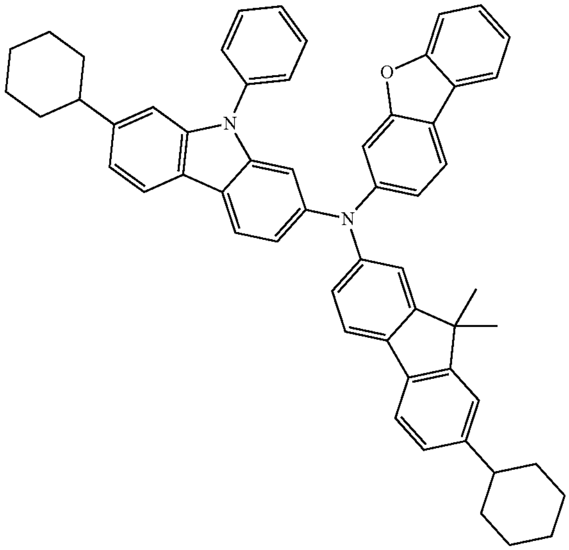
131
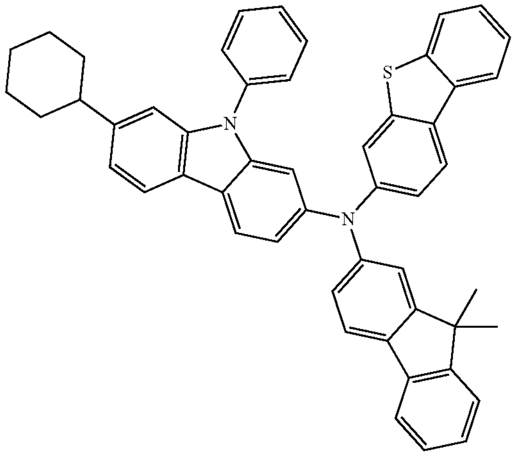
-continued
132
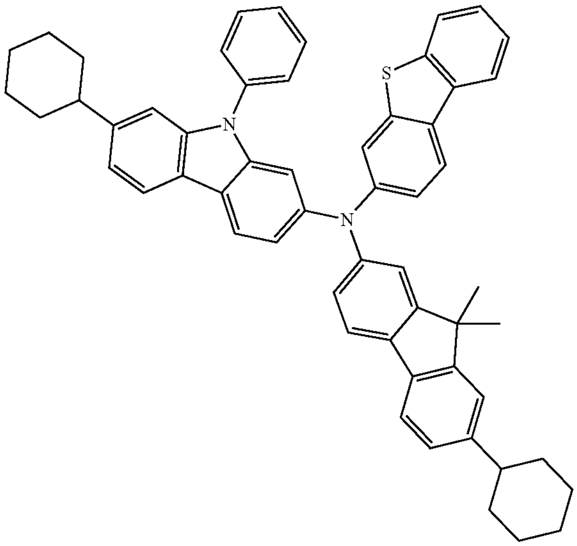
137
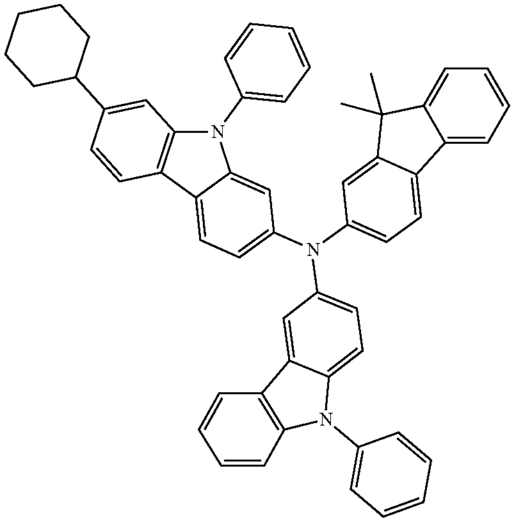
139
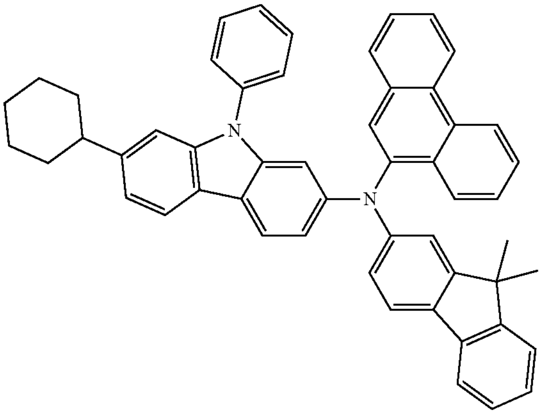

-continued
140
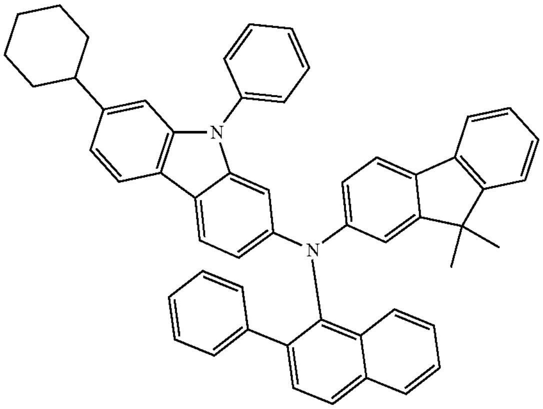
141
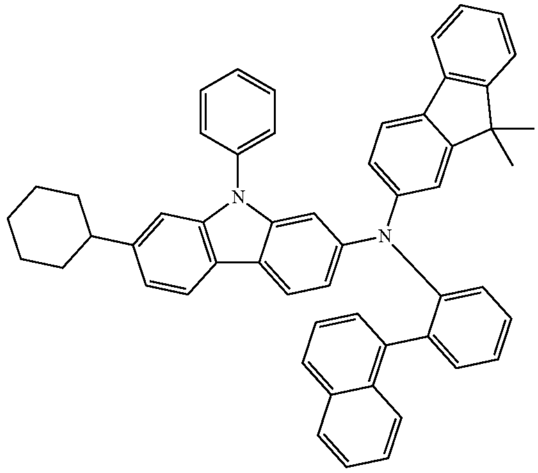
142
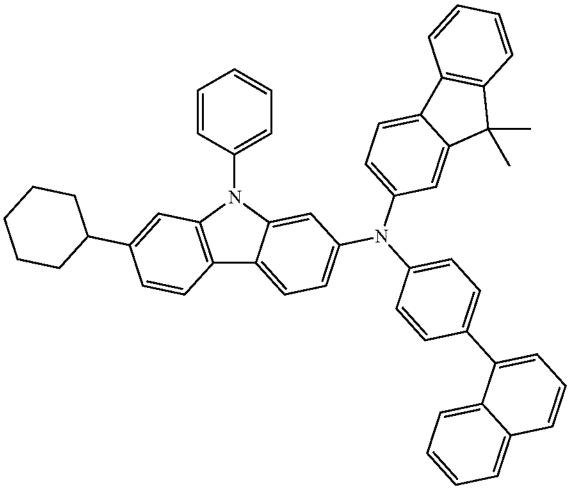
-continued
143
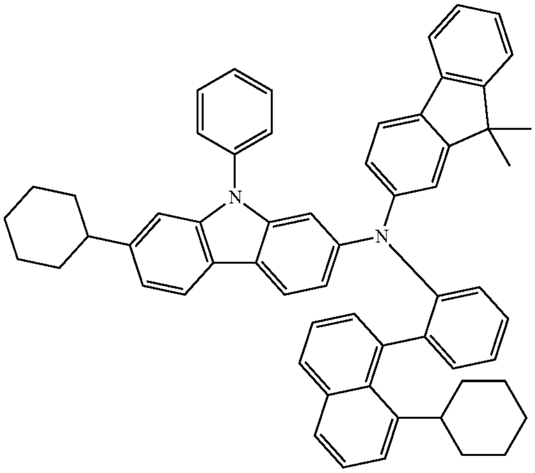
144
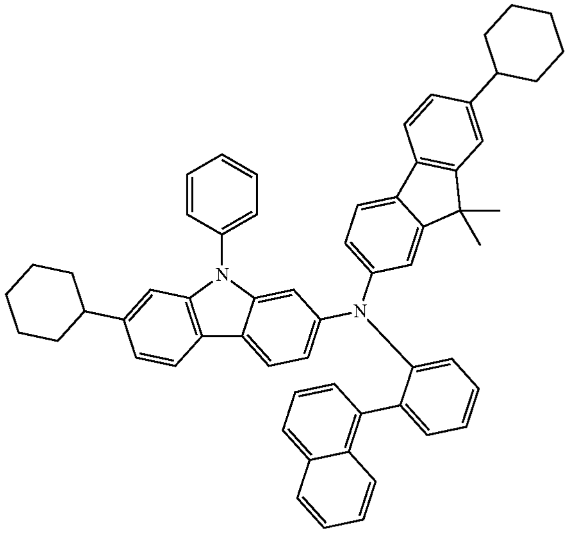
145
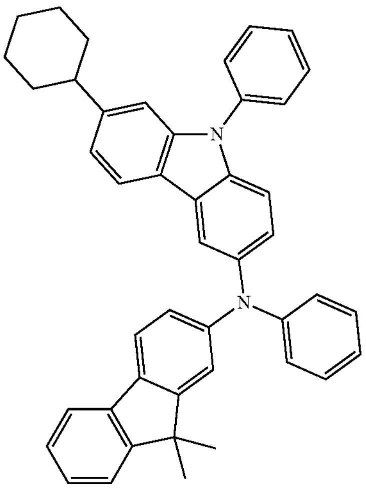

-continued
146
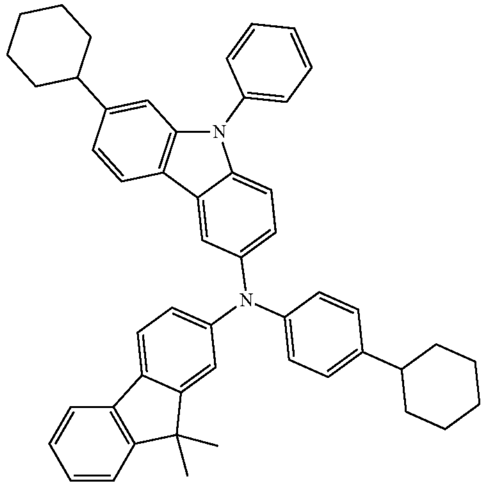
147
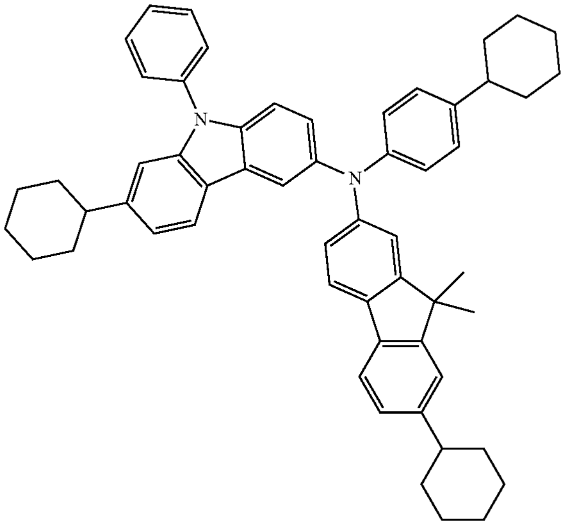
148
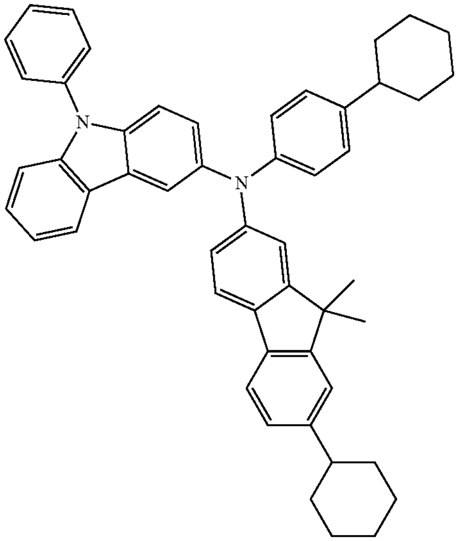
-continued
149
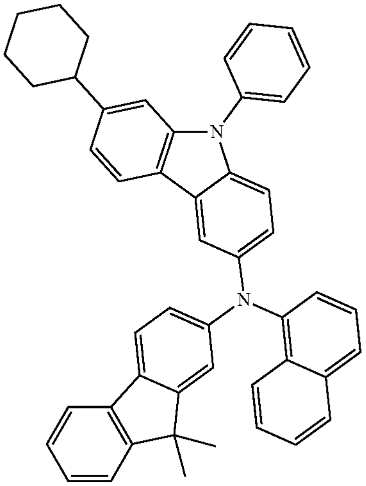
150
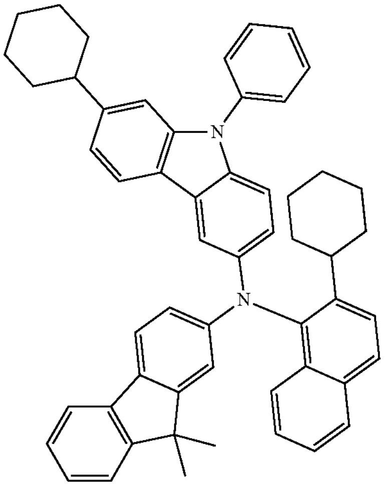
151
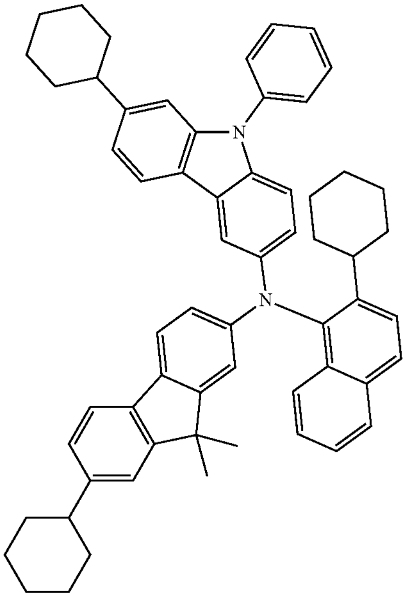

152
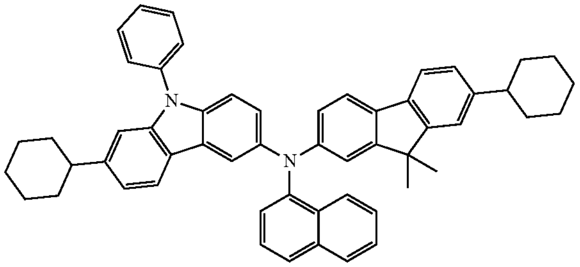
153
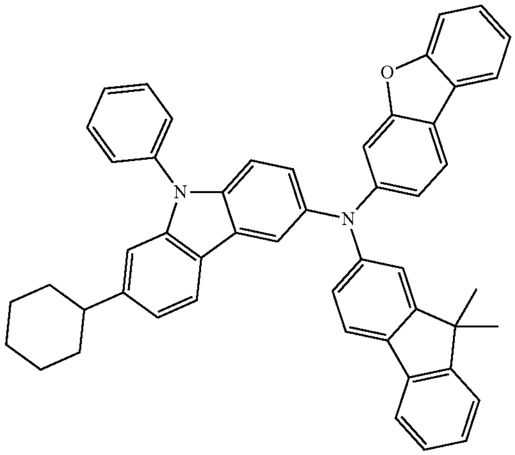
154
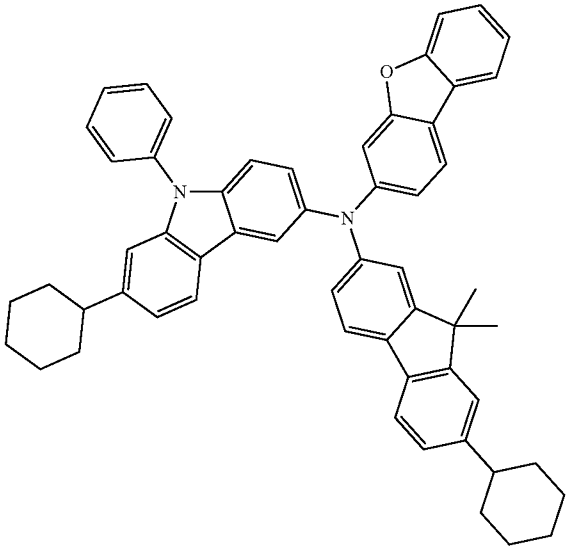
155
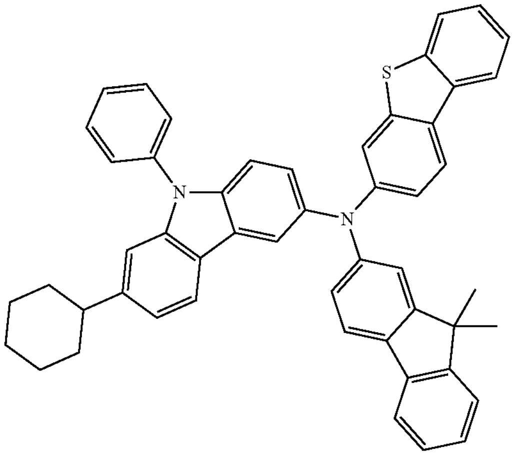
156
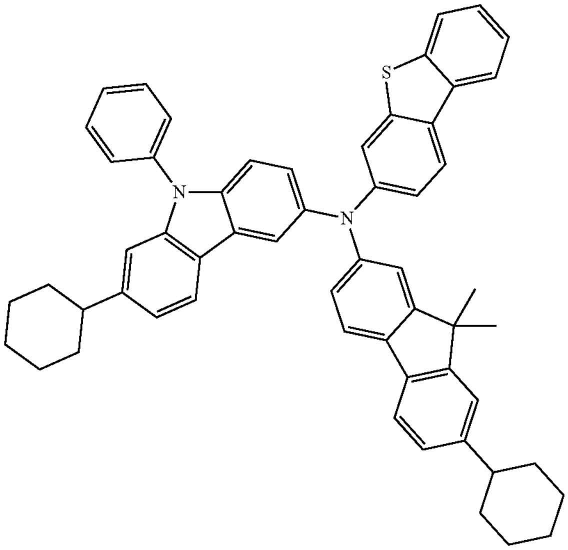
157
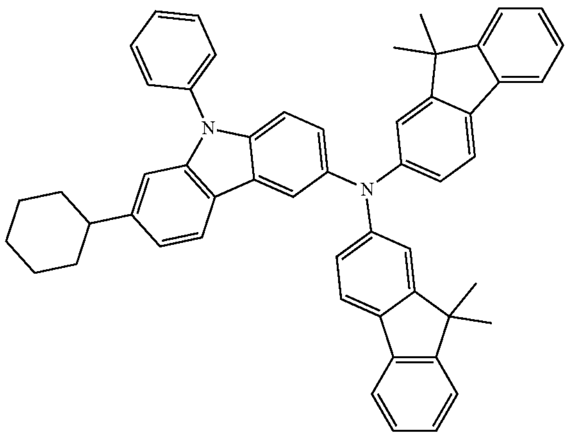

-continued
158
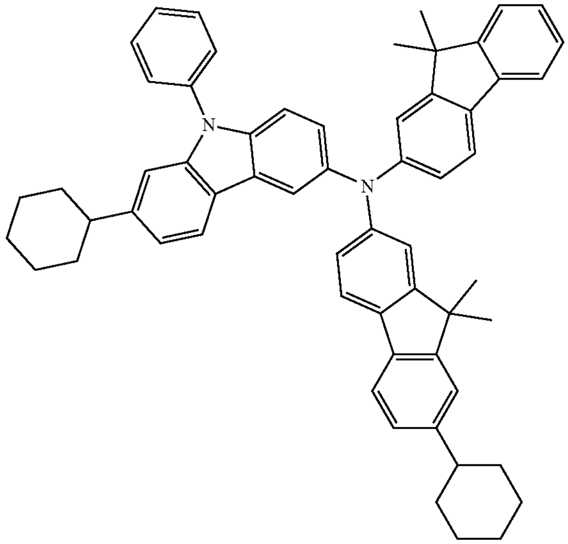
159
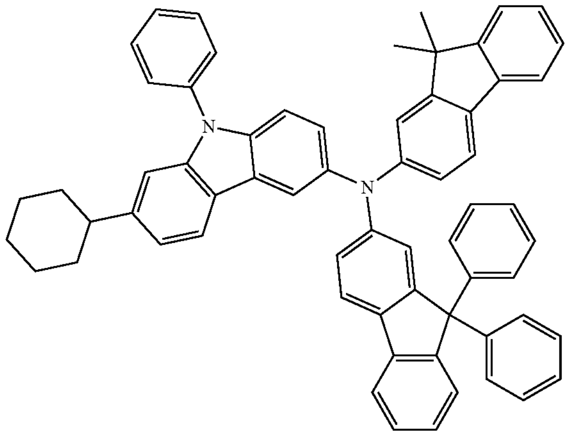
160
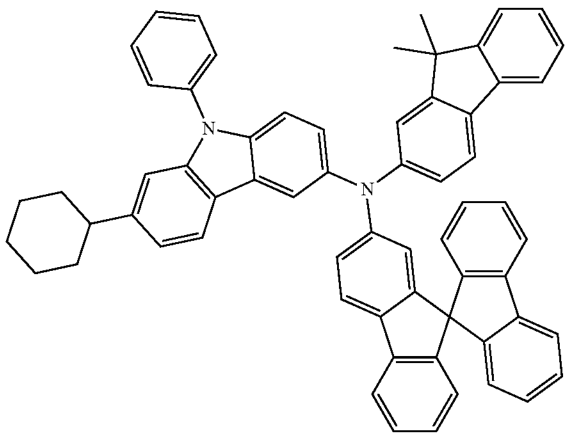
-continued
161
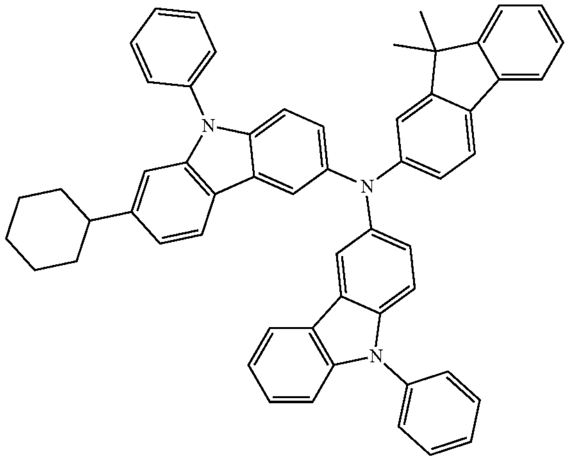
162
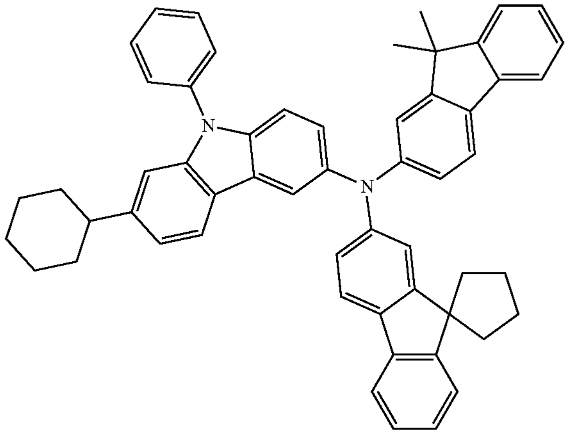
163
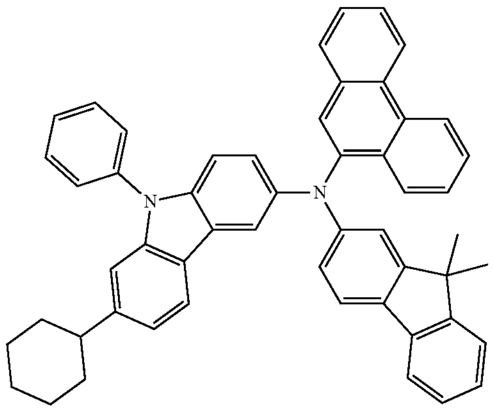

-continued
164
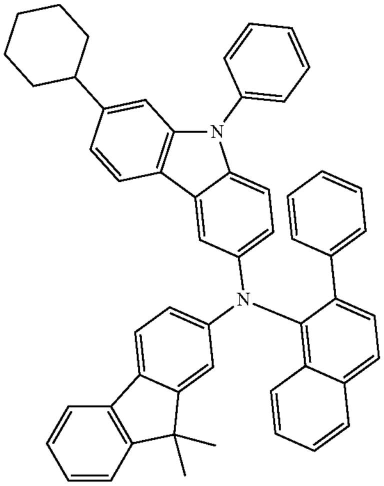
165
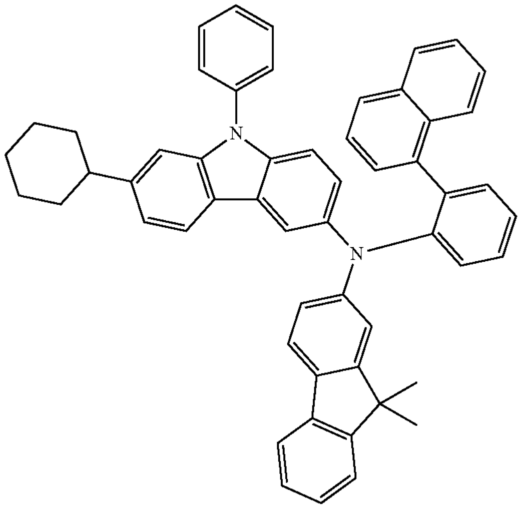
166
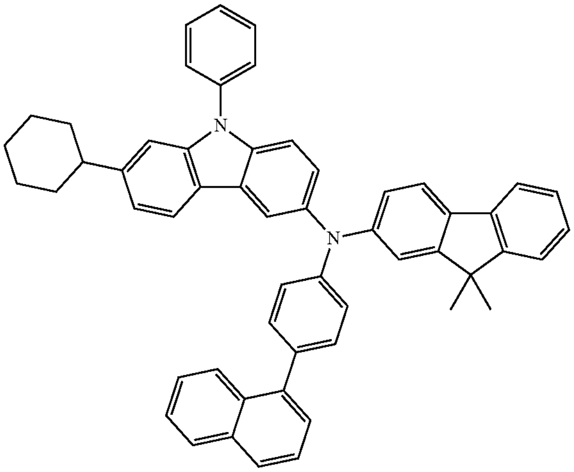
-continued
167
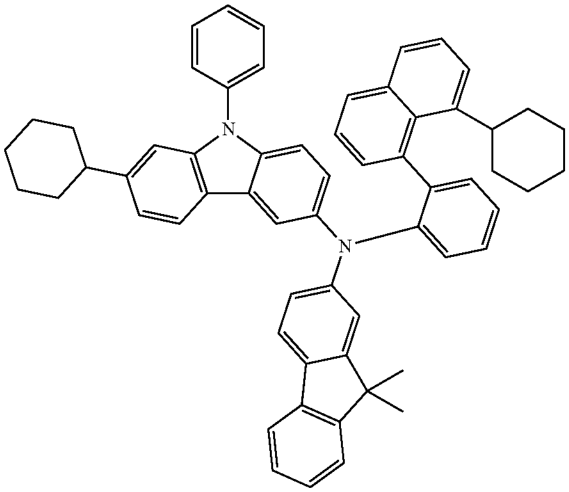
168
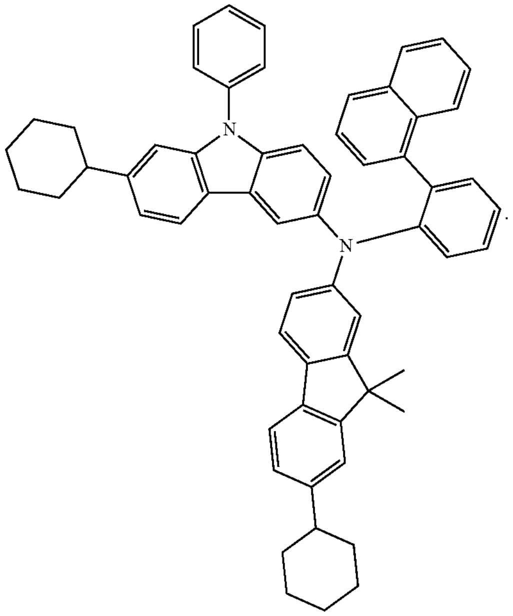
* * * * *